(12) United States Patent
Chien

(10) Patent No.: US 6,760,249 B2
(45) Date of Patent: Jul. 6, 2004

(54) CONTENT ADDRESSABLE MEMORY DEVICE CAPABLE OF COMPARING DATA BIT WITH STORAGE DATA BIT

(76) Inventor: Pien Chien, No. 50, Alley 111, Lane 155, Sec. 3, Keelung Rd., Taipei (TW)

( * ) Notice: Subject to any disclaimer, the term of this patent is extended or adjusted under 35 U.S.C. 154(b) by 51 days.

(21) Appl. No.: 10/176,238

(22) Filed: Jun. 19, 2002

(65) Prior Publication Data

US 2003/0012063 A1 Jan. 16, 2003

Related U.S. Application Data

(60) Provisional application No. 60/318,793, filed on Sep. 10, 2001, provisional application No. 60/301,691, filed on Jun. 27, 2001, provisional application No. 60/301,637, filed on Jun. 27, 2001, provisional application No. 60/300,483, filed on Jun. 22, 2001, and provisional application No. 60/300,000, filed on Jun. 21, 2001.

(51) Int. Cl.[7] .............................. G11C 11/00; G11C 7/00
(52) U.S. Cl. .................... 365/154; 365/49; 365/198.07; 365/190
(58) Field of Search .......................... 365/49, 204, 190, 365/189.07, 154

(56) References Cited

U.S. PATENT DOCUMENTS 5,949,696 A * 9/1999 Threewitt .................... 365/49
6,430,073 B1 * 8/2002 Batson et al. ................. 365/49

* cited by examiner

*Primary Examiner*—Thong Q. Le
(74) *Attorney, Agent, or Firm*—J.C. Patents

(57) ABSTRACT

A NAND or NOR content-addressable memory (CAM) cell, which selectively use single port, tow ports, or three ports for operations depending on design requirements. Only n-channel transistors or p-channel transistors design these NAND or NOR CAM cells. In such designs, one-port bit line with one-port word line, or one-port bit line with two-port word lines, or two-port bit lines with two-port word lines are provided for meeting different operations and pruposes.

106 Claims, 69 Drawing Sheets

CONTENT ADDRESSABLE MEMORY DEVICE CAPABLE OF COMPARING DATA BIT WITH STORAGE DATA BIT

CROSS-REFERENCE TO RELATED APPLICATION

This application claims the priority benefits of U.S. provisional application titled "CONTENT ADDRESSABLE MEMORY DEVICE" serial No. 60/262,989, filed on Jan. 19, 2001, U.S. patent application titled "CONTENT ADDRESSABLE MEMORY (CAM) APPARATUS AND A METHOD OF OPERATING THE SAME" filed on Jun. 26, 2001, Ser. No. 09/899,555, U.S. provisional application titled "CONTENT ADDRESSABLE MEMORY (CAM) CELL" filed on Jun. 21, 2001, serial No. 60/300,000, U.S. provisional application titled "CONTENT ADDRESSABLE MEMORY (CAM) CELL" filed on Jun. 22, 2001, serial No. 60/300,483, U.S. provisional application titled "CONTENT ADDRESSABLE MEMORY (CAM) CELL" filed on Sep. 10, 2001, serial no. 60/318,793, U.S. provisional application titled "1-T SRAM Device" filed on Jan. 19, 2001, serial No. 60/262,988, U.S. provisional application titled "1-T SRAM" filed on Jun. 27, 2001, serial No. 60/301,637, U.S. provisional application titled "HIGH SPEED MULTI-PORT MEMORY DEVICE" filed on Apr. 25, 2001, serial No. 60/286,395, and U.S. provisional application titled "1-T SRAM" filed on Jun. 27, 2001, serial No. 60/301,637, U.S. provisional application titled "HIGH SPEED MULTI-PORT MEMORY DEVICE" filed on Jun. 27, 2001, serial No. 60/301,691. All disclosures of these applications are incorporated herein by reference.

BACKGROUND OF THE INVENTION

Field of the Invention

This invention relates to NMOS semiconductor memories, and more particularly to content-addressable memory (CAM) cells.

BACKGROUND OF THE INVENTION

Most memory devices store and retrieve data by addressing specific memory locations. As a result, this path often becomes the limiting factor for systems that rely on fast memory accesses. The time required finding an item stored in memory can be reduced considerably if the item can be identified for access by its content rather than by its address. A memory that is accessed in this way is called content-addressable memory or CAM. CAM provides a performance advantage over other memory search algorithms, such as binary or tree-based searches, by comparing the desired information against the entire list of pre-stored entries simultaneously, often resulting in an order-of-magnitude reduction in the search time.

CAM is ideally suited for several functions, including Ethernet address lookup, data compression, pattern-recognition, cache tags, high-bandwidth address filtering, and fast lookup of routing, user privilege, security or encryption information on a packet-by-packet basis for high-performance data switches, firewalls, bridges and routers.

Since CAM is an outgrowth of Random Access Memory (RAM) technology, in order to understand CAM, it helps to contrast it with RAM. A RAM is an integrated circuit that stores data temporarily. Data is stored in a RAM at a particular location, called an address. In a RAM, the user supplies the address, and gets back the data. The number of address line limits the depth of a memory using RAM, but the width of the memory can be extended as far as desired. With CAM, the user supplies the data and gets back the address. The CAM searches through the memory in one clock cycle and returns the address where the data is found. The CAM can be preloaded at device startup and also be rewritten during device operation. Because the CAM does not need address lines to find data, the depth of a memory system using CAM can be extended as far as desired, but the width is limited by the physical size of the memory.

CAM can be used to accelerate any application requiring fast searches of data-base, lists, or patterns, such as in image or voice recognition, or computer and communication designs. For this reason, CAM is used in applications where search time is very critical and must be very short. For example, the search key could be the IP address of a network user, and the associated information could be user's access privileges and his location on the network. If the search key presented to the CAM is present in the CAM's table, the CAM indicates a 'match' and returns the associated information, which is the user's privilege. A CAM can thus operate as a data-parallel or Single Instruction/Multiple Data (SIMD) processor.

CAM can be used to accelerate any applications ranging from local-area networks, database management, file-storage management, pattern recognition, artificial intelligence, fully associative and processor-specific cache memories, and disk cache memories. Although CAM has many applications, it is particularly well suited to perform any kind of search operations.

Each CAM cell is essentially a RAM cell with a match function. Match functions can be implemented by adding an exclusive-OR (XOR) or inverse XOR gate to each RAM cell. The XOR output is applied to a match line that connects many CAM cells together in a row or column. The match signal can then be output from the memory.

CAM cells were originally constructed from static RAM (SRAM) cells by adding transistors to perform the XOR function. More recently, CAM cells have also been constructed from dynamic RAM (DRAM) cells. DRAM cells have an area and cost advantage over SRAM cells since a small capacitor stores charge rather than a bi-stable or cross-coupled pair of transistors.

FIG. 1 shows a prior-art dynamic CAM cell using six transistors. U.S. Pat. No. 5,428,564 by Winters shows a six-transistor (6T) CAM cell based on earlier dynamic CAM cells of just 4 or 5 transistors. While the earlier 4T and 5T CAM cells were small in area, these cells were particularly noise sensitive and slow, having relatively low voltage ratios. Winter's CAM cell uses only n-channel (NMOS) transistors, and has a small area. However, bit-line capacitance is high, the high bit-line capacitance slows read and write operations.

FIG. 2 is a conventional dynamic CAM cell using CMOS transistors. See U.S. Pat. No. 4,791,606 by Threewitt et al. A single bit of data is stored on capacitor when pass transistor is activated by word line WL. Only one bit line BL is used. While such a CMOS CAM cell is useful, integrating p-channel transistors into each cell is expensive. The spacing from a p-channel transistor to an n-channel transistor is large, since separate P and N wells must be made. The spacing between two n-channel transistors is much smaller. Thus the size of the cell is larger when p-channel transistors are included with the r-channel transistors. Also, a single bit line makes reading and writing slow since an absolute voltage rather than a voltage difference is sensed or driven.

What is desired is a CAM cell using only n-channel transistors or p-channel transistors. It is desired to use dynamic storage rather than static storage to reduce the size of the CAM cell.

SUMMARY OF THE INVENTION

The invention provides NAND or NOR content-addressable memory (CAM) cells, which selectively use single port, tow ports, or three ports for operations depending on design requirements. These NAND or NOR CAM cells are designed by only n-channel transistors or p-channel transistors. In such designs, one-port bit line with one-port word line, or one-port bit line with two-port word lines, or two-port bit lines with two-port word lines are provided for meeting different purposes.

One arrangement with two-port word lines can be one port word line for refresh and other port word line for SRAM write operation. One of the other arrangements with two-port word lines can be one port word line for read operation and other port word line for write operation, while a wave-pipeline technique is used for refresh cycle (which means hidden refresh). One of the other arrangements with two-port word lines can be one port word line for read operation and other port word line for write operation, while idle a refresh cycle for such dynamic CAM cell.

One arrangement with two-port bit lines can be a match operation and a read/write operation can be performed in the same cycle, while a wave-pipeline technique is used for refresh cycle (which means a hidden refresh method). One of the other arrangements with two-port bit lines is a match operation and a read/write operation can be performed in the same cycle, while idle one cycle for refresh. One of the other arrangements with two-port bit lines is and two-port word line can be one word-line port for refresh and the other word-line port for a SRAM write operation, while the match operation can be performed in the same cycle. One of the other arrangements with two-port bit lines is and two-port word line can be one word-line port for read operation and the other word-line port for write operation, while a wave-pipeline technique for hidden refresh is used for a refresh cycle (which means hidden refresh) and the match operation can be performed in the same cycle. One of the other arrangements with two-port bit lines is and two-port word line can be one word-line port for read operation and the other word-line port for write operation, while the match operation is performed in the same cycle and idle a refresh cycle for refresh operation (for dynamic CAM cells). Such 3-port dynamic differential CAM cells can be implemented by any CMOS technologies, such as FRAM, DRAM, logic technology, etc. These CAM cells can be combined and modified in accordance with different purposes.

As embodied and broadly described herein, the invention provides a memory cell, comprising a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell; a first pass transistor, having a gate controlled by the first word line, for connecting the first bit line to the gate of the first storage transistor and the first capacitor, during the accessing operation mode; a second pass transistor, having a gate controlled by the first word line, for connecting the second bit line to the gate of the second storage transistor and the second capacitor, during the accessing operation mode; a first storage transistor and a first capacitor, a gate of the first storage transistor and the first capacitor for dynamically storing a storage data bit of the memory cell in respond to the first data bit during the accessing operation mode; a second storage transistor and a second capacitor, a gate of the second storage transistor and the second capacitor for dynamically storing a complement of the storage data bit of the memory cell in respond to the complement of first data bit during the accessing operation mode; a match line; a match unit, coupled to the first bit line, the second bit line, the first storage transistor and the second storage transistor. During the comparison operation mode of the memory cell, the first word line stopping data transmitting between the first and second bit lines and the memory cell, the second bit line receiving a comparing data bit and the first bit line receiving a complement of the comparing data bit, if the complement of the comparing data bit from the first bit line is not logically equal to the storage data bit, or if the comparing data bit from the second bit line is not logically equal to the complement of the storage data bit, the match unit discharging current from the match line to indicate a mis-match signal.

The match unit comprises a first transistor, being coupled a gate the first storage transistor and the first capacitor, a gate of the first transistor being controlled by the storage data bit stored in the a gate the first storage transistor and the first capacitor, a source/drain region of the first transistor being coupled to ground; a second transistor, being coupled a gate of the second storage transistor and the second capacitor, a gate of the second transistor being controlled by the complement of the storage data bit stored in the gate of the second storage transistor and the second capacitor, a source/drain region of the second transistor being coupled to ground; a first match transistor, a gate of the first match transistor being coupled to the first bit line, a source/drain region of the first match transistor being coupled to another ungrounded source/drain region of the first transistor and another source/drain region of the first match transistor being coupled to the match line; and a second match transistor, a gate of the second match transistor being coupled to the second bit line, a source/drain region of the second match transistor being coupled to another ungrounded source/drain region of the second transistor and another source/drain region of the second match transistor being coupled to the match line.

In the above-described memory cell, the first and second pass transistors, the first and second storage transistors, the first and second match transistors, and the first and second transistors are all n-channel metal-oxide-semiconductor (NMOS) transistors.

In the above-described memory cell, further comprises a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first storage transistor and the first capacitor; and a forth pass transistor, having a gate controlled by the second word line, for connecting the forth bit line to the gate of the second storage transistor and the second capacitor, wherein the storage data bit stored in the gate of the first storage transistor and the first capacitor being selectively updated in response to the second data bit, the storage data bit stored in the gate of the second storage transistor and the second capacitor being selectively updated in response to the complement of the second data bit.

As embodied and broadly described herein, the invention provides a memory cell, comprising a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell; a first pass transistor, having a gate controlled by the first word line, for connecting the first bit line to the gate of the first storage transistor, during the accessing operation mode; a second pass transistor, having a gate controlled by the first word line, for connecting the second bit line to the gate of the second storage transistor, during the accessing operation mode; a first storage transistor, having a first gate for dynamically storing a storage data bit of the memory cell in response to the first data bit; a second storage transistor, having a second gate for dynamically storing a complement of the storage data bit of the memory cell in response to the complement of the first data bit; a match line; and a match unit, coupled to the first bit line, the second bit line, the gate of the first storage transistor and the gate of the second storage transistor. During the comparison operation mode of the memory cell, the first word line stopping data transmitting between the first and second bit lines and the memory cell, the second bit line receiving a comparing data bit and the first bit line receiving a complement of the comparing data bit, if the complement of the comparing data bit from the first bit line is not logically equal to the storage data bit, or if the comparing data bit from the second bit line is not logically equal to the complement of the storage data bit, the match unit discharging current from the match line to indicate a mis-match signal.

The match unit above-described comprises a first transistor, being coupled the first storage transistor, a gate of the first transistor being controlled by the storage data bit stored in the gate of the first storage transistor, a source/drain region of the first transistor being coupled to ground; a second transistor, being coupled the second storage transistor, a gate of the second transistor being controlled by the complement of the storage data bit stored in the gate of the second storage transistor, a source/drain region of the second transistor being coupled to ground; a first match transistor, a gate of the first match transistor being coupled to the first bit line, a source/drain region of the first match transistor being coupled to another ungrounded source/drain region of the first transistor and another source/drain region of the first match transistor being coupled to the match line; and a second match transistor, a gate of the second match transistor being coupled to the second bit line, a source/drain region of the second match transistor being coupled to another ungrounded source/drain region of the second transistor and another source/drain region of the second match transistor being coupled to the match line.

In the above-described memory cell, the first and second pass transistors, the first and second storage transistors, the first and second match transistors, and the first and second transistors are all n-channel metal-oxide-semiconductor (NMOS) transistors.

In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first storage transistor and the first capacitor; and a forth pass transistor, having a gate controlled by the second word line, for connecting the forth bit line to the gate of the second storage transistor and the second capacitor, and wherein the storage data bit stored in the gate of the first storage transistor being selectively updated in response to the second data bit, the storage data bit stored in the gate of the second storage transistor being selectively updated in response to the complement of the second data bit.

In the above-described memory cell, the first and second pass transistors, the third and forth pass transistors, the first and second storage transistors, the first and second match transistors, and the first and second transistors are all n-channel metal-oxide-semiconductor (NMOS) transistors.

As embodied and broadly described herein, the invention provides a memory cell, comprising a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell; a first pass transistor, having a gate controlled by the first match transistor word line, for connecting the first bit line to the first capacitor, during the accessing operation mode; a second pass transistor, having a gate controlled by the first match transistor word line, for connecting the second bit line to the second capacitor, during the accessing operation mode; a first capacitor, for storing a storage data bit of the memory cell in response to the first data bit; a second capacitor, for dynamically storing a complement of the storage data bit of the memory cell in response to the complement of the first data bit; a match line; and a match unit, coupled to the first bit line, the second bit line, the first capacitor and the second capacitor. During the comparison operation mode of the memory cell, the first word line stopping data transmitting between the first and second bit lines and the memory cell, the second bit line receiving a comparing data bit and the first bit line receiving a complement of the comparing data bit, if the complement of the comparing data bit from the first bit line is not logically equal to the storage data bit, or if the comparing data bit from the second bit line is not logically equal to the complement of the storage data bit, the match unit discharging current from the match line to indicate a mis-match signal.

In the above-described memory cell, the match unit comprising: a first transistor, having a gate being controlled by the storage data bit stored in the first capacitor, a source/drain region of the first transistor being coupled to ground; a second transistor, having a gate being controlled by the complement of the storage data bit stored in the second capacitor, a source/drain region of the second transistor being coupled to ground; a first match transistor, a gate of the first match transistor being coupled to the first bit line, a source/drain region of the first match transistor being coupled to another ungrounded source/drain region of the first transistor and another source/drain region of the first match transistor being coupled to the match line; and a second match transistor, a gate of the second match transistor being coupled to the second bit line, a source/drain region of the second match transistor being coupled to another ungrounded source/drain region of the second transistor and another source/drain region of the second match transistor being coupled to the match line.

In the above-described memory cell, the first and second pass transistors, the first and second storage transistors, the first and second match transistors, and the first and second transistors are all n-channel metal-oxide-semiconductor (NMOS) transistors.

In the above-described memory cell, the first and second pass transistors, the first and second storage transistors, the first and second match transistors, and the first and second transistors are all p-channel metal-oxide-semiconductor (PMOS) transistors.

The first capacitor and the second capacitor can be MOS capacitors, metal-insulator-metal (MIM) capacitors, polysilicon capacitors, ferroelectric capacitors suitable usage for ferroelectric random-access memory (FRAM), capacitors manufactured by a DRAM process, or magnetoresistive random access memory (MRAM) capacitors made of magnetic materials to store data.

In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the first capacitor; and a forth pass transistor, having a gate controlled by the second word line, for connecting the forth bit line to the second capacitor. The storage data bit stored in the first capacitor being selectively updated in response to the second data bit, the storage data bit stored in the second capacitor being selectively updated in response to the complement of the second data bit.

In the above-described memory cell, the first and second pass transistors, the third and forth pass transistors, the first and second storage transistors, the first and second match transistors, and the first and second transistors are all n-channel metal-oxide-semiconductor (NMOS) transistors.

In the above-described memory cell, the first and second pass transistors, the third and forth pass transistors, the first and second storage transistors, the first and second match transistors, and the first and second transistors are all p-channel metal-oxide-semiconductor (PMOS) transistors.

As embodied and broadly described herein, the invention provides a memory cell, comprising: a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell; a first pass transistor, having a gate controlled by the first match transistor word line, for connecting the first bit line to the gate of the first transistor, during the accessing operation mode; a second pass transistor, having a gate controlled by the first match transistor word line, for connecting the second bit line to the gate of the second transistor, during the accessing operation mode; a first transistor, having a gate for dynamically storing a storage data bit of the memory cell and having a source/drain region coupling to ground; a second transistor, having a gate for dynamically storing a complement of the storage data bit of the memory cell and having a source/drain region coupling to ground; a match line; a first match transistor, having a gate coupled to the first bit line, a source/drain region being coupled to another ungrounded source/drain region of the first transistor, and another source/drain region being coupled to the match line; and a second match transistor, having a gate being coupled to the second bit line, a source/drain region being coupled to another ungrounded source/drain region of the second transistor, and another source/drain region being coupled to the match line. During the comparison operation mode of the memory cell, the first word line stopping data transmitting between the first and second bit lines and the memory cell, the second bit line receiving a comparing data bit and the first bit line receiving a complement of the comparing data bit, if the complement of the comparing data bit is not logically equal to the storage data bit, the first match transistor discharging current from the match line to indicate a mis-match signal, if the complement of the comparing data bit from the first bit line is not logically equal to the storage data bit, or if the comparing data bit from the second bit line is not logically equal to the complement of the storage data bit, the second match transistor discharging current from the match line to indicate a mis-match signal.

In the above-described memory cell, the first and second pass transistors, the first and second storage transistors, the first and second match transistors, and the first and second transistors are all n-channel metal-oxide-semiconductor (NMOS) transistors.

In the above-described memory cell, the first and second pass transistors, the first and second storage transistors, the first and second match transistors, and the first and second transistors are all p-channel metal-oxide-semiconductor (PMOS) transistors.

In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the first capacitor; and a forth pass transistor, having a gate controlled by the second word line, for connecting the forth bit line to the second capacitor. The storage data bit stored in the gate of the first transistor is selectively updated in response to the second data bit, and the storage data bit stored in the gate of the second transistor is selectively updated in response to the complement of the second data bit.

In the above-described memory cell, the first and second pass transistors, the third and forth pass transistors, the first and second storage transistors, the first and second match transistors, and the first and second transistors are all n-channel metal-oxide-semiconductor (NMOS) transistors.

In the above-described memory cell, the first and second pass transistors, the third and forth pass transistors, the first and second storage transistors, the first and second match transistors, and the first and second transistors are all p-channel metal-oxide-semiconductor (PMOS) transistors.

As embodied and broadly described herein, the invention provides a memory cell, comprising: a first bit line, for transmitting a first data bit to the memory cell; a second bit line, for transmitting a complement of the first data bit to the memory cell; a first word line, for controlling data transmitting between the first and second bit lines and the memory cell; a first pass transistor, having a gate controlled by the first word line, for connecting the first bit line to the gate of the first storage transistor and the first capacitor; a second pass transistor, having a gate controlled by the first word line, for connecting the second bit line to the gate of the second storage transistor and the second capacitor; a first storage transistor and a first capacitor, a gate of the first storage transistor and the first capacitor for dynamically storing a storage data bit of the memory cell in response to the first data bit; a second storage transistor and a second capacitor, a gate of the second storage transistor and the second capacitor for dynamically storing a complement of the storage data bit of the memory cell in response to complement of the first data bit; a first compare line, for transmitting a compare data bit to the memory cell; a second compare bit line, for transmitting a complement of the compare data bit to the memory cell; a match line; and a match unit, coupled to the first and second bit lines, the first and second compare lines, the first storage transistor and the second storage transistor. During comparison operation of the memory cell, the compare data bit being conducted to the first and second compare lines, and if the complement of the comparing data bit from the first compare line is not logically equal to the storage data bit, or if the comparing data bit from the second compare line is not logically equal to the complement of the storage data bit, the match unit discharging current from the match line to indicate a mis-match signal.

In the above-described memory cell, the match unit comprises a first transistor, being coupled to a gate of the first storage transistor and the first capacitor, a gate of the first transistor being controlled by the storage data bit stored in the first storage transistor and the first capacitor, a source/drain region of the first transistor being coupled to ground; a second transistor, being coupled to a gate of the second storage transistor and the second capacitor, a gate of the second transistor being controlled by the complement of the storage data bit stored in the second storage transistor and the second capacitor, a source/drain region of the second transistor being coupled to ground; a first match transistor, a gate of the first match transistor being controlled by the first compare line, a source/drain region of the first match transistor being coupled to another ungrounded source/drain region of the first transistor and another source/drain region of the first match transistor being coupled to the match line; and a second match transistor, a gate of the second match transistor being controlled by the second compare line, a source/drain region of the second match transistor being coupled to another ungrounded source/drain region of the second transistor and another source/drain region of the second match transistor being coupled to the match line.

In the above-described memory cell, the first and second pass transistors, the first and second storage transistors, the first and second match transistors, and the first and second transistors are all n-channel metal-oxide-semiconductor (NMOS) transistors.

In the above-described memory cell, further comprises a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first storage transistor and the first capacitor; and a forth pass transistor, having a gate controlled by the second word line, for connecting the forth bit line to the gate of the second storage transistor and the second capacitor. The storage data bit stored in the gate of the first storage transistor and the first capacitor is selectively updated in response to the second data bit, and the storage data bit stored in the gate of the second storage transistor and the second capacitor is selectively updated in response to the complement of the second data bit.

As embodied and broadly described herein, the invention provides a memory cell, comprising a first bit line, for transmitting a first data bit to the memory cell; a second bit line, for transmitting a complement of the first data bit to the memory cell; a first word line, for controlling data transmitting between the first and second bit lines and the memory cell; a first pass transistor, having a gate controlled by the first word line, for connecting the first bit line to the gate of the first storage transistor; a second pass transistor, having a gate controlled by the first word line, for connecting the second bit line to the gate of the second storage transistor; a first storage transistor, having a gate for dynamically storing a storage data bit of the memory cell in response to the first data bit; a second storage transistor, having a gate for dynamically storing a complement of the storage data bit of the memory cell in response to complement of the first data bit; a first compare line, for transmitting a compare data bit to the memory cell; a second compare bit line, for transmitting a complement of the compare data bit to the memory cell; a match line; and a match unit, coupled to the first and second bit lines, the first and second compare lines, the first storage transistor and the second storage transistor. During comparison operation of the memory cell, the compare data bit is conducted to the first and second compare lines, and if the complement of the comparing data bit from the first compare line is not logically equal to the storage data bit, or if the comparing data bit from the second compare line is not logically equal to the complement of the storage data bit, the match unit discharges current from the match line to indicate a mis-match signal.

In the above-described memory cell, the match unit comprising: a first transistor, being coupled to a gate of the first storage transistor and the first capacitor, a gate of the first transistor being controlled by the storage data bit stored in the first storage transistor, a source/drain region of the first transistor being coupled to ground; a second transistor, being coupled to a gate of the second storage transistor and the second capacitor, a gate of the second transistor being controlled by the complement of the storage data bit stored in the second storage transistor, a source/drain region of the second transistor being coupled to ground; a first match transistor, a gate of the first match transistor being controlled by the first compare line, a source/drain region of the first match transistor being coupled to another ungrounded source/drain region of the first transistor and another source/drain region of the first match transistor being coupled to the match line; and a second match transistor, a gate of the second match transistor being controlled by the second compare line, a source/drain region of the second match transistor being coupled to another ungrounded source/drain region of the second transistor and another source/drain region of the second match transistor being coupled to the match line.

In the above-described memory cell, the first and second pass transistors, the first and second storage transistors, the first and second match transistors, and the first and second transistors are all n-channel metal-oxide-semiconductor (NMOS) transistors.

In the above-described memory cell, further comprising a third bit line, for transmitting a second data bit to the memory cell; a forth bit line, for transmitting a complement of the second data bit to the memory cell, a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first storage transistor; and a forth pass transistor, having a gate controlled by the second word line, for connecting the forth bit line to the gate of the second storage transistor, the storage data bit stored in the gate of the first storage transistor and the first capacitor being selectively updated in response to the second data bit, the storage data bit stored in the gate of the second storage transistor and the second capacitor being selectively updated in response to the complement of the second data bit.

As embodied and broadly described herein, the invention provides a memory cell, comprising: a first bit line, for transmitting a first data bit to the memory cell; a second bit line, for transmitting a complement of the first data bit to the memory cell; a first word line, for controlling data transmitting between the first and second bit lines and the memory cell; a first pass transistor, having a gate controlled by the first word line, for connecting the first bit line to the first capacitor; a second pass transistor, having a gate controlled by the first word line, for connecting the second bit line to the second capacitor; a first capacitor, for dynamically storing a storage data bit of the memory cell in response to the first data bit; a second capacitor, for dynamically storing a complement of the storage data bit of the memory cell in response to complement of the first data bit; a first compare line, for transmitting a compare data bit to the memory cell; a second compare bit line, for transmitting a complement of the compare data bit to the memory cell; a match line; and a match unit, coupled to the first and second bit lines, the first and second compare lines, the first storage transistor and the second storage transistor. During comparison operation of the memory cell, the compare data bit being conducted to the first and second compare lines, and if the complement of the comparing data bit from the first compare line is not logically equal to the storage data bit, or if the comparing data bit from the second compare line is not logically equal to the complement of the storage data bit, the match unit discharging current from the match line to indicate a mis-match signal.

In the above-described memory cell, the match unit comprising: a first transistor, being coupled to the first capacitor, a gate of the first transistor being controlled by the storage data bit stored in the first capacitor, a source/drain region of the first transistor being coupled to ground; a second transistor, being coupled to the second capacitor, a gate of the second transistor being controlled by the complement of the storage data bit stored in the second capacitor, a source/drain region of the second transistor being coupled to ground; a first match transistor, a gate of the first match transistor being controlled by the first compare line, a source/drain region of the first match transistor being coupled to another ungrounded source/drain region of the first transistor and another source/drain region of the first match transistor being coupled to the match line; and a second match transistor, a gate of the second match transistor being controlled by the second compare line, a source/drain region of the second match transistor being coupled to another ungrounded source/drain region of the second transistor and another source/drain region of the second match transistor being coupled to the match line.

In the above-described memory cell, the first and second pass transistors, the first and second storage transistors, the first and second match transistors, and the first and second transistors are all n-channel metal-oxide-semiconductor (NMOS) transistors or p-channel metal-oxide-semiconductor (PMOS) transistors.

In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the first capacitor; and a forth pass transistor, having a gate controlled by the second word line, for connecting the forth bit line to the second capacitor, wherein the storage data bit stored in the gate of the first storage transistor and the first capacitor being selectively updated in response to the second data bit, the storage data bit stored in the gate of the second storage transistor and the second capacitor being selectively updated in response to the complement of the second data bit.

In the above-described memory cell, the first and second pass transistors, the third and forth pass transistors, the first and second storage transistors, the first and second match transistors, and the first and second transistors are all n-channel metal-oxide-semiconductor (NMOS) transistors, or p-channel metal-oxide-semiconductor (PMOS) transistors.

In the above-described memory cell, the first capacitor and the second capacitor are metal-insulator-metal (MIM) capacitors, polysilicon capacitors, ferroelectric random-access memory (FRAM), capacitors manufactured by a DRAM process, or magnetoresistive random access memory (MRAM) capacitors made of magnetic materials to store data.

As embodied and broadly described herein, the invention provides a memory cell, comprising: a first bit line, for transmitting a first data bit to the memory cell; a second bit line, for transmitting a complement of the first data bit to the memory cell; a first word line, for controlling data transmitting between the first and second bit lines and the memory cell; a first pass transistor, having a gate controlled by the first word line, for connecting the first bit line to the gate of the first transistor; a second pass transistor, having a gate controlled by the first word line, for connecting the second bit line to the gate of the second transistor; a first transistor, having a gate for dynamically storing a storage data bit of the memory cell in response to the first data bit and having a source/drain region coupling to ground; a second transistor, having a gate for dynamically storing a complement of the storage data bit of the memory cell in response to the complement of the first data bit and having a source/drain region coupling to ground; a first compare line, for transmitting a compare data bit to the memory cell; a second bit line, for transmitting a complement of the compare data bit to the memory cell; a match line; a first match transistor, having a gate coupled to the first compare line, a source/drain region being coupled to another ungrounded source/drain region of the first transistor, and another source/drain region being coupled to the match line; and a second match transistor, having a gate being coupled to the second compare line, a source/drain region being coupled to another ungrounded source/drain region of the second transistor, and another source/drain region being coupled to the match line, wherein during comparison operation of the memory cell, the compare data bit being conducted to the first and second compare lines, and if the complement of the comparing data bit from the first compare line is not logically equal to the storage data bit, or if the comparing data bit from the second compare line is not logically equal to the complement of the storage data bit, the match unit discharging current from the match line to indicate a mis-match signal.

In the above-described memory cell, the first and second pass transistors, the first and second storage transistors, the first and second match transistors, and the first and second transistors are all n-channel metal-oxide-semiconductor (NMOS) transistors or PMOS transistors In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first transistor; and a forth pass transistor, having a gate controlled by the second word line, for connecting the forth bit line to the gate of the second transistor, wherein the storage data bit stored in the gate of the first transistor being selectively updated in response to the second data bit, the storage data bit stored in the gate of the second transistor being selectively updated in response to the complement of the second data bit.

As embodied and broadly described herein, the invention provides a memory cell, comprising a memory cell, comprising: a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell; a first pass transistor, having a gate controlled by the first word line, for connecting the first bit line to the gate of the first storage transistor and the first capacitor, during the accessing operation mode; a second pass transistor, having a gate controlled by the first word line, for connecting the second bit line to the gate of the second storage transistor and the second capacitor, during the accessing operation mode; a first storage transistor and a first capacitor, a gate of the first storage transistor and the first capacitor for dynamically storing a storage data bit of the memory cell in respond to the first data bit during the accessing operation mode; a second storage transistor and a second capacitor, a gate of the second storage transistor and the second capacitor for dynamically storing a complement of the storage data bit of the memory cell in respond to the complement of first data bit during the accessing operation mode; a first transistor, being coupled to a gate the first storage transistor and the first capacitor, a gate of the first transistor being controlled by the storage data bit stored in the a gate the first storage transistor and the first capacitor, a source/drain region of the first transistor being coupled to the first bit line; a second transistor, being coupled to a gate of the second storage transistor and the second capacitor, a gate of the second transistor being controlled by the complement of the storage data bit stored in the gate of the second storage transistor and the second capacitor, a source/drain region of the second transistor being coupled to the second bit line; and a match transistor, having a gate coupled to an unconnected source/drain region of the first transistor and an unconnected source/drain region of the second transistor, wherein during the comparison operation mode of the memory cell, the first word line stopping data transmitting between the first and second bit lines and the memory cell, the first bit line receiving a comparing data bit and the second bit line receiving a complement of the comparing data bit, if the comparing data bit from the first bit line is logically equal to the storage data bit, or if the comparing data bit from the second bit line is logically equal to the complement of the storage data bit, the match transistor being turned on to indicate a match signal.

In the above-described memory cell, the first and second pass transistors, the first and second transistors, and the match transistor are all n-channel metal-oxide-semiconductor (NMOS) transistors.

In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first transistor and the first capacitor; and a forth pass transistor, having a gate controlled by the second word line, for connecting the forth bit line to the gate of the second transistor and the second capacitor, wherein the storage data bit stored in the gate of the first transistor and the first capacitor being selectively updated in response to the second data bit, the storage data bit stored in the gate of the second transistor and the second capacitor being selectively updated in response to the complement of the second data bit.

As embodied and broadly described herein, the invention provides a memory cell, comprising a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell; a first pass transistor, having a gate controlled by the first word line, for connecting the first bit line to the gate of the first storage transistor, during the accessing operation mode; a second pass transistor, having a gate controlled by the first word line, for connecting the second bit line to the gate of the second storage transistor, during the accessing operation mode; a first capacitor, for dynamically storing a storage data bit of the memory cell in respond to the first data bit during the accessing operation mode; a second capacitor, for dynamically storing a complement of the storage data bit of the memory cell in respond to the complement of first data bit during the accessing operation mode; a first transistor, being coupled to the first capacitor, a gate of the first transistor being controlled by the storage data bit stored in the first capacitor, a source/drain region of the first transistor being coupled to the first bit line; a second transistor, being coupled to the second capacitor, a gate of the second transistor being controlled by the complement of the storage data bit stored in the second capacitor, a source/drain region of the second transistor being coupled to the second bit line; and a match transistor, having a gate coupled to an unconnected source/drain region of the first transistor and an unconnected source/drain region of the second transistor, during the comparison operation mode of the memory cell, the first word line stopping data transmitting between the first and second bit lines and the memory cell, the first bit line receiving a comparing data bit and the second bit line receiving a complement of the comparing data bit, if the comparing data bit from the first bit line is logically equal to the storage data bit, or if the comparing data bit from the second bit line is logically equal to the complement of the storage data bit, the match transistor being turned on to indicate a match signal.

In the above-described memory cell, the first and second pass transistors, the match transistor, and the first and second transistors are all n-channel metal-oxide-semiconductor (NMOS) transistors, or p-channel metal-oxide-semiconductor (PMOS) transistors.

In the above-described memory cell, the first and second pass transistors, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first transistor and the first capacitor; and a forth pass transistor, having a gate controlled by the second word line, for connecting the forth bit line to the gate of the second transistor and the second capacitor, wherein the storage data bit stored in the gate of the first transistor and the first capacitor being selectively updated in response to the second data bit, the storage data bit stored in the gate of the second transistor and the second capacitor being selectively updated in response to the complement of the second data bit.

In the above-described memory cell, the first and second pass transistors, the first and second pass transistors, the third and forth pass transistors, the match transistor, and the first and second transistors are all n-channel metal-oxide-semiconductor (NMOS) transistors, or all p-channel metal-oxide-semiconductor (PMOS) transistors The first capacitor and the second capacitor are metal-insulator-metal (MIM) capacitors, polysilicon capacitors, ferroelectric capacitors suitable usage for ferroelectric random-access memory (FRAM), capacitors manufactured by a DRAM process, or magnetoresistive random access memory (MRAM) capacitors made of magnetic materials to store data.

As embodied and broadly described herein, the invention provides a memory cell, comprising a memory cell a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell; a first pass transistor, having a gate controlled by the first word line, for connecting the first bit line to the gate of the first storage transistor and the first capacitor, during the accessing operation mode; a second pass transistor, having a gate controlled by the first word line, for connecting the second bit line to the gate of the second storage transistor and the second capacitor, during the accessing operation mode; a first storage transistor, having a gate for dynamically storing a storage data bit of the memory cell in respond to the first data bit during the accessing operation mode; a second storage transistor, having a gate for dynamically storing a complement of the storage data bit of the memory cell in respond to the complement of first data bit during the accessing operation mode; a first transistor, being coupled to a gate the first storage transistor, a gate of the first transistor being controlled by the storage data bit stored in the a gate the first storage transistor, a source/drain region of the first transistor being coupled to the first bit line; a second transistor, being coupled to a gate of the second storage transistor, a gate of the second transistor being controlled by the complement of the storage data bit stored in the gate of the second storage transistor, a source/drain region of the second transistor being coupled to the second bit line; and a match transistor, having a gate coupled to an unconnected source/drain region of the first transistor and an unconnected source/drain region of the second transistor, during the comparison operation mode of the memory cell, the first word line stopping data transmitting between the first and second bit lines and the memory cell, the first bit line receiving a comparing data bit and the second bit line receiving a complement of the comparing data bit, if the comparing data bit from the first bit line is logically equal to the storage data bit, or if the comparing data bit from the second bit line is logically equal to the complement of the storage data bit, the match transistor being turned on to indicate a match signal.

In the above-described memory cell, the first and second pass transistors, the first and second storage transistors, the first and second transistors, and the match transistor are all n-channel metal-oxide-semiconductor (NMOS) transistors.

In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first storage transistor; and a forth pass transistor, having a gate controlled by the second word line, for connecting the forth bit line to the gate of the second storage transistor, wherein the storage data bit stored in the gate of the first storage transistor being selectively updated in response to the second data bit, the storage data bit stored in the gate of the second storage transistor being selectively updated in response to the complement of the second data bit.

In the above-described memory cell, the first and second pass transistors, the third and forth pass transistors, the first and second storage transistors, the first and second match transistors, and the first and second transistors are all n-channel metal-oxide-semiconductor (NMOS) transistors.

As embodied and broadly described herein, the invention provides a memory cell, comprising a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell; a first transistor, having a gate for dynamically storing a storage data bit of the memory cell in respond to the first data bit during the accessing operation mode, a source/drain region of the first transistor being coupled to the first bit line; a second transistor, having a gate for dynamically storing a complement of the storage data bit of the memory cell in respond to the complement of first data bit during the accessing operation mode, a source/drain region of the second transistor being coupled to the second bit line; a first pass transistor, having a gate controlled by the first word line, for connecting the first bit line to the gate of the first transistor, during the accessing operation mode; a second pass transistor, having a gate controlled by the first word line, for connecting the second bit line to the gate of the second transistor, during the accessing operation mode; a match transistor, having a gate coupled to an unconnected source/drain region of the first transistor and an unconnected source/drain region of the second transistor, during the comparison operation mode of the memory cell, the first word line stopping data transmitting between the first and second bit lines and the memory cell, the first bit line receiving a comparing data bit and the second bit line receiving a complement of the comparing data bit, if the comparing data bit from the first bit line is logically equal to the storage data bit, or if the comparing data bit from the second bit line is logically equal to the complement of the storage data bit, the match transistor being turned on to indicate a match signal.

In the above-described memory cell, the first and second pass transistors, the first and second transistors, and the match transistor are all n-channel metal-oxide-semiconductor (NMOS) transistors, or all p-channel metal-oxide-semiconductor (PMOS) transistors.

In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first transistor; and a forth pass transistor, having a gate controlled by the second word line, for connecting the forth bit line to the gate of the second transistor, wherein the storage data bit stored in the gate of the first transistor being selectively updated in response to the second data bit, the storage data bit stored in the gate of the second transistor being selectively updated in response to the complement of the second data bit.

In the above-described memory cell, the first and second pass transistors, the third and forth pass transistors, the match transistor, and the first and second transistors are all n-channel metal-oxide-semiconductor (NMOS) transistors, or all p-channel metal-oxide-semiconductor (PMOS) transistors.

As embodied and broadly described herein, the invention provides a memory cell, comprising a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell; a first pass transistor, having a gate controlled by the first word line, for connecting the first bit line to the gate of the first storage transistor and the first capacitor, during the accessing operation mode; a second pass transistor, having a gate controlled by the first word line, for connecting the second bit line to the gate of the second storage transistor and the second capacitor, during the accessing operation mode; a first storage transistor and a first capacitor, a gate of the first storage transistor and the first capacitor for dynamically storing a storage data bit of the memory cell in respond to the first data bit during the accessing operation mode; a second storage transistor and a second capacitor, a gate of the second storage transistor and the second capacitor for dynamically storing a complement of the storage data bit of the memory cell in respond to the complement of first data bit during the accessing operation mode; a first compare line, for transmitting a compare data bit to the memory cell; a second compare bit line, for transmitting a complement of the compare data bit to the memory cell; a first transistor, being coupled to a gate the first storage transistor and the first capacitor, a gate of the first transistor being controlled by the storage data bit stored in the a gate the first storage transistor and the first capacitor, a source/drain region of the first transistor being coupled to the first compare line; a second transistor, being coupled to a gate of the second storage transistor and the second capacitor, a gate of the second transistor being controlled by the complement of the storage data bit stored in the gate of the second storage transistor and the second capacitor, a source/drain region of the second transistor being coupled to the second compare line; and a match transistor, having a gate coupled to an unconnected source/drain region of the first transistor and an unconnected source/drain region of the second transistor, during the comparison operation mode of the memory cell, the first compare line receiving a comparing data bit and the second compare line receiving a complement of the comparing data bit, if the comparing data bit from the first compare line is logically equal to the storage data bit, or if the comparing data bit from the second compare line is logically equal to the complement of the storage data bit, the match transistor being turned on to indicate a match signal.

In the above-described memory cell, the first and second pass transistors, the first and second storage transistors, the first and second transistors, and the match transistor are all n-channel metal-oxide-semiconductor (NMOS) transistors.

In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first storage transistor and the first capacitor; and a forth pass transistor, having a gate controlled by the second word line, for connecting the forth bit line to the gate of the second storage transistor and the second capacitor, wherein the storage data bit stored in the gate of the first transistor and the first capacitor being selectively updated in response to the second data bit, the storage data bit stored in the gate of the second transistor and the second capacitor being selectively updated in response to the complement of the second data bit.

In the above-described memory cell, the first and second pass transistors, the third and forth pass transistors, the first and second storage transistors, the match transistor, and the first and second transistors are all n-channel metal-oxide-semiconductor (NMOS) transistors.

As embodied and broadly described herein, the invention provides a memory cell, comprising a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell;

a first pass transistor, having a gate controlled by the first word line, for connecting the first bit line to the gate of the first storage transistor and the first capacitor, during the accessing operation mode; a second pass transistor, having a gate controlled by the first word line, for connecting the second bit line to the gate of the second storage transistor and the second capacitor, during the accessing operation mode; a first storage transistor, having a gate for dynamically storing a storage data bit of the memory cell in respond to the first data bit during the accessing operation mode; a second storage transistor, having a gate for dynamically storing a complement of the storage data bit of the memory cell in respond to the complement of first data bit during the accessing operation mode; a first compare line, for transmitting a compare data bit to the memory cell; a second compare bit line, for transmitting a complement of the compare data bit to the memory cell; a first transistor, being coupled to a gate the first storage transistor, a gate of the first transistor being controlled by the storage data bit stored in the a gate the first storage transistor, a source/drain region of the first transistor being coupled to the first compare line; a second transistor, being coupled to a gate of the second storage transistor, a gate of the second transistor being controlled by the complement of the storage data bit stored in the gate of the second storage transistor, a source/drain region of the second transistor being coupled to the second compare line; and a match transistor, having a gate coupled to an unconnected source/drain region of the first transistor and an unconnected source/drain region of the second transistor, during the comparison operation mode of the memory cell, the first compare line receiving a comparing data bit and the second compare line receiving a complement of the comparing data bit, if the comparing data bit from the first compare line is logically equal to the storage data bit, or if the comparing data bit from the second compare line is logically equal to the complement of the storage data bit, the match transistor being turned on to indicate a match signal.

In the above-described memory cell, the first and second pass transistors, the first and second storage transistors, the first and second transistors, and the match transistor are all n-channel metal-oxide-semiconductor (NMOS) transistors.

In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first transistor; and a forth pass transistor, having a gate controlled by the second word line, for connecting the forth bit line to the gate of the second transistor and the second capacitor, wherein the storage data bit stored in the gate of the first storage transistor being selectively updated in response to the second data bit, the storage data bit stored in the gate of the second storage transistor being selectively updated in response to the complement of the second data bit.

In the above-described memory cell, the first and second pass transistors, the third and forth pass transistors, the first and second storage transistors, the match transistor, and the first and second transistors are all n-channel metal-oxide-semiconductor (NMOS) transistors.

As embodied and broadly described herein, the invention provides a memory cell, comprising a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell; a first pass transistor, having a gate controlled by the first word line, for connecting the first bit line to the gate of the first storage transistor and the first capacitor, during the accessing operation mode; a second pass transistor, having a gate controlled by the first word line, for connecting the second bit line to the gate of the second storage transistor and the second capacitor, during the accessing operation mode; a first capacitor, for dynamically storing a storage data bit of the memory cell in respond to the first data bit during the accessing operation mode; a second capacitor, for dynamically storing a complement of the storage data bit of the memory cell in respond to the complement of first data bit during the accessing operation mode; a first compare line, for transmitting a compare data bit to the memory cell; a second compare bit line, for transmitting a complement of the compare data bit to the memory cell; a first transistor, being coupled to the first capacitor, a gate of the first transistor being controlled by the storage data bit stored in the first capacitor, a source/drain region of the first transistor being coupled to the first compare line; a second transistor, being coupled to the second capacitor, a gate of the second transistor being controlled by the complement of the storage data bit stored in the gate of the second capacitor, a source/drain region of the second transistor being coupled to the second compare line; and a match transistor, having a gate coupled to an unconnected source/drain region of the first transistor and an unconnected source/drain region of the second transistor, during the comparison operation mode of the memory cell, the first compare line receiving a comparing data bit and the second compare line receiving a complement of the comparing data bit, if the comparing data bit from the first compare line is logically equal to the storage data bit, or if the comparing data bit from the second compare line is logically equal to the complement of the storage data bit, the match transistor being turned on to indicate a match signal.

In the above-described memory cell, the first and second pass transistors, the first and second transistors, and the match transistor are all n-channel metal-oxide-semiconductor (NMOS) transistors, or all p-channel metal-oxide-semiconductor (PMOS) transistors.

In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the first capacitor; and a forth pass transistor, having a gate controlled by the second word line, for connecting the forth bit line to the second capacitor, wherein the storage data bit stored in the first capacitor being selectively updated in response to the second data bit, the storage data bit stored in the second capacitor being selectively updated in response to the complement of the second data bit.

In the above-described memory cell, the first and second pass transistors, the third and forth pass transistors, the match transistor, and the first and second transistors are all n-channel metal-oxide-semiconductor (NMOS) transistors, or p-channel metal-oxide-semiconductor (PMOS) transistors.

In the above-described memory cell, the first capacitor and the second capacitor are metal-insulator-metal (MIM) capacitors, polysilicon capacitors, ferroelectric capacitors suitable usage for ferroelectric random-access memory (FRAM), capacitors manufactured by a DRAM process, or magnetoresistive random access memory (MRAM) capacitors made of magnetic materials to store data.

As embodied and broadly described herein, the invention provides a memory cell, comprising a first bit line, for transmitting a first data bit to the memory cell; a second bit line, for transmitting a complement of the first data bit to the memory cell; a first word line, for selectively controlling data transmitting between the first and second bit lines and the memory cell in accordance with an accessing operation mode and a comparison operation mode of the memory cell; a first pass transistor, having a gate controlled by the first word line, for connecting the first bit line to the gate of the first storage transistor and the first capacitor, during the accessing operation mode; a second pass transistor, having a gate controlled by the first word line, for connecting the second bit line to the gate of the second storage transistor and the second capacitor, during the accessing operation mode; a first compare line, for transmitting a compare data bit to the memory cell; a second compare bit line, for transmitting a complement of the compare data bit to the memory cell; a first transistor, having a gate for dynamically storing a storage data bit of the memory cell in respond to the first data bit during the accessing operation mode, a source/drain region of the first transistor being coupled to the first compare line; a second transistor, having a gate for dynamically storing a complement of the storage data bit of the memory cell in respond to the complement of first data bit during the accessing operation mode, a source/drain region of the second transistor being coupled to the first compare line; and a match transistor, having a gate coupled to an unconnected source/drain region of the first transistor and an unconnected source/drain region of the second transistor, during the comparison operation mode of the memory cell, the first compare line receiving a comparing data bit and the second compare line receiving a complement of the comparing data bit, if the comparing data bit from the first compare line is logically equal to the storage data bit, or if the comparing data bit from the second compare line is logically equal to the complement of the storage data bit, the match transistor being turned on to indicate a match signal.

In the above-described memory cell, the first and second pass transistors, the first and second transistors, and the match transistor are all n-channel metal-oxide-semiconductor (NMOS) transistors, or all p-channel metal-oxide-semiconductor (PMOS) transistors.

In the above-described memory cell, further comprising a third bit line, for transmitting a second data bit to the memory cell; a forth bit line, for transmitting a complement of the second data bit to the memory cell; a second word line, for selectively controlling data transmitting between the third and forth bit lines and the memory cell in accordance with the accessing operation mode and the comparison operation mode of the memory cell; a third pass transistor, having a gate controlled by the second word line, for connecting the third bit line to the gate of the first transistor; and a forth pass transistor, having a gate controlled by the second word line, for connecting the forth bit line to the gate of the second transistor, wherein the storage data bit stored in the gate of the first transistor being selectively updated in response to the second data bit, the storage data bit stored in the gate of the second transistor being selectively updated in response to the complement of the second data bit.

As embodied and broadly described herein, the invention provides a simple peripheral circuit with CAM cells describe above for one word comparison operation. In such arrangement, the number of CAM cells is dependent on the bit number of the one-word comparison; for example, n bits being compared simultaneously and a match signal being signaled after comparison. The CAM cells can be one of all types of the CAM cells described in the first, second and third preferred embodiments. The match sense line (MSL) is pre-charged high before a compare operation. When the comparing data matches the stored data in the CAM cells, match sense line MSL remains high. When the comparing data matches the stored data in the CAM cells, match sense line MSL remains high. When the comparing data does not match the stored data in the CAM cells, match sense line MSL is pulled low. In such architecture, a n-bit word comparison operation can be easily implemented.

As embodied and broadly described herein, the invention provides a simple peripheral circuit with CAM cells describe above for multiple-word comparison operation. In such arrangement, the number of CAM cells is dependent on the bit number of the word for such comparison; for example, n bits of one word being compared simultaneously and a match signal being signaled after comparison. For multiple words, for example, m words, m rows for n-bit comparison will be arranged for such m-word comparison. The CAM cells can be one of all types of the CAM cells described in the first, second and third preferred embodiments. The match sense line (MSL) is pre-charged high before a compare operation. When the comparing data matches the stored data in the CAM cells, match sense line MSL remains high. When the comparing data matches the stored data in the CAM cells, match sense line MSL remains high. When the comparing data does not match the stored data in the CAM cells, match sense line MSL is pulled low. By using a encoder device, such as encoder ROM, a result signal can be easily signaled for simultaneously comparing m words. The numbers of m and n are determined in accordance with the design requirements.

As embodied and broadly described herein, the invention provides a simple peripheral circuit with CAM cells describe above for one word comparison operation. In such arrangement, the number of CAM cells is dependent on the bit number of the one-word comparison; for example, n bits being compared simultaneously and a match signal being signaled after comparison. The CAM cells can be one of all types of the CAM cells described in the fifth-preferred embodiment. The match transistors MT1, MT2, MT3 . . . MTn are specifically turned on if the comparing data matches the stored data in the CAM cells. If all of the n match transistors are turned on, the current path will be established through the evaluation transistor to the precharge transistor. The one-word comparison operation can be easily implemented. For reducing power consumption during comparison operation because too many transistors are turned on simultaneously, another row of n match transistors can be used in the implementation for other n-bit comparison. By simply using a logic AND gate, the Match signal is generated from results of two or more n-bit comparison operations, which are used for the one-word comparison operation with more and more bits.

As embodied and broadly described herein, the invention provides a simple peripheral circuit with CAM cells describe above for multiple-word comparison operation. In such arrangement, the number of CAM cells is dependent on the bit number of the word for such comparison; for example, n bits of one word being compared simultaneously and a Match signal being signaled after comparison. For other example, several n-bit comparison operations can also be performed simultaneously and a Match signal being signaled by using a AND gate.

For multiple words, for example, m words, m rows for n-bit comparisons will be arranged for such m-word comparison. The CAM cells can be one of all types of the CAM cells described in the fifth-preferred embodiments. Match signals such as $Match_i$, $Match_j$ and $Match_k$ are generated after several n-bit comparison operations. By using a encoder device, such as encoder ROM, a result signal can be easily signaled for simultaneously comparing m words. The numbers of m and n are determined in accordance with the design requirements.

In the above-described memory cell, the first and second pass transistors, the third and forth pass transistors, the match transistor, and the first and second transistors are all n-channel metal-oxide-semiconductor (NMOS) transistors, or all p-channel metal-oxide-semiconductor (PMOS) transistors

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF PREFERRED EMBODIMENTS

The present invention relates to an improvement in memory cells. The following description is presented to enable one of ordinary skill in the art to make and use the invention as provided in the context of a particular application and its requirements. Various modifications to the preferred embodiments will be apparent to those with skill in the art, and the general principles defined herein may be applied to other embodiments.

It is noted that that differential access is faster than single-ended access. Thus providing a pair of bit lines rather than just one bit line provides significant speed advantages. Differential storage is more robust and less sensitive to noise and leakage, perhaps allowing for less frequent refreshing.

Although standard dynamic RAM (Random Access Memory) cells use single-ended rather than differential storage, differential sensing can be used with dynamic storage. The size advantage of dynamic storage can then be combined with the speed and stability advantages of differential sensing. In the invention, different RAM cells are provided for implementation of the invention, for example, RAM cells applied to all CMOS technologies, such as DRAM, FRAM (Ferroelectric random-access memory), SiGe and GaAs.

Figure 3:
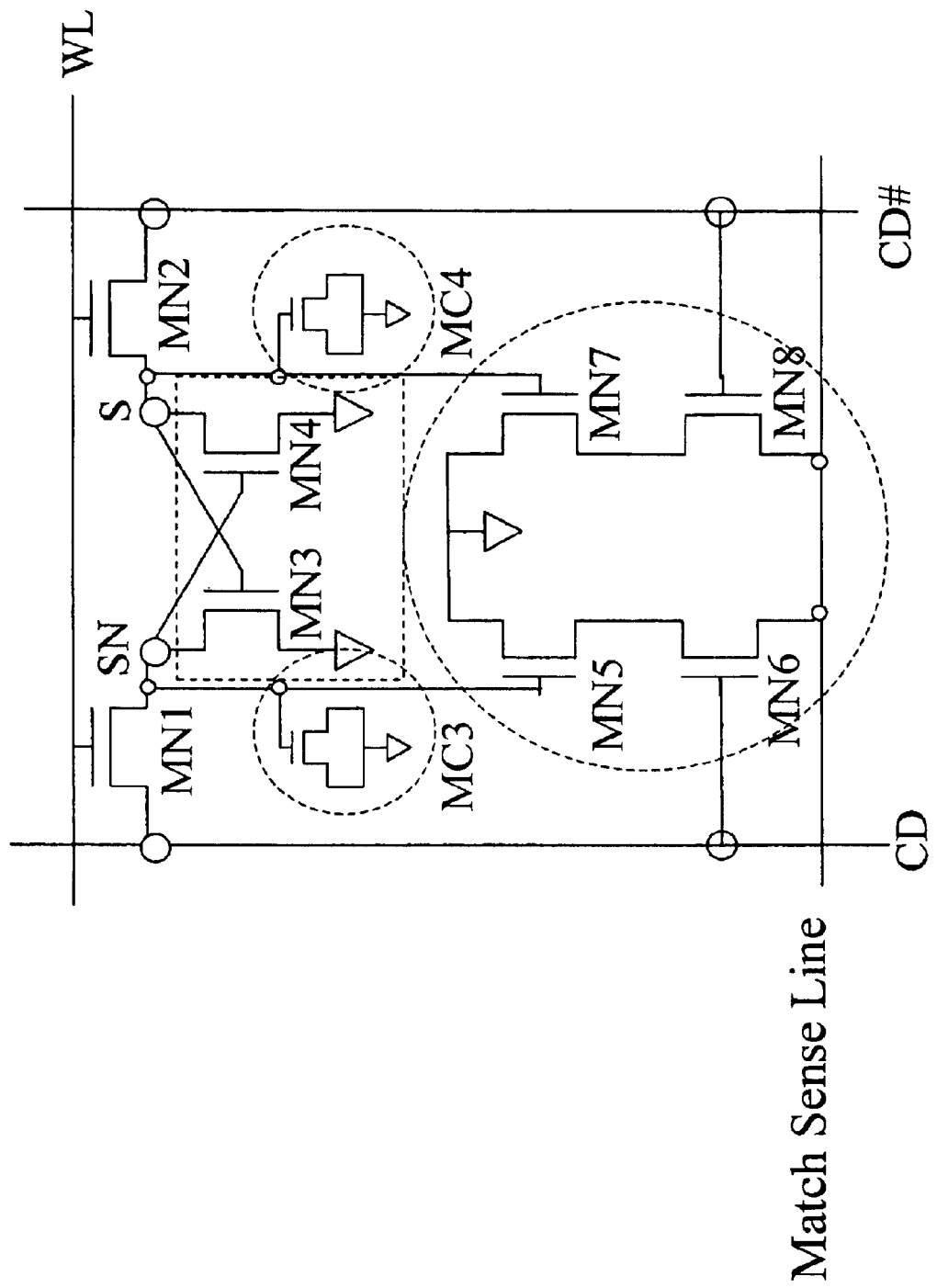
FIG. 3 is a diagram of a single-port dynamic differential CAM of a first preferred embodiment of the invention.

NAND CAM Cells for Preferred Embodiments
First Embodiment—Single-Port CAM Cell
Type 1—Basic Single-Port CAM Cell Refer to FIG. 3, which is a diagram of a single-port dynamic differential CAM of a first preferred embodiment of the invention. This CAM cell stored one bit of data, but the data is stored differentially as true and complement data.

A pair of bit lines CD, CD# carry true and complement data to a column of cells. Two pass transistors MN1 and MN2 are turned on when word line WL is driven with a high voltage during a write operation. The pass transistor MN1 connects bit line CD to the gate of storage transistor MN4 and capacitor MC3. Pass transistors MN2 connects bit line CD# to the gate of storage transistors MN3 and capacitor MC4. One gate is charged high while the other gate is charged low. The capacitors MC3 and MC4 can be, for example, MOS capacitors to meet the requirements of manufacturing process.

During read/write operation, word line WL is driven high for turning on the pass transistors MN1 and MN2. For storing data 1, bit line CD is high, storing a high voltage on the gate of storage transistor MN4. Bit line CD# is low, driving a low voltage on the gate of storage transistor MN3. When word line WL is driven low, the gate of the storage transistor MN4 and the accompanying capacitor MC3 store a positive charge while the gate of the storage transistor MN3 and the accompanying capacitor MC4 store little or no charge. The opposite occurs when a data 0 is written to the cell. That is, the storage transistor MN4 and the accompanying capacitor MC3 store a positive charge while storage transistor MN3 stores little or no charge.

Match sense line (MSL) is held low during read and write operations. The sources of storage transistors MN3 and MN4 are connected to ground. A virtual or switched ground such as a MASK line can be substituted. MSL is pre-charged high before a compare operation.

The cell can be read by equalizing and pre-charging both bit lines CD and CD# to an intermediate voltage before word line WL is raised. One bit line is then driven low and the other is driven high by charge sharing as pass transistors MN1 and MN2 are turned on. A sensitive sense amplifier can then detect a slight voltage difference on bit lines CD and CD#. The cell can be refreshed by writing the sensed data back to the bit lines.

During a match or compare operation, word line WL is low and pass transistors MN1 and MN2 remain off. Thus the stored charges on the gates of storage transistors MN3 and MN4 as well as the accompanying capacitors MC3 and MC4 are isolated and not disturbed.

The comparing data from bit lines CD and CD# are applied to the gates of match transistors MN6 and MN8 respectively. The complements of the comparing data are applied to these bit lines during the compare operation. Thus bit line CD carries the complement of the comparing data. Complement bit line CD# carries the true comparing data.

When the comparing data matches the stored data in the CAM cell, match sense line MSL remains high. For example, when the cell stores a 1, storage transistor MN4 is on but storage transistor MN3 is off. The charges stored on the gate of storage transistor MN4 and the capacitor MC3 turns on the transistor MN5. The transistor MN6 remains off because gate of storage transistor MN3 and the capacitor MC4 stores little or no charge. The true comparing data is applied to bit line CD# while the complement comparing data is applied to bit line CD. Since the comparing data is also a 1, CD is low while CD# is high. Thus transistor MN6 is off, blocking current flow through the transistor MN5. The transistor MN7 is off, also blocking current flow through the transistor MN8, which is turned on by the high voltage applied to CD#. Thus no discharge path to ground occurs, since transistors MN6 and MN7 are off.

When the cell stores a 0, storage transistor MN3 is on but storage transistor MN4 is off. The charges stored on the gate of storage transistor MN3 and the capacitor MC4 turns on the transistor MN7. The transistor MN5 remains off because gate of storage transistor MN4 and the capacitor MC3 stores little or no charge. The true comparing data is applied to bit line CD# while the complement comparing data is applied to bit line CD. Since the comparing data is also a 0, CD# is low while CD is high. Thus transistor MN5 is off, blocking current flow through the transistor MN6, which is turned on by the high voltage applied to CD. The transistor MN8 is off, also blocking current flow through the transistor MN7, which is turned on by the charges stored on the gate of storage transistor MN3 and the capacitor MC4. Thus no discharge path to ground occurs, since transistors MN5 and MN8 are off.

When the comparing data does not match the stored data in the CAM cell, match sense line MSL is pulled low. For example, when the stored data is "1," the stored data or stored charge on the gate of storage transistor MN4 and the capacitor MC3 turns on the transistor MN5. When the comparing data is "0", the complement comparing data applied to the bit line CD is high, which turns the transistor MN6 on, and a low signal is applied to bit line CD#. Both transistors MN5 and MN6 are turned on, causing the match sense line MSL to be discharged to ground. Thus a mismatch is signaled.

The match sense line MSL is also pulled low when the stored data is low but the comparing data is high. When the stored data is "0," the stored data or stored charge on the gate of storage transistor MN3 and the capacitor MC4 turns on the transistor MN7. When the comparing data is "1", the complement comparing data applied to the bit line CD# is high, which turns the transistor MN8 on, and a low signal is applied to bit One CD. Both transistors MN7 and MN8 are turned on, causing the match sense line MSL to be discharged to ground. Thus a mismatch is signaled.

The CAM cell requires only NMOS transistors, which does not have to expand for well-to-well spacing as only a P-well or p-substrate is present within the cell.

Type 2—Single-Port CAM Cell Variation I

Figure 4:
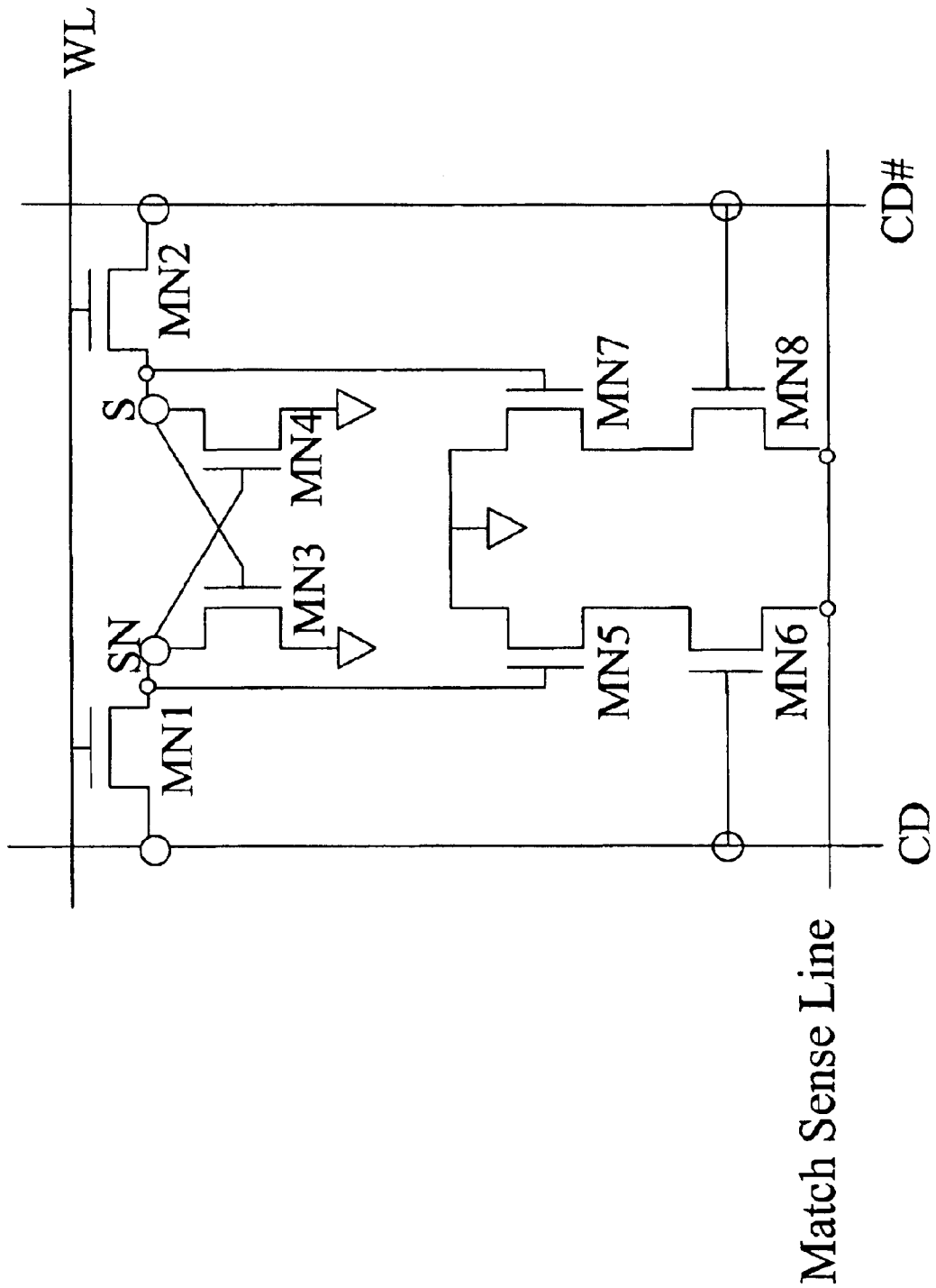
FIG. 4 is a diagram of a first variation of the single-port dynamic differential CAM as shown in FIG. 3 of the first preferred embodiment of the invention.

Refer to FIG. 4, which is a diagram of a first variation of the single-port dynamic differential CAM as shown in the first preferred embodiment of the invention. This CAM cell stored one bit of data, but the data is stored differentially as true and complement data. The important variation of the embodiment is that two capacitors MC3 and MC4, such as MOS capacitors, which are shown in FIG. 3 are eliminated.

A pair of bit lines CD, CD# carry true and complement data to a column of cells. Two pass transistors MN1 and MN2 are turned on when word line WL is driven with a high voltage during a write operation. The pass transistor MN1 connects bit line CD to the gate of storage transistor MN4. Pass transistors MN2 connects bit line CD# to the gate of storage transistors MN3. One gate is charged high while the other gate is charged low.

During read/write operation, word line WL is driven high for turning on the pass transistors MN1 and MN2. For storing data 1, bit line CD is high, storing a high voltage on the gate of storage transistor MN4. Bit line CD# is low, driving a low voltage on the gate of storage transistor MN3. When word line WL is driven low, the gate of the storage transistor MN4 stores a positive charge while the gate of the storage transistor MN3 stores little or no charge. The opposite occurs when a data 0 is written to the cell. That is, the storage transistor MN4 and the accompanying capacitor MC3 store a positive charge while storage transistor MN3 stores little or no charge.

Match sense line (MSL) is held low during read and write operations. The sources of storage transistors MN3 and MN4 are connected to ground. A virtual or switched ground such as a MASK line can be substituted. MSL is pre-charged high before a compare operation.

The cell can be read by equalizing and pre-charging both bit lines CD and CD# to an intermediate voltage before word line WL is raised. One bit line is then driven low and the other is driven high by charge sharing as pass transistors MN1 and MN2 are turned on. A sensitive sense amplifier can then detect a slight voltage difference on bit lines CD and CD#. The cell can be refreshed by writing the sensed data back to the bit lines.

During a match or compare operation, word line WL is low and pass transistors MN1 and MN2 remain off. Thus the stored charges on the gates of storage transistors MN3 and MN4 are isolated and not disturbed.

The comparing data from bit lines CD and CD# are applied to the gates of match transistors MN6 and MN8 respectively. The complements of the comparing data are applied to these bit lines during the compare operation. Thus bit line CD carries the complement of the comparing data. Complement bit line CD# carries the true comparing data.

When the comparing data matches the stored data in the CAM cell, match sense line MSL remains high. For example, when the cell stores a 1, storage transistor MN4 is on but storage transistor MN3 is off. The charges stored on the gate of storage transistor MN4 turns on the transistor MN5. The transistor MN7 remains off because gate of storage transistor MN3 stores little or no charge. The true comparing data is applied to bit line CD# while the complement comparing data is applied to bit line CD. Since the comparing data is also a 1, CD is low while CD# is high. Thus transistor MN6 is off, blocking current flow through the transistor MN5. The transistor MN7 is off, also blocking current flow through the transistor MN8, which is turned on by the high voltage applied to CD#. Thus no discharge path to ground occurs, since transistors MN6 and MN7 are off.

When the cell stores a 0, storage transistor MN3 is on but storage transistor MN4 is off. The charges stored on the gate of storage transistor MN3 turns on the transistor MN7. The transistor MN5 remains off because gate of storage transistor MN4 stores little or no charge. The true comparing data is applied to bit line CD# while the complement comparing data is applied to bit line CD. Since the comparing data is also a 0, CD# is low while CD is high. Thus transistor MN5 is off, blocking current flow through the transistor MN6, which is turned on by the high voltage applied to CD. The transistor MN8 is off, also blocking current flow through the transistor MN7, which is turned on by the charges stored on the gate of storage transistor MN3. Thus no discharge path to ground occurs, since transistors MN5 and MN8 are off.

When the comparing data does not match the stored data in the CAM cell, match sense line MSL is pulled low. For example, when the stored data is "1," the stored data or stored charge on the gate of storage transistor MN4 turns on the transistor MN5. When the comparing data is "0", the complement comparing data applied to the bit line CD is high, which turns the transistor MN6 on, and a low signal is applied to bit line CD#. Both transistors MN5 and MN6 are turned on, causing the match sense line MSL to be discharged to ground. Thus a mismatch is signaled.

The match sense line MSL is also pulled low when the stored data is low but the comparing data is high. When the stored data is "0," the stored data or stored charge on the gate of storage transistor MN3 turns on the transistor MN7. When the comparing data is "1", the complement comparing data applied to the bit line CD# is high, which turns the transistor MN8 on, and a low signal is applied to bit line CD. Both transistors MN7 and MN8 are turned on, causing the match sense line MSL to be discharged to ground. Thus a mismatch is signaled.

The CAM cell requires only NMOS transistors, which does not have to expand for well-to-well spacing as only a P-well or p-substrate is present within the cell.

Type 3—Single-Port CAM Cell Variation II

Figure 5:
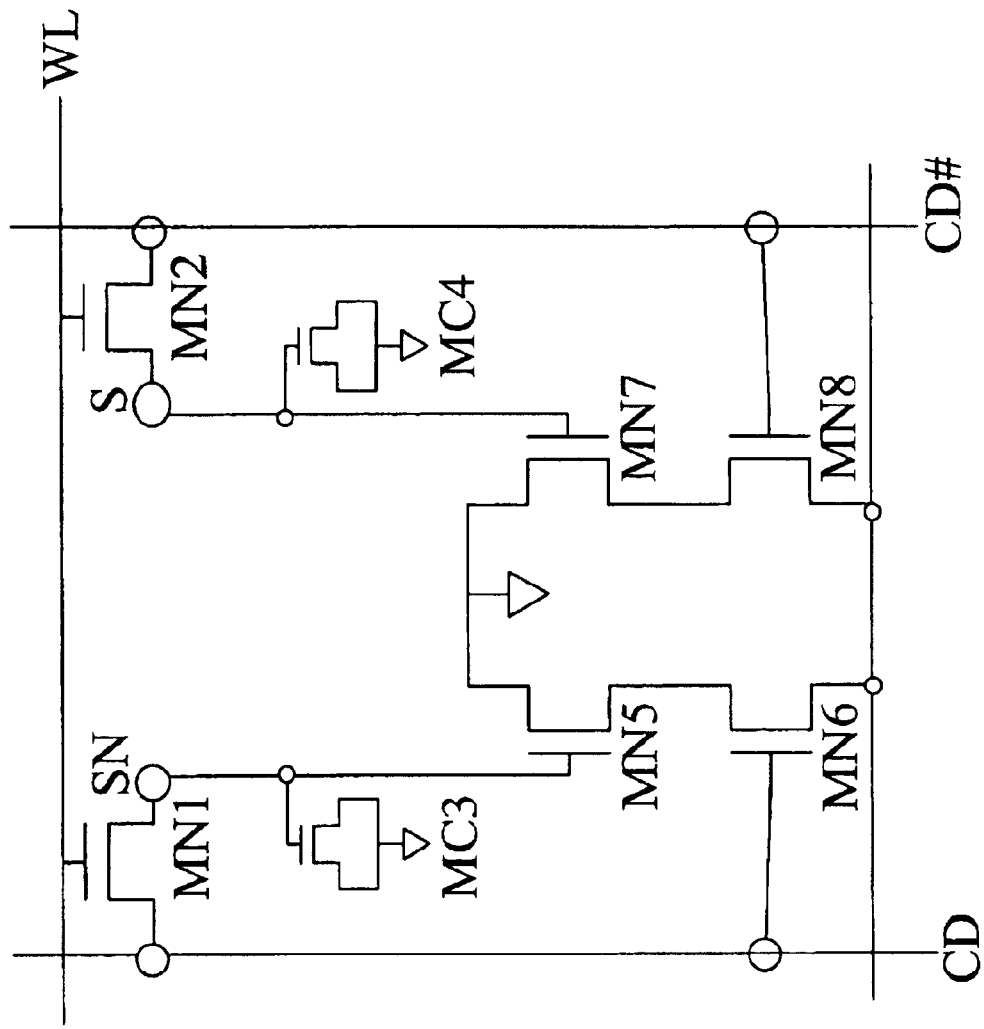
FIG. 5 is a diagram of a second variation of the single-port dynamic differential CAM as shown in FIG. 3 of the first preferred embodiment of the invention.

Refer to FIG. 5, which is a diagram of a second variation of the single-port dynamic differential CAM as shown in the first preferred embodiment of the invention. This CAM cell stored one bit of data, but the data is stored differentially as true and complement data. The important variation of the embodiment is that two transistors MN3 and MN4 shown in FIG. 3 are eliminated.

A pair of bit lines CD, CD# carry true and complement data to a column of cells. Two pass transistors MN1 and MN2 are turned on when word line WL is driven with a high voltage during a write operation. The pass transistor MN1 connects bit line CD to the capacitor MC3. Pass transistors MN2 connects bit line CD# to the capacitor MC4. One gate is charged high while the other gate is charged low. The capacitors MC3 and MC4 can be, for example, MOS capacitors to meet the requirements of manufacturing process.

During read/write operation, word line WL is driven high for turning on the pass transistors MN1 and MN2. For storing data 1, bit line CD is high, storing charges in the capacitor MC3. Bit line CD# is low, driving a low voltage to the capacitor MC4 and storing little or no charges on the capacitor MC4. When word line WL is driven low, the accompanying capacitor MC3 stores many charges while the capacitor MC4 stores little or no charges. The opposite occurs when a data 0 is written to the cell. That is, the capacitor MC3 store a positive charge while the capacitor MC4 stores little or no charge.

Match sense line (MSL) is held low during read and write operations. MSL is pre-charged high before a compare operation.

The cell can be read by equalizing and pre-charging both bit lines CD and CD# to an intermediate voltage before word line WL is raised. One bit line is then driven low and the other is driven high by charges sharing as pass transistors MN1 and MN2 are turned on. A sensitive sense amplifier can then detect a slight voltage difference on bit lines CD and CD#. The cell can be refreshed by writing the sensed data back to the bit lines.

During a match or compare operation, word line WL is low and pass transistors MN1 and MN2 remain off. Thus the stored charges on the capacitors MC3 and MC4 are isolated and not disturbed.

The comparing data from bit lines CD and CD# are applied to the gates of match transistors MN6 and MN8 respectively. The complements of the comparing data are applied to these bit lines during the compare operation. Thus bit line CD carries the complement of the comparing data. Complement bit line CD# carries the true comparing data.

When the comparing data matches the stored data in the CAM cell, match sense line MSL remains high. For example, when the cell stores a 1, the charges stored on the capacitor MC3 turns on the transistor MN5. The transistor MN7 remains off because the capacitor MC4 stores little or no charges. The true comparing data is applied to bit line CD# while the complement comparing data is applied to bit line CD. Since the comparing data is also a 1, CD is low while CD# is high. Thus transistor MN6 is off, blocking current flow through the transistor MN5. The transistor MN7 is off, also blocking current flow through the transistor MN8, which is turned on by the high voltage applied to CD#. Thus no discharge path to ground occurs, since transistors MN6 and MN7 are off.

When the cell stores a 0, the charges stored on the capacitor MC4 turns on the transistor MN7. The transistor MN5 remains off because the capacitor MC3 stores little or no charges. The true comparing data is applied to bit line CD# while the complement comparing data is applied to bit line CD. Since the comparing data is also a 0, CD# is low while CD is high. Thus transistor MN5 is off, blocking current flow through the transistor MN6, which is turned on by the high voltage applied to CD. The transistor MN8 is off, also blocking current flow through the transistor MN7, which is turned on by the charges stored on the capacitor MC4. Thus no discharge path to ground occurs, since transistors MN5 and MN8 are off.

When the comparing data does not match the stored data in the CAM cell, match sense line MSL is pulled low. For example, when the stored data is "1," the stored charges on the capacitor MC3 turns on the transistor MN5. When the comparing data is "0", the complement comparing data applied to the bit line CD is high, which turns the transistor MN6 on, and a low signal is applied to bit line CD#. Both transistors MN5 and MN6 are turned on, causing the match sense line MSL to be discharged to ground. Thus a mismatch is signaled.

The match sense line MSL is also pulled low when the stored data is low but the comparing data is high. When the stored data is "0," the stored charges on the capacitor MC4 turns on the transistor MN7. When the comparing data is "1", the complement comparing data applied to the bit line CD# is high, which turns the transistor MN8 on, and a low signal is applied to bit line CD. Both transistors MN7 and MN8 are turned on, causing the match sense line MSL to be discharged to ground. Thus a mismatch is signaled.

The CAM cell requires only NMOS transistors, which does not have to expand for well-to-well spacing as only a P-well or p-substrate is present within the cell.

Type 4—Single-Port CAM Cell Variation III

Figure 6:
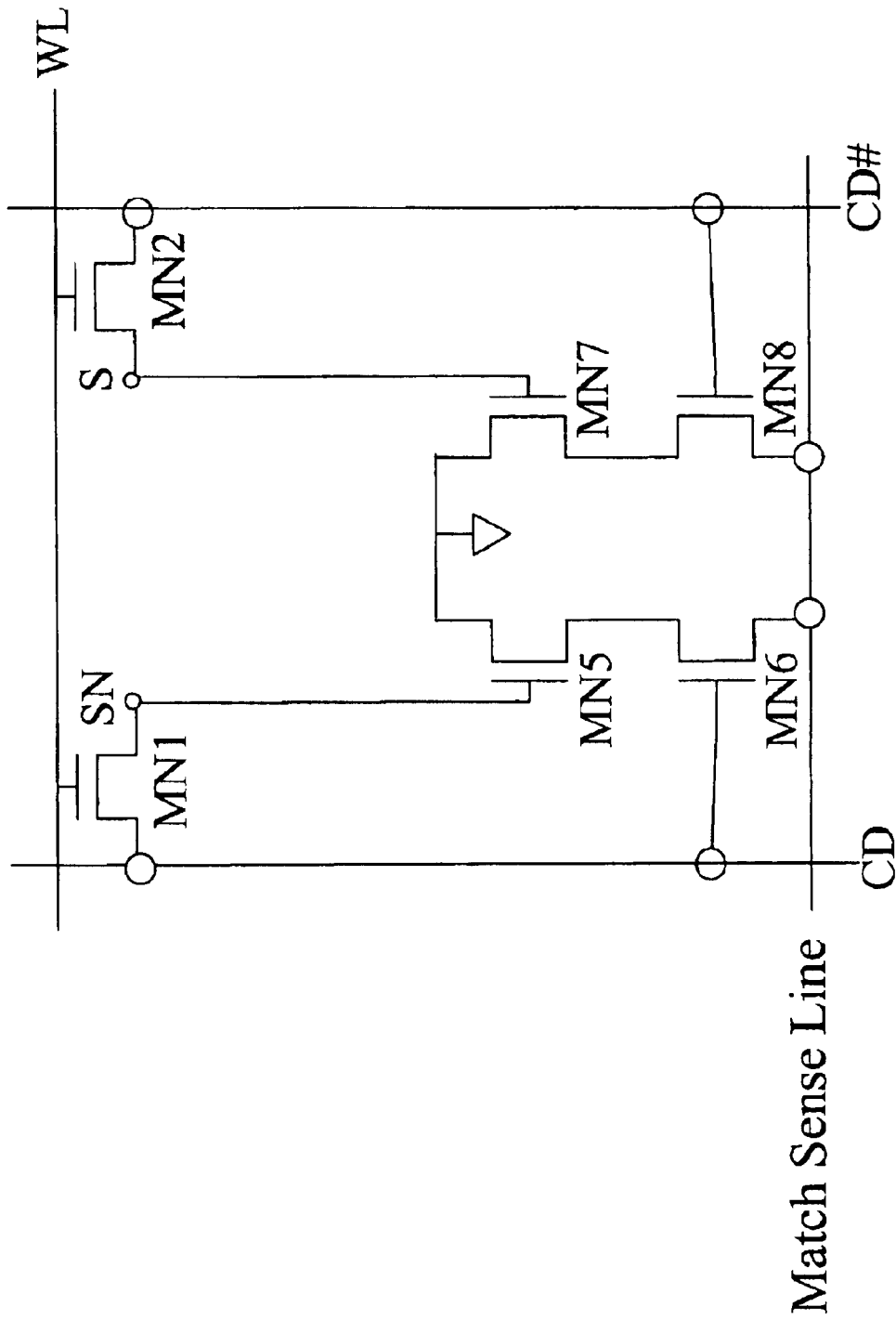
FIG. 6 is a diagram of a third variation of the single-port dynamic differential CAM as shown in FIG. 3 of the first preferred embodiment of the invention.

Refer to FIG. 6, which is a diagram of a third variation of the single-port dynamic differential CAM as shown in the first preferred embodiment of the invention. This CAM cell stored one bit of data, but the data is stored differentially as true and complement data. The important variation of the embodiment is that two transistors MN3 and MN4 and two capacitors MC3 and MC4 shown in FIG. 3 are eliminated. The total size of CAM cell is significantly decreased, which meets the requirements of cost-down for each memory cell or products therewith.

A pair of bit lines CD, CD# carry true and complement data to a column of cells. Two pass transistors MN1 and MN2 are turned on when word line WL is driven with a high voltage during a write operation. The pass transistor MN1 connects bit line CD to the gate of storage transistor MN5. Pass transistors MN2 connects bit line CD# to the gate of storage transistors MN7. One gate is charged high while the other gate is charged low. For a data 1, bit line CD is high, storing a high voltage on the gate of storage transistor MN5. Bit line CD# is low, driving a low voltage on the gate of storage transistor MN7. When word line WL is driven low, the gate of the storage transistor MN5 stores a positive charge while the gate of the storage transistor MN7 stores little or no charges. The opposite occurs when a data 0 is written to the cell. That is, the gate of the storage transistor MN7 stores a positive charge while storage transistor MN5 stores little or no charge.

Match sense line (MSL) is held low during read and write operations. The sources of storage transistors MN5 and MN7 are connected to ground. A virtual or switched ground such as a MASK line can be substituted. MSL is pre-charged high before a compare operation.

When the comparing data matches the stored data in the CAM cell, match sense line MSL remains high. For example, when the cell stores a 1, the stored charges on the gate of the transistor MN5 turns the transistor MN5 on, but the transistor MN7 remains off. The true comparing data is applied to bit line CD# while the complement comparing data is applied to bit line CD. Since the comparing data is also a 1, CD is low while CD# is high. Thus transistor MN6 is off, blocking current flow through the transistor MN5. The transistor MN7 is off, also blocking current flow through the transistor MN8. Thus no discharge path to ground occurs, since transistors MN6 and MN7 are off.

When the cell stores a 0, the charges stored on the gate of storage transistor MN7 turn on the transistor MN7. The transistor MN5 remains off because gate of storage transistor MN5 stores little or no charges. The true comparing data is applied to bit line CD# while the complement comparing data is applied to bit line CD. Since the comparing data is also a 0, CD# is low while CD is high. Thus transistor MN8 is off, blocking current flow through the transistor MN7. The transistor MN5 is off, also blocking current flow through the transistor MN6 because CD is high. Thus no discharge path to ground occurs, since transistors MN5 and MN8 are off.

When the comparing data does not match the stored data in the CAM cell, match sense line MSL is pulled low. For example, when the stored data is "1," the stored charge on the gate of storage transistor MN5 turns on the transistor MN5. When the comparing data is "0", the complement comparing data applied to the bit line CD is high, which turns the transistor MN6 on, and a low signal is applied to bit line CD#. Both transistors MN5 and MN6 are turned on, causing the match sense line MSL to be discharged to ground. Thus a mismatch is signaled.

The match sense line MSL is also pulled low when the stored data is low but the comparing data is high. When the stored data is "0," the stored charges on the gate of storage transistor MN7 turns on the transistor MN7. When the comparing data is "1", the complement comparing data applied to the bit line CD# is high, which turns the transistor MN8 on, and a low signal is applied to bit line CD. Both transistors MN7 and MN8 are turned on, causing the match sense line MSL to be discharged to ground. Thus a mismatch is signaled.

The CAM cell requires only NMOS transistors, which does not have to expand for well-to-well spacing as only a P-well or p-substrate is present within the cell.

Type 5—Single-Port CAM Cell Variation IV

Figure 7:
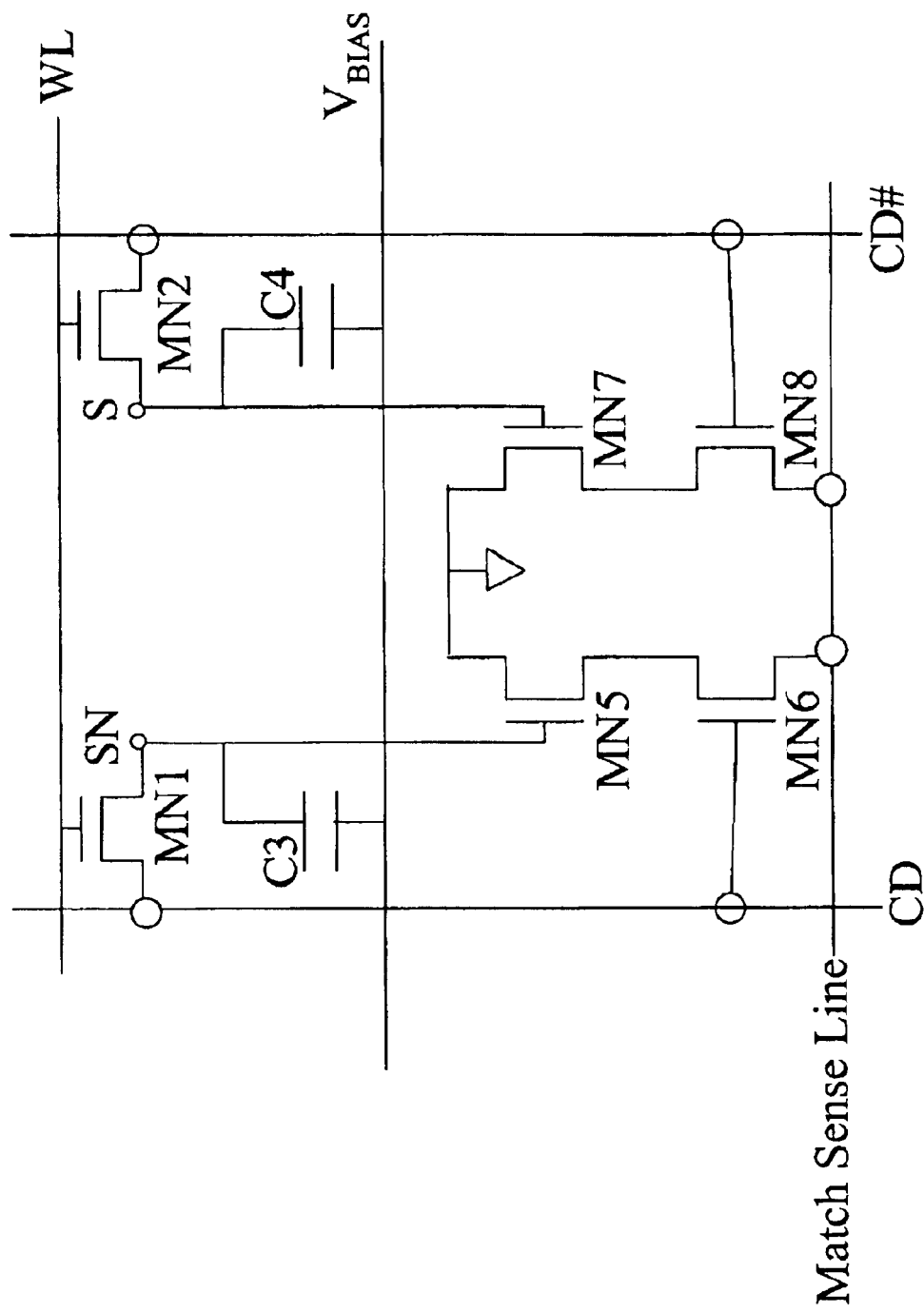
FIG. 7 is a diagram of a forth variation of the single-port dynamic differential CAM as shown in FIG. 3 of the first preferred embodiment of the invention.

Refer to FIG. 7, which is a diagram of a second variation of the single-port dynamic differential CAM as shown in the first preferred embodiment of the invention. This CAM cell stored one bit of data, but the data is stored differentially as true and complement data. The important variation of the embodiment is that two transistors MN3 and MN4 shown in FIG. 3 are eliminated and two capacitors MC3 and MC4 are replaced by the capacitors C3 and C4, which are manufactured by a DRAM process and can be DRAM capacitors, for example. A bias voltage $V_{BIAS}$ is applied to one terminal of each of the capacitors. For variations, the capacitors can be capacitors manufactured by a FRAM (Ferroelectric random-access memory), DRAM or MIM (metal-insulator-metal) capacitor process. Either polysilicon and metal-insulator-metal (MIM) capacitors can be used for the capacitors. The MIM capacitor module, which is inserted into the backend process of integrated circuit manufacturing, results in a very low capacitance density. The capacitance density is proportional to the reverse of the dielectric thickness. Often, sophisticated additional metal and dielectric layers must be added for high capacitance density.

A pair of bit lines CD, CD# carry true and complement data to a column of cells. Two pass transistors MN1 and MN2 are turned on when word line WL is driven with a high voltage during a write operation. The pass transistor MN1 connects bit line CD to the capacitor C3. Pass transistors MN2 connects bit line CD# to the capacitor C4. One gate is charged high while the other gate is charged low.

During read/write operation, word line WL is driven high for turning on the pass transistors MN1 and MN2. For storing data 1, bit line CD is high, storing charges in the capacitor C3. Bit line CD# is low, driving a low voltage to the capacitor C4 and storing little or no charges on the capacitor C4. When word line WL is driven low, the accompanying capacitor C3 stores many charges while the capacitor C4 stores little or no charges. The opposite occurs when a data 0 is written to the cell. That is, the capacitor C3 store a positive charge while the capacitor C4 stores little or no charge.

Match sense line (MSL) is held low during read and write operations. MSL is pre-charged high before a compare operation.

The cell can be read by equalizing and pre-charging both bit lines CD and CD# to an intermediate voltage before word line WL is raised. One bit line is then driven low and the other is driven high by charges sharing as pass transistors MN1 and MN2 are turned on. A sensitive sense amplifier can then detect a slight voltage difference on bit lines CD and CD#. The cell can be refreshed by writing the sensed data back to the bit lines.

During a match or compare operation, word line WL is low and pass transistors MN1 and MN2 remain off. Thus the stored charges on the capacitors C3 and C4 are isolated and not disturbed.

The comparing data from bit lines CD and CD# are applied to the gates of match transistors MN6 and MN8 respectively. The complements of the comparing data are applied to these bit lines during the compare operation. Thus bit line CD carries the complement of the comparing data. Complement bit line CD# carries the true comparing data.

When the comparing data matches the stored data in the CAM cell, match sense line MSL remains high. For example, when the cell stores a 1, the charges stored on the capacitor C3 turns on the transistor MN5. The transistor MN7 remains off because the capacitor C4 stores little or no charges. The true comparing data is applied to bit line CD# while the complement comparing data is applied to bit line CD. Since the comparing data is also a 1, CD is low while CD# is high. Thus transistor MN6 is off, blocking current flow through the transistor MN5. The transistor MN7 is off, also blocking current flow through the transistor MN8, which is turned on by the high voltage applied to CD#. Thus no discharge path to ground occurs, since transistors MN6 and MN7 are off.

When the cell stores a 0, the charges stored on the capacitor C4 turns on the transistor MN7. The transistor MN5 remains off because the capacitor C3 stores little or no charges. The true comparing data is applied to bit line CD# while the complement comparing data is applied to bit line CD. Since the comparing data is also a 0, CD# is low while CD is high. Thus transistor MN5 is off, blocking current flow through the transistor MN6, which is turned on by the high voltage applied to CD. The transistor MN8 is off, also blocking current flow through the transistor MN7, which is turned on by the charges stored on the capacitor C4. Thus no discharge path to ground occurs, since transistors MN5 and MN8 are off.

When the comparing data does not match the stored data in the CAM cell, match sense line MSL is pulled low. For example, when the stored data is "1," the stored charges on the capacitor C3 turns on the transistor MN5. When the comparing data is "0", the complement comparing data applied to the bit line CD is high, which turns the transistor MN6 on, and a low signal is applied to bit line CD#. Both transistors MN5 and MN6 are turned on, causing the match sense line MSL to be discharged to ground. Thus a mismatch is signaled.

The match sense line MSL is also pulled low when the stored data is low but the comparing data is high. When the stored data is "0," the stored charges on the capacitor C4 turns on the transistor MN7. When the comparing data is "1", the complement comparing data applied to the bit line CD# is high, which turns the transistor MN8 on, and a low signal is applied to bit line CD. Both transistors MN7 and MN8 are turned on, causing the match sense line MSL to be discharged to ground. Thus a mismatch is signaled.

The CAM cell requires only NMOS transistors, which does not have to expand for well-to-well spacing as only a P-well or p-substrate is present within the cell.

Second Embodiment—2-Port CAM Cell

Type 1—Basic 2-Port CAM Cell

Figure 8:
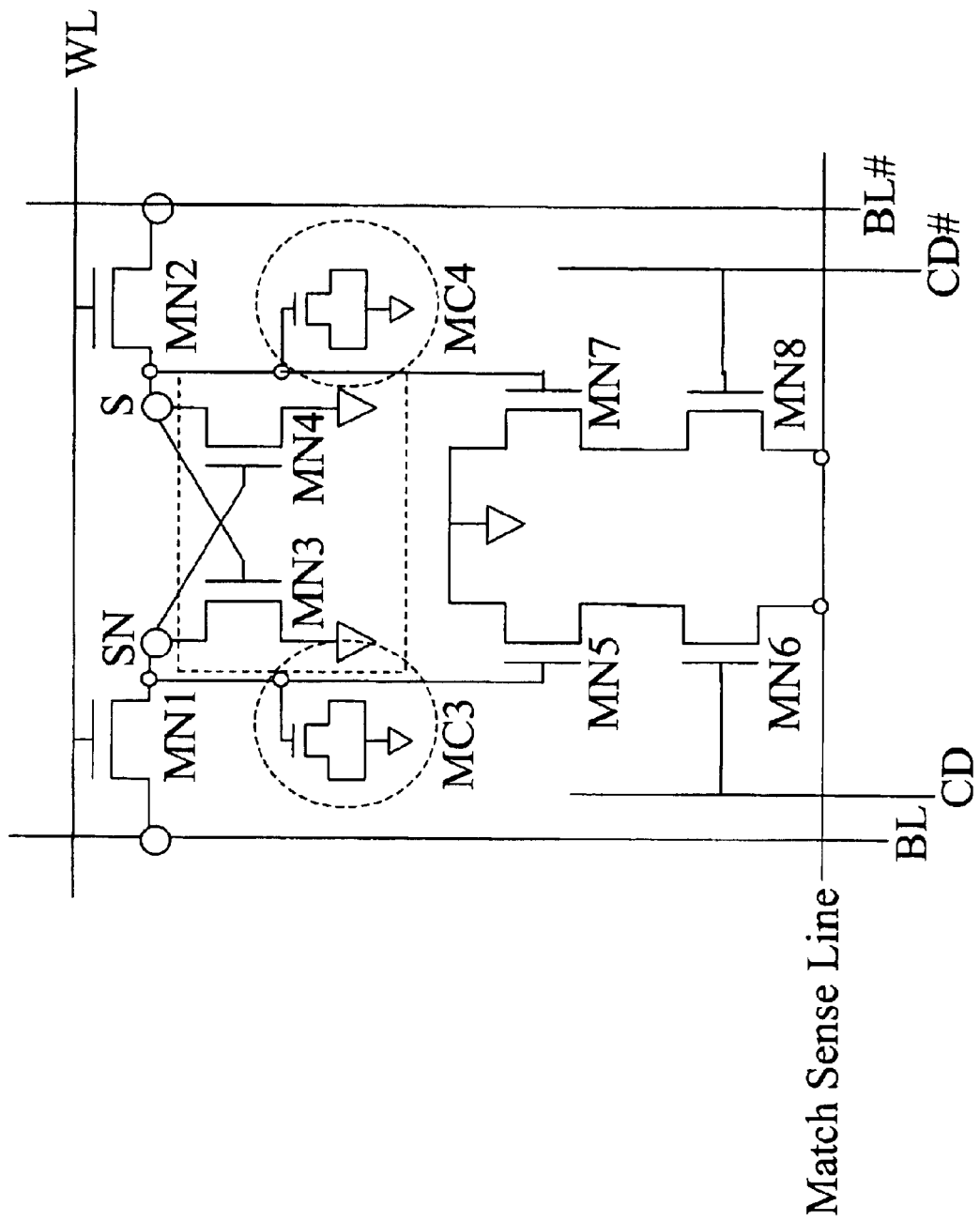
FIG. 8 is a diagram of a 2-port dynamic differential CAM of a second preferred embodiment of the invention.

Refer to FIG. 8, which is a diagram of a 2-port dynamic differential CAM of a second preferred embodiment of the invention. This CAM cell stored one bit of data, but the data is stored differentially as true and complement data. The embodiment relates to a CAM cell using another port for compare operation. In such architecture of one port for word line and two ports for bit lines, it allows read/write operation and Match operation can be performed in the same cycle and a wave-pipeline hidden refresh method is introduced for refresh operation. Another arrangement for operation is Match operation can be performed in the same cycle and one cycle is idled for refresh. Two-port bit line with one-port word line architecture can be arranged in accordance with requirements.

A pair of bit lines BL and BL# carry true and complement data to a column of cells. Two pass transistors MN1 and MN2 are turned on when word line WL is driven with a high voltage during a write operation. The pass transistor MN1 connects bit line BL to the gate of storage transistor MN4 and capacitor MC3. Pass transistors MN2 connects bit line BL# to the gate of storage transistors MN3 and capacitor MC4. One gate is charged high while the other gate is charged low. The capacitors MC3 and MC4 can be MOS capacitors, which meet the requirements of the manufacturing process.

For a data 1, bit line BL is high, storing a high voltage on the gate of storage transistor MN4. Bit line BL# is low, driving a low voltage on the gate of storage transistor MN3. When word line WL is driven low, the gate of the storage transistor MN4 and the accompanying capacitor MC3 store a positive charge while the gate of the storage transistor MN3 and capacitor MC4 store little or no charges. The opposite occurs when a data 0 is written to the cell. That is, the gate of the storage transistor MN3 and the accompanying capacitor MC4 store a positive charge while the gate of the storage transistor MN4 and the accompanying capacitor MC3 store little or no charge.

The sources of storage transistors MN3 and MN4 are connected to ground. A virtual or switched ground such as a MASK line can be substituted. Match sense line MSL is pre-charged high before a compare operation.

The cell can be read by equalizing and pre-charging both bit lines BL and BL# to an intermediate voltage before word line WL is raised. One bit line is then driven low and the other is driven high by charge sharing as pass transistors MN1 and MN2 are turned on. A sensitive sense amplifier can then detect a slight voltage difference on bit lines BL and BL#. The cell can be refreshed by writing the sensed data back to the bit lines.

The comparing data from a pair of compare lines CD and CD# are applied to the gates of match transistors MN6 and MN8 respectively. Thus compare line CD carries the complement of the comparing data. Complement compare line CD# carries the true comparing data.

When the comparing data matches the stored data in the CAM cell, match sense line MSL remains high. For example, when the cell stores a 1, storage transistor MN4 is on but storage transistor MN3 is off. The charges stored on the gate of storage transistor MN4 and the capacitor MC3 turn on the transistor MN5. The transistor MN7 remains off because gate of storage transistor MN3 and the capacitor MC4 store little or no charge. The true comparing data is applied to compare line CD# while the complement comparing data is applied to compare line CD. Since the comparing data is also a 1, CD is low while CD# is high. Thus transistor MN6 is off, blocking current flow through the transistor MN5. The transistor MN7 is off, also blocking current flow through the transistor MN8. Thus no discharge path to ground occurs, since transistors MN6 and MN7 are off.

When the cell stores a 0, storage transistor MN3 is on but storage transistor MN4 is off. The charges stored on the gate of storage transistor MN3 and the capacitor MC4 turns on the transistor MN7. The transistor MN5 remains off because gate of storage transistor MN4 and the capacitor MC3 stores little or no charges. The true comparing data is applied to compare line CD# while the complement comparing data is applied to compare line CD. Since the comparing data is also a 0, CD# is low while CD is high. Thus transistor MN5 is off, blocking current flow through the transistor MN6, which is turned on by the CD. The transistor MN8 is off, also blocking current flow through the transistor MN7. Thus no discharge path to ground occurs, since transistors MN5 and MN8 are off.

When the comparing data does not match the stored data in the CAM cell, match sense line MSL is pulled low. For example, when the stored data is "1," the stored data or stored charge on the gate of storage transistor MN4 and the capacitor MC3 turns on the transistor MN5. When the comparing data is "0", the complement comparing data applied to the compare line CD is high, which turns the transistor MN6 on, and a low signal is applied to compare line CD#. Both transistors MN5 and MN6 are turned on, causing the match sense line MSL to be discharged to ground. Thus a mismatch is signaled.

The match sense line MSL is also pulled low when the stored data is low but the comparing data is high. When the stored data is "0," the stored data or stored charge on the gate of storage transistor MN3 and the capacitor MC4 turns on the transistor MN7. When the comparing data is "1", the complement comparing data applied to the compare line CD# is high, which turns the transistor MN8 on, and a low signal is applied to compare line CD. Both transistors MN7 and MN8 are turned on, causing the match sense line MSL to be discharged to ground. Thus a mismatch is signaled.

The CAM cell requires only NMOS transistors, which does not have to expand for well-to-well spacing as only a P-well or p-substrate is present within the cell.

Type 2—2-Port CAM Cell Variation I

Figure 9:
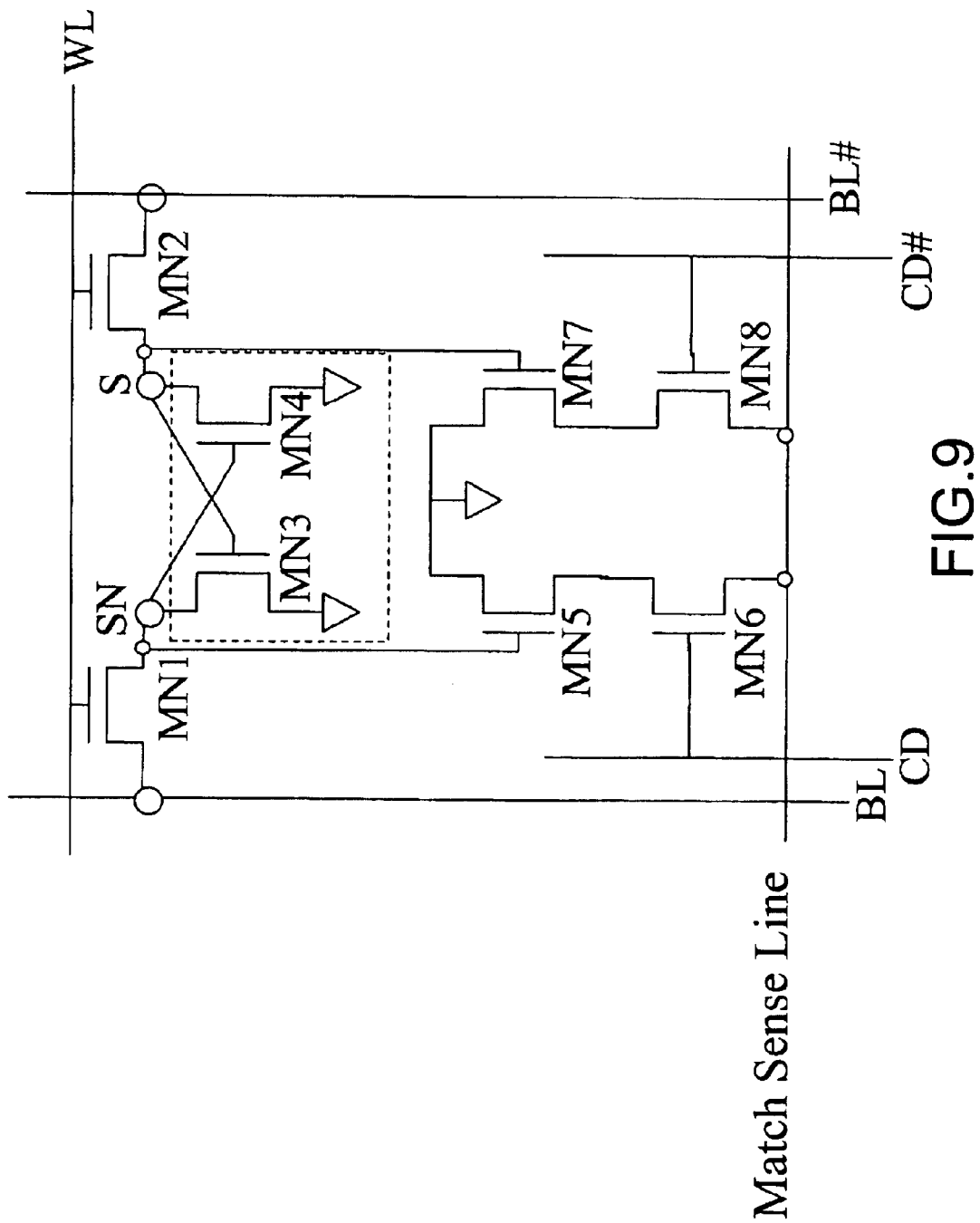
FIG. 9 is a diagram of a first variation of the 2-port dynamic differential CAM as shown in FIG. 8 of the first preferred embodiment of the invention.

Refer to FIG. 9, which is a diagram of a first variation of the 2-port dynamic differential CAM, as shown in the FIG. 8 of the second preferred embodiment of the invention. This CAM cell stored one bit of data, but the data is stored differentially as true and complement data. The important variation of the embodiment is that two capacitors MC3 and MC4 shown in FIG. 8 are eliminated.

A pair of bit lines BL and BL# carry true and complement data to a column of cells. Two pass transistors MN1 and MN2 are turned on when word line WL is driven with a high voltage during a write operation. The pass transistor MN1 connects bit line BL to the gate of storage transistor MN4. Pass transistors MN2 connects bit line BL# to the gate of storage transistors MN3. One gate is charged high while the other gate is charged low. For a data 1, bit line BL is high, storing a high voltage on the gate of storage transistor MN4. Bit line BL# is low, driving a low voltage on the gate of storage transistor MN3. When word line WL is driven low, the gate of the storage transistor MN4 stores a positive charge while the gate of the storage transistor MN3 stores little or no charge. The opposite occurs when a data 0 is written to the cell. That is, the gate of the storage transistor MN3 stores a positive charge while storage transistor MN4 stores little or no charge.

When the comparing data matches the stored data the CAM cell, match sense line MSL remains high. For example, when the cell stores a 1, storage transistor MN4 is on but storage transistor MN3 is off. The charges stored on the gate of storage transistor MN4 turns on the transistor MN5. The transistor MN7 remains off because gate of storage transistor MN3 stores little or no charge. The true comparing data is applied to compare line CD# while the complement comparing data is applied to compare line CD. Since the comparing data is also a 1, CD is low while CD# is high. Thus transistor MN6 is off, blocking current flow through the transistor MN5. The transistor MN7 is off, also blocking current flow through the transistor MN8. Thus no discharge path to ground occurs, since transistors MN6 and MN7 are off.

When the cell stores a 0, storage transistor MN3 is on but storage transistor MN4 is off. The charges stored on the gate of storage transistor MN3 turns on the transistor MN7. The transistor MN5 remains off because gate of storage transistor MN4 stores little or no charge. The true comparing data is applied to compare line CD# while the complement comparing data is applied to compare line CD. Since the comparing data is also a 0, CD# is low while CD is high. Thus transistor MN5 is off, blocking current flow through the transistor MN6. The transistor MN8 is off, also blocking current flow through the transistor MN7. Thus no discharge path to ground occurs, since transistors MN5 and MN8 are off.

When the comparing data does not match the stored data in the CAM cell, match sense line MSL is pulled low. For example, when the stored data is "1," the stored data or stored charge on the gate of storage transistor MN4 turns on the transistor MN5. When the comparing data is "0", the complement comparing data applied to the compare line CD is high, which turns the transistor MN6 on, and a low signal is applied to compare line CD#. Both transistors MN5 and MN6 are turned on, causing the match sense line MSL to be discharged to ground. Thus a mismatch is signaled.

The match sense line MSL is also pulled low when the stored data is low but the comparing data is high. When the stored data is "0," the stored data or stored charge on the gate of storage transistor MN3 turns on the transistor MN7.

When the comparing data is "1", the complement comparing data applied to the compare line CD# is high, which turns the transistor MN8 on, and a low signal is applied to compare line CD. Both transistors MN7 and MN8 are turned on, causing the match sense line MSL to be discharged to ground. Thus a mismatch is signaled.

The CAM cell requires only NMOS transistors, which does not have to expand for well-to-well spacing as only a P-well or p-substrate is present within the cell.

Type 3—2-Port CAM Cell Variation II

Figure 10:
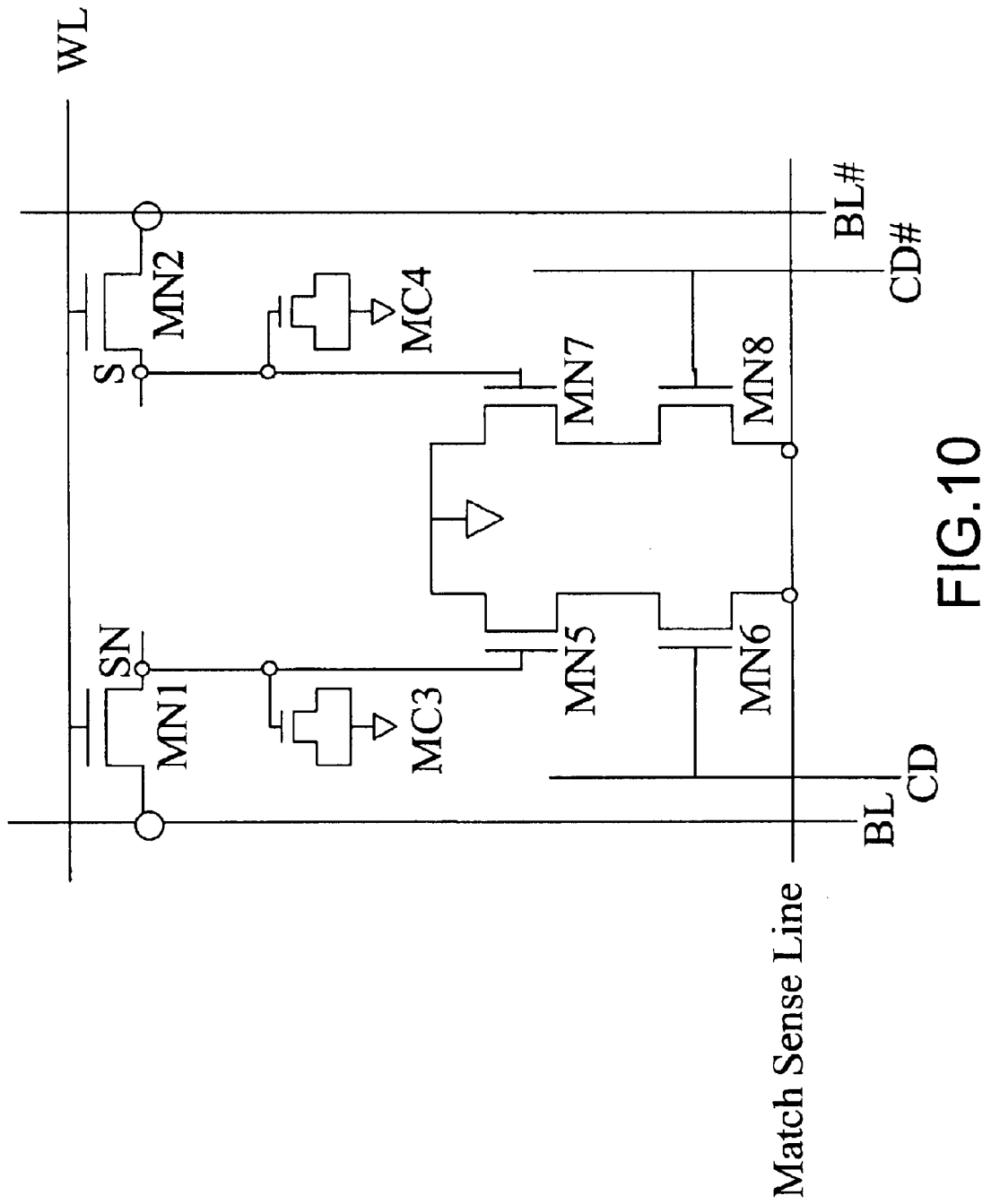
FIG. 10 is a diagram of a second variation of the 2-port dynamic differential CAM as shown in FIG. 8 of the first preferred embodiment of the invention.

Refer to FIG. 10, which is a diagram of a second variation of the 2-port dynamic differential CAM, as shown in the FIG. 8 of the second preferred embodiment of the invention. This CAM cell stored one bit of data, but the data is stored differentially as true and complement data. The important variation of the embodiment is that two transistors MN3 and MN4 shown in FIG. 8 are eliminated.

A pair of bit lines BL and BL# carry true and complement data to a column of cells. Two pass transistors MN1 and MN2 are turned on when word line WL is driven with a high voltage during a write operation. The pass transistor MN1 connects bit line BL to the gate of storage transistor MN5 and capacitor MC3. Pass transistors MN2 connects bit line BL# to the gate of storage transistors MN7 and capacitor MC4. One gate is charged high while the other gate is charged low. For a data 1, bit line BL is high, storing a high voltage on the gate of storage transistor MN5 and capacitor MC3. Bit line BL# is low, driving a low voltage on the gate of storage transistor MN7. When word line WL is driven low, the gate of the storage transistor MN5 and the accompanying capacitor MC3 store a positive charge while the gate of the storage transistor MN7 and the accompanying capacitor MC4 store little or no charge. The opposite occurs when a data 0 is written to the cell. That is, the gate of the storage transistor MN7 and the accompanying capacitor MC4 store a positive charge while storage transistor MN5 stores little or no charge.

The sources of storage transistors MN5 and MN7 are connected to ground. A virtual or switched ground such as a MASK line can be substituted. Match sense line MSL is pre-charged high before a compare operation. A pair of compare lines CD and CD# is respectively coupled to transistors MN6 and MN8, as shown in FIG. 10.

When the comparing data matches the stored data in the CAM cell, match sense line MSL remains high. For example, when the cell stores a 1, the stored charges on the gate of the transistor MN5 and capacitor MC3 turn the transistor MN5 on, but the transistor MN7 remains off. The true comparing data is applied to the compare line CD# while the complement comparing data is applied to the compare line CD. Since the comparing data is also a 1, CD is low while CD# is high. Thus transistor MN6 is off, blocking current flow through the transistor MN5. The transistor MN7 is off, also blocking current flow through the transistor MN8. Thus no discharge path to ground occurs, since transistors MN8 and MN5 are off.

When the cell stores a 0, the charges stored on the gate of storage transistor MN7 and capacitor MC4 turn on the transistor MN7. The transistor MN5 remains off because gate of storage transistor MN5 stores little or no charge. The true comparing data is applied to a compare line CD# while the complement comparing data is applied to a compare line CD. Since the comparing data is also a 0, CD# is low while CD is high. Thus transistor MN8 is off, blocking current low through the transistor MN7. The transistor MN5 is off, also blocking current flow through the transistor MN6 because CD is high. Thus no discharge path to ground occurs, since transistors Mn5 and MN8 are off.

When the comparing data does not match the stored data in the CAM cell, match sense line MSL is pulled low. For example, when the stored data is "1," the stored charge on the gate of storage transistor MN5 turns on the transistor MN5. When the comparing data is "0", the complement comparing data applied to the compare line CD is high, which turns the transistor MN6 on, and a low signal is applied to compare line CD#. Both transistors MN5 and MN6 are turned on, causing the match sense line MSL to be discharged to ground. Thus a mismatch is signaled.

The match sense line MSL is also pulled low when the stored data is low but the comparing data is high. When the stored data is "0," the stored charges on the gate of storage transistor MN7 turns on the transistor MN7. When the comparing data is "1", the complement comparing data applied to the compare line CD# is high, which turns the transistor MN8 on, and a low signal is applied to compare line CD. Both transistors MN7 and MN8 are turned on, causing the match sense line MSL to be discharged to ground. Thus a mismatch is signaled.

The CAM cell requires only NMOS transistors, which does not have to expand for well-to-well spacing as only a P-well or p-substrate is present within the cell.

Type 4—2-Port CAM Cell Variation III

Figure 11:
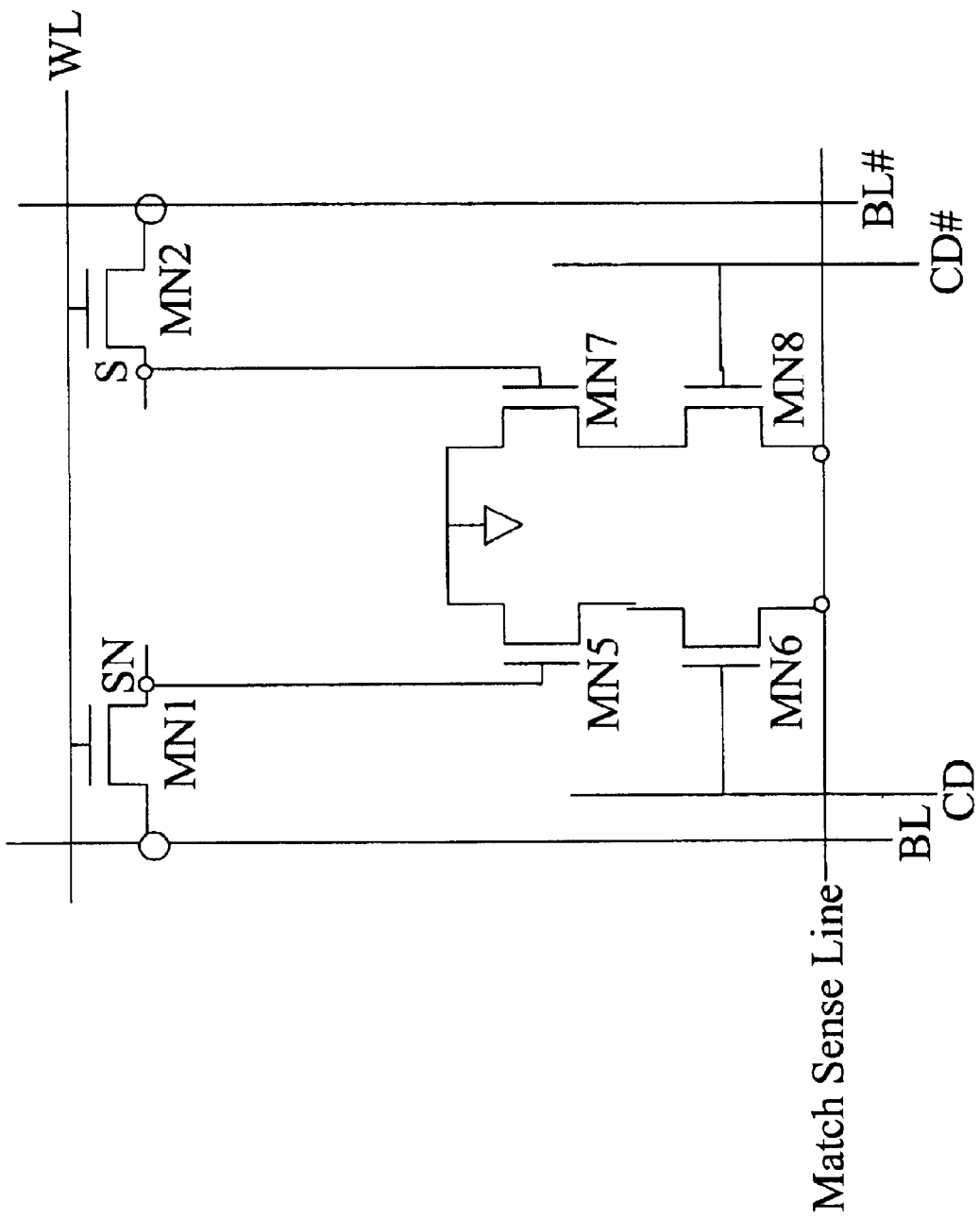
FIG. 11 is a diagram of a third variation of the 2-port dynamic differential CAM as shown in FIG. 8 of the first preferred embodiment of the invention.

Refer to FIG. 11, which is a diagram of a third variation of the 2-port dynamic differential CAM, as shown in the FIG. 8 of the second preferred embodiment of the invention. This CAM cell stored one bit of data, but the data is stored differentially as true and complement data. The important variation of the embodiment is that two transistors MN3 and MN4 and two capacitors MC3 and MC4 shown in FIG. 8 are eliminated. The total size of CAM cell is significantly decreased, which meets the requirement of cost-down for such products.

A pair of bit lines BL and BL# carry true and complement data to a column of cells. Two pass transistors MN1 and MN2 are turned on when word line WL is driven with a high voltage during a write operation. The pass transistor MN1 connects bit line BL to the gate of storage transistor MN5. Pass transistors MN2 connects bit line BL# to the gate of storage transistors MN7. One gate is charged high while the other gate is charged low. For a data 1, bit line BL is high, storing a high voltage on the gate of storage transistor MN5. Bit line BL# is low, driving a low voltage on the gate of storage transistor MN7. When word line WL is driven low, the gate of the storage transistor MN5 stores a positive charge while the gate of the storage transistor MN7 stores little or no charge. The opposite occurs when a data 0 is written to the cell. That is, the gate of the storage transistor MN7 stores a positive charge while storage transistor MN5 stores little or no charge.

The sources of storage transistors MN5 and MN7 are connected to ground. A virtual or switched ground such as a MASK line can be substituted. Match sense line (MSL) is pre-charged high before a compare operation. A pair of compare lines CD and CD# are provided for transmitting comparing data. The true comparing data is applied to the compare line CD# while the complement comparing data is applied to the compare line CD.

When the comparing data matches the stored data in the CAM cell, match sense line MSL remains high. For example, when the cell stores a 1, the stored charges on the gate of the transistor MN5 turns the transistor MN5 on, but the transistor MN7 remains off. The true comparing data is applied to the compare line CD# while the complement comparing data is applied to the compare line CD. Since the comparing data is also a 1, CD is low while CD# is high.

Thus transistor MN6 is off, blocking current flow through the transistor MN5. The transistor MN7 is off, also blocking current flow through the transistor MN8, which is turned by the CD#. Thus no discharge path to ground occurs, since transistors MN6 and MN7 are off.

When the cell stores a 0, the charges stored on the gate of storage transistor MN7 turn on the transistor MN7. The transistor MN5 remains off because gate of storage transistor MN5 stores little or no charge. The true comparing data is applied to the compare line CD# while the complement comparing data is applied to the compare line CD. Since the comparing data is also a 0, CD# is low while CD is high. Thus transistor MN5 is off, blocking current flow through the transistor MN6, which is turned by CD. The transistor MN8 is off, also blocking current flow through the transistor MN7 because CD is high. Thus no discharge path to ground occurs, since transistors MN5 and MN8 are off.

When the comparing data does not match the stored data in the CAM cell, match sense line MSL is pulled low. For example, when the stored data is "1," the stored charge on the gate of storage transistor MN5 turns on the transistor MN5. When the comparing data is "0", the complement comparing data applied to the compare line CD is high, which turns the transistor MN6 on, and a low signal is applied to the compare line CD#. Both transistors MN5 and MN6 are turned on, causing the match sense line MSL to be discharged to ground. Thus a mismatch is signaled.

The match sense line MSL is also pulled low when the stored data is low but the comparing data is high. When the stored data is "0," the stored charges on the gate of storage transistor MN7 turns on the transistor MN7. When the comparing data is "1", the complement comparing data applied to the compare line CD# is high, which turns the transistor MN8 on, and a low signal is applied to the compare line CD. Both transistors MN7 and MN8 are turned on, causing the match sense line MSL to be discharged to ground. Thus a mismatch is signaled.

The CAM cell requires only NMOS transistors, which does not have to expand for well-to-well spacing as only a P-well or p-substrate is present within the cell.

Type 5—2-Port CAM Cell Variation IV

Figure 12:
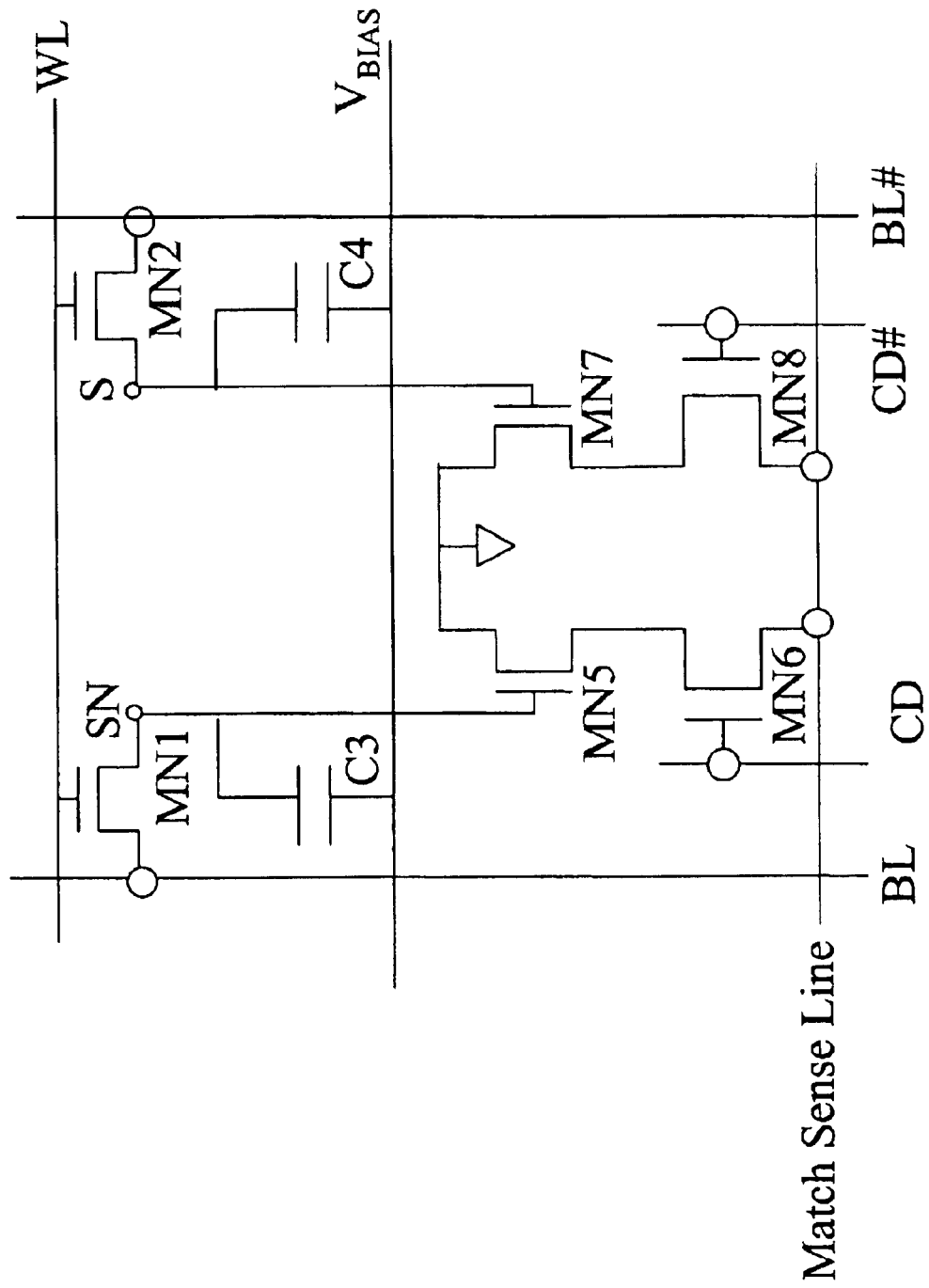
FIG. 12 is a diagram of a forth variation of the 2-port dynamic differential CAM as shown in FIG. 8 of the first preferred embodiment of the invention.

Refer to FIG. 12, which is a diagram of a forth variation of the 2-port dynamic differential CAM, as shown in the FIG. 8 of the second preferred embodiment of the invention. This CAM cell stored one bit of data, but the data is stored differentially as true and complement data. The important variation of the embodiment is that two transistors MN3 and MN4 shown in FIG. 3 are eliminated and two capacitors MC3 and MC4 are replaced with capacitors C3 and C4, which are manufactured by a DRAM process and can be DRAM capacitors, for example. A bias voltage $V_{BIAS}$ is applied to one terminal of each of the capacitors. For variations, the capacitors can be capacitors manufactured by a FRAM (Ferroelectric random-access memory), DRAM or MIM (metal-insulator-metal) capacitor process. Either polysilicon or metal-insulator-metal (MIM) capacitors can be used for the capacitors. The MIM capacitor module, which is inserted into the backend process of integrated circuit manufacturing, results in a very low capacitance density. The capacitance density is proportional to the reverse of the dielectric thickness. Often, sophisticated additional metal and dielectric layers must be added for high capacitance density.

A pair of bit lines BL, BL# carry true and complement data to a column of cells. Two pass transistors MN1 and MN2 are turned on when word line WL is driven with a high voltage during a write operation. The pass transistor MN1 connects bit line BL to the capacitor C3. Pass transistors MN2 connects bit line BL# to the capacitor C4. One gate is charged high while the other gate is charged low.

During read/write operation, word line WL is driven high for turning on the pass transistors MN1 and MN2. For storing data 1, bit line BL is high, storing charges in the capacitor C3. Bit line BL# is low, driving a low voltage to the capacitor C4 and storing little or no charges on the capacitor C4. When word line WL is driven low, the accompanying capacitor C3 stores data 1 while the capacitor C4 stores data 0. The opposite occurs when a data 0 is written to the cell. That is, the capacitor C3 store data 0 while the capacitor C4 stores data 1.

Match sense line (MSL) is held low during read and write operations. MSL is pre-charged high before a compare operation.

The cell can be read by equalizing and pre-charging both bit lines BL and BL# to an intermediate voltage before word line WL is raised. One bit line is then driven low and the other is driven high by charges sharing as pass transistors MN1 and MN2 are turned on. A sensitive sense amplifier can then detect a slight voltage difference on bit lines BL and BL#. The cell can be refreshed by writing the sensed data back to the bit lines.

During a match or compare operation, word line WL is low and pass transistors MN1 and MN2 remain off. Thus the stored data on the capacitors C3 and C4 are isolated and not disturbed.

The comparing data from compare lines CD and CD# are applied to the gates of match transistors MN6 and MN8 respectively. The complements of the comparing data are applied to these bit lines during the compare operation. Thus the compare line CD carries the complement of the comparing data. Complement compare line CD# carries the true comparing data.

When the comparing data matches the stored data in the CAM cell, match sense line MSL remains high. For example, when the cell stores a 1, the charges stored on the capacitor C3 turns on the transistor MN5. The transistor MN7 remains off because the capacitor C4 stores little or no charges. The true comparing data is applied to the compare line CD# while the complement comparing data is applied to the compare line CD. Since the comparing data is also a 1, CD is low while CD# is high. Thus transistor MN6 is off, blocking current flow through the transistor MN5. The transistor MN7 is off, also blocking current flow through the transistor MN8, which is turned on by the high voltage applied to CD#. Thus no discharge path to ground occurs, since transistors MN6 and MN7 are off.

When the cell stores a 0, the charges stored on the capacitor C4 turns on the transistor MN7. The transistor MN5 remains off because the capacitor C3 stores little or no charges. The true comparing data is applied to the compare line CD# while the complement comparing data is applied to the compare line CD. Since the comparing data is also a 0, CD# is low while CD is high. Thus transistor MN5 is off, blocking current flow through the transistor MN6, which is turned on by the high voltage applied to CD. The transistor MN8 is off, also blocking current flow through the transistor MN7, which is turned on by the charges stored on the capacitor C4. Thus no discharge path to ground occurs, since transistors MN5 and MN8 are off.

When the comparing data does not match the stored data in the CAM cell, match sense line MSL is pulled low. For example, when the stored data is "1," the stored charges on the capacitor C3 turns on the transistor MN5. When the comparing data is "0", the complement comparing data applied to the compare line CD is high, which turns the transistor MN6 on, and a low signal is applied to the compare line CD#. Both transistors MN5 and MN6 are turned on, causing the match sense line MSL to be discharged to ground. Thus a mismatch is signaled.

The match sense line MSL is also pulled low when the stored data is low but the comparing data is high. When the stored data is "0," the stored charges on the capacitor C4 turns on the transistor MN7. When the comparing data is "1", the complement comparing data applied to the compare line CD# is high, which turns the transistor MN8 on, and a low signal is applied to the compare line CD. Both transistors MN7 and MN8 are turned on, causing the match sense line MSL to be discharged to ground. Thus a mismatch is signaled.

The CAM cell requires only NMOS transistors, which does not have to expand for well-to-well spacing as only a P-well or p-substrate is present within the cell.

Third Embodiment—3-Port CAM Cell

Hereinafter a 3-port dynamic differential CAM of a third preferred embodiment of the invention is introduced. This CAM cell stored one bit of data, but the data is stored differentially as true and complement data. The stored data both true terminal and complement terminals, S and SN as shown in the FIG. 13 for example, are all "0," it means that the CAM cell is in a status of "Don't Care."

The embodiment relates to a CAM cell using three ports for operations (Two-port word line and One-port bit line, or Two-port word line and Two-port bit line), depending on requirements. One arrangement with two-port word line can be: (i) one port for refresh and other port for SRAM write operation, (ii) one port for read operation and other port for write operation, while a wave-pipeline technique for refresh cycle (which means hidden refresh), or (iii) one port for read operation and other port for write operation, while idle a refresh cycle for such dynamic CAM cell. One arrangement with two-port bit line can be: (i) Match operation and Read/Write operation can be performed in the same cycle, while a wave-pipeline technique for refresh cycle (which means hidden refresh), or (ii) Match operation and Read/Write operation can be performed in the same cycle, while idle one cycle for refresh. One arrangement with two-port bit line and two-port word line can be: (i) one word-line port for refresh and the other word-line port for SRAM write operation, while the Match operation can be performed in the same cycle; (ii) one word-line port for read operation and the other word-line port for write operation, while a wave-pipeline technique for hidden refresh is used for a refresh cycle (which means hidden refresh) and Match operation is performed in the same cycle; or (iii) one word-line port for read operation and the other word-line port for write operation, while Match operation is performed in the same cycle and idle a refresh cycle for refresh operation (for dynamic CAM cells). Such 3-port dynamic differential CAM cells can be implemented by any CMOS technologies, such as FRAM, DRAM, logic technology, etc. These CAM cells can be combined and modified in accordance with different purposes. These different types of CAM cells are described hereafter.

Type 1—Basic 3-Port CAM Cell

Figure 13:
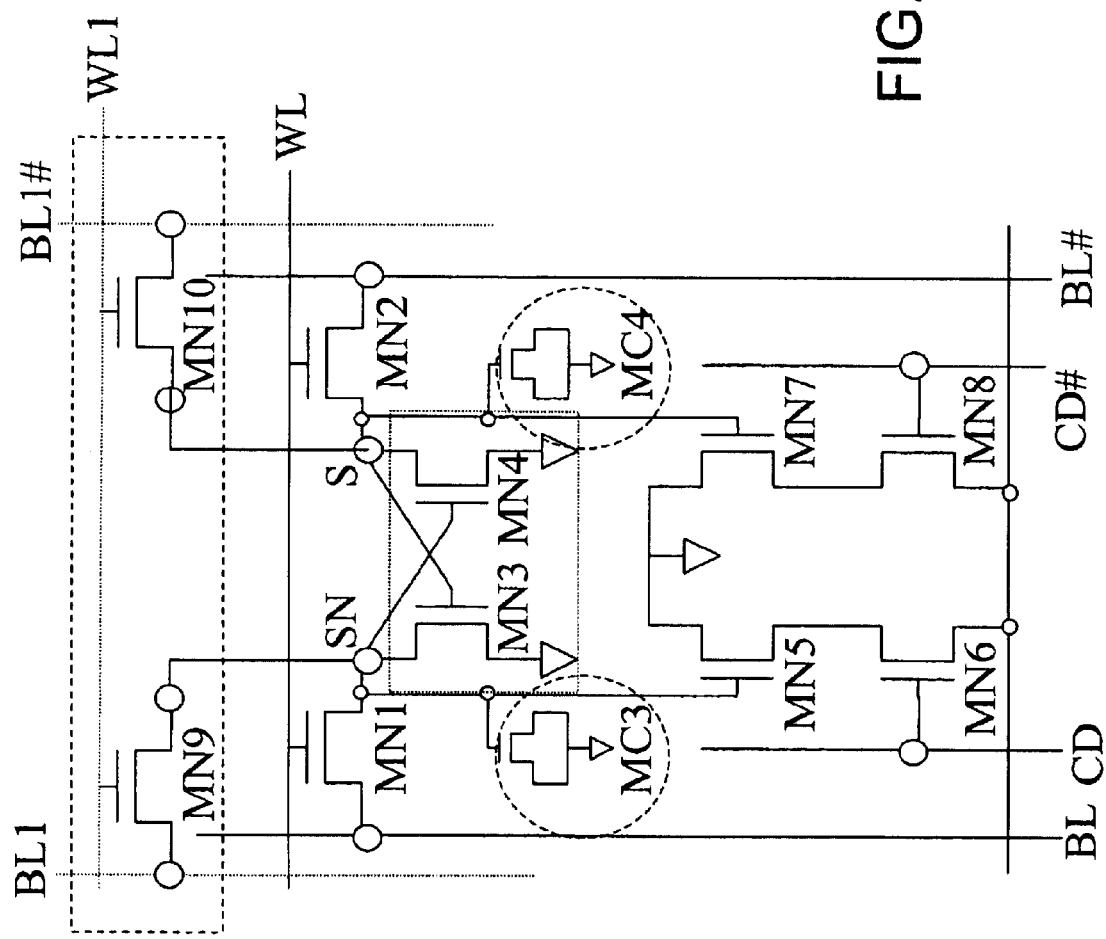
FIG. 13 is a diagram of a 3-port dynamic differential CAM of a third preferred embodiment of the invention.

Refer to FIG. 13, which is a diagram of a 3-port dynamic differential CAM of a third preferred embodiment of the invention. A pair of bit lines BL and BL# carry true and complement data to a column of cells. Two pass transistors MN1 and MN2 are turned on when word line WL is driven with a high voltage during a write operation. The pass transistor MN1 connects bit line BL to the gate of storage transistor MN4 and capacitor MC3. Pass transistors MN2 connects bit line BL# to the gate of storage transistors MN3 and capacitor MC4. One gate is charged high while the other gate is charged low. The capacitors MC3 and MC4 can be MOS capacitors, which meet the requirements of the manufacturing process.

Operations of such 3-port CAM cell are familiar with the operations described in FIG. 8 except a separate pair of bit lines BL1 and BL1# and an additional word line WL1 are provided in this type of CAM cell of the third preferred embodiment of the invention.

As described above, these two word lines can be arranged as followed. In a case that if word line WL is used for SRAM write operation, the other word line WL1 is used for refresh. In another case that if word line WL is used for write operation, the other word line WL1 is used for read operation, while a wave-pipeline technique is used for refresh cycle (which means hidden refresh). In further case that if word line WL is used for write operation, word line WL1 is used for read operation, while idle a refresh cycle for such dynamic CAM cell.

As describe above, there bit lines can be arranged as followed. In a case that Match operation and Read/Write operation can be performed in the same cycle through different pair of bit lines, while a wave-pipeline technique for refresh cycle (which means hidden refresh). In other case that Match operation and Read/Write operation can be performed in the same cycle through different pair of bit lines, while idle one cycle for refresh.

For combing these arrangements together, which means two pairs of bit lines BL, BL# and BL1, BL1#, and two word lines WL, WL1 are provided. These features described above for two-pair bit lines and two word lines can be incorporated together for different purposes. For example, if word line WL is used for SRAM write operation, the other word line WL1 is used for refresh. The Match operation can be performed in the same cycle when write operation and refresh operation are performed. Another arrangement can also that if word line WL is for write operation, the word line WL1 is for read operation, while a wave-pipeline technique for hidden refresh is used for a refresh cycle (which means hidden refresh) and Match operation is performed in the same cycle. Another choice of arrangement is that if the word line WL is for write operation, the other word line WL1 is for read operation, while Match operation is performed in the same cycle and idle a refresh cycle for refresh operation (for dynamic CAM cells). The read/write operation accompanying with the refresh operation will be described in tails in FIG. 66.

Type 2—3-Port CAM Cell Variation I

Figure 14:
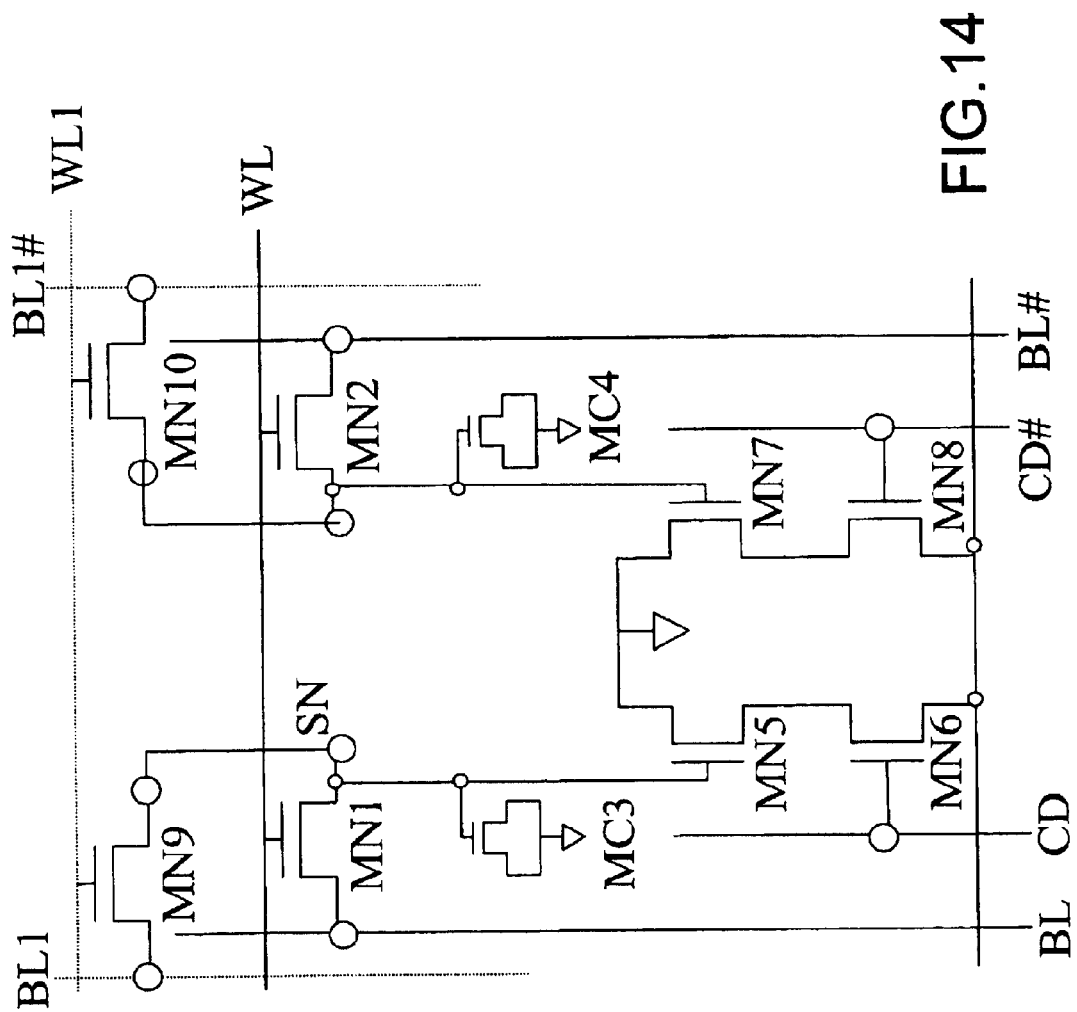
FIG. 14 is a diagram of a first variation of the 3-port dynamic differential CAM as shown in FIG. 13 of the third preferred embodiment of the invention.

Refer to FIG. 14, which is a diagram of a first variation of the 3-port dynamic differential CAM, as shown in the FIG. 13 of the third preferred embodiment of the invention. This CAM cell stored one bit of data, but the data is stored differentially as true and complement data. The important variation of the embodiment is that two transistors MN3 and MN4 shown in FIG. 13 are eliminated.

Operations of such 3-port CAM cell are familiar with the operations described in FIG. 10 except a separate pair of bit lines BL1 and BL1# and an additional word line WL1 are provided in this type of CAM cell of the third preferred embodiment of the invention. These features are the same as described in the first type of 3-port CAM cell shown in FIG. 13.

Type 3—3-Port CAM Cell Variation II

Figure 15:
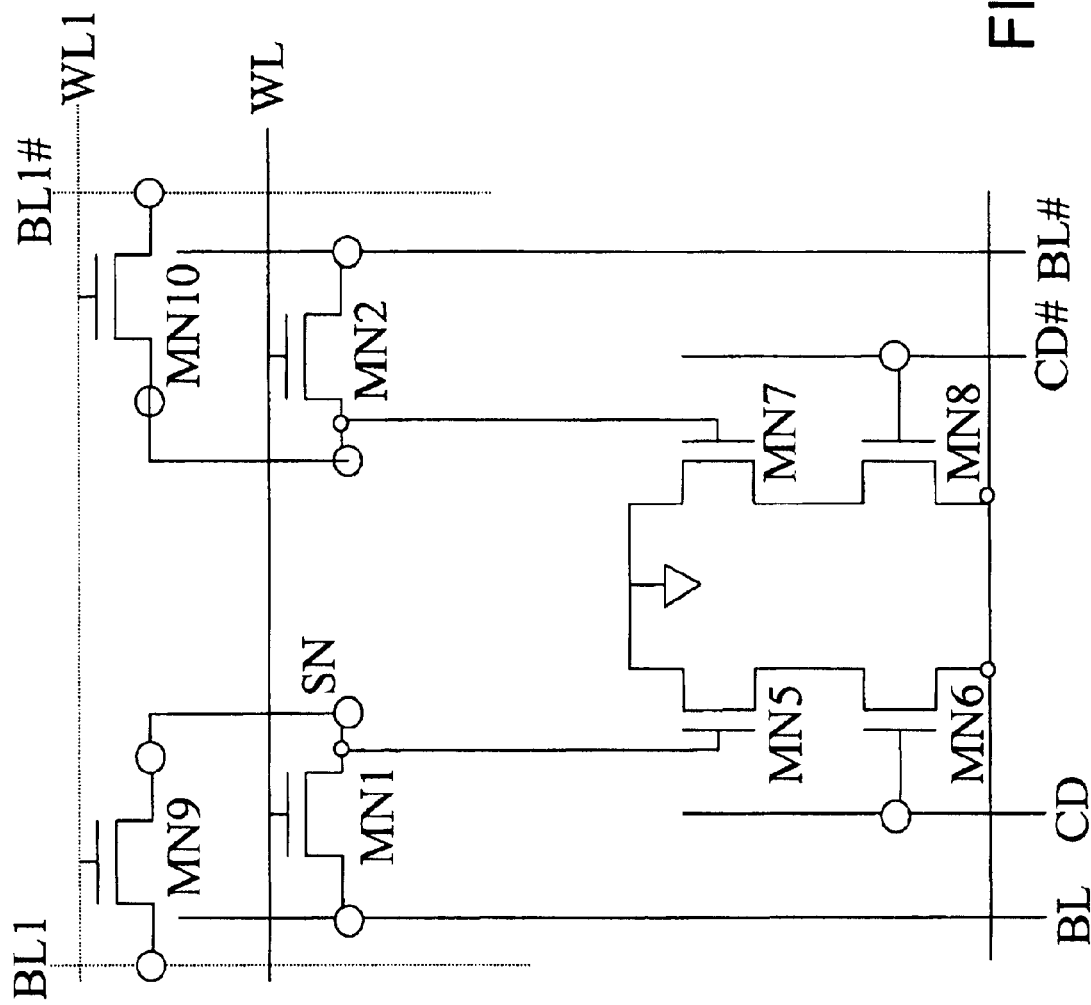
FIG. 15 is a diagram of a second variation of the 3-port dynamic differential CAM as shown in FIG. 13 of the third preferred embodiment of the invention.

Refer to FIG. 15, which is a diagram of a second variation of the 3-port dynamic differential CAM, as shown in the FIG. 13 of the third preferred embodiment of the invention. This CAM cell stored one bit of data, but the data is stored differentially as true and complement data. The important variation of the embodiment is that two transistors MN3 and MN4 and two capacitors MC3 and MC4 shown in FIG. 13 are eliminated. The total size of CAM cell is significantly decreased, which meets the requirement of cost-down for such products.

Operations of such 3-port CAM cell are familiar with the operations described in FIG. 11 except a separate pair of bit lines BL1 and BL1# and an additional word line WL1 are provided in this type of CAM cell of the third preferred embodiment of the invention. These features are the same as described in the first type of 3-port CAM cell shown in FIG. 13.

Type 4—3-Port CAM Cell Variation III

Figure 16:
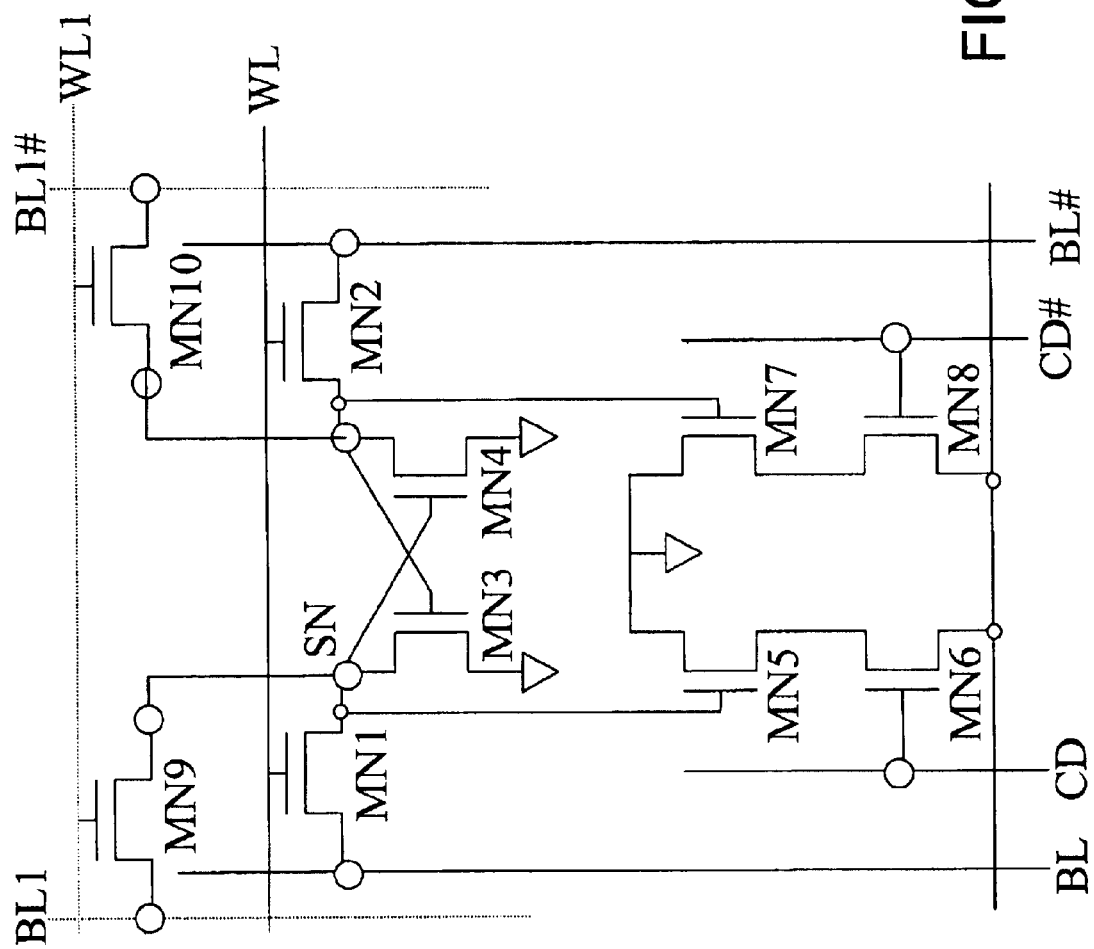
FIG. 16 is a diagram of a third variation of the 3-port dynamic differential CAM as shown in FIG. 13 of the third preferred embodiment of the invention.

Refer to FIG. 16, which is a diagram of a third variation of the 3-port dynamic differential CAM, as shown in the FIG. 13 of the third preferred embodiment of the invention. This CAM cell stored one bit of data, but the data is stored differentially as true and complement data. The important variation of the embodiment is that two capacitors MC3 and MC4 shown in FIG. 13 are eliminated.

Operations of such 3-port CAM cell are familiar with the operations described in FIG. 9 except a separate pair of bit lines BL1 and BL1# and an additional word line WL1 are provided in this type of CAM cell of the third preferred embodiment of the invention. These features are the same as described in the first type of 3-port CAM cell shown in FIG. 13.

Type 5—3-Port CAM Cell Variation IV

Figure 17:
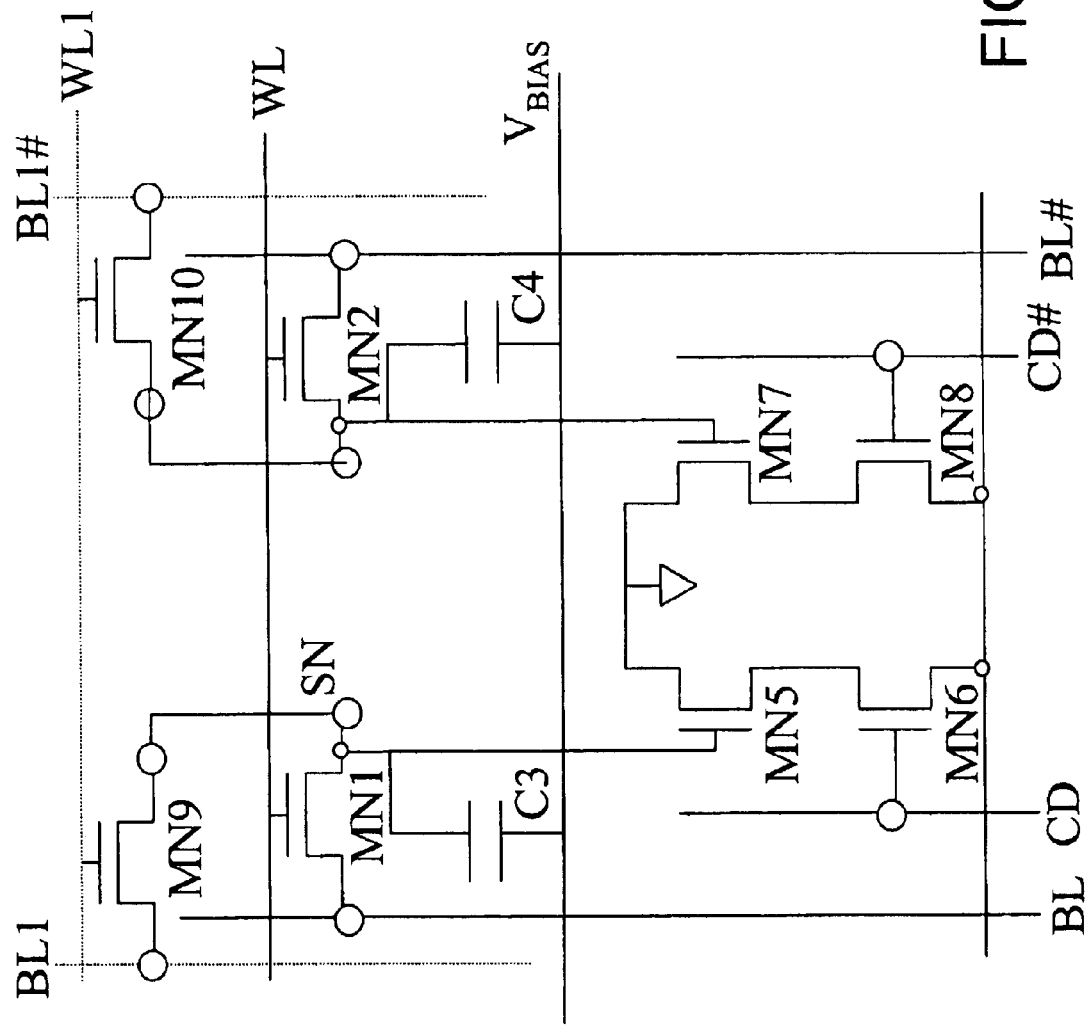
FIG. 17 is a diagram of a forth variation of the 3-port dynamic differential CAM as shown in FIG. 13 of the third preferred embodiment of the invention.

Refer to FIG. 17, which is a diagram of a forth variation of the 3-port dynamic differential CAM, as shown in the FIG. 13 of the third preferred embodiment of the invention. This CAM cell stored one bit of data, but the data is stored differentially as true and complement data. The important variation of the embodiment is that two transistors MN3 and MN4 shown in FIG. 3 are eliminated and two capacitors MC3 and MC4 are replaced with capacitors C3 and C4, which are manufactured by a DRAM process and can be DRAM capacitors, for example. A bias voltage $V_{BIAS}$ is applied to one terminal of each of the capacitors. For variations, the capacitors can be capacitors manufactured by a FRAM (Ferroelectric random-access memory), DRAM or MIM (metal-insulator-metal) capacitor process. Either poly-silicon or metal-insulator-metal (MIM) capacitors can be used for the capacitors. The MIM capacitor module, which is inserted into the backend process of integrated circuit manufacturing, results in a very low capacitance density. The capacitance density is proportional to the reverse of the dielectric thickness. Often, sophisticated additional metal and dielectric layers must be added for high capacitance density.

Operations of such 3-port CAM cell are familiar with the operations described in FIG. 12 except a separate pair of bit lines BL1 and BL1# and an additional word line WL1 are provided in this type of CAM cell of the third preferred embodiment of the invention. These features are the same as described in the first type of 3-port CAM cell shown in FIG. 13.

Type 6—3-Port CAM Cell Variation V

Figure 18:
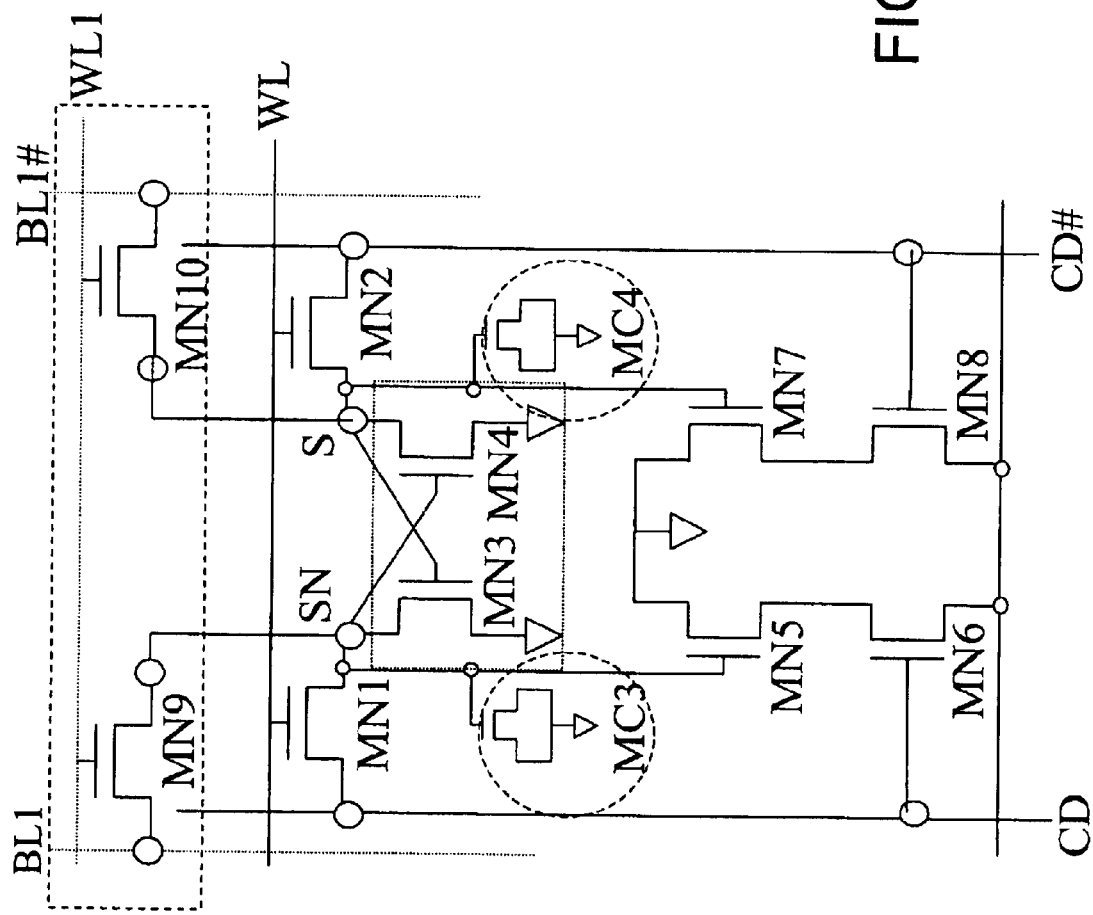
FIG. 18 is a diagram of a fifth variation of the 3-port dynamic differential CAM as shown in FIG. 13 of the third preferred embodiment of the invention.

Refer to FIG. 18, which is a diagram of a fifth variation of the 3-port dynamic differential CAM, as shown in the FIG. 13 of the third preferred embodiment of the invention. A pair of bit lines CD and CD# carry true and complement data to a column of cells. Two pass transistors MN1 and MN2 are turned on when word line WL is driven with a high voltage during a write operation. The pass transistor MN1 connects bit line CD to the gate of storage transistor MN4 and capacitor MC3. Pass transistors MN2 connects bit line CD# to the gate of storage transistors MN3 and capacitor MC4. One gate is charged high while the other gate is charged low. The capacitors MC3 and MC4 can be MOS capacitors, which meet the requirements of the manufacturing process.

Figure 1:
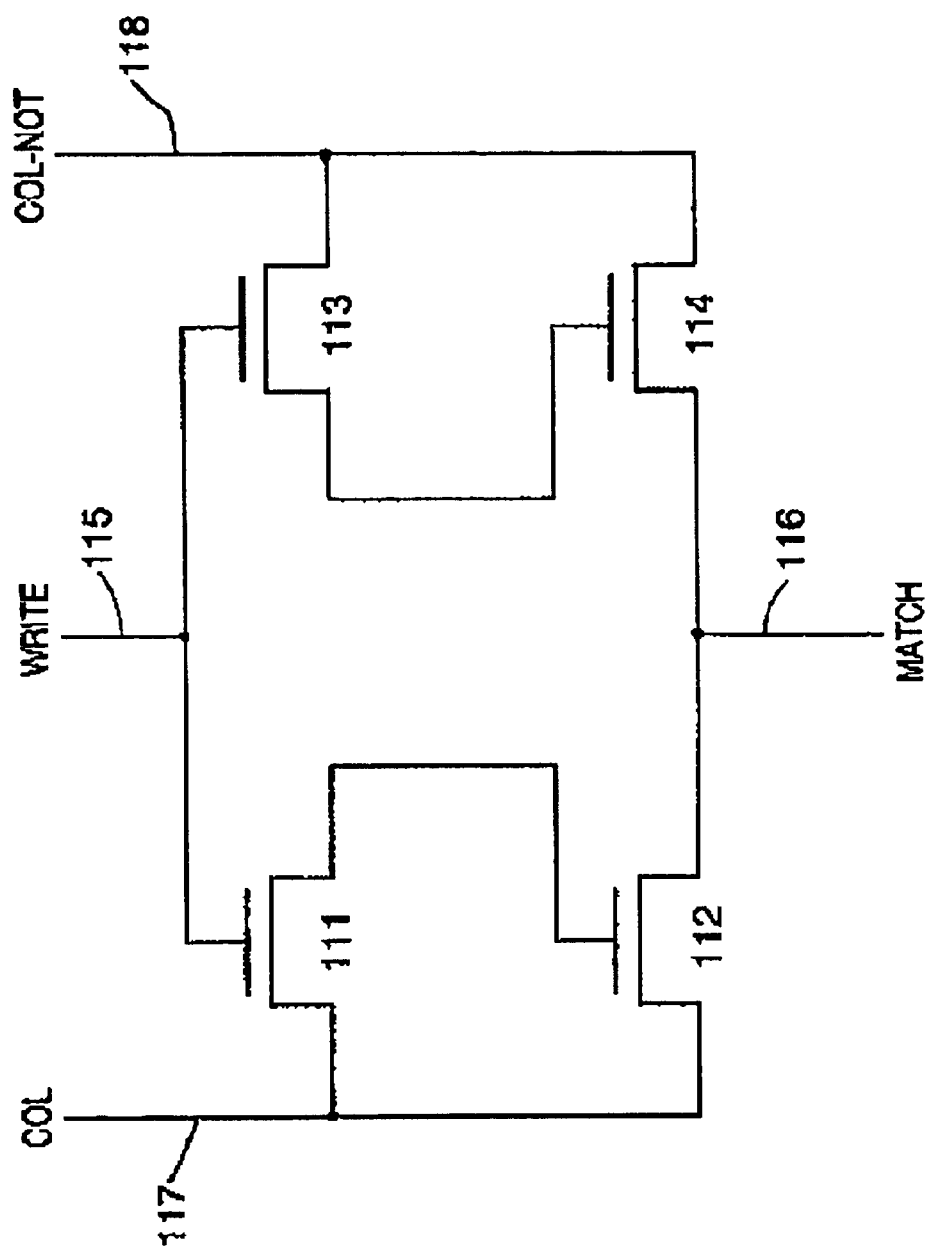
FIG. 1 shows a conventional dynamic CAM cell using six transistors.
Figure 2:
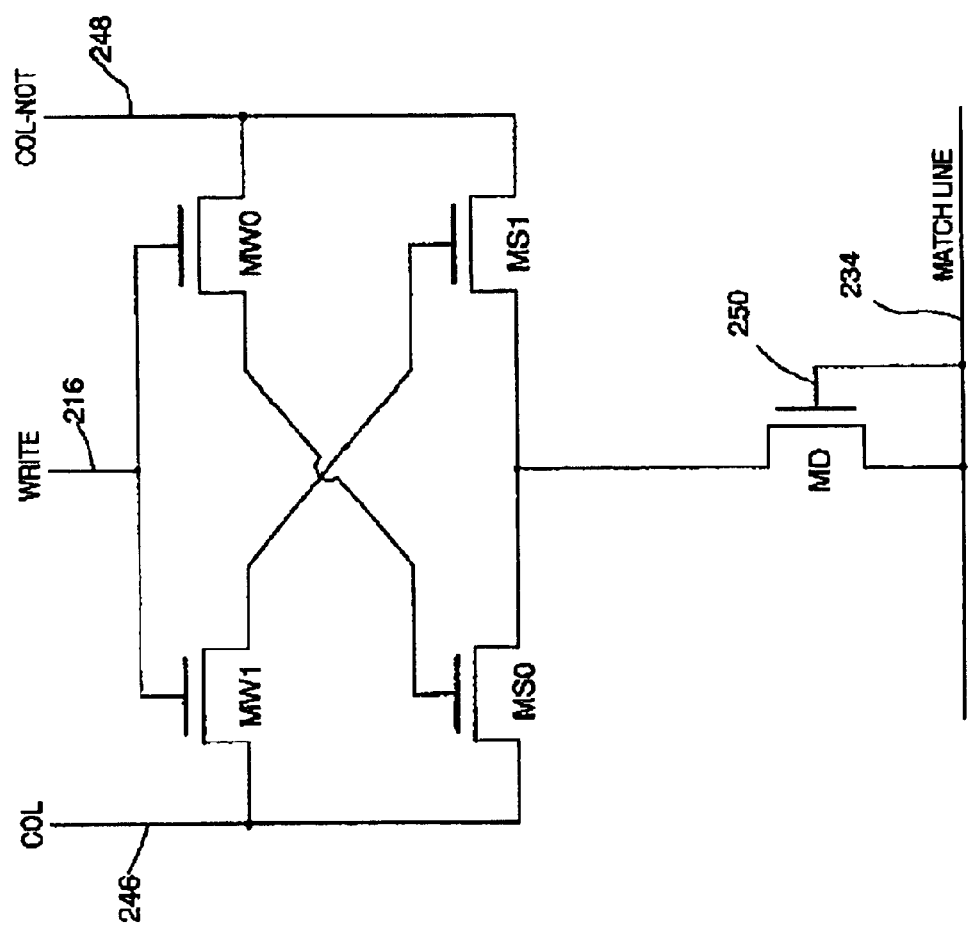
FIG. 2 is a conventional dynamic CAM cell using CMOS transistors.

Operations of such 3-port CAM cell are familiar with the operations described in FIG. 1 except a separate pair of bit lines BL1 and BL1# and an additional word line WL1 are provided in this type of CAM cell of the third preferred embodiment of the invention.

As described above, these two word lines can be arranged as followed. In a case that if word line WL is used for SRAM write operation, the other word line WL1 is used for refresh. In another case that if word line WL is used for write operation, the other word line WL1 is used for read operation, while a wave-pipeline technique is used for refresh cycle (which means hidden refresh). In further case that if word line WL is used for write operation, word line WL1 is used for read operation, while idle a refresh cycle for such dynamic CAM cell.

As describe above, there bit lines can be arranged as followed. In a case that Match operation and Read/Write operation can be performed in the same cycle through a pair of bit lines CD, CD# as well as bit lines BL1, BL1#, while a wave-pipeline technique for refresh cycle (which means hidden refresh). In other case that Match operation and Read/Write operation can be performed in the same cycle through different pair of bit lines, while idle one cycle for refresh.

For combing these arrangements together, which means two pairs of bit lines CD, CD# and BL1, BL1#, and two word lines WL, WL1 are provided. These features described above for two-pair bit lines and two word lines can be incorporated together for different purposes. For example, if word line WL is used for SRAM write operation, the other word line WL1 is used for refresh. The Match operation can be performed in the same cycle when write operation and refresh operation are performed. Another arrangement can also that if word line WL is for write operation, the word line WL1 is for read operation, while a wave-pipeline technique for hidden refresh is used for a refresh cycle (which means hidden refresh) and Match operation is performed in the same cycle. Another choice of arrangement is that if the word line WL is for write operation, the other word line WL1 is for read operation, while Match operation is performed in the same cycle and idle a refresh cycle for refresh operation (for dynamic CAM cells). The read/write operation accompanying with the refresh operation will be described in tails in FIG. 66.

Type 7—3-Port CAM Cell Variation VI

Figure 19:
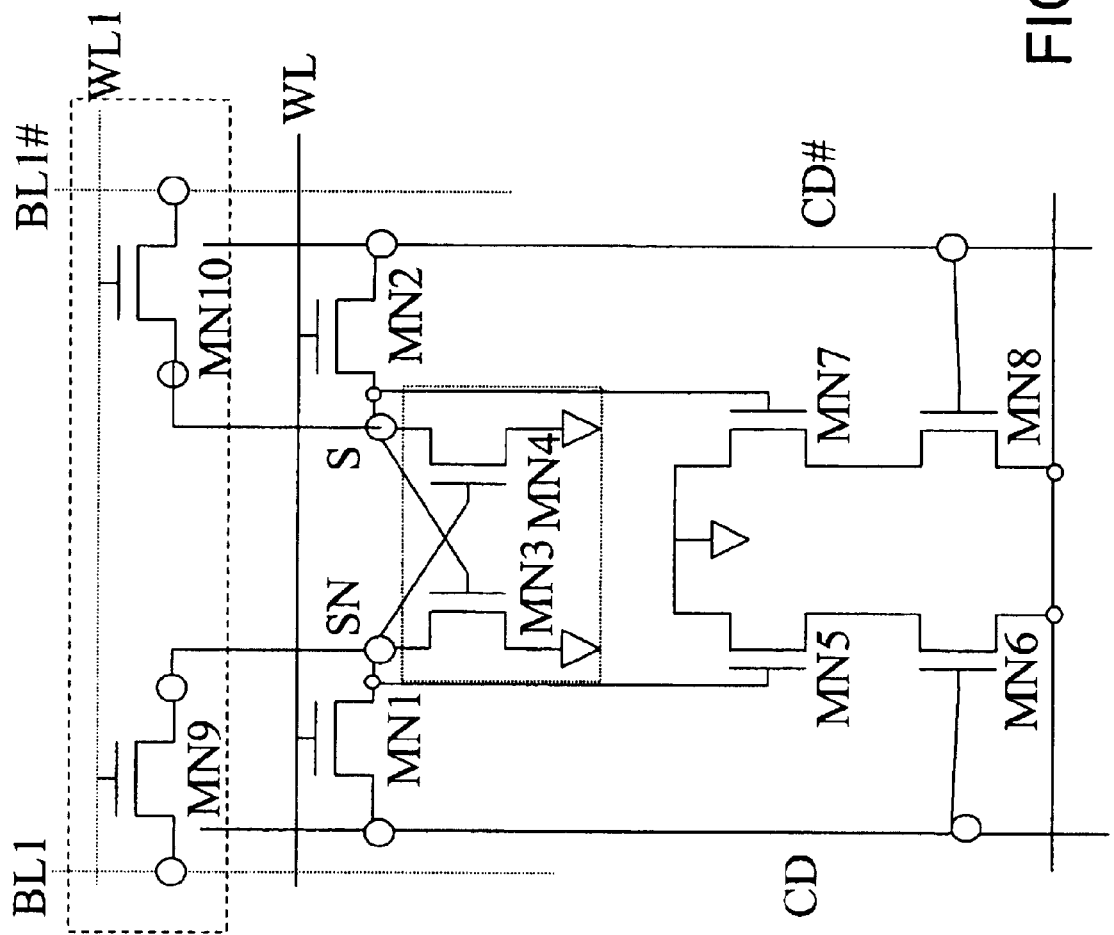
FIG. 19 is a diagram of a sixth variation of the 3-port dynamic differential CAM as shown in FIG. 13 of the third preferred embodiment of the invention.

Refer to FIG. 19, which is a diagram of a sixth variation of the 3-port dynamic differential CAM, as shown in the FIG. 13 of the third preferred embodiment of the invention This CAM cell stored one bit of data, but the data is stored differentially as true and complement data. The important variation of the embodiment is that two capacitors MC3 and MC4, such as MOS capacitors, which are shown in FIG. 18 are eliminated.

Operations of such 3-port CAM cell are familiar with the operations described in FIG. 4 except a separate pair of bit lines BL1 and BL1# and an additional word line WL1 are provided in this type of CAM cell of the third preferred embodiment of the invention. These features are the same as described in the first type of 3-port CAM cell shown in FIG. 18.

Type 8—3-Port CAM Cell Variation VII

Figure 20:
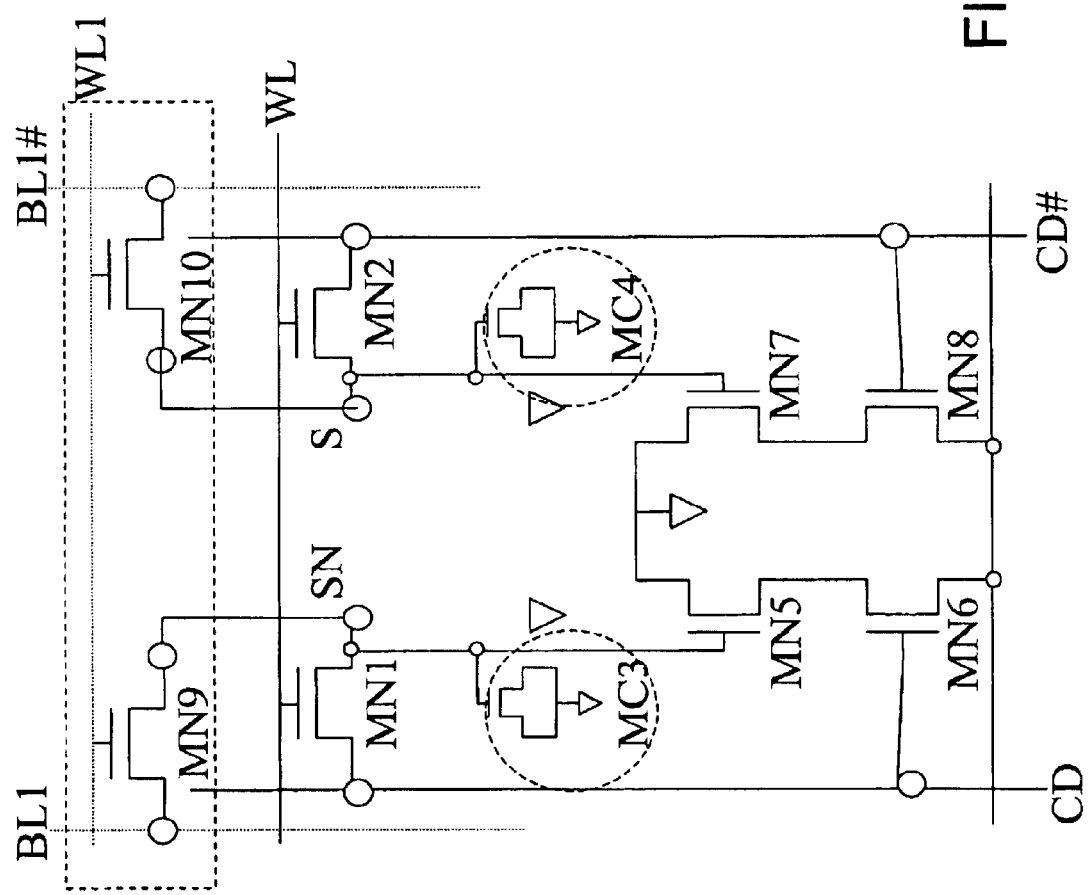
FIG. 20 is a diagram of a seventh variation of the 3-port dynamic differential CAM as shown in FIG. 13 of the third preferred embodiment of the invention.

Refer to FIG. 20, which is a diagram of a seventh variation of the 3-port dynamic differential CAM, as shown in the FIG. 13 of the third preferred embodiment of the invention. This CAM cell stored one bit of data, but the data is stored differentially as true and complement data. The important variation of the embodiment is that two transistors MN3 and MN4 shown in FIG. 18 are eliminated.

Operations of such 3-port CAM cell are familiar with the operations described in FIG. 5 except a separate pair of bit lines BL1 and BL1# and an additional word line WL1 are provided in this type of CAM cell of the third preferred embodiment of the invention. These features for adding the additional pair of bit lines and word line are the same as described in the first type of 3-port CAM cell shown in FIG. 18.

Type 9—3-Port CAM Cell Variation VIII

Figure 21:
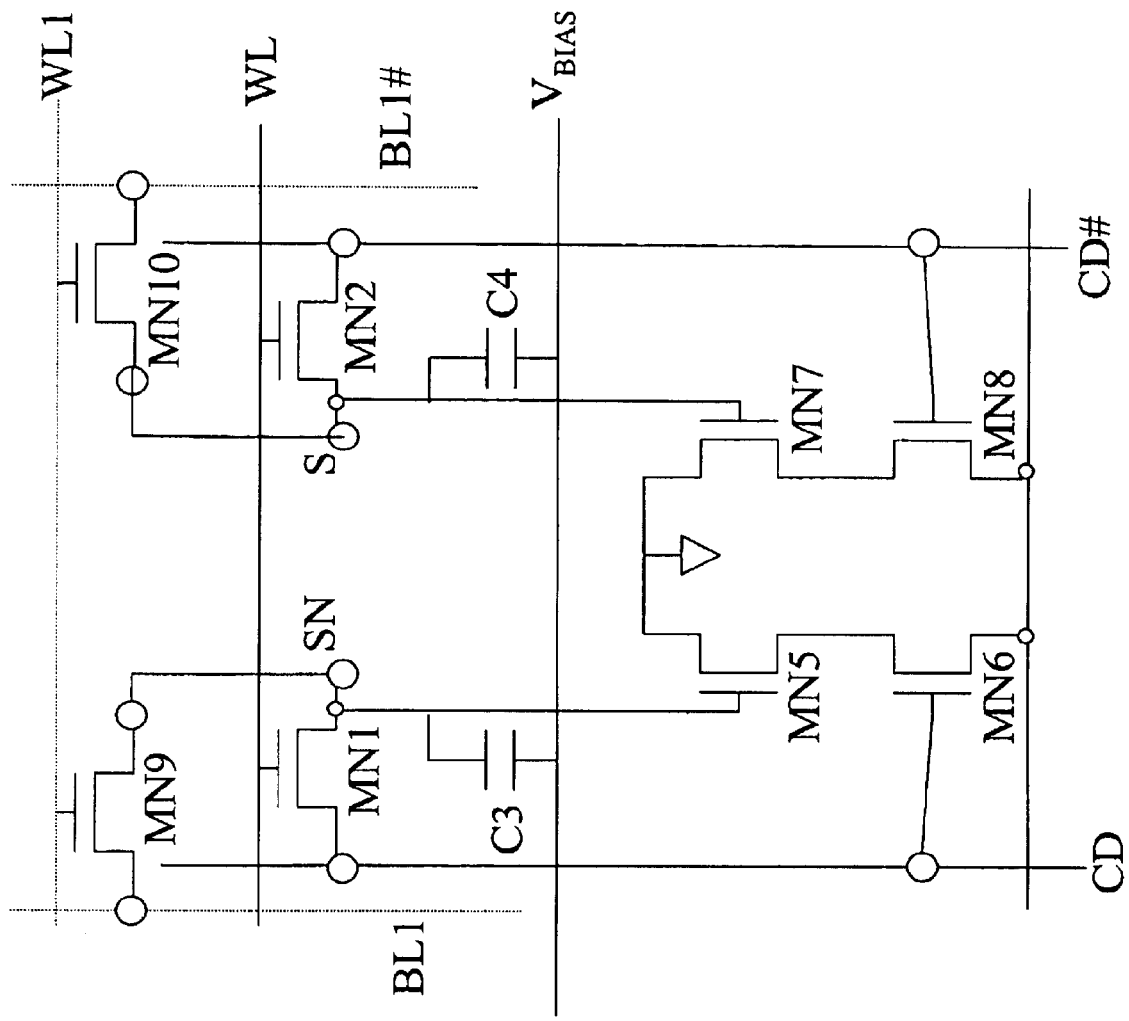
FIG. 21 is a diagram of a eighth variation of the 3-port dynamic differential CAM as shown in FIG. 13 of the third preferred embodiment of the invention.

Refer to FIG. 21, which is a diagram of an eighth variation of the 3-port dynamic differential CAM, as shown in the FIG. 13 of the third preferred embodiment of the invention. This CAM cell stored one bit of data, but the data is stored differentially as true and complement data. The important variation of the embodiment is that two transistors MN3 and MN4 shown in FIG. 3 are eliminated and two capacitors MC3 and MC4 are replaced by the capacitors C3 and C4, which are manufactured by a DRAM process and can be DRAM capacitors, for example. A bias voltage $V_{BIAS}$ is applied to one terminal of each of the capacitors. For variations, the capacitors can be capacitors manufactured by a FRAM (Ferroelectric random-access memory), DRAM or MIM (metal-insulator-metal) capacitor process. Either polysilicon and metal-insulator-metal (MIM) capacitors can be used for the capacitors. The MIM capacitor module, which is inserted into the backend process of integrated circuit manufacturing, results in a very low capacitance density. The capacitance density is proportional to the reverse of the dielectric thickness. Often, sophisticated additional metal and dielectric layers must be added for high capacitance density.

Operations of such 3-port CAM cell are familiar with the operations described in FIG. 7 except a separate pair of bit lines BL1 and BL1# and an additional word line WL1 are provided in this type of CAM cell of the third preferred embodiment of the invention. These features for adding the additional pair of bit lines and word line are the same as described in the first type of 3-port CAM cell shown in FIG. 18.

Applications of the Embodiments of CAM Cells

In the first, second and third preferred embodiments of the CAM cells of the invention, different combinations or modifications of such CAM cells can be implemented in accordance with the design requirements. Accompanying peripheral circuits can also be designed in accordance with the memory products. These CAM cells can also be embedded in some specific-purpose semiconductor products in supports of comparing the desired information against the entire list of pre-stored entries simultaneously, often resulting in an order-of-magnitude reduction in the search time.

Figure 22:
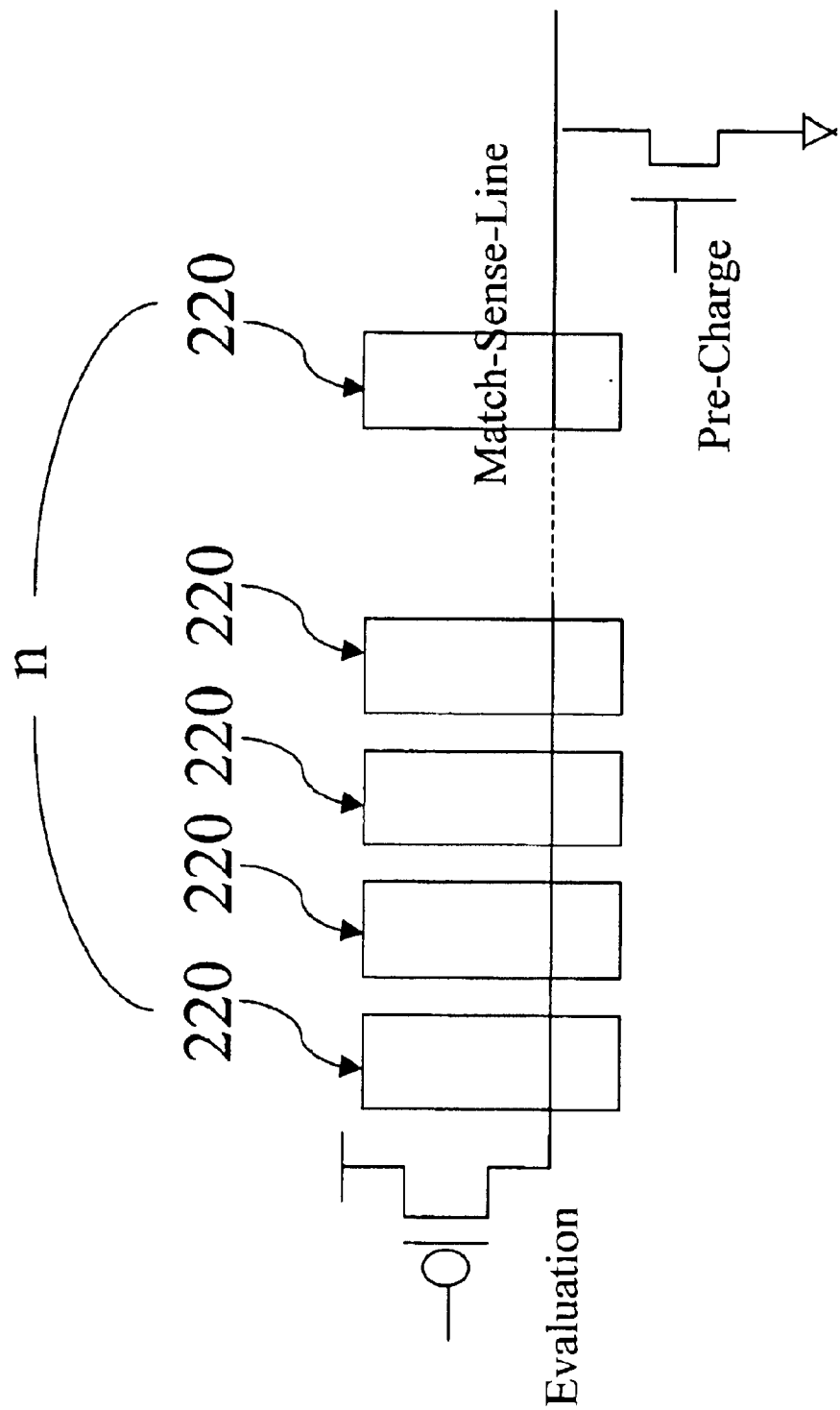
FIG. 22 shows an embodiment of a simple peripheral circuit with CAM cells described above for one-word comparison operation.

Refer to FIG. 22, which shows an embodiment of a simple peripheral circuit with CAM cells describe above for one word comparison operation. In such arrangement, the number of CAM cells 220 is dependent on the bit number of the one-word comparison; for example, n bits being compared simultaneously and a match signal being signaled after comparison, as shown in FIG. 22. The CAM cells can be one of all types of the CAM cells described in the first, second and third preferred embodiments. The match sense line (MSL) is pre-charged high before a compare operation. When the comparing data matches the stored data in the CAM cells, match sense line MSL remains high. When the comparing data matches the stored data in the CAM cells, match sense line MSL remains high. When the comparing data does not match the stored data in the CAM cells, match sense line MSL is pulled low. In such architecture, a n-bit word comparison operation can be easily implemented.

Figure 23:
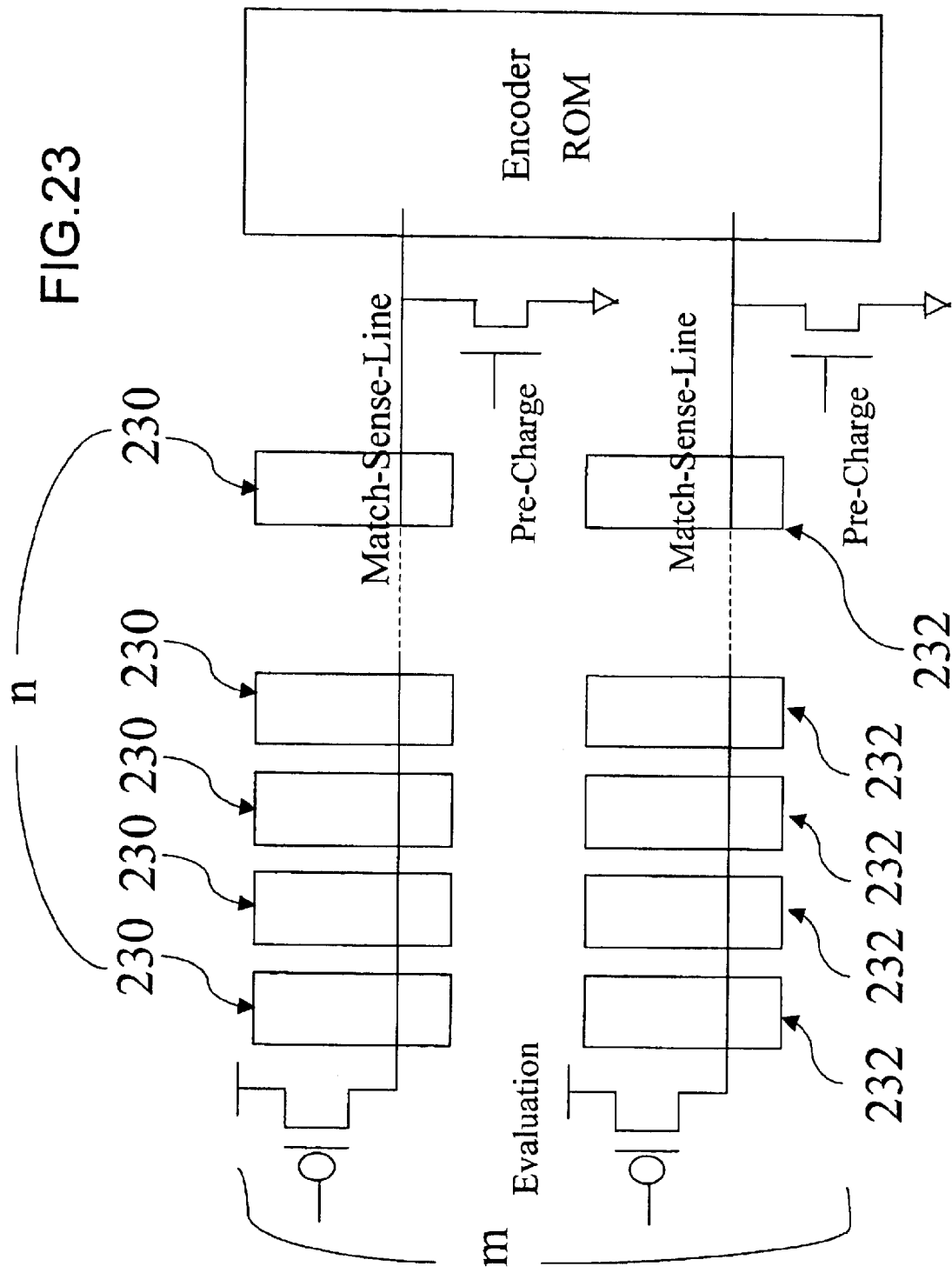
FIG. 23 shows an embodiment of a simple peripheral circuit with CAM cells described above for multiple-word comparison operation.

Refer to FIG. 23, which shows an embodiment of a simple peripheral circuit with CAM cells describe above for multiple-word comparison operation. In such arrangement, the number of CAM cells 230 is dependent on the bit number of the word for such comparison; for example, n bits of one word being compared simultaneously and a match signal being signaled after comparison. For multiple words, for example, m words, m rows for n-bit comparison will be arranged for such m-word comparison. The CAM cells can be one of all types of the CAM cells described in the first, second and third preferred embodiments. The match sense line (MSL) is pre-charged high before a compare operation. When the comparing data matches the stored data in the CAM cells, match sense line MSL remains high. When the comparing data matches the stored data in the CAM cells, match sense line MSL remains high. When the comparing data does not match the stored data in the CAM cells, match sense line MSL is pulled low. By using a encoder device, such as encoder ROM, a result signal can be easily signaled for simultaneously comparing m words. The numbers, of m and n are determined in accordance with the design requirements.

NOR CAM Cells for Preferred Embodiments

The CAM cells in the first, second and third preferred embodiments of the invention are NAND-type CAM cells implemented by all NMOS. In such designs, the spacing between two n-channel transistors is much smaller. Thus the size of the cell is larger when p-channel transistors are included with the n-channel transistors. In the following several embodiments, a NOR-type CAM cell implemented by all p-channel transistors is described for different applications of such CAM cells. There is no such spacing problem and the size of the cell can also be reduced. The data stored in such CAM cells is implemented by using a pair of true and complement terminals. If these two terminals both store "1", it means that the CAM cell is in a status of "Don't Care."

The embodiment relates to a CAM cell using multiple ports for operations in accordance with design requirements. For example, in the following embodiments, one design single port word line and bit line, one design for two port word lines, one design for two port bit lines; or one design for two port word lines and two port bit lines. One arrangement with two-port word line can be: (i) one port for refresh and other port for SRAM write operation, (ii) one port for read operation and other port for write operation, while a wave-pipeline technique for refresh cycle (which means hidden refresh), or (iii) one port for read operation and other port for write operation, while idle a refresh cycle for such dynamic CAM cell. One arrangement with two-port bit line can be: (i) Match operation and Read/Write operation can be performed in the same cycle, while a wave-pipeline technique for refresh cycle (which means hidden refresh), or (ii) Match operation and Read/Write operation can be performed in the same cycle, while idle one cycle for refresh. One arrangement with two-port bit line and two-port word line can be: (i) one word-line port for refresh and the other word-line port for SRAM write operation, while the Match operation can be performed in the same cycle; (ii) one word-line port for read operation and the other word-line port for write operation, while a wave-pipeline technique for hidden refresh is used for a refresh cycle (which means hidden refresh) and Match operation is performed in the same cycle; or (iii) one word-line port for read operation and the other word-line port for write operation, while Match operation is performed in the same cycle and idle a refresh cycle for refresh operation (for dynamic CAM cells). Such 3-port dynamic differential CAM cells can be implemented by any CMOS technologies, such as FRAM, DRAM, logic technology, etc. These CAM cells can be combined and modified in accordance with different purposes. These different types of CAM cells are described hereafter.

Forth Embodiment—CAM Cell

Type 1—Single-Port CAM Cell

Figure 24:
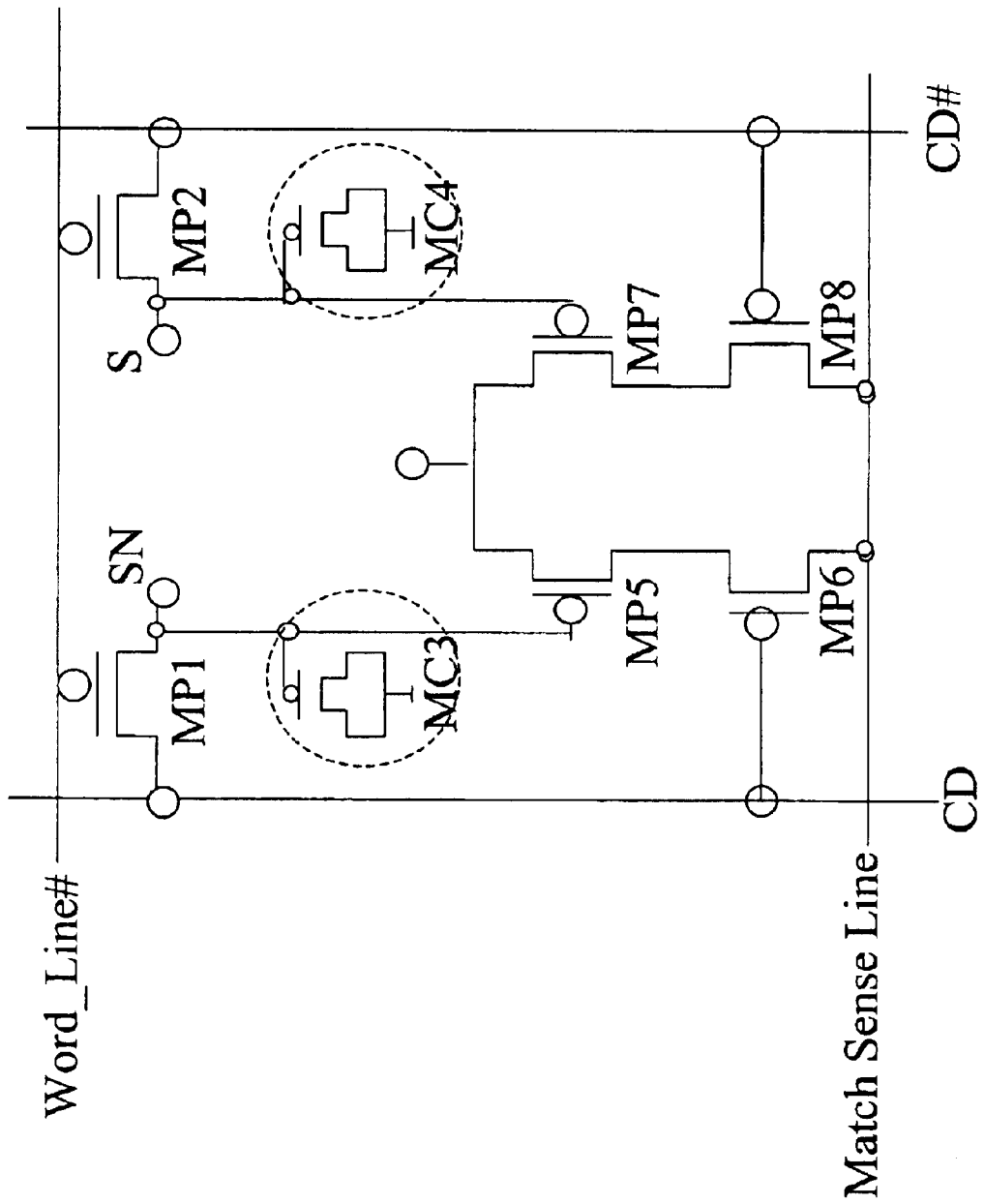
FIG. 24 is a diagram of a single-port dynamic differential CAM cell of a forth embodiment of the invention.

Refer to FIG. 24, which is a diagram of a single-port dynamic differential CAM cell of a forth embodiment of the invention. This CAM cell stored one bit of data, but the data is stored differentially as true and complement data, as shown in terminals S and SN. If these two terminals S and SN both store "1", it means that the CAM cell is in a status of "Don't Care." All transistors using in such CAM cell are p-channel transistors (PMOS).

A pair of bit lines CD, CD# carry true and complement data to a column of cells. Two pass transistors MP1 and MP2 are turned on when word line WL is driven with a high voltage and the complement word line Word_Line# which is coupled to the gates of the pass transistors MP1 and MP2 is driven with a low voltage during a write operation. The pass transistor MP1 connects bit line CD to the capacitor MC3. Pass transistors MP2 connects bit line CD# to the capacitor MC4. One gate is charged high while the other gate is charged low. The capacitors MC3 and MC4 can be, for example, MOS capacitors to meet the requirements of manufacturing process.

During read/write operation, complement word line Word_Line# is driven low for turning on the pass transistors MP1 and MP2. For storing data 1, bit line CD is high, storing charges in the capacitor MC3. Bit line CD# is low, driving a low voltage to the capacitor MC4 and storing little or no charges on the capacitor MC4. When Word_Line# is driven high, the accompanying capacitor MC3 stores charges while the capacitor MC4 stores little or no charges. The opposite occurs when a data 0 is written to the cell. That is, the capacitor MC3 store a positive charge while the capacitor MC4 stores little or no charge. Such arrangement can also be changed in accordance with the practical design. For example, for storing data 1, the capacitor MC3 can also store little or no charges while the capacitor MC4 stores lots of charges, which is totally different arrangement for the capacitor MC3 storing lots of charges. That is, the data can be stored differentially as true and complement data, in accordance with real requirements. In the embodiment, the former arrangement is introduced herewith.

Match sense line (MSL) is held low during read and write operations. MSL is pre-charged high before a compare operation.

The cell can be read by equalizing and pre-charging both bit lines CD and CD# to an intermediate voltage before Word_Line# is driven low. One bit line is then driven low and the other is driven high by charges sharing as pass transistors MP1 and MP2 are turned on. A sensitive sense amplifier can then detect a slight voltage difference on bit lines CD and CD#. The cell can be refreshed by writing the sensed data back to the bit lines.

During a match or compare operation, the Word_Line# is driven high and the pass transistors MP1 and MP2 remain off. Thus the stored charges on the capacitors MC3 and MC4 are isolated and not disturbed.

A comparing data from bit lines CD and CD# are applied to the gates of match transistors MP6 and MP8 respectively. The complements of the comparing data are applied to these bit lines during the compare operation. Thus bit line CD carries the complement of the true comparing data. Complement bit line CD# carries the true comparing data.

When the comparing data matches the stored data in the CAM cell, match sense line MSL remains high. For example, when the cell stores a 1, the charges stored on the capacitor MC3 turns off the transistor MP5. The transistor MP7 is turned on because the capacitor MC4 stores little or no charges. The true comparing data is applied to bit line CD# while the complement comparing data is applied to bit line CD. Since the comparing data is also a 1, CD is low while CD# is high. Thus transistor MP5 is off, blocking current flow through the transistor MP6, which is turned on by CD. The transistor MP8 is off, which remains off because the CD# is high, also blocking current flow through the transistor MP8. Thus no discharge path to ground occurs, since transistors MP5 and MP8 are off.

When the cell stores a 0, the transistor MP5 is turned on because the capacitor MC3 stores little or no charges. The transistor MP7 remains off because the capacitor MC4 stores lots of charges. The true comparing data is applied to bit line CD# while the complement comparing data is applied to bit line CD. Since the comparing data is also a 0, CD# is low while CD is high. Thus transistor MP6 is off, blocking current flow through the transistor MP5, which is turned off by the high voltage applied to CD. The transistor MP7 is off, also blocking current flow through the transistor MP8, which is turned on by the CD#. Thus no discharge path to ground occurs, since transistors MP6 and MP7 are off.

When the comparing data does not match the stored data in the CAM cell, match sense line MSL is pulled low. For example, when the stored data is "1," the stored charges on the capacitor MC4 turns on the transistor MP7. When the comparing data is "0", the true comparing data applied to the bit line CD# is low, which turns the transistor MP8 on. Both transistors MP7 and MP8 are turned on, causing the match sense line MSL to be discharged to ground or Vcc. Thus a mismatch is signaled.

The match sense line MSL is also pulled low when the stored data is low but the comparing data is high. When the stored data is "0," the transistor MP5 is turned off because a low voltage is applied to the gate of the transistor MP5. When the comparing data is "1", the complement comparing data applied to the bit line CD# is high and a low signal is applied to bit line CD, which turns the transistor MP6 on. Both transistors MP5 and MP6 are turned on, causing the match sense line MSL to be discharged to ground or Vcc. Thus a mismatch is signaled.

The CAM cell requires only PMOS transistors, which does not have to expand for well-to-well spacing as only a P-well or p-substrate is present within the cell.

Type 2—Single-Port CAM Cell Variation I

Figure 25:
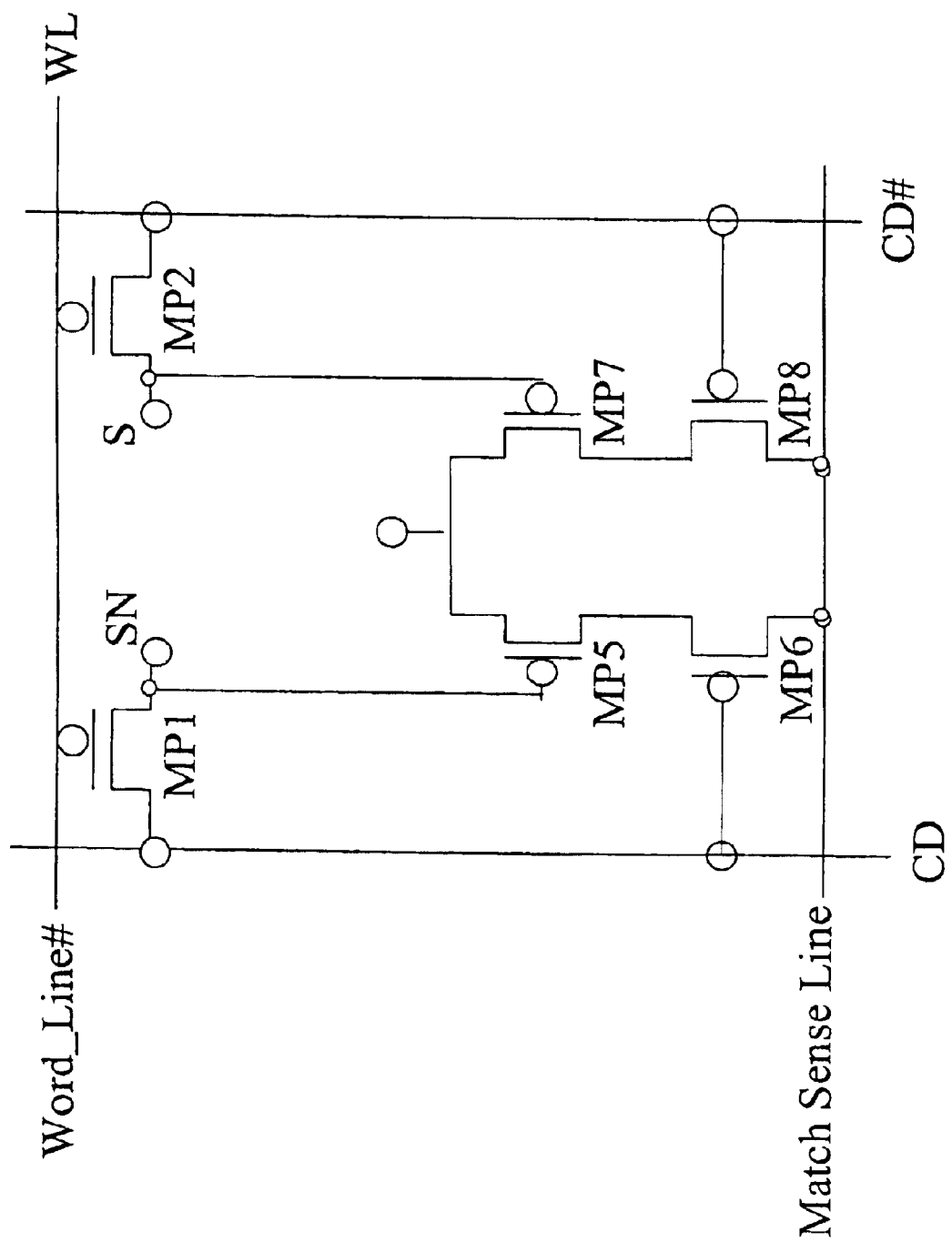
FIG. 25 is a diagram of a first variation of the single-port dynamic differential CAM as shown in FIG. 24 of the forth-preferred embodiment of the invention.

Refer to FIG. 25, which is a diagram of a first variation of the single-port dynamic differential CAM cell as of the forth embodiment of the invention, as shown in FIG. 24. This CAM cell stored one bit of data, but the data is stored differentially as true and complement data, as shown in terminals S and SN. If these two terminals S and SN both store "1", it means that the CAM cell is in a status of "Don't Care." All transistors using in such CAM cell are p-channel transistors (PMOS).

A pair of bit lines CD, CD# carry true and complement data to a column of cells. Two pass transistors MP1 and MP2 are turned on when word line WL is driven with a high voltage and the complement word line Word_Line# which is coupled to the gates of the pass transistors MP1 and MP2 is driven with a low voltage during a write operation. The pass transistor MP1 connects bit line CD to the gate of the transistor MP5. Pass transistors MP2 connects bit line CD# to the gate of the transistor MP7. One gate is charged high while the other gate is charged low. By using the capacitance of the gates of the transistors MP5 and MP7, data is stored differentially as true and complement data.

During read/write operation, complement word line Word_Line# is driven low for turning on the pass transistors MP1 and MP2. For storing data 1, bit line CD is high, storing charges in the gate of the transistor MP5. Bit line CD# is low, driving a low voltage to the gate of the transistor MP7. When Word_Line# is driven high, the gate of the transistor MP5 stores charges while the gate of the transistor MP7 stores little or no charges. The opposite occurs when a data 0 is written to the cell. That is, the gate of the transistor MP5 stores a positive charge while the gate of the transistor MP7 stores little or no charge.

Match sense line (MSL) is held low during read and write operations. MSL is pre-charged high before a compare operation.

The cell can be read by equalizing and pre-charging both bit lines CD and CD# to an intermediate voltage before Word_Line# is driven low. One bit line is then driven low and the other is driven high by charges sharing as pass transistors MP1 and MP2 are turned on. A sensitive sense amplifier can then detect a slight voltage difference on bit lines CD and CD#. Writing the sensed data back to the bit lines can refresh the cell.

During a match or compare operation, the Word_Line# is driven high and the pass transistors MP1 and MP2 remain off. Thus the stored charges on the gates of the transistors MP5 and MP7 are isolated and not disturbed.

A comparing data from bit lines CD and CD# are applied to the gates of match transistors MP6 and MP8 respectively. The complements of the comparing data are applied to these bit lines during the compare operation. Thus bit line CD carries the complement of the true comparing data. Complement bit line CD# carries the true comparing data.

When the comparing data matches the stored data in the CAM cell, match sense line MSL remains high. For example, when the cell stores a 1, the charges stored on the gate of the transistor MP5 turns off the transistor MP5. The transistor MP7 is turned on because the gate of the transistor MP7 stores little or no charges. The true comparing data is applied to bit line CD# while the complement comparing data is applied to bit line CD. Since the comparing data is also a 1, CD is low while CD# is high. Thus transistor MP5 is off, blocking current flow through the transistor MP6, which is turned on by CD. The transistor MP8 is off, which remains off because the CD# is high, also blocking current flow through the transistor MP8. Thus no discharge path to ground occurs, since transistors MP5 and MP8 are off.

When the cell stores a 0, the transistor MP5 is turned on because the capacitor MC3 stores little or no charges. The transistor MP7 remains off because the capacitor MC4 stores lots of charges. The true comparing data is applied to bit line CD# while the complement comparing data is applied to bit line CD. Since the comparing data is also a 0, CD# is low while CD is high. Thus transistor MP6 is off, blocking current flow through the transistor MP5, which is turned off by the high voltage applied to CD. The transistor MP7 is off, also blocking current flow through the transistor MP8, which is turned on by the CD#. Thus no discharge path to ground occurs, since transistors MP6 and MP7 are off.

When the comparing data does not match the stored data in the CAM cell, match sense line MSL is pulled low. For example, when the stored data is "1," the stored charges on the capacitor MC4 turns on the transistor MP7. When the comparing data is "0", the true comparing data applied to the bit line CD# is low, which turns the transistor MP8 on. Both transistors MP7 and MP8 are turned on, causing the match sense line MSL to be discharged to ground or Vcc. Thus a mismatch is signaled.

The match sense line MSL is also pulled low when the stored data is low but the comparing data is high. When the stored data is "0," the transistor MP5 is turned off because a low voltage is applied to the gate of the transistor MP5. When the comparing data is "1", the complement comparing data applied to the bit line CD# is high and a low signal is applied to bit line CD, which turns the transistor MP6 on. Both transistors MP5 and MP6 are turned on, causing the match sense line MSL to be discharged to ground or Vcc. Thus a mismatch is signaled.

The CAM cell requires only PMOS transistors, which does not have to expand for well-to-well spacing as only a P-well or p-substrate is present within the cell.

Type 3—2-Port CAM Cell

Figure 26:
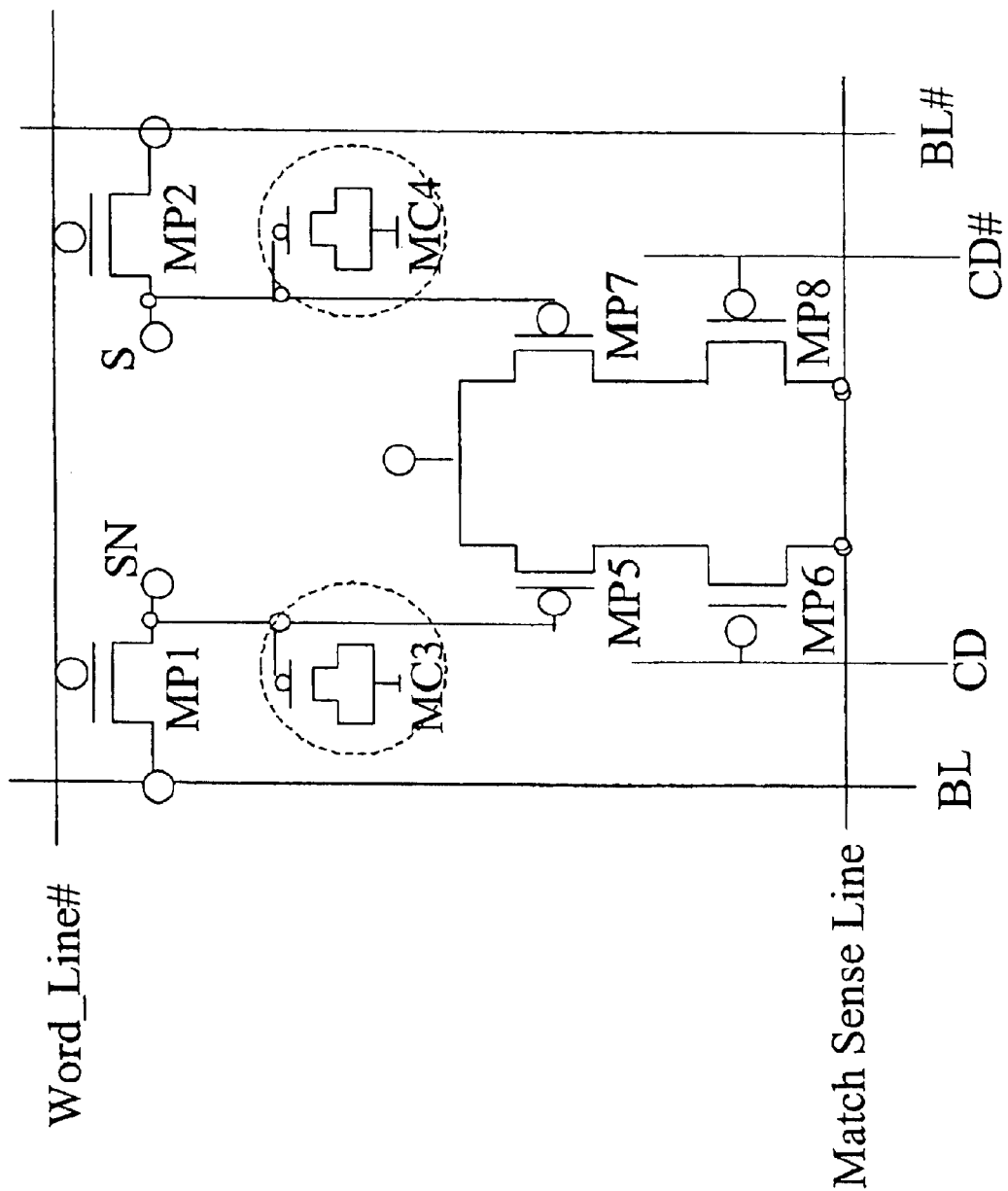
FIG. 26 is a diagram of a 2-port dynamic differential CAM as shown in FIG. 24 of the forth-preferred embodiment of the invention.

Refer to FIG. 26, which is a diagram of a 2-port dynamic differential CAM cell of the forth embodiment of the invention. This CAM cell stored one bit of data, but the data is stored differentially as true and complement data, as shown in terminals S and SN. If these two terminals S and SN both store "1", it means that the CAM cell is in a status of "Don't Care." All transistors using in such CAM cell are p-channel transistors (PMOS).

A pair of bit lines BL, BL# carry true and complement data to a column of cells. Two pass transistors MP1 and MP2 are turned on when word line WL is driven with a high voltage and the complement word line Word_Line# which is coupled to the gates of the pass transistors MP1 and MP2 is driven with a low voltage during a write operation. The pass transistor MP1 connects bit line BL to the capacitor MC3. Pass transistors MP2 connects bit line BL# to the capacitor MC4. One gate is charged high while the other gate is charged low. The capacitors MC3 and MC4 can be, for example, MOS capacitors to meet the requirements of manufacturing process.

During read/write operation, complement word line Word_Line# is driven low for turning on the pass transistors MP1 and MP2. For storing data 1, bit line BL is high, storing charges in the capacitor MC3. Bit line BL# is low, driving a low voltage to the capacitor MC4 and storing little or no charges on the capacitor MC4. When Word_Line# is driven high, the accompanying capacitor MC3 stores charges while the capacitor MC4 stores little or no charges. The opposite occurs when a data 0 is written to the cell. That is, the capacitor MC3 store a positive charge while the capacitor MC4 stores little or no charge. Such arrangement can also be changed in accordance with the practical design. For example, for storing data 1, the capacitor MC3 can also store little or no charges while the capacitor MC4 stores lots of charges, which is totally different arrangement for the capacitor MC3 storing lots of charges. That is, the data can be stored differentially as true and complement data, in accordance with real requirements. In the embodiment, the former arrangement is introduced herewith.

Match sense line (MSL) is held low during read and write operations. MSL is pre-charged high before a compare operation.

The cell can be read by equalizing and pre-charging both bit lines BL and BL# to an intermediate voltage before Word_Line# is driven low One bit line is then driven low and the other is driven high by charges sharing as pass transistors MP1 and MP2 are turned on. A sensitive sense amplifier can then detect a slight voltage difference on bit lines BL and BL#. The cell can be refreshed by writing the sensed data back to the bit lines.

During a match or compare operation, the Word_Line# is driven high and the pass transistors MP1 and MP2 remain off. Thus the stored charges on the capacitors MC3 and MC4 are isolated and not disturbed.

A comparing data from compare lines CD and CD# are applied to the gates of match transistors MP6 and MP8 respectively. The complements of the comparing data are applied to these bit lines during the compare operation. Thus compare line CD carries the complement of the true comparing data. Complement compare line CD# carries the true comparing data.

When the comparing data matches the stored data in the CAM cell, match sense line MSL remains high. For example, when the cell stores a 1, the charges stored on the capacitor MC3 turns off the transistor MP5. The transistor MP7 is turned on because the capacitor MC4 stores little or no charges. The true comparing data is applied to the compare line CD# while the complement comparing data is applied to the compare line CD. Since the comparing data is also a 1, the compare line CD is low while the compare line CD# is high. Thus transistor MP5 is off, blocking current flow through the transistor MP6, which is turned on by the compare line CD. The transistor MP8 is off, which remains off because the compare line CD# is high, also blocking current flow through the transistor MP8. Thus no discharge path to ground occurs, since transistors MP5 and MP8 are off.

When the cell stores a 0, the transistor MP5 is turned on because the capacitor MC3 stores little or no charges. The transistor MP7 remains off because the capacitor MC4 stores lots of charges. The true comparing data is applied to the compare line CD# while the complement comparing data is applied to bit line the compare line CD. Since the comparing data is also a 0, the compare line CD# is low while the compare line CD is high. Thus transistor MP6 is off, blocking current flow through the transistor MP5, which is turned off by the high voltage applied to the compare line CD. The transistor MP7 is off, also blocking current flow through the transistor MP8, which is turned on by the compare line CD#. Thus no discharge path to ground occurs, since transistors MP6 and MP7 are off.

When the comparing data does not match the stored data in the CAM cell, match sense line MSL is pulled low. For example, when the stored data is "1," the stored charges on the capacitor MC4 turns on the transistor MP7. When the comparing data is "0", the true comparing data applied to the compare line CD# is low, which turns the transistor MP8 on. Both transistors MP7 and MP8 are turned on, causing the match sense line MSL to be discharged to ground or Vcc. Thus a mismatch is signaled.

The match sense line MSL is also pulled low when the stored data is low but the comparing data is high. When the stored data is "0," the transistor MP5 is turned off because a low voltage is applied to the gate of the transistor MP5. When the comparing data is "1", the complement comparing data applied to the compare line CD# is high and a low signal is applied to the compare line CD, which turns the transistor MP6 on. Both transistors MP5 and MP6 are turned on, causing the match sense line MSL to be discharged to ground or Vcc. Thus a mismatch is signaled.

The CAM cell requires only PMOS transistors, which does not have to expand for well-to-well spacing as only a P-well or p-substrate is present within the cell.

Type 4—2-Port CAM Cell Variation I

Figure 27:
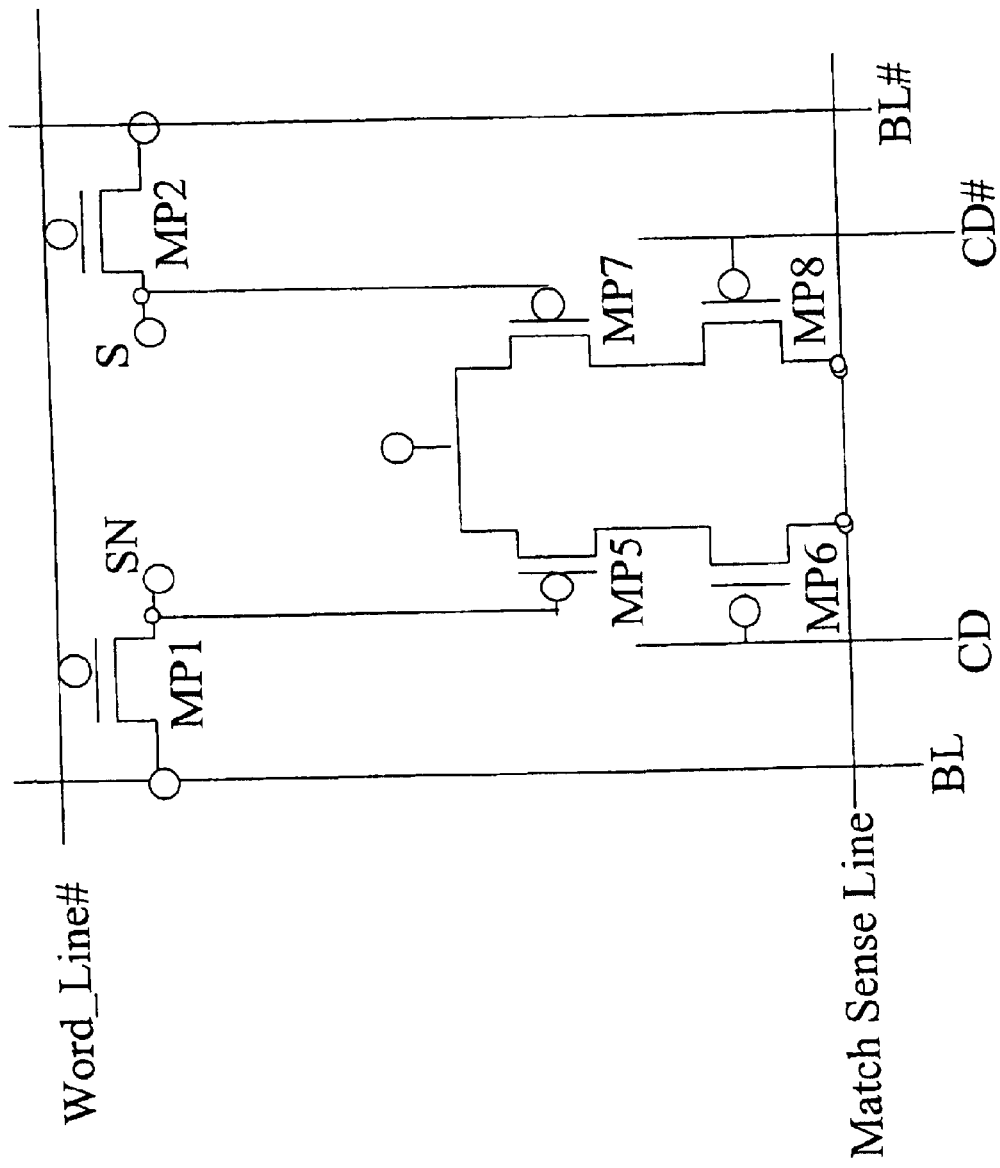
FIG. 27 is a diagram of a second variation of the 2-port dynamic differential CAM as shown in FIG. 26 of the forth preferred embodiment of the invention.

Refer to FIG. 27, which is a diagram of a first variation of the 2-port dynamic differential CAM cell as of the forth embodiment of the invention, as shown in FIG. 26. This CAM cell stored one bit of data, but the data is stored differentially as true and complement data, as shown in terminals S and SN. If these two terminals S and SN both store "1", it means that the CAM cell is in a status of "Don't Care." All transistors using in such CAM cell are p-channel transistors (PMOS).

A pair of bit lines BL, BL# carry true and complement data to a column of cells. Two pass transistors MP1 and MP2 are turned on when word line WL is driven with a high voltage and the complement word line Word_Line# which is coupled to the gates of the pass transistors MP1 and MP2 is driven with a low voltage during a write operation. The pass transistor MP1 connects bit line BL to the gate of the transistor MP5. Pass transistors MP2 connects bit line BL# to the gate of the transistor MP7. One gate is charged high while the other gate is charged low. By using the capacitance of the gates of the transistors MP5 and MP7, data is stored differentially as true and complement data.

During read/write operation, complement word line Word_Line# is driven low for turning on the pass transistors MP1 and MP2. For storing data 1, bit line BL is high, storing charges in the gate of the transistor MP5. Bit line BL# is low, driving a low voltage to the gate of the transistor MP7. When Word_Line# is driven high, the gate of the transistor MP5 stores charges while the gate of the transistor MP7 stores little or no charges. The opposite occurs when a data 0 is written to the cell. That is, the gate of the transistor MP5 stores a positive charge while the gate of the transistor MP7 stores little or no charge.

Match sense line (MSL) is held low during read and write operations. MSL is pre-charged high before a compare operation.

The cell can be read by equalizing and pre-charging both bit lines BL and BL# to an intermediate voltage before Word_Line# is driven low. One bit line is then driven low and the other is driven high by charges sharing as pass transistors MP1 and MP2 are turned on. A sensitive sense amplifier can then detect a slight voltage difference on bit lines BL and BL#. Writing the sensed data back to the bit lines can refresh the cell.

During a match or compare operation, the Word_Line# is driven high and the pass transistors MP1 and MP2 remain off. Thus the stored charges on the gates of the transistors MP5 and MP7 are isolated and not disturbed.

A comparing data from compare lines CD and CD# are separately applied to the gates of match transistors MP6 and MP8 respectively. The complements of the comparing data are applied to these bit lines during the compare operation. Thus the compare line CD carries the complement of the true comparing data. Complement compare line CD# carries the true comparing data.

When the comparing data matches the stored data in the CAM cell, match sense line MSL remains high. For example, when the cell stores a 1, the charges stored on the gate of the transistor MP5 turns off the transistor MP5. The transistor MP7 is turned on because the gate of the transistor MP7 stores little or no charges. The true comparing data is applied to the compare line CD# while the complement comparing data is applied to the compare line CD. Since the comparing data is also a 1, the compare line CD is low while the compare line CD# is high. Thus transistor MP5 is off, blocking current flow through the transistor MP6, which is turned on by the compare line CD. The transistor MP8 is off, which remains off because the compare line CD# is high, also blocking current flow through the transistor MP8. Thus no discharge path to ground occurs, since transistors MP5 and MP8 are off.

When the cell stores a 0, the transistor MP5 is turned on because the capacitor MC3 stores little or no charges. The transistor MP7 remains off because the capacitor MC4 stores lots of charges. The true comparing data is applied to the compare line CD# while the complement comparing data is applied to the compare line CD. Since the comparing data is also a 0, the compare line CD# is low while the compare line CD is high. Thus transistor MP6 is off, blocking current flow through the transistor MP5, which is turned off by the high voltage applied to the compare line CD. The transistor MP7 is off, also blocking current flow through the transistor MP8, which is turned on by the compare line CD#. Thus no discharge path to ground occurs, since transistors MP6 and MP7 are off.

When the comparing data does not match the stored data in the CAM cell, match sense line MSL is pulled low. For example, when the stored data is "1," the stored charges on the capacitor MC4 turns on the transistor MP7. When the comparing data is "0", the true comparing data applied to the compare line CD# is low, which turns the transistor MP8 on. Both transistors MP7 and MP8 are turned on, causing the match sense line MSL to be discharged to ground or Vcc. Thus a mismatch is signaled.

The match sense line MSL is also pulled low when the stored data is low but the comparing data is high. When the stored data is "0," the transistor MP5 is turned off because a low voltage is applied to the gate of the transistor MP5. When the comparing data is "1", the complement comparing data applied to the compare line CD# is high and a low signal is applied to the compare line CD, which turns the transistor MP6 on. Both transistors MP5 and MP6 are turned on, causing the match sense line MSL to be discharged to ground or Vcc. Thus a mismatch is signaled.

The CAM cell requires only PMOS transistors, which does not have to expand for well-to-well spacing as only a P-well or p-substrate is present within the cell.

Type 5—3-Port CAM Cell

Figure 28:
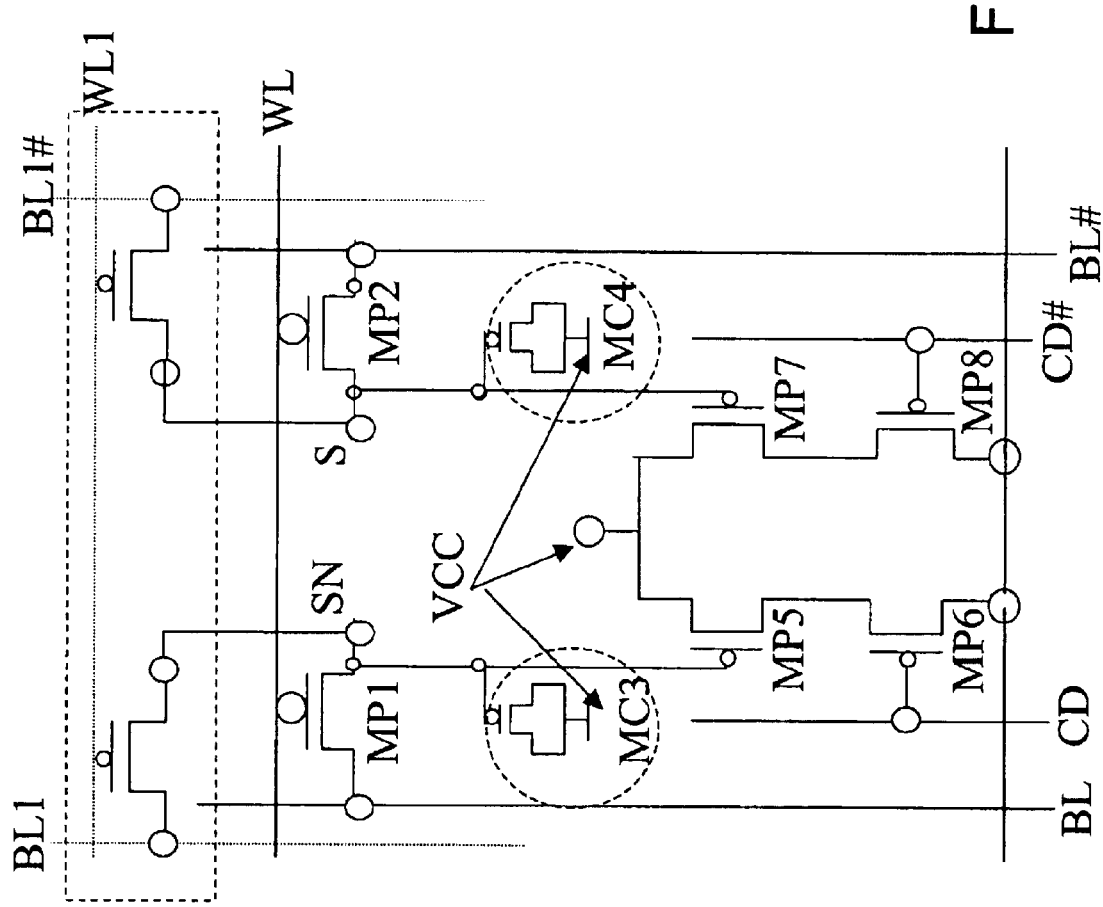
FIG. 28 is a diagram of a 3-port dynamic differential CAM of the forth-preferred embodiment of the invention.

Refer to FIG. 28, which is a diagram of a 3-port dynamic differential CAM of the forth-preferred embodiment of the invention. This CAM cell stored one bit of data, but the data is stored differentially as true and complement data.

Operations of such 3-port CAM cell are familiar with the operations described in FIG. 26 except a separate pair of bit lines BL1 and BL1# and an additional word line WL1 are provided in this type of CAM cell of the forth preferred embodiment of the invention.

These two word lines can be arranged as followed. In a case that if word line WL is used for SRAM write operation, the other word line WL1 is used for refresh. In another case that if word line WL is used for write operation, the other word line WL1 is used for read operation, while a wave-pipeline technique is used for refresh cycle (which means hidden refresh). In further case that if word line WL is used for write operation, word line WL1 is used for read operation, while idle a refresh cycle for such dynamic CAM cell.

As describe above, there bit lines can be arranged as followed. In a case that Match operation and Read/Write operation can be performed in the same cycle through different pair of bit lines, while a wave-pipeline technique for refresh cycle (which means hidden refresh). In other case that Match operation and Read/Write operation can be performed in the same cycle through different pair of bit lines, while idle one cycle for refresh.

For combing these arrangements together, which means two pairs of bit lines BL, BL# and BL1, BL1#, and two word lines WL, WL1 are provided. These features described above for two-pair bit lines and two word lines can be incorporated together for different purposes. For example, if word line WL is used for SRAM write operation, the other word line WL1 is used for refresh. The Match operation can be performed in the same cycle when write operation and refresh operation are performed. Another arrangement can also that if word line WL is for write operation, the word line WL1 is for read operation, while a wave-pipeline technique for hidden refresh is used for a refresh cycle (which means hidden refresh) and Match operation is performed in the same cycle. Another choice of arrangement is that if the word line WL is for write operation, the other word line WL1 is for read operation, while Match operation is performed in the same cycle and idle a refresh cycle for refresh operation (for dynamic CAM cells). The read/write operation accompanying with the refresh operation will be described in tails in FIG. 66.

Type 6—3-Port CAM Cell Variation I

Figure 29:
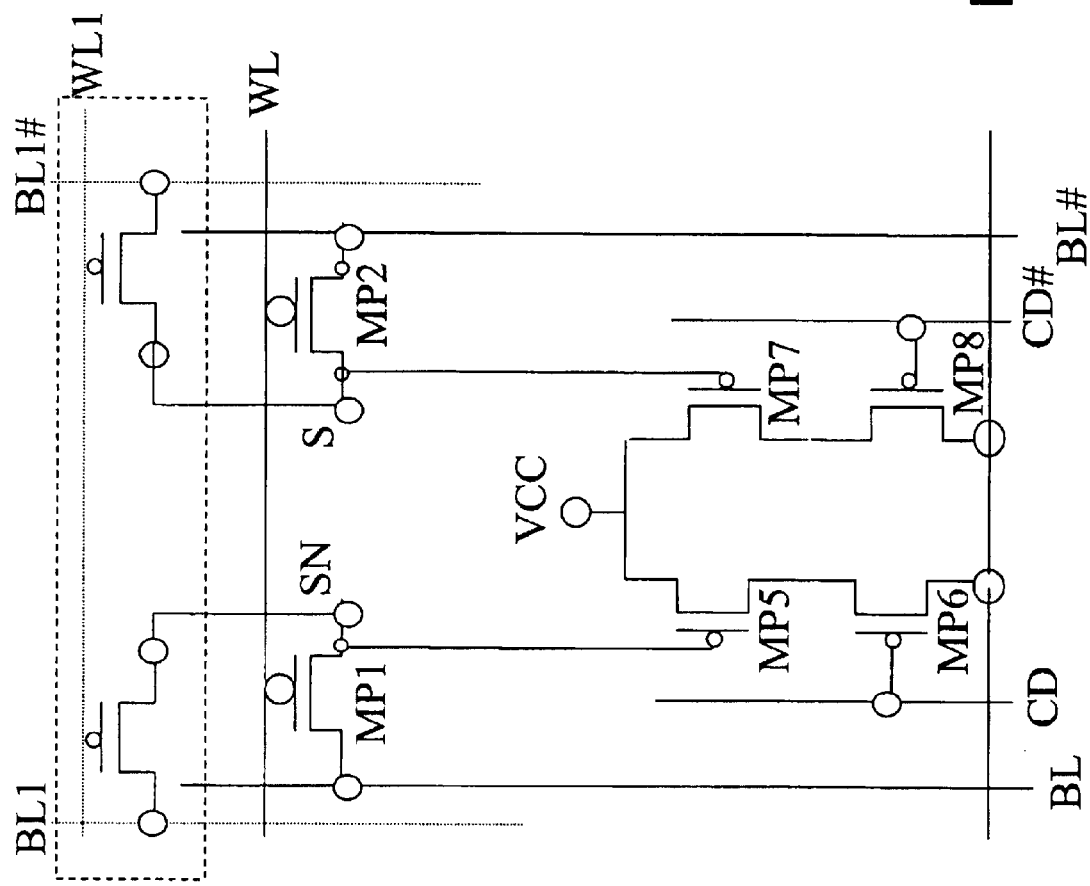
FIG. 29 is a diagram of a first variation of the 3-port dynamic differential CAM as shown in FIG. 28 of the forth-preferred embodiment of the invention.

Refer to FIG. 29, which is a diagram of a first variation of the 3-port dynamic differential CAM, as shown in the FIG. 28 of the forth preferred embodiment of the invention. This CAM cell stored one bit of data, but the data is stored differentially as true and complement data. The important variation of the embodiment is that two capacitors MC3 and MC4 shown in FIG. 28 are eliminated. The total size of CAM cell is significantly decreased, which meets the requirement of cost-down for such products.

Operations of such 3-port CAM cell are familiar with the operations described in FIG. 27 except a separate pair of bit lines BL1 and BL1# and an additional word line WL1 are provided in this type of CAM cell of the third preferred embodiment of the invention. These features are the same as described in the first type of 3-port CAM cell shown in FIG. 28.

Type 7—3-Port CAM Cell Variation II

Figure 30:
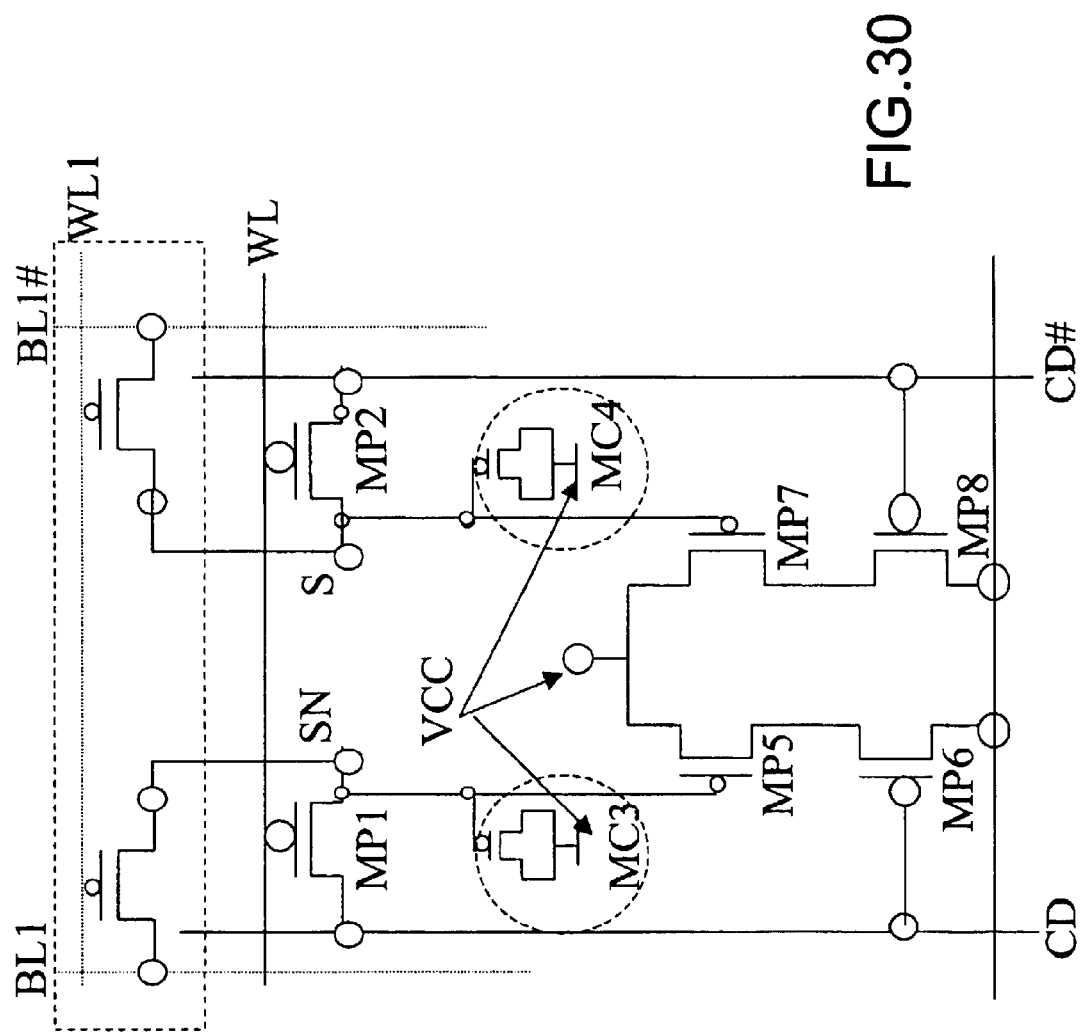
FIG. 30 is a diagram of a second variation of the 3-port dynamic differential CAM as shown in FIG. 28 of the forth-preferred embodiment of the invention.
Figure 31:
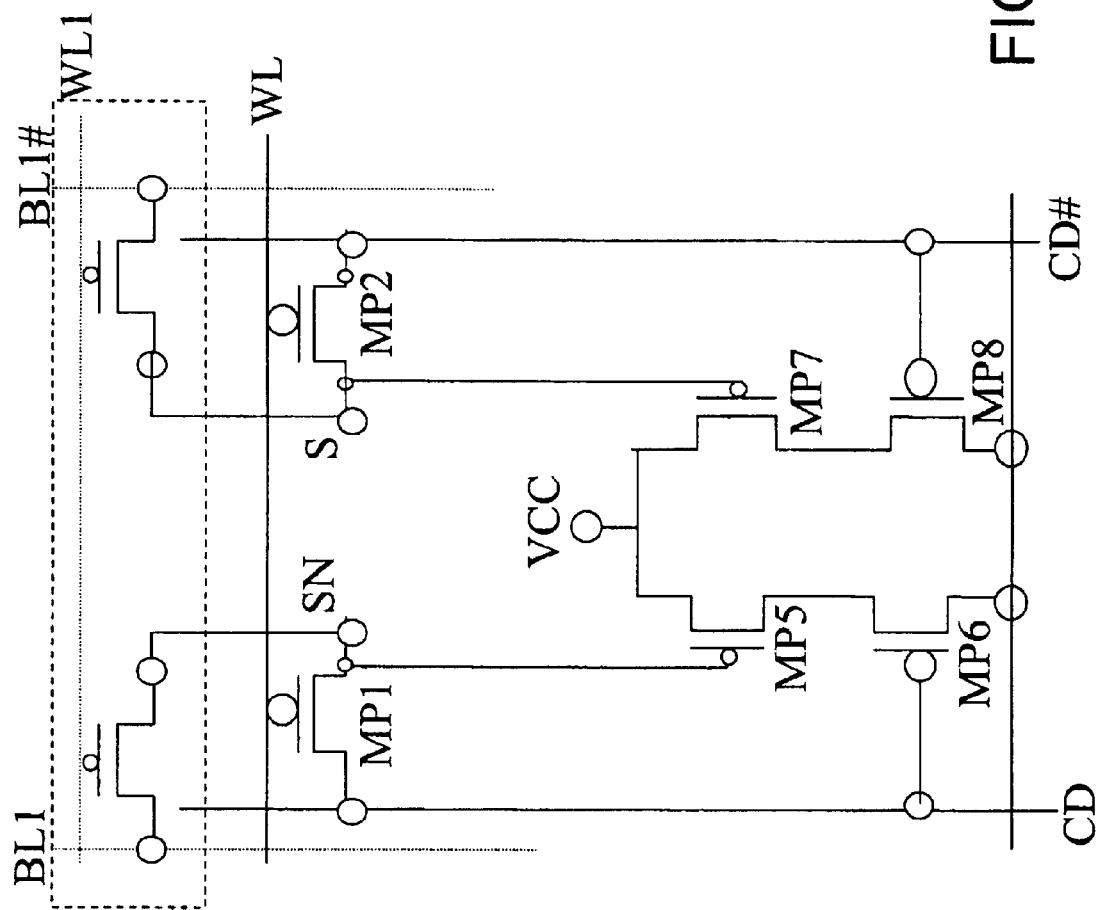
FIG. 31 is a diagram of a third variation of the 3-port dynamic differential CAM as shown in FIG. 28 of the forth-preferred embodiment of the invention.

Refer to FIG. 30, which is a diagram of a second variation of the 3-port dynamic differential CAM, as shown in the FIG. 28 of the forth preferred embodiment of the invention. This CAM cell stored one bit of data, but the data is stored differentially as true and complement data. The important variation of the embodiment is that Operations of such 3-port CAM cell are familiar with the operations described in FIG. 24 except a separate pair of bit lines BL1 and BL1# and an additional word line WL1 are provided in this type of CAM cell of the third preferred embodiment of the invention. These features are the same as described in the first type of 3-port CAM cell shown in FIG. 28.

Type 8—3-Port CAM Cell Variation III

Refer to FIG. 30, which is a diagram of a third variation of the 3-port dynamic differential CAM, as shown in the FIG. 28 of the forth preferred embodiment of the invention. This CAM cell stored one bit of data, but the data is stored differentially as true and complement data. The important variation of the embodiment is that Operations of such 3-port CAM cell are familiar with the operations described in FIG. 25 except a separate pair of bit lines BL1 and BL1# and an additional word line WL1 are provided in this type of CAM cell of the third preferred embodiment of the invention. These features are the same as described in the first type of 3-port CAM cell shown in FIG. 28.

Applications of the Embodiments of CAM Cells

In the forth-preferred embodiment of the CAM cells of the invention, different combinations or modifications of such CAM cells can be implemented in accordance with the design requirements. Accompanying peripheral circuits can also be designed in accordance with the memory products. These CAM cells can also be embedded in some specific-purpose semiconductor products in supports of comparing the desired information against the entire list of pre-stored entries simultaneously, often resulting in an order-of-magnitude reduction in the search time.

Figure 32:
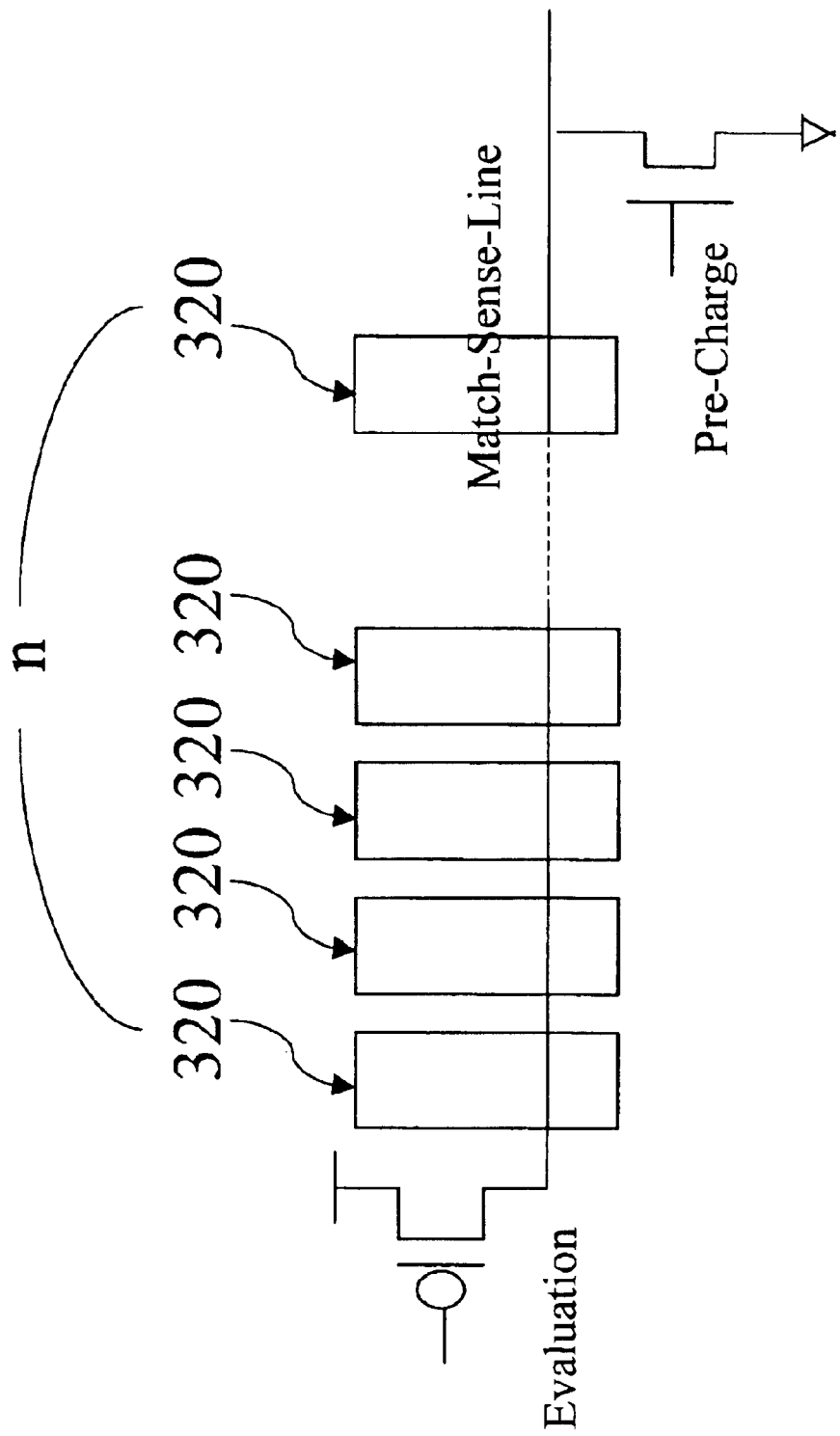
FIG. 32 shows an embodiment of a simple peripheral circuit with CAM cells described above for one-word comparison operation.

Refer to FIG. 32, which shows an embodiment of a simple peripheral circuit with CAM cells of the forth embodiment of the invention for one word comparison operation. In such arrangement, the number of CAM cells 320 is dependent on the bit number of the one-word comparison; for example, n bits being compared simultaneously and a match signal being signaled after comparison, as shown in FIG. 32. The CAM cells can be one of all types of the CAM cells described in the first, second and third preferred embodiments. The match sense line (MSL) is pre-charged high before a compare operation. When the comparing data matches the stored data in the CAM cells, match sense line MSL remains high. When the comparing data matches the stored data in the CAM cells, match sense line MSL remains high. When the comparing data does not match the stored data in the CAM cells, match sense line MSL is pulled low. In such architecture, a n-bit word comparison operation can be easily implemented.

Figure 33:
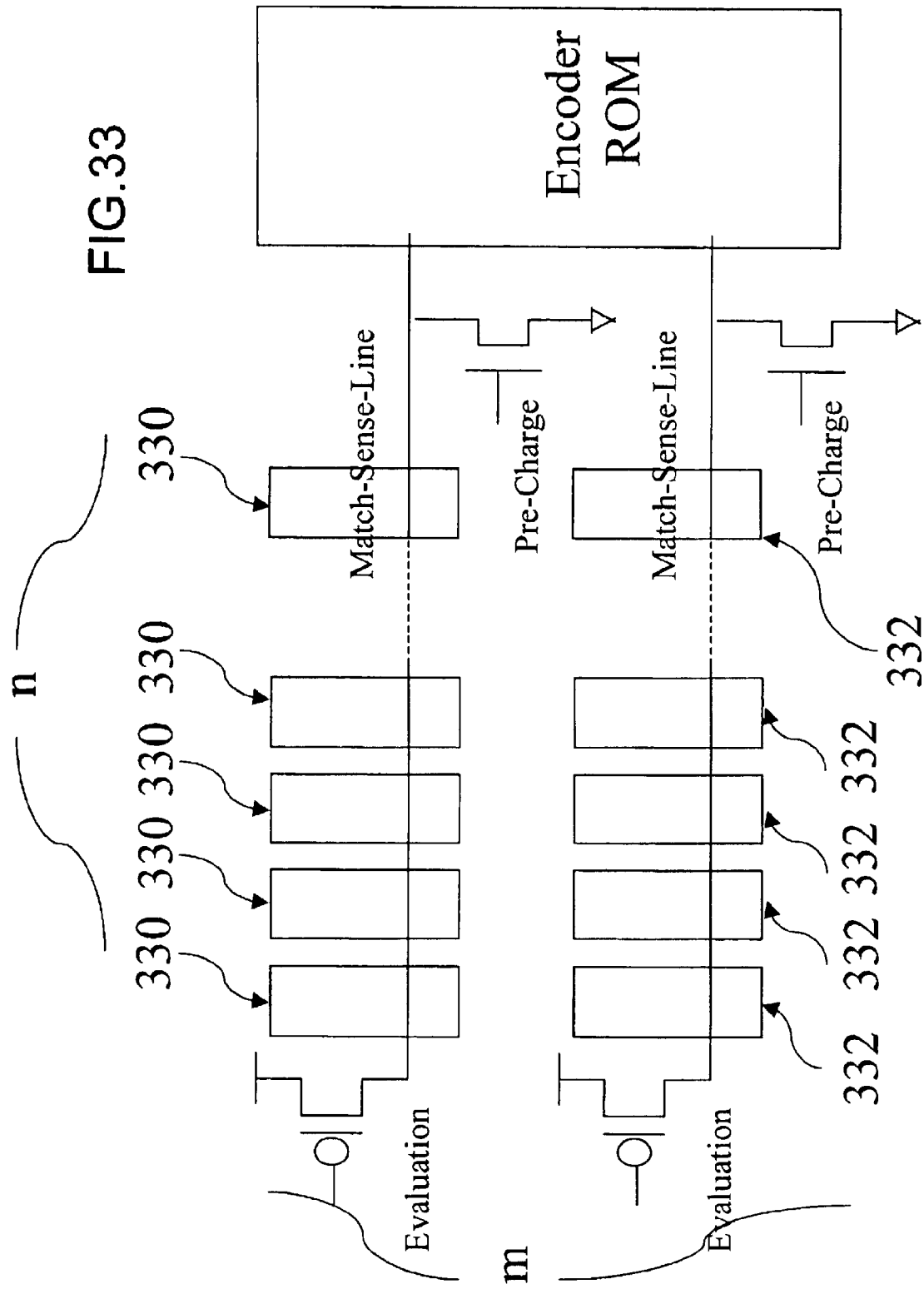
FIG. 33 shows an embodiment of a simple peripheral circuit with CAM cells described above for multiple-word comparison operation.

Refer to FIG. 33, which shows an embodiment of a simple peripheral circuit with CAM cells describe above for multiple-word comparison operation. In such arrangement, the number of CAM cells 330 and 332 is dependent on the bit number of the word for such comparison; for example, n bits of one word being compared simultaneously and a match signal being signaled after comparison. For multiple words, for example, m words, m rows for n-bit comparison will be arranged for such m-word comparison. The CAM cells can be one of all types of the CAM cells described in the first, second and third preferred embodiments. The match sense line (MSL) is pre-charged high before a compare operation. When the comparing data matches the stored data in the CAM cells, match sense line MSL remains high. When the comparing data matches the stored data in the CAM cells, match sense line MSL remains high. When the comparing data does not match the stored data in the CAM cells, match sense line MSL is pulled low. By using a encoder device, such as encoder ROM, a result signal can be easily signaled for simultaneously comparing m words. The numbers of m and n are determined in accordance with the design requirements.

Figure 34:
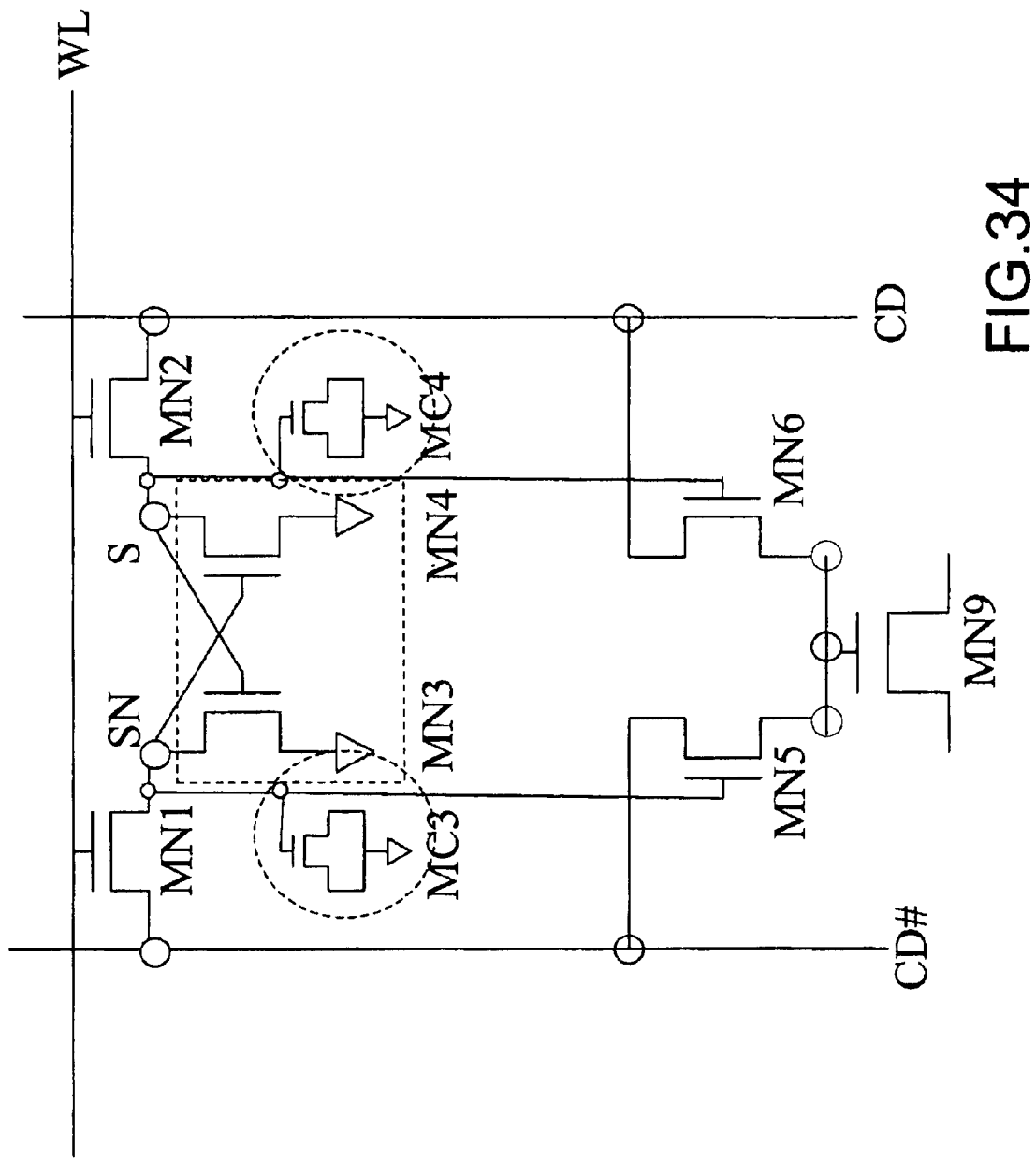
FIG. 34 is a diagram of a single-port dynamic differential CAM of a fifth-preferred embodiment of the invention.

NAND CAM Cells for Preferred Embodiments
Fifth Embodiment—Single-Port CAM Cell
Type 1—Basic Single-Port CAM Cell Refer to FIG. 34, which is a diagram of a single-port dynamic differential CAM of a fifth preferred embodiment of the invention. This CAM cell stored one bit of data, but the data is stored differentially as true and complement data.

A pair of bit lines CD, CD# carry true and complement data to a column of cells. Two pass transistors MN1 and MN2 are turned on when word line WL is driven with a high voltage during a write operation. The pass transistor MN1 connects bit line CD to the gate of storage transistor MN4 and capacitor MC3. Pass transistors MN2 connects bit line CD# to the gate of storage transistors MN3 and capacitor MC4. One gate is charged high while the other gate is charged low. The capacitors MC3 and MC4 can be, for example, MOS capacitors to meet the requirements of manufacturing process.

During read/write operation, word line WL is driven high for turning on the pass transistors MN1 and MN2. For storing data 1, bit line CD is high, storing a high voltage on the gate of storage transistor MN4. Bit line CD# is low, driving a low voltage on the gate of storage transistor MN3. When word line WL is driven low, the gate of the storage transistor MN4 and the accompanying capacitor MC3 store a positive charge while the gate of the storage transistor MN3 and the accompanying capacitor MC4 store little or no charge. The opposite occurs when a data 0 is written to the cell. That is, the storage transistor MN4 and the accompanying capacitor MC3 store a positive charge while storage transistor MN3 stores little or no charge.

The cell can be read by equalizing and pre-charging both bit lines CD and CD# to an intermediate voltage before word line WL is raised. One bit line is then driven low and the other is driven high by charge sharing as pass transistors MN1 and MN2 are turned on. A sensitive sense amplifier can then detect a slight voltage difference on bit lines CD and CD#. The cell can be refreshed by writing the sensed data back to the bit lines.

During a match or compare operation, word line WL is low and pass transistors MN1 and MN2 remain off. Thus the stored charges on the gates of storage transistors MN3 and MN4 as well as the accompanying capacitors MC3 and MC4 are isolated and not disturbed.

For lower power consumption, a match transistor MN9 is introduced in the embodiment. If the comparing data matches the stored data in the CAM cell, the match transistor MN9 is turned on. However, if the comparing data does not match the stored data in the CAM cell, the match transistor MN9 remain off. If a word comparison is performed, that means that a serially connected match transistors can be used for comparison. If the serially connected match transistors are all turned on and a current flow path is established, that means that a match comparison is signaled by sensing the current flow path. In such arrangement, if a row of such CAM cells is not simultaneously turned on, there is no current flow path occurred, that means that no power consumption will occur. Operations of such arrays of CAM cells will be described later.

The comparing data from bit lines CD# and CD are applied to one of source/drain terminals of transistors MN5 and MN6 respectively. The other source/drain terminals of the transistors MN5 and MN6 are connected to the gate of the match transistors MN9. The complements of the comparing data are applied to these bit lines during the compare operation. Thus bit line CD carries the complement of the comparing data. Complement bit line CD# carries the true comparing data.

When the comparing data matches the stored data in the CAM cell, the match transistor MN9 is turned on. For example, when the cell stores a 1, storage transistor MN4 is on but storage transistor MN3 is off. The charges stored on the gate of storage transistor MN4 and the capacitor MC3 turns on the transistor MN5. The transistor MN6 remains off because gate of storage transistor MN3 and the capacitor MC4 stores little or no charge. The true comparing data is applied to bit line CD# while the complement comparing data is applied to bit line CD. Since the comparing data is also a 1, CD is low while CD# is high. Thus the transistor MN5 is on, causing a high voltage being applied to the gate of a transistor MN9 from CD# and then the transistor being turned on.

When the cell stores a 0, storage transistor MN3 is on but storage transistor MN4 is off. The charges stored on the gate of storage transistor MN3 and the capacitor MC4 turns on the transistor MN6. The transistor MN5 remains off because gate of storage transistor MN4 and the capacitor MC3 stores little or no charge. The true comparing data is applied to bit line CD# while the complement comparing data is applied to bit line CD. Since the comparing data is also a 0, CD# is low while CD is high. Since the comparing data is also a 1, CD is low while CD# is high. Thus the transistor MN6 is on, causing a high voltage being applied from CD to the gate of a transistor MN9 and then the transistor being turned on.

When the comparing data matches the stored data in the CAM cell, the match transistor MN9 is turned off. For example, when the stored data is "1," the stored data or stored charge on the gate of storage transistor MN4 and the capacitor MC3 turns on the transistor MN5. When the comparing data is "0", the complement comparing data applied to the bit line CD is high and a low signal is applied to bit line CD#. Since the comparing data is a 0, CD# is low while CD is high. Thus the transistor MN5 is on, causing a low voltage being applied from CD# to the gate of a transistor MN9 and then the transistor MN9 remaining off.

The transistor MN9 still remains off when the stored data is low but the comparing data is high. When the stored data is "0," the stored data or stored charge on the gate of storage transistor MN3 and the capacitor MC4 turns on the transistor MN6. When the comparing data is "1", the complement comparing data applied to the bit line CD# is high and a low signal is applied to bit line CD. Since the comparing data is a 1, CD# is high while CD is low. Thus the transistor MN6 is on, causing a low voltage being applied from CD to the gate of a transistor MN9 and then the transistor MN9 remaining off.

Type 2—Single-Port CAM Cell Variation I

Figure 35:
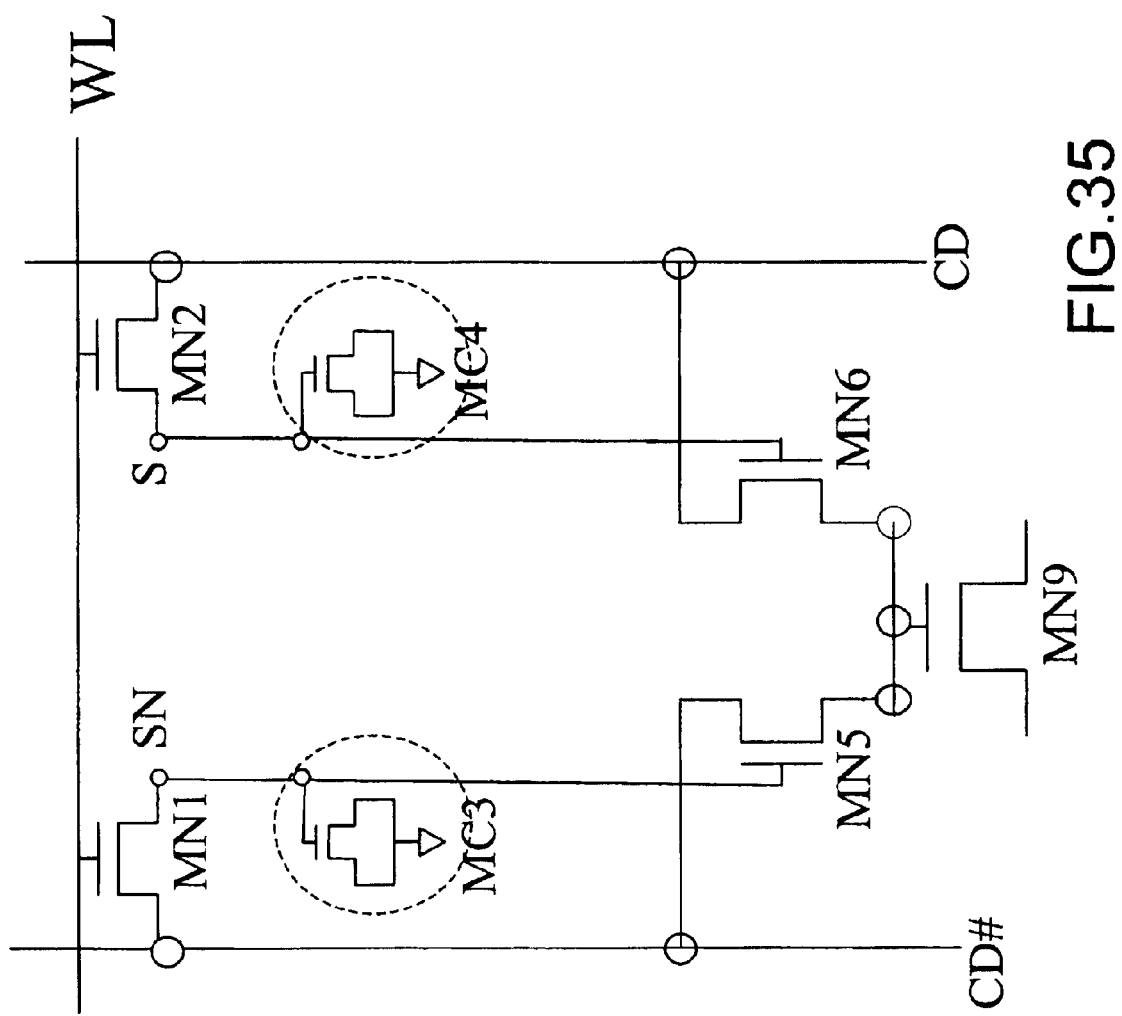
FIG. 35 is a diagram of a first variation of the single-port dynamic differential CAM as shown in FIG. 34 of the fifth-preferred embodiment of the invention.

Refer to FIG. 35, which is a diagram of a first variation of the single-port dynamic differential CAM as shown in the FIG. 34 of the fifth preferred embodiment of the invention. This CAM cell stored one bit of data, but the data is stored differentially as true and complement data. The important variation of the embodiment is that two transistors MN3 and MN4, which are shown in FIG. 34, are eliminated.

A pair of bit lines CD, CD# carry true and complement data to a column of cells. Two pass transistors MN1 and MN2 are turned on when word line WL is driven with a high voltage during a write operation. The pass transistor MN1 connects bit line CD to the capacitor MC3. Pass transistors MN2 connects bit line CD# to the capacitor MC4. The capacitors MC3 and MC4 can be, for example, MOS capacitors to meet the requirements of manufacturing process.

During read/write operation, word line WL is driven high for turning on the pass transistors MN1 and MN2. For storing data 1, bit line CD is high, storing charges in the capacitor MC3. Bit line CD# is low, driving a low voltage to the capacitor MC4 and storing little or no charges on the capacitor MC4. When word line WL is driven low, the accompanying capacitor MC3 stores many charges while the capacitor MC4 stores little or no charges. The opposite occurs when a data 0 is written to the cell. That is, the capacitor MC3 store a positive charge while the capacitor MC4 stores little or no charge.

The cell can be read by equalizing and pre-charging both bit lines CD and CD# to an intermediate voltage before word line WL is raised. One bit line is then driven low and the other is driven high by charges sharing as pass transistors MN1 and MN2 are turned on. A sensitive sense amplifier can then detect a slight voltage difference on bit lines CD and CD#. The cell can be refreshed by writing the sensed data back to the bit lines.

During a match or compare operation, word line WL is low and pass transistors MN1 and MN2 remain off. Thus the stored charges on the capacitors MC3 and MC4 are isolated and not disturbed.

For lower power consumption, a match transistor MN9 is introduced in the embodiment, as described above. If the comparing data matches the stored data in the CAM cell, the match transistor MN9 is turned on. However, if the comparing data does not match the stored data in the CAM cell, the match transistor MN9 remain off.

The comparing data from bit lines CD# and CD are applied to one of source/drain terminals of transistors MN5 and MN6 respectively. The other source/drain terminals of the transistors MN5 and MN6 are connected to the gate of the match transistors MN9. The complements of the comparing data are applied to these bit lines during the compare operation. Thus bit line CD carries the complement of the comparing data. Complement bit line CD# carries the true comparing data.

When the comparing data matches the stored data in the CAM cell, the match transistor MN9 is turned on. For example, when the cell stores a 1, the charges stored on the gate of the transistor MN5 and the capacitor MC3 turns on the transistor MN5. The transistor MN6 remains off because gate of transistor MN6 and the capacitor MC4 stores little or no charge. The true comparing data is applied to bit line CD# while the complement comparing data is applied to bit line CD. Since the comparing data is also a 1, CD is low while CD# is high. Thus the transistor MN5 is on, causing a high voltage being applied to the gate of a transistor MN9 from CD# and then the transistor being turned on.

When the cell stores a 0, the charges stored on the gate of the transistor MN6 and the capacitor MC4 turns on the transistor MN6. The transistor MN5 remains off because gate of the transistor MN5 and the capacitor MC3 stores little or no charge. The true comparing data is applied to bit line CD# while the complement comparing data is applied to bit line CD. Since the comparing data is also a 0, CD# is low while CD is high. Since the comparing data is also a 1, CD is low while CD# is high. Thus the transistor MN6 is on, causing a high voltage being applied from CD to the gate of a transistor MN9 and then the transistor being turned on.

When the comparing data matches the stored data in the CAM cell, the match transistor MN9 is turned off. For example, when the stored data is "1," the stored data or stored charge on the gate of the transistor MN5 and the capacitor MC3 turns on the transistor MN5. When the comparing data is "0", the complement comparing data applied to the bit line CD is high and a low signal is applied to bit line CD#. Since the comparing data is a 0, CD# is low while CD is high. Thus the transistor MN5 is on, causing a low voltage being applied from CD# to the gate of a transistor MN9 and then the transistor MN9 remaining off.

The transistor MN9 still remains off when the stored data is low but the comparing data is high. When the stored data is "0," the stored data or stored charge on the gate of the transistor MN6 and the capacitor MC4 turns on the transistor MN6. When the comparing data is "1", the complement comparing data applied to the bit line CD# is high and a low signal is applied to bit line CD. Since the comparing data is a 1, CD# is high while CD is low. Thus the transistor MN6 is on, causing a low voltage being applied from CD to the gate of a transistor MN9 and then the transistor MN9 remaining off.

Type 3—Single-Port CAM Cell Variation II

Figure 36:
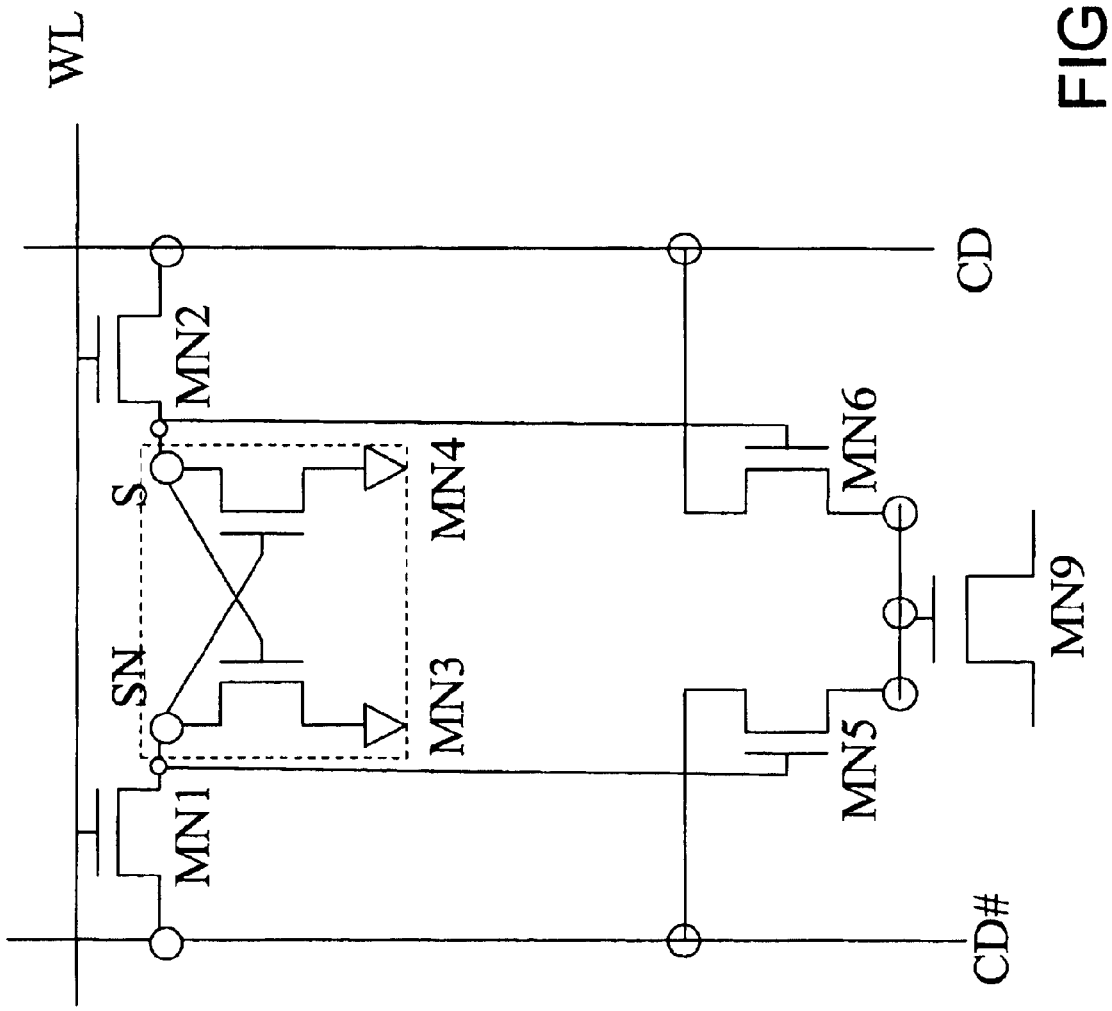
FIG. 36 is a diagram of a second variation of the single-port dynamic differential CAM as shown in FIG. 34 of the fifth preferred embodiment of the invention.

Refer to FIG. 36, which is a diagram of a second variation of the single-port dynamic differential CAM as shown in the FIG. 34 of the fifth preferred embodiment of the invention. This CAM cell stored one bit of data, but the data is stored differentially as true and complement data. The important variation of the embodiment is that two capacitor MC3 and MC4, which are shown in FIG. 34, are eliminated.

A pair of bit lines CD, CD# carry true and complement data to a column of cells. Two pass transistors MN1 and MN2 are turned on when word line WL is driven with a high voltage during a write operation. The pass transistor MN1 connects bit line CD to the gate of the transistor MN3. Pass transistors MN2 connects bit line CD# to the gate of the transistor MN4. One gate is charged high while the other gate is charged low.

During read/write operation, word line WL is driven high for turning on the pass transistors MN1 and MN2. For storing data 1, bit line CD is high, storing a high voltage on the gate of storage transistor MN4. Bit line CD# is low, driving a low voltage on the gate of storage transistor MN3. When word line WL is driven low, the gate of the storage transistor MN4 stores a positive charge while the gate of the storage transistor MN3 stores little or no charge. The opposite occurs when a data 0 is written to the cell. That is, the gate of the storage transistor MN4 stores a positive charge while the gate of the storage transistor MN3 stores little or no charge.

The cell can be read by equalizing and pre-charging both bit lines CD and CD# to an intermediate voltage before word line WL is raised. One bit line is then driven low and the other is driven high by charge sharing as pass transistors MN1 and MN2 are turned on. A sensitive sense amplifier can then detect a slight voltage difference on bit lines CD and CD#. The cell can be refreshed by writing the sensed data back to the bit lines.

During a match or compare operation, word line WL is low and pass transistors MN1 and MN2 remain off. Thus the stored charges on the gates of storage transistors MN3 and MN4 are isolated and not disturbed.

For lower power consumption, a match transistor MN9 is introduced in the embodiment, as described above. If the comparing data matches the stored data in the CAM cell, the match transistor MN9 is turned on. However, if the comparing data does not match the stored data in the CAM cell, the match transistor MN9 remain off.

The comparing data from bit lines CD# and CD are applied to one of source/drain terminals of transistors MN5 and MN6 respectively. The other source/drain terminals of the transistors MN5 and MN6 are connected to the gate of the match transistors MN9. The complements of the comparing data are applied to these bit lines during the compare operation. Thus bit line CD carries the complement of the comparing data. Complement bit line CD# carries the true comparing data.

When the comparing data matches the stored data in the CAM cell, the match transistor MN9 is turned on. For example, when the cell stores a 1, storage transistor MN4 is on but storage transistor MN3 is off. The charges stored on the gate of storage transistor MN4 turn on the transistor MN5. The transistor MN6 remains off because gate of storage transistor MN3 stores little or no charge. The true comparing data is applied to bit line CD# while the complement comparing data is applied to bit line CD. Since the comparing data is also a 1, CD is low while CD# is high. Thus the transistor MN5 is on, causing a high voltage being applied to the gate of a transistor MN9 from CD# and then the transistor being turned on.

When the cell stores a 0, storage transistor MN3 is on but storage transistor MN4 is off. The charges stored on the gate of storage transistor MN3 turn on the transistor MN6. The transistor MN5 remains off because gate of storage transistor MN4 stores little or no charge. The true comparing data is applied to bit line CD# while the complement comparing data is applied to bit line CD. Since the comparing data is also a 0, CD# is low while CD is high. Since the comparing data is also a 1, CD is low while CD# is high. Thus the transistor MN6 is on, causing a high voltage being applied from CD to the gate of a transistor MN9 and then the transistor being turned on.

When the comparing data matches the stored data in the CAM cell, the match transistor MN9 is turned off. For example, when the stored data is "1," the stored data or stored charge on the gate of storage transistor MN4 turn on the transistor MN5. When the comparing data is "0", the complement comparing data applied to the bit line CD is high and a low signal is applied to bit line CD#. Since the comparing data is a 0, CD# is low while CD is high. Thus the transistor MN5 is on, causing a low voltage being applied from CD# to the gate of a transistor MN9 and then the transistor MN9 remaining off.

The transistor MN9 still remains off when the stored data is low but the comparing data is high. When the stored data is "0," the stored data or stored charge on the gate of storage transistor MN3 turn on the transistor MN6. When the comparing data is "1", the complement comparing data applied to the bit line CD# is high and a low signal is applied to bit line CD. Since the comparing data is a 1, CD# is high while CD is low. Thus the transistor MN6 is on, causing a low voltage being applied from CD to the gate of a transistor MN9 and then the transistor MN9 remaining off.

Type 4—Single-Port CAM Cell Variation III

Figure 37:
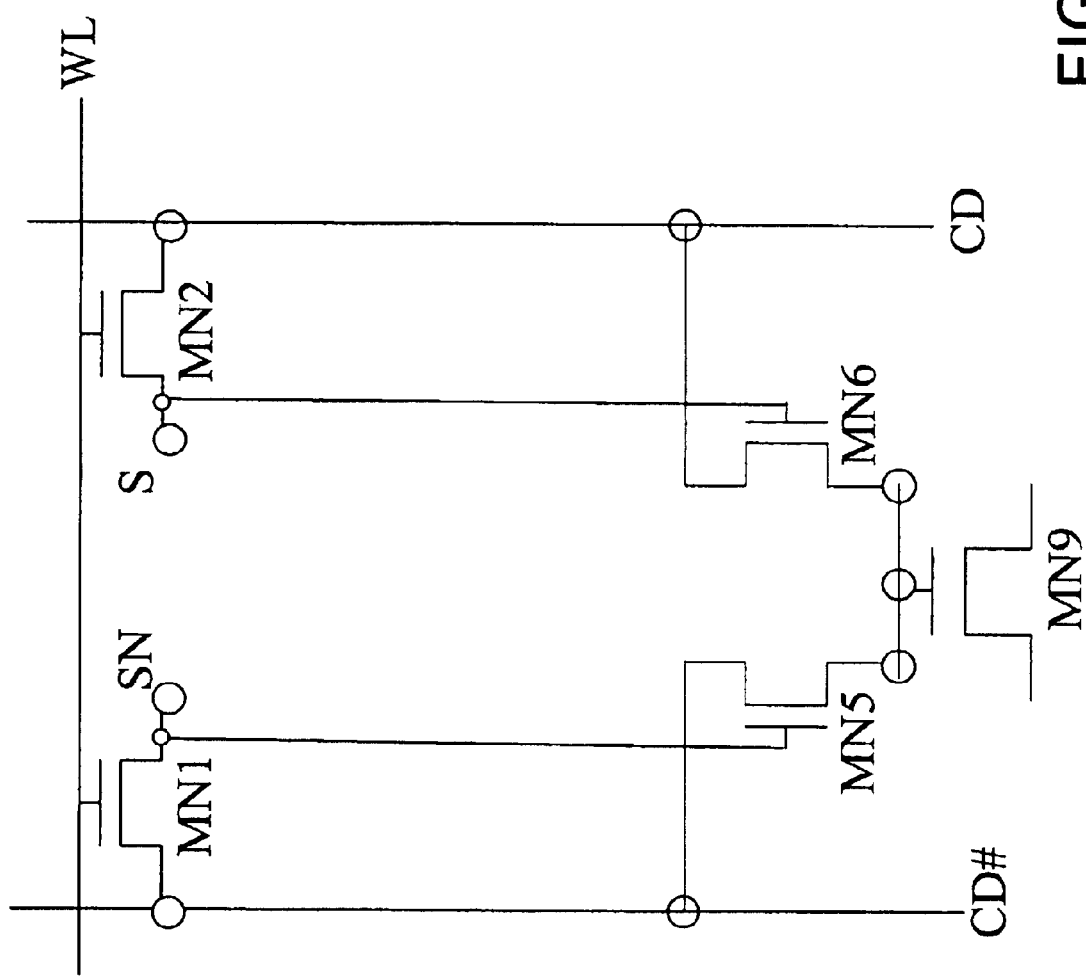
FIG. 37 is a diagram of a third variation of the single-port dynamic differential CAM as shown in FIG. 34 of the fifth preferred embodiment of the invention.

Refer to FIG. 37, which is a diagram of a third variation of the single-port dynamic differential CAM as shown in the FIG. 34 of the fifth preferred embodiment of the invention. This CAM cell stored one bit of data, but the data is stored differentially as true and complement data. The important variation of the embodiment is that two storage transistors MN3 and MN4 as well as two capacitors MC3 and MC4, which are shown in FIG. 34, are eliminated.

A pair of bit lines CD, CD# carry true and complement data to a column of cells. Two pass transistors MN1 and MN2 are turned on when word line WL is driven with a high voltage during a write operation. The pass transistor MN1 connects bit line CD to the gate of the transistor MN5. Pass transistors MN2 connects bit line CD# to the gate of the transistor MN6. One gate is charged high while the other gate is charged low.

During read/write operation, word line WL is driven high for turning on the pass transistors MN1 and MN2. For storing data 1, bit line CD is high, storing a high voltage on the gate of the transistor MN5. Bit line CD# is low, driving a low voltage on the gate of the transistor MN6. When word line WL is driven low, the gate of the storage transistor MN5 stores a positive charge while the gate of the storage transistor MN6 stores little or no charge. The opposite occurs when a data 0 is written to the cell. That is, the gate of the storage transistor MN6 stores a positive charge while the gate of the storage transistor MN5 stores little or no charge.

The cell can be read by equalizing and pre-charging both bit lines CD and CD# to an intermediate voltage before word line WL is raised. One bit line is then driven low and the other is driven high by charge sharing as pass transistors MN1 and MN2 are turned on. A sensitive sense amplifier can then detect a slight voltage difference on bit lines CD and CD#. The cell can be refreshed by writing the sensed data back to the bit lines.

During a match or compare operation, word line WL is low and pass transistors MN1 and MN2 remain off. Thus the stored charges on the gates of the transistors MN5 and MN6 are isolated and not disturbed.

For lower power consumption, a match transistor MN9 is introduced in the embodiment, as described above. If the comparing data matches the stored data in the CAM cell, the match transistor MN9 is turned on. However, if the comparing data does not match the stored data in the CAM cell, the match transistor MN9 remain off.

The comparing data from bit lines CD# and CD are applied to one of source/drain terminals of transistors MN5 and MN6 respectively. The other source/drain terminals of the transistors MN5 and MN6 are connected to the gate of the match transistors MN9. The complements of the comparing data are applied to these bit lines during the compare operation. Thus bit line CD carries the complement of the comparing data. Complement bit line CD# carries the true comparing data.

When the comparing data matches the stored data in the CAM cell, the match transistor MN9 is turned on. For example, when the cell stores a 1, the transistor MN5 is on but the transistor MN6 is off. The charges stored on the gate of the transistor MN5 turn on the transistor MN5. The transistor MN6 remains off because gate of the transistor MN6 stores little or no charge. The true comparing data is applied to bit line CD# while the complement comparing data is applied to bit line CD. Since the comparing data is also a 1, CD is low while CD# is high. Thus the transistor MN5 is on, causing a high voltage being applied to the gate of a transistor MN9 from CD# and then the transistor being turned on.

When the cell stores a 0; the transistor MN6 is on but the transistor MN5 is off. The charges stored on the gate of storage transistor MN6 turn on the transistor MN6. The transistor MN5 remains off because gate of the transistor MN5 stores little or no charge. The true comparing data is applied to bit line CD# while the complement comparing data is applied to bit line CD. Since the comparing data is also a 0, CD# is low while CD is high. Since the comparing data is also a 1, CD is low while CD# is high. Thus the transistor MN6 is on, causing a high voltage being applied from CD to the gate of a transistor MN9 and then the transistor being turned on.

When the comparing data matches the stored data in the CAM cell, the match transistor MN9 is turned off. For example, when the stored data is "1," the stored data or stored charge on the gate of the transistor MN5 turn on the transistor MN5. When the comparing data is "0", the complement comparing data applied to the bit line CD is high and a low signal is applied to bit line CD#. Since the comparing data is a 0, CD# is low while CD is high. Thus the transistor MN5 is on, causing a low voltage being applied from CD# to the gate of a transistor MN9 and then the transistor MN9 remaining off.

The transistor MN9 still remains off when the stored data is low but the comparing data is high. When the stored data is "0," the stored data or stored charge on the gate of the transistor MN6 turn on the transistor MN6. When the comparing data is "1", the complement comparing data applied to the bit line CD# is high and a low signal is applied to bit line CD. Since the comparing data is a 1, CD# is high while CD is low. Thus the transistor MN6 is on, causing a low voltage being applied from CD to the gate of a transistor MN9 and then the transistor MN9 remaining off.

Type 5—Single-Port CAM Cell Variation IV

Figure 38:
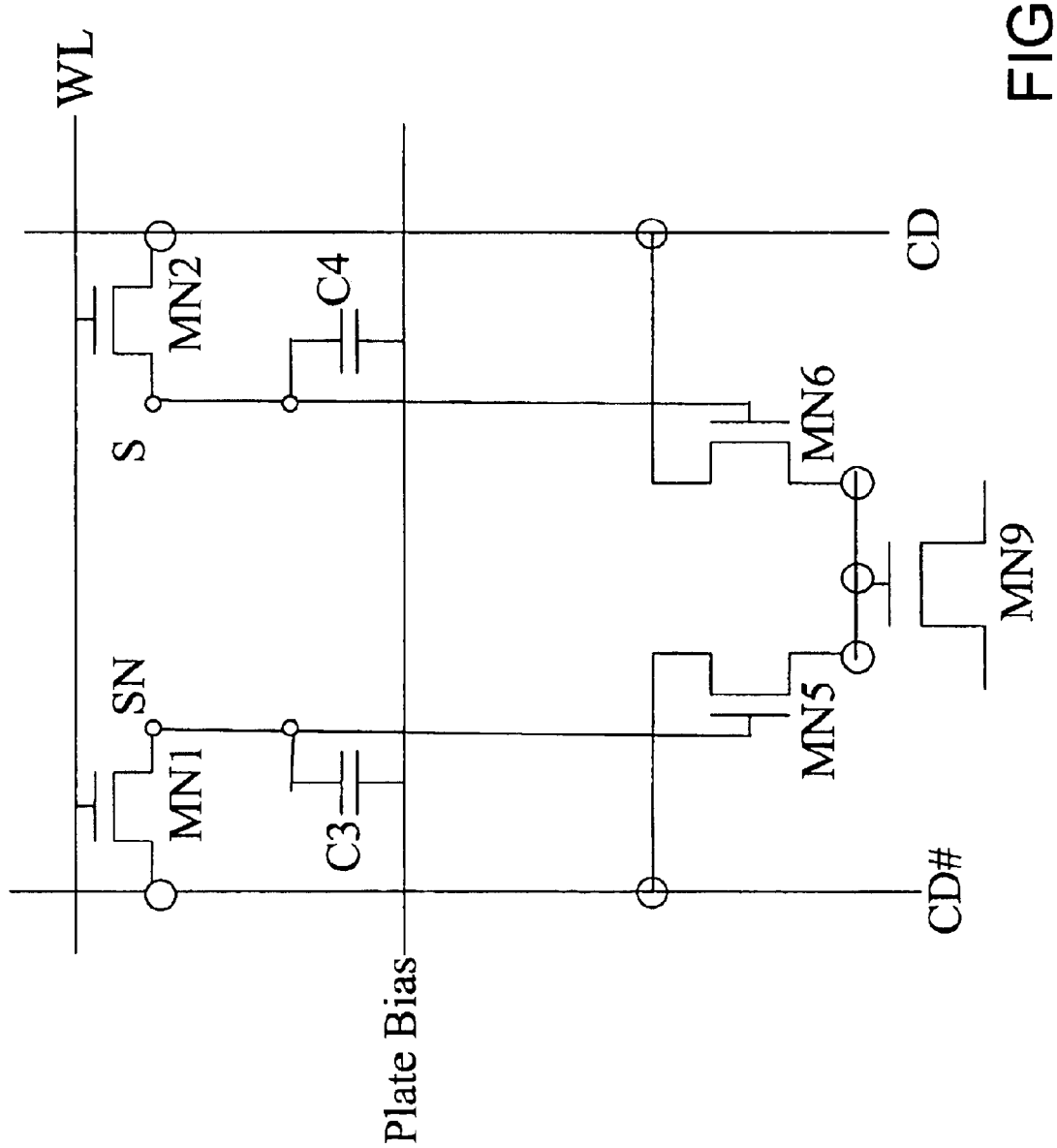
FIG. 38 is a diagram of a forth variation of the single-port dynamic differential CAM as shown in FIG. 34 of the fifth preferred embodiment of the invention.

Refer to FIG. 38, which is a diagram of a forth variation of the single-port dynamic differential CAM as shown in the FIG. 34 of the fifth preferred embodiment of the invention. This CAM cell stored one bit of data, but the data is stored differentially as true and complement data. The important variation of the embodiment is that two transistors MN3 and MN4 shown in FIG. 34 are eliminated and two capacitors MC3 and MC4 are replaced by the capacitors C3 and C4, which are manufactured by a DRAM process and can be DRAM capacitors, for example. A plate bias voltage $V_{BIAS}$ is applied to one terminal of each of the capacitors. For variations, the capacitors can be capacitors manufactured by a FRAM (Ferroelectric random-access memory), DRAM or MIM (metal-insulator-metal) capacitor process. Either polysilicon and metal-insulator-metal (MIM) capacitors can be used for the capacitors. The MIM capacitor module, which is inserted into the backend process of integrated circuit manufacturing, results in a very low capacitance density. The capacitance density is proportional to the reverse of the dielectric thickness. Often, sophisticated additional metal and dielectric layers must be added for high capacitance density.

A pair of bit lines CD, CD# carry true and complement data to a column of cells. Two pass transistors MN1 and MN2 are turned on when word line WL is driven with a high voltage during a write operation. The pass transistor MN1 connects bit line CD to the capacitor C3. Pass transistors MN2 connects bit line CD# to the capacitor C4. The capacitors C3 and C4 can be, for example, MOS capacitors to meet the requirements of manufacturing process.

During read/write operation, word line WL is driven high for turning on the pass transistors MN1 and MN2. For storing data 1, bit line CD is high, storing charges in the capacitor C3. Bit line CD# is low, driving a low voltage to the capacitor C4 and storing little or no charges on the capacitor MC4. When word line WL is driven low, the accompanying capacitor C3 stores many charges while the capacitor C4 stores little or no charges. The opposite occurs when a data 0 is written to the cell. That is, the capacitor C3 store a positive charge while the capacitor C4 stores little or no charge.

The cell can be read by equalizing and pre-charging both bit lines CD and CD# to an intermediate voltage before word line WL is raised. One bit line is then driven low and the other is driven high by charges sharing as pass transistors MN1 and MN2 are turned on. A sensitive sense amplifier can then detect a slight voltage difference on bit lines CD and CD#. The cell can be refreshed by writing the sensed data back to the bit lines.

During a match or compare operation, word line WL is low and pass transistors MN1 and MN2 remain off. Thus the stored charges on the capacitors C3 and C4 are isolated and not disturbed.

For lower power consumption, a match transistor MN9 is introduced in the embodiment, as described above. If the comparing data matches the stored data in the CAM cell, the match transistor MN9 is turned on. However, if the comparing data does not match the stored data in the CAM cell, the match transistor MN9 remain off.

The comparing data from bit lines CD# and CD are applied to one of source/drain terminals of transistors MN5 and MN6 respectively. The other source/drain terminals of the transistors MN5 and MN6 are connected to the gate of the match transistors MN9. The complements of the comparing data are applied to these bit lines during the compare operation. Thus bit line CD carries the complement of the comparing data. Complement bit line CD# carries the true comparing data.

When the comparing data matches the stored data in the CAM cell, the match transistor MN9 is turned on For example, when the cell stores a 1, the charges stored on the gate of the transistor MN5 and the capacitor C3 turns on the transistor MN5. The transistor MN6 remains off because gate of transistor MN6 and the capacitor C4 stores little or no charge. The true comparing data is applied to bit line CD# while the complement comparing data is applied to bit line CD. Since the comparing data is also a 1, CD is low while CD# is high. Thus the transistor MN5 is on, causing a high voltage being applied to the gate of a transistor MN9 from CD# and then the transistor being turned on.

When the cell stores a 0, the charges stored on the gate of the transistor MN6 and the capacitor C4 turns on the transistor MN6. The transistor MN5 remains off because gate of the transistor MN5 and the capacitor C3 stores little or no charge. The true comparing data is applied to bit line CD# while the complement comparing data is applied to bit line CD. Since the comparing data is also a 0, CD# is low while CD is high. Since the comparing data is also a 1, CD is low while CD# is high. Thus the transistor MN6 is on, causing a high voltage being applied from CD to the gate of a transistor MN9 and then the transistor being turned on.

When the comparing data matches the stored data in the CAM cell, the match transistor MN9 is turned off. For example, when the stored data is "1," the stored data or stored charge on the gate of the transistor MN5 and the capacitor C3 turns on the transistor MN5. When the comparing data is "0", the complement comparing data applied to the bit line CD is high and a low signal is applied to bit line CD#. Since the comparing data is a 0, CD# is low while CD is high. Thus the transistor MN5 is on, causing a low voltage being applied from CD# to the gate of a transistor MN9 and then the transistor MN9 remaining off.

The transistor MN9 still remains off when the stored data is low but the comparing data is high. When the stored data is "0," the stored data or stored charge on the gate of the transistor MN6 and the capacitor C4 turns on the transistor MN6. When the comparing data is "1", the complement comparing data applied to the bit line CD# is high and a low signal is applied to bit line CD. Since the comparing data is a 1, CD# is high while CD is low Thus the transistor MN6 is on, causing a low voltage being applied from CD to the gate of a transistor MN9 and then the transistor MN9 remaining off.

Type 6—Basic 2-Port CAM Cell

Figure 39:
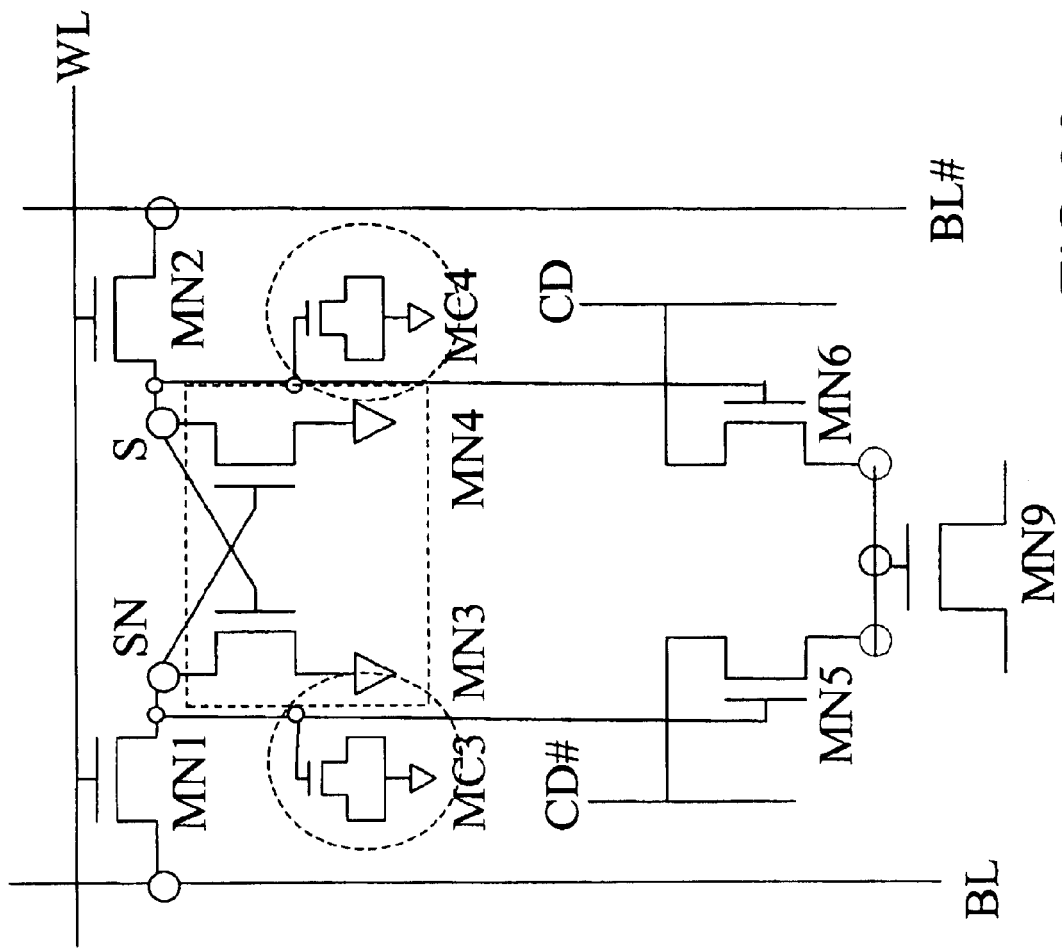
FIG. 39 is a diagram of a 2-port dynamic differential CAM of the fifth preferred embodiment of the invention.

Refer to FIG. 39, which is a diagram of a 2-port dynamic differential CAM of a fifth preferred embodiment of the invention. This CAM cell stored one bit of data, but the data is stored differentially as true and complement data.

A pair of bit lines BL, BL# carry true and complement data to a column of cells. Two pass transistors MN1 and MN2 are turned on when word line WL is driven with a high voltage during a write operation. The pass transistor MN1 connects bit line BL to the gate of storage transistor MN4 and capacitor MC3. Pass transistors MN2 connects bit line BL# to the gate of storage transistors MN3 and capacitor MC4. One gate is charged high while the other gate is charged low. The capacitors MC3 and MC4 can be, for example, MOS capacitors to meet the requirements of manufacturing process.

During read/write operation, word line WL is driven high for turning on the pass transistors MN1 and MN2. For storing data 1, bit line BL is high, storing a high voltage on the gate of storage transistor MN4. Bit line BL# is low, driving a low voltage on the gate of storage transistor MN3. When word line WL is driven low, the gate of the storage transistor MN4 and the accompanying capacitor MC3 store a positive charge while the gate of the storage transistor MN3 and the accompanying capacitor MC4 store little or no charge. The opposite occurs when a data 0 is written to the cell. That is, the storage transistor MN4 and the accompanying capacitor MC3 store a positive charge while storage transistor MN3 stores little or no charge.

The cell can be read by equalizing and pre-charging both bit lines BL and BL# to an intermediate voltage before word line WL is raised. One bit line is then driven low and the other is driven high by charge sharing as pass transistors MN1 and MN2 are turned on. A sensitive sense amplifier can then detect a slight voltage difference on bit lines BL and BL#. The cell can be refreshed by writing the sensed data back to the bit lines.

During a match or compare operation, word line WL is low and pass transistors MN1 and MN2 remain off. Thus the stored charges on the gates of storage transistors MN3 and MN4 as well as the accompanying capacitors MC3 and MC4 are isolated and not disturbed.

For lower power consumption, a match transistor MN9 is introduced in the embodiment. If the comparing data matches the stored data in the CAM cell, the match transistor MN9 is turned on. However, if the comparing data does not match the stored data in the CAM cell, the match transistor MN9 remain off. If a word comparison is performed, that means that a serially connected match transistors can be used for comparison. If the serially connected match transistors are all turned on and a current flow path is established, that means that a match comparison is signaled by sensing the current flow path. In such arrangement, if a row of such CAM cells is not simultaneously turned on, there is no current flow path occurred, that means that no power consumption will occur. Operations of such arrays of CAM cells will be described later.

The comparing data from compare lines CD# and CD are applied to one of source/drain terminals of transistors MN5 and MN6 respectively. The other source/drain terminals of the transistors MN5 and MN6 are connected to the gate of the match transistors MN9. The complements of the comparing data are applied to these compare lines during the compare operation. Thus the compare line CD carries the complement of the comparing data. Complement compare line CD# carries the true comparing data.

When the comparing data matches the stored data in the CAM cell, the match transistor MN9 is turned on. For example, when the cell stores a 1, storage transistor MN4 is on but storage transistor MN3 is off. The charges stored on the gate of storage transistor MN4 and the capacitor MC3 turns on the transistor MN5. The transistor MN6 remains off because gate of storage transistor MN3 and the capacitor MC4 stores little or no charge. The true comparing data is applied to the compare line CD# while the complement comparing data is applied to the compare line CD. Since the comparing data is also a 1, the compare line CD is low while the compare line CD# is high. Thus the transistor MN5 is on, causing a high voltage being applied to the gate of a transistor MN9 from the compare line CD# and then the transistor being turned on.

When the cell stores a 0, storage transistor MN3 is on but storage transistor MN4 is off. The charges stored on the gate of storage transistor MN3 and the capacitor MC4 turns on the transistor MN6. The transistor MN5 remains off because gate of storage transistor MN4 and the capacitor MC3 stores little or no charge. The true comparing data is applied to the compare line CD# while the complement comparing data is applied to the compare line CD. Since the comparing data is also a 0, the compare line CD# is low while the compare line CD is high. Since the comparing data is also a 1, the compare line CD is low while the compare line CD# is high. Thus the transistor MN6 is on, causing a high voltage being applied from the compare line CD to the gate of a transistor MN9 and then the transistor being turned on.

When the comparing data matches the stored data in the CAM cell, the match transistor MN9 is turned off. For example, when the stored data is "1," the stored data or stored charge on the gate of storage transistor MN4 and the capacitor MC3 turns on the transistor MN5. When the comparing data is "0", the complement comparing data applied to the compare line CD is high and a low signal is applied to the compare line CD#. Since the comparing data is a 0, the compare line CD# is low while the compare line CD is high. Thus the transistor MN5 is on, causing a low voltage being applied from the compare line CD# to the gate of a transistor MN9 and then the transistor MN9 remaining off.

The transistor MN9 still remains off when the stored data is low but the comparing data is high. When the stored data is "0," the stored data or stored charge on the gate of storage transistor MN3 and the capacitor MC4 turns on the transistor MN6. When the comparing data is "1", the complement comparing data applied to the compare line CD# is high and a low signal is applied to the compare line CD. Since the comparing data is a 1, the compare line CD# is high while the compare line CD is low. Thus the transistor MN6 is on, causing a low voltage being applied from the compare line CD to the gate of a transistor MN9 and then the transistor MN9 remaining off.

Type 7—2-Port CAM Cell Variation I

Figure 40:
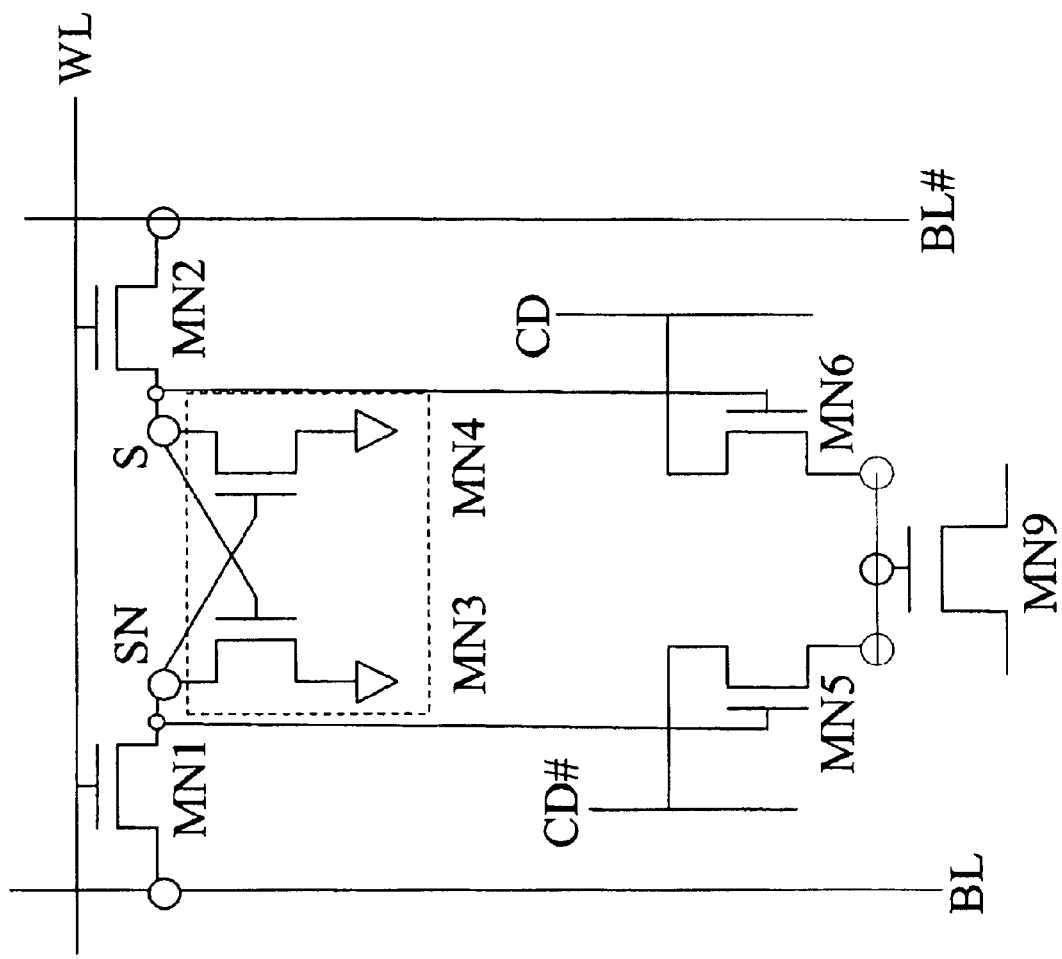
FIG. 40 is a diagram of a first variation of the 2-port dynamic differential CAM as shown in FIG. 39 of the fifth preferred embodiment of the invention.

Refer to FIG. 40, which is a diagram of a first variation of the 2-port dynamic differential CAM as shown in the FIG. 39 of the fifth preferred embodiment of the invention. This CAM cell stored one bit of data, but the data is stored differentially as true and complement data. The important variation of the embodiment is that two capacitor MC3 and MC4, which are shown in FIG. 39, are eliminated.

A pair of bit lines BL, BL# carry true and complement data to a column of cells. Two pass transistors MN1 and MN2 are turned on when word line WL is driven with a high voltage during a write operation. The pass transistor MN1 connects bit line BL to the gate of the transistor MN3. Pass transistors MN2 connects bit line BL# to the gate of the transistor MN4. One gate is charged high while the other gate is charged low.

During read/write operation, word line WL is driven high for turning on the pass transistors MN1 and MN2. For storing data 1, bit line BL is high, storing a high voltage on the gate of storage transistor MN4. Bit line BL# is low, driving a low voltage on the gate of storage transistor MN3. When word line WL is driven low, the gate of the storage transistor MN4 stores a positive charge while the gate of the storage transistor MN3 stores little or no charge. The opposite occurs when a data 0 is written to the cell. That is, the gate of the storage transistor MN4 stores a positive charge while the gate of the storage transistor MN3 stores little or no charge.

The cell can be read by equalizing and pre-charging both bit lines BL and BL# to an intermediate voltage before word line WL is raised. One bit line is then driven low and the other is driven high by charge sharing as pass transistors MN1 and MN2 are turned on. A sensitive sense amplifier can then detect a slight voltage difference on bit lines BL and BL#. The cell can be refreshed by writing the sensed data back to the bit lines.

During a match or compare operation, word line WL is low and pass transistors MN1 and MN2 remain off. Thus the stored charges on the gates of storage transistors MN3 and MN4 are isolated and not disturbed.

For lower power consumption, a match transistor MN9 is introduced in the embodiment, as described above. If the comparing data matches the stored data in the CAM cell, the match transistor MN9 is turned on. However, if the comparing data does not match the stored data in the CAM cell, the match transistor MN9 remain off.

The comparing data from compare lines CD# and CD are applied to one of source/drain terminals of transistors MN5 and MN6 respectively. The other source/drain terminals of the transistors MN5 and MN6 are connected to the gate of the match transistors MN9. The complements of the comparing data are applied to these compare lines during the compare operation. Thus the compare line CD carries the complement of the comparing data. Complement compare line CD# carries the true comparing data.

When the comparing data matches the stored data in the CAM cell, the match transistor MN9 is turned on. For example, when the cell stores a 1, storage transistor MN4 is on but storage transistor MN3 is off. The charges stored on the gate of storage transistor MN4 turn on the transistor MN5. The transistor MN6 remains off because gate of storage transistor MN3 stores little or no charge. The true comparing data is applied to the compare line CD# while the complement comparing data is applied to the compare line CD. Since the comparing data is also a 1, the compare line CD is low while the compare line CD# is high. Thus the transistor MN5 is on, causing a high voltage being applied to the gate of a transistor MN9 from the compare line CD# and then the transistor being turned on.

When the cell stores a 0, storage transistor MN3 is on but storage transistor MN4 is off. The charges stored on the gate of storage transistor MN3 turn on the transistor MN6. The transistor MN5 remains off because gate of storage transistor MN4 stores little or no charge. The true comparing data is applied to the compare line CD# while the complement comparing data is applied to the compare line CD. Since the comparing data is also a 0, the compare line CD# is low while the compare line CD is high. Since the comparing data is also a 1, the compare line CD is low while the compare line CD# is high. Thus the transistor MN6 is on, causing a high voltage being applied from the compare line CD to the gate of a transistor MN9 and then the transistor being turned on.

When the comparing data matches the stored data in the CAM cell, the match transistor MN9 is turned off. For example, when the stored data is "1," the stored data or stored charge on the gate of storage transistor MN4 turn on the transistor MN5. When the comparing data is "0", the complement comparing data applied to the compare line CD is high and a low signal is applied to the compare line CD#. Since the comparing data is a 0, the compare line CD# is low while the compare line CD is high. Thus the transistor MN5 is on, causing a low voltage being applied from the compare line CD# to the gate of a transistor MN9 and then the transistor MN9 remaining off.

The transistor MN9 still remains off when the stored data is low but the comparing data is high. When the stored data is "0," the stored data or stored charge on the gate of storage transistor MN3 turn on the transistor MN6. When the comparing data is "1", the complement comparing data applied to the compare line CD# is high and a low signal is applied to the compare line CD. Since the comparing data is a 1, the compare line CD# is high while the compare line CD is low. Thus the transistor MN6 is on, causing a low voltage being applied from the compare line CD to the gate of a transistor MN9 and then the transistor MN9 remaining off.

Type 8—2-Port CAM Cell Variation II

Figure 41:
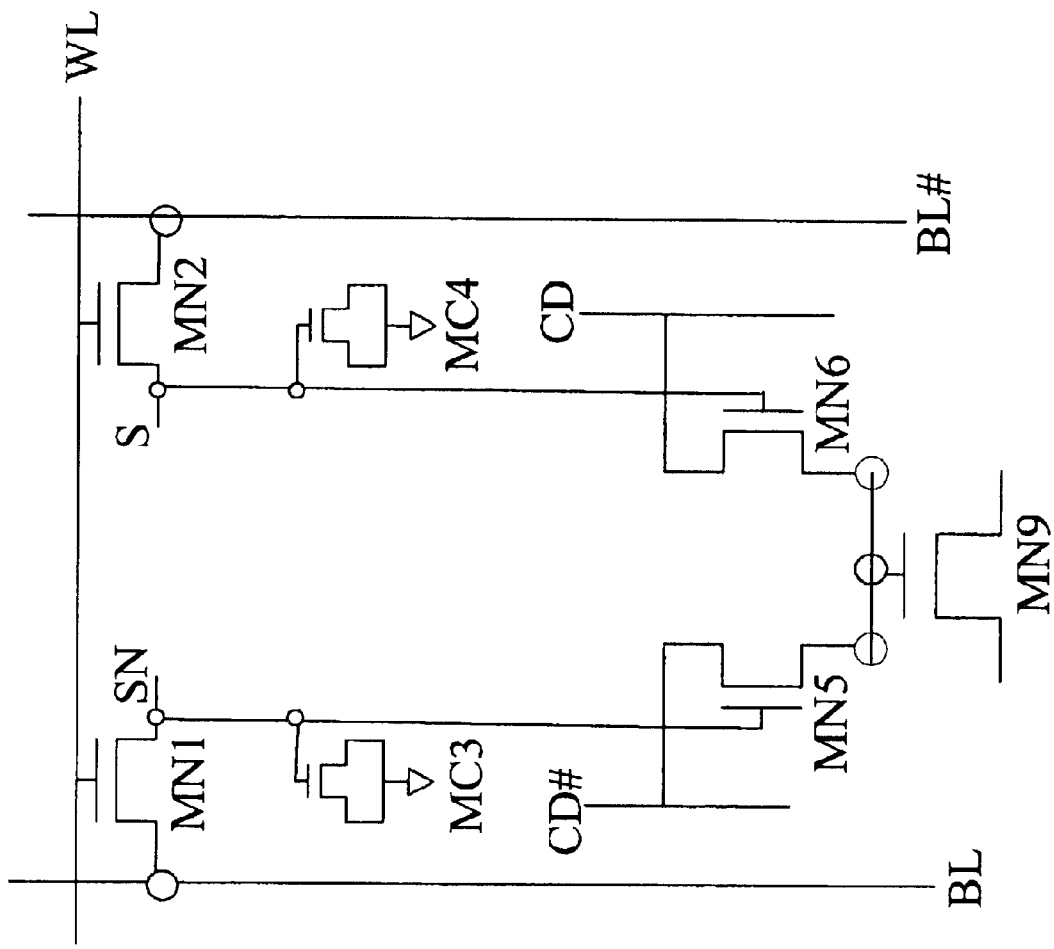
FIG. 41 is a diagram of a second variation of the 2-port dynamic differential CAM as shown in FIG. 39 of the fifth preferred embodiment of the invention.

Refer to FIG. 41, which is a diagram of a second variation of the single-port dynamic differential CAM as shown in the FIG. 39 of the fifth preferred embodiment of the invention. This CAM cell stored one bit of data, but the data is stored differentially as true and complement data. The important variation of the embodiment is that two transistors MN3 and MN4, which are shown in FIG. 39, are eliminated.

A pair of bit lines BL, BL# carry true and complement data to a column of cells. Two pass transistors MN1 and MN2 are turned on when word line WL is driven with a high voltage during a write operation. The pass transistor MN1 connects bit line BL to the capacitor MC3. Pass transistors MN2 connects bit line BL# to the capacitor MC4. The capacitors MC3 and MC4 can be, for example, MOS capacitors to meet the requirements of manufacturing process.

During read/write operation, word line WL is driven high for turning on the pass transistors MN1 and MN2. For storing data 1, bit line BL is high, storing charges in the capacitor MC3. Bit line BL# is low, driving a low voltage to the capacitor MC4 and storing little or no charges on the capacitor MC4. When word line WL is driven low, the accompanying capacitor MC3 stores many charges while the capacitor MC4 stores little or no charges. The opposite occurs when a data 0 is written to the cell. That is, the capacitor MC3 store a positive charge while the capacitor MC4 stores little or no charge.

The cell can be read by equalizing and pre-charging both bit lines BL and BL# to an intermediate voltage before word line WL is raised. One bit line is then driven low and the other is driven high by charges sharing as pass transistors MN1 and MN2 are turned on. A sensitive sense amplifier can then detect a slight voltage difference on bit lines BL and BL#. The cell can be refreshed by writing the sensed data back to the bit lines.

During a match or compare operation, word line WL is low and pass transistors MN1 and MN2 remain off. Thus the stored charges on the capacitors MC3 and MC4 are isolated and not disturbed.

For lower power consumption, a match transistor MN9 is introduced in the embodiment, as described above. If the comparing data matches the stored data in the CAM cell, the match transistor MN9 is turned on. However, if the comparing data does not match the stored data in the CAM cell, the match transistor MN9 remain off.

The comparing data from compare lines CD# and CD are applied to one of source/drain terminals of transistors MN5 and MN6 respectively. The other source/drain terminals of the transistors MN5 and MN6 are connected to the gate of the match transistors MN9. The complements of the comparing data are applied to these bit lines during the compare operation. Thus the compare line CD carries the complement of the comparing data. Complement compare line CD# carries the true comparing data.

When the comparing data matches the stored data in the CAM cell, the match transistor MN9 is turned on. For example, when the cell stores a 1, the charges stored on the gate of the transistor MN5 and the capacitor MC3 turns on the transistor MN5. The transistor MN6 remains off because gate of transistor MN6 and the capacitor MC4 stores little or no charge. The true comparing data is applied to the compare line CD# while the complement comparing data is applied to the compare line CD. Since the comparing data is also a 1, the compare line CD is low while the compare line CD# is high. Thus the transistor MN5 is on, causing a high voltage being applied to the gate of a transistor MN9 from the compare line CD# and then the transistor being turned on.

When the cell stores a 0, the charges stored on the gate of the transistor MN6 and the capacitor MC4 turns on the transistor MN6. The transistor MN5 remains off because gate of the transistor MN5 and the capacitor MC3 stores little or no charge. The true comparing data is applied to the compare line CD# while the complement comparing data is applied to the compare line CD. Since the comparing data is also a 0, the compare line CD# is low while the compare line CD is high. Since the comparing data is also a 1, the compare line CD is low while the compare line CD# is high. Thus the transistor MN6 is on, causing a high voltage being applied from the compare line CD to the gate of a transistor MN9 and then the transistor being turned on.

When the comparing data matches the stored data in the CAM cell, the match transistor MN9 is turned off. For example, when the stored data is "1," the stored data or stored charge on the gate of the transistor MN5 and the capacitor MC3 turns on the transistor MN5. When the comparing data is "0", the complement comparing data applied to the compare line CD is high and a low signal is applied to the compare line CD#. Since the comparing data is a 0, the compare line CD# is low while the compare line CD is high. Thus the transistor MN5 is on, causing a low voltage being applied from the compare line CD# to the gate of a transistor MN9 and then the transistor MN9 remaining off.

The transistor MN9 still remains off when the stored data is low but the comparing data is high. When the stored data is "0," the stored data or stored charge on the gate of the transistor MN6 and the capacitor MC4 turns on the transistor MN6. When the comparing data is "1", the complement comparing data applied to the compare line CD# is high and a low signal is applied to the compare line CD. Since the comparing data is a 1, the compare line CD# is high while the compare line CD is low. Thus the transistor MN6 is on, causing a low voltage being applied from the compare line CD to the gate of a transistor MN9 and then the transistor MN9 remaining off.

Type 9—2-Port CAM Cell Variation III

Figure 42:
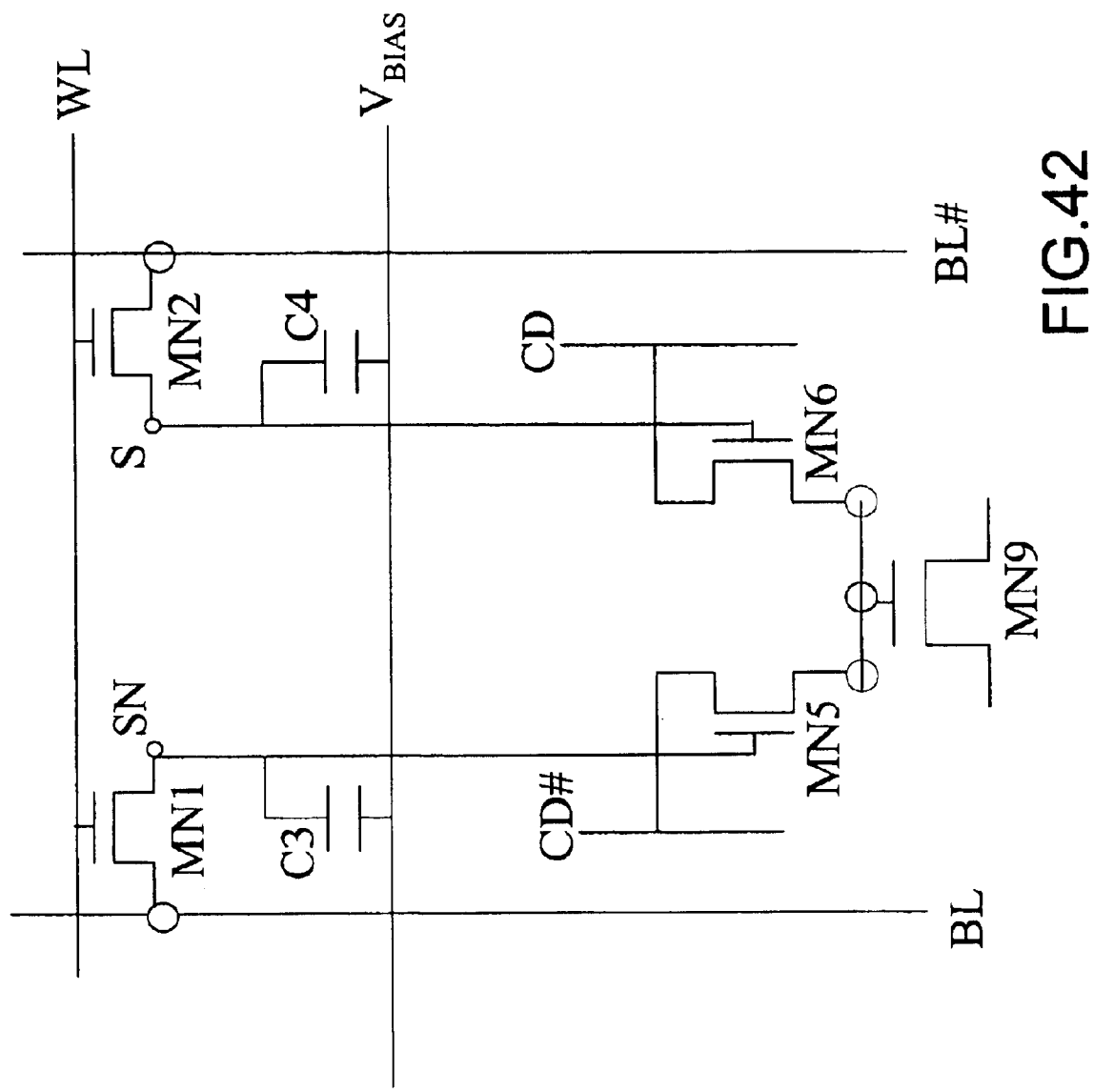
FIG. 42 is a diagram of a third variation of the 2-port dynamic differential CAM as shown in FIG. 39 of the fifth preferred embodiment of the invention.

Refer to FIG. 42, which is a diagram of a third variation of the 2-port dynamic differential CAM as shown in the FIG. 39 of the fifth preferred embodiment of the invention. This CAM cell stored one bit of data, but the data is stored differentially as true and complement data. The important variation of the embodiment is that two transistors MN3 and MN4 shown in FIG. 34 are eliminated and two capacitors, MC3 and MC4 are replaced by the capacitors C3 and C4, which are manufactured by a DRAM process and can be DRAM capacitors, for example. A plate bias voltage $V_{BIAS}$ is applied to one terminal of each of the capacitors. For variations, the capacitors can be capacitors manufactured by a FRAM (Ferroelectric random-access memory), DRAM or MIM (metal-insulator-metal) capacitor process. Either polysilicon and metal-insulator-metal (MIM) capacitors can be used for the capacitors. The MIM capacitor module, which is inserted into the backend process of integrated circuit manufacturing, results in a very low capacitance density. The capacitance density is proportional b the reverse of the dielectric thickness. Often, sophisticated additional metal and dielectric layers must be added for high capacitance density.

A pair of bit lines BL, BL# carry true and complement data to a column of cells. Two pass transistors MN1 and MN2 are turned on when word line WL is driven with a high voltage during a write operation. The pass transistor MN1 connects bit line BL to the capacitor C3. Pass transistors MN2 connects bit line BL# to the capacitor C4. The capacitors C3 and C4 can be, for example, MOS capacitors to meet the requirements of manufacturing process.

During read/write operation, word line WL is driven high for turning on the pass transistors MN1 and MN2. For storing data 1, bit line BL is high, storing charges in the capacitor C3. Bit line BL# is low, driving a low voltage to the capacitor C4 and storing little or no charges on the capacitor MC4. When word line WL is driven low, the accompanying capacitor C3 stores many charges while the capacitor C4 stores little or no charges. The opposite occurs when a data 0 is written to the cell. That is, the capacitor C3 store a positive charge while the capacitor C4 stores little or no charge.

The cell can be read by equalizing and pre-charging both bit lines BL and BL# to an intermediate voltage before word line WL is raised. One bit line is then driven low and the other is driven high by charges sharing as pass transistors MN1 and MN2 are turned on. A sensitive sense amplifier can then detect a slight voltage difference on bit lines BL and BL#. The cell can be refreshed by writing the sensed data back to the bit lines.

During a match or compare operation, word line WL is low and pass transistors MN1 and MN2 remain off. Thus the stored charges on the capacitors C3 and C4 are isolated and not disturbed.

For lower power consumption, a match transistor MN9 is introduced in the embodiment, as described above. If the comparing data matches the stored data in the CAM cell, the match transistor MN9 is turned on. However, if the comparing data does not match the stored data in the CAM cell, the match transistor MN9 remain off.

The comparing data from compare lines CD# and CD are applied to one of source/drain terminals of transistors MN5 and MN6 respectively. The other source/drain terminals of the transistors MN5 and MN6 are connected to the gate of the match transistors MN9. The complements of the comparing data are applied to these bit lines during the compare operation. Thus the compare line CD carries the complement of the comparing data. Complement compare line CD# carries the true comparing data.

When the comparing data matches the stored data in the CAM cell, the match transistor MN9 is turned on. For example, when the cell stores a 1, the charges stored on the gate of the transistor MN5 and the capacitor C3 turns on the transistor MN5. The transistor MN6 remains off because gate of transistor MN6 and the capacitor C4 stores little or no charge. The true comparing data is applied to the compare line CD# while the complement comparing data is applied to the compare line CD. Since the comparing data is also a 1, the compare line CD is low while the compare line CD# is high. Thus the transistor MN5 is on, causing a high voltage being applied to the gate of a transistor MN9 from the compare line CD# and then the transistor being turned on.

When the cell stores a 0, the charges stored on the gate of the transistor MN6 and the capacitor C4 turns on the transistor MN6. The transistor MN5 remains off because gate of the transistor MN5 and the capacitor C3 stores little or no charge. The true comparing data is applied to the compare line CD# while the complement comparing data is applied to the compare line CD. Since the comparing data is also a 0, the compare line CD# is low while the compare line CD is high. Since the comparing data is also a 1, the compare line CD is low while the compare line CD# is high. Thus the transistor MN6 is on, causing a high voltage being applied from the compare line CD to the gate of a transistor MN9 and then the transistor being turned on.

When the comparing data matches the stored data in the CAM cell, the match transistor MN9 is turned off. For example, when the stored data is "1," the stored data or stored charge on the gate of the transistor MN5 and the capacitor C3 turns on the transistor MN5. When the comparing data is "0", the complement comparing data applied to the compare line CD is high and a low signal is applied to the compare line CD#. Since the comparing data is a 0, the compare line CD# is low while the compare line CD is high. Thus the transistor MN5 is on, causing a low voltage being applied from C the compare line D# to the gate of a transistor MN9 and then the transistor MN9 remaining off.

The transistor MN9 still remains off when the stored data is low but the comparing data is high. When the stored data is "0," the stored data or stored charge on the gate of the transistor MN6 and the capacitor C4 turns on the transistor MN6. When the comparing data is "1", the complement comparing data applied to the compare line CD# is high and a low signal is applied to the compare line CD. Since the comparing data is a 1, the compare line CD# is high while the compare line CD is low. Thus the transistor MN6 is on, causing a low voltage being applied from the compare line CD to the gate of a transistor MN9 and then the transistor MN9 remaining off.

Type 10—2-Port CAM Cell Variation IV

Figure 43:
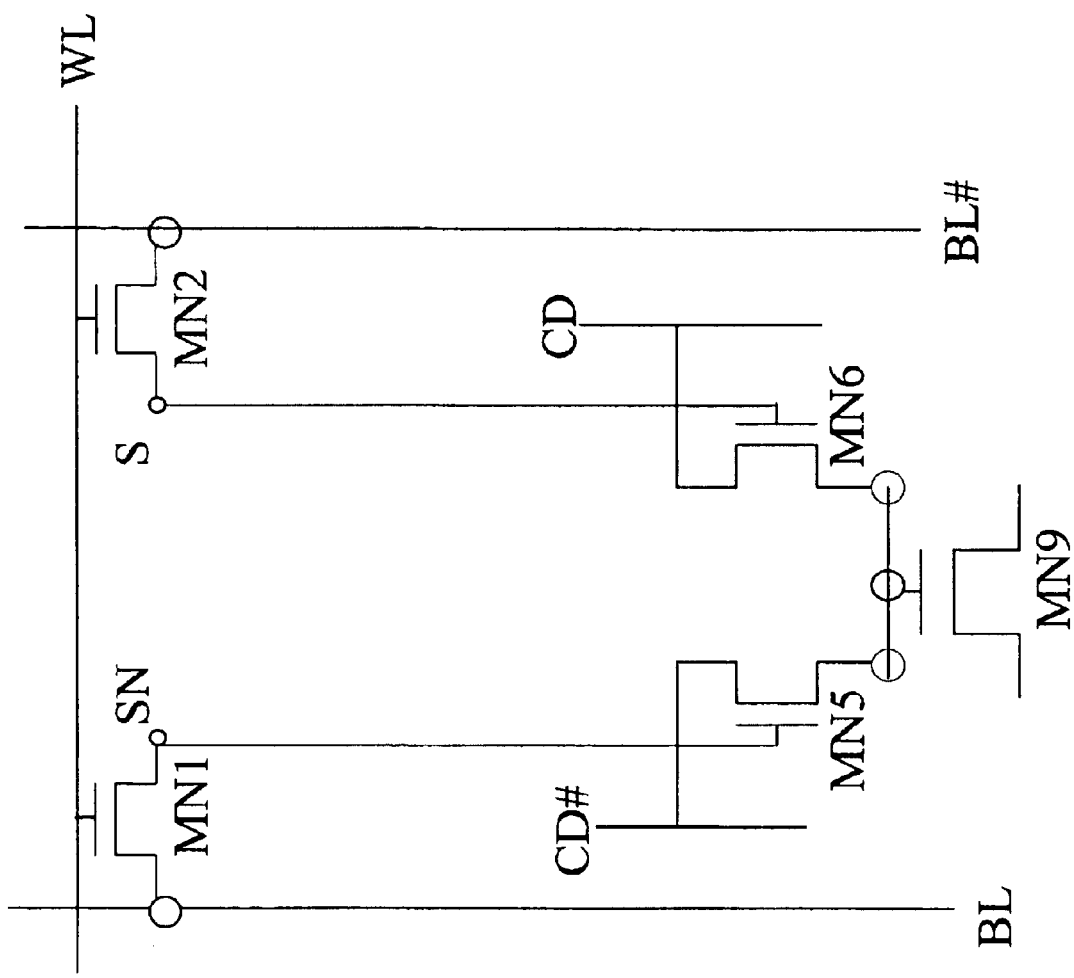
FIG. 43 is a diagram of a forth variation of the 2-port dynamic differential CAM as shown in FIG. 39 of the fifth preferred embodiment of the invention.

Refer to FIG. 43, which is a diagram of a forth variation of the 2-port dynamic differential CAM as shown in the FIG. 39 of the fifth preferred embodiment of the invention. This CAM cell stored one bit of data, but the data is stored differentially as true and complement data. The important variation of the embodiment is that two storage transistors MN3 and MN4 as well as two capacitors MC3 and MC4, which are shown in FIG. 34, are eliminated.

A pair of bit lines BL, BL# carry true and complement data to a column of cells. Two pass transistors MN1 and MN2 are turned on when word line WL is driven with a high voltage during a write operation. The pass transistor MN1 connects bit line BL to the gate of the transistor MN5. Pass transistors MN2 connects bit line BL# to the gate of the transistor MN6. One gate is charged high while the other gate is charged low.

During read/write operation, word line WL is driven high for turning on the pass transistors MN1 and MN2. For storing data 1, bit line BL is high, storing a high voltage on the gate of the transistor MN5. Bit line BL# is low, driving a low voltage on the gate of the transistor MN6. When word line WL is driven low, the gate of the storage transistor MN5 stores a positive charge while the gate of the storage transistor MN6 stores little or no charge. The opposite occurs when a data 0 is written to the cell. That is, the gate of the storage transistor MN6 stores a positive charge while the gate of the storage transistor MN5 stores little or no charge.

The cell can be read by equalizing and pre-charging both bit lines BL and BL# to an intermediate voltage before word line WL is raised. One bit line is then driven low and the other is driven high by charge sharing as pass transistors MN1 and MN2 are turned on. A sensitive sense amplifier can then detect a slight voltage difference on bit lines BL and BL#. The cell can be refreshed by writing the sensed data back to the bit lines.

During a match or compare operation, word line WL is low and pass transistors MN1 and MN2 remain off. Thus the stored charges on the gates of the transistors MN5 and MN6 are isolated and not disturbed.

For lower power consumption, a match transistor MN9 is introduced in the embodiment, as described above. If the comparing data matches the stored data in the CAM cell, the match transistor MN9 is turned on. However, if the comparing data does not match the stored data in the CAM cell, the match transistor MN9 remain off.

The comparing data from compare lines CD# and CD are applied to one of source/drain terminals of transistors MN5 and MN6 respectively. The other source/drain terminals of the transistors MN5 and MN6 are connected to the gate of the match transistors MN9. The complements of the comparing data are applied to these bit lines during the compare operation. Thus the compare line CD carries the complement of the comparing data. Complement compare line CD# carries the true comparing data.

When the comparing data matches the stored data in the CAM cell, the match transistor MN9 is turned on For example, when the cell stores a 1, the transistor MN5 is on but the transistor MN6 is off. The charges stored on the gate of the transistor MN5 turn on the transistor MN5. The transistor MN6 remains off because gate of the transistor MN6 stores little or no charge. The true comparing data is applied to the compare line CD# while the complement comparing data is applied to the compare line CD. Since the comparing data is also a 1, the compare line CD is low while the compare line CD# is high. Thus the transistor MN5 is on, causing a high voltage being applied to the gate of a transistor MN9 from the compare line CD# and then the transistor being turned on.

When the cell stores a 0, the transistor MN6 is on but the transistor MN5 is off. The charges stored on the gate of storage transistor MN6 turn on the transistor MN6. The transistor MN5 remains off because gate of the transistor MN5 stores little or no charge. The true comparing data is applied to the compare line CD# while the complement comparing data is applied to the compare line CD. Since the comparing data is also a 0, the compare line CD# is low while the compare line CD is high. Since the comparing data is also a 1, the compare line CD is low while the compare line CD# is high. Thus the transistor MN6 is on, causing a high voltage being applied from the compare line CD to the gate of a transistor MN9 and then the transistor being turned on.

When the comparing data matches the stored data in the CAM cell, the match transistor MN9 is turned off. For example, when the stored data is "1," the stored data or stored charge on the gate of the transistor MN5 turn on the transistor MN5. When the comparing data is "0", the complement comparing data applied to the compare line CD is high and a low signal is applied to the compare line CD#. Since the comparing data is a 0, the compare line CD# is low while the compare line CD is high. Thus the transistor MN5 is on, causing a low voltage being applied from the compare line CD# to the gate of a transistor MN9 and then the transistor MN9 remaining off.

The transistor MN9 still remains off when the stored data is low but the comparing data is high. When the stored data is "0," the stored data or stored charge on the gate of the transistor MN6 turn on the transistor MN6. When the comparing data is "1", the complement comparing data applied to the compare line CD# is high and a low signal is applied to the compare line CD. Since the comparing data is a 1, the compare line CD# is high while the compare line CD is low. Thus the transistor MN6 is on, causing a low voltage being applied from the compare line CD to the gate of a transistor MN9 and then the transistor MN9 remaining off.

Type 11—3-Port CAM Cell

Figure 44:
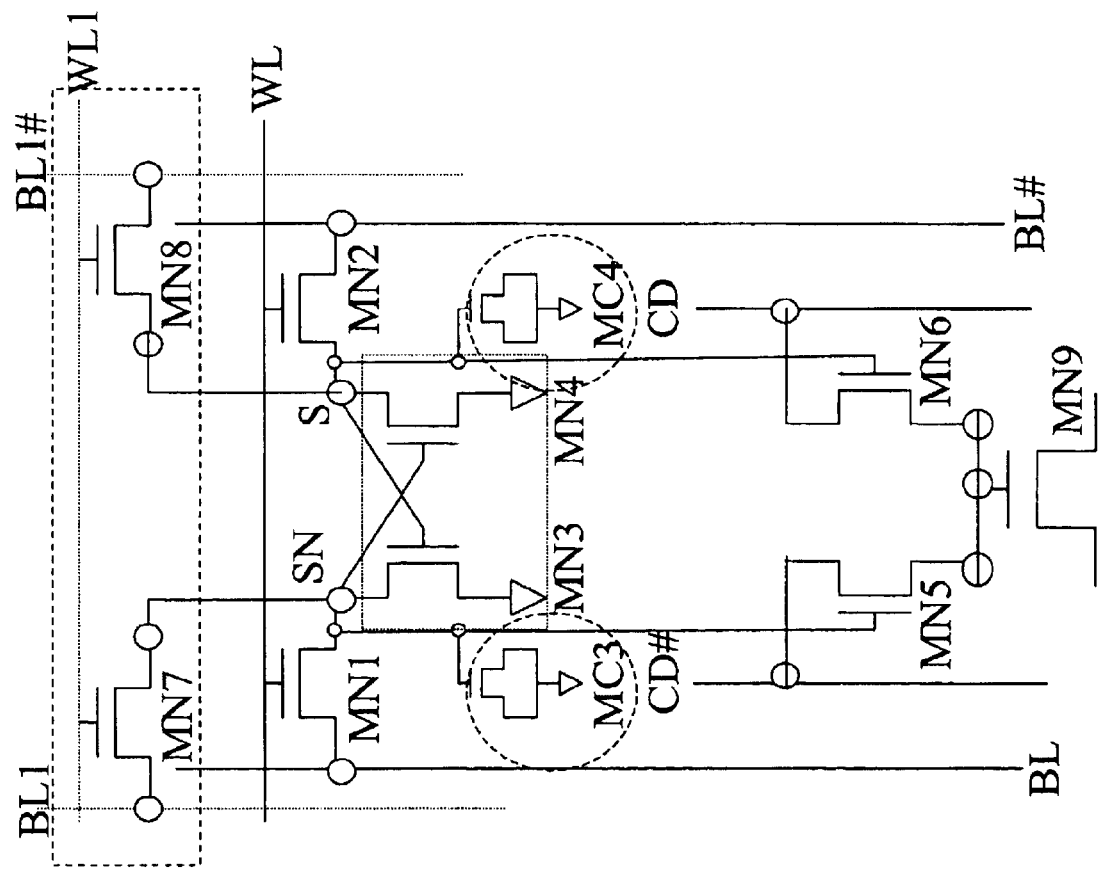
FIG. 44 is a diagram of a 3-port dynamic differential CAM of the fifth preferred embodiment of the invention.

Refer to FIG. 44, which is a diagram of a 3-port dynamic differential CAM of the fifth-preferred embodiment of the invention. This CAM cell stored one bit of data, but the data is stored differentially as true and complement data.

Operations of such 3-port CAM cell are familiar with the operations described in FIG. 39 except a separate pair of bit lines BL1 and BL1# and an additional word line WL1 are provided in this type of CAM cell of the forth preferred embodiment of the invention.

These two word lines can be arranged as followed. In a case that if word line WL is used for SRAM write operation, the other word line WL1 is used for refresh. In another case that if word line WL is used for write operation, the other word line WL1 is used for read operation, while a wave-pipeline technique is used for refresh cycle (which means hidden refresh). In further case that if word line WL is used for write operation, word line WL1 is used for read operation, while idle a refresh cycle for such dynamic CAM cell.

As describe above, there bit lines can be arranged as followed. In a case that Match operation and Read/Write operation can be performed in the same cycle through different pair of bit lines, while a wave-pipeline technique for refresh cycle (which means hidden refresh). In other case that Match operation and Read/Write operation can be performed in the same cycle through different pair of bit lines, while idle one cycle for refresh.

For combing these arrangements together, which means two pairs of bit lines BL, BL# and BL1, BL1#, and two word lines WL, WL1 are provided. These features described above for two-pair bit lines and two word lines can be incorporated together for different purposes. For example, if word line WL is used for SRAM write operation, the other word line WL1 is used for refresh. The Match operation can be performed in the same cycle when write operation and refresh operation are performed. Another arrangement can also that if word line WL is for write operation, the word line WL1 is for read operation, while a wave-pipeline technique for hidden refresh is used for a refresh cycle (which means hidden refresh) and Match operation is performed in the same cycle. Another choice of arrangement is that if the word line WL is for write operation, the other word line WL1 is for read operation, while Match operation is performed in the same cycle and idle a refresh cycle for refresh operation (for dynamic CAM cells). The read/write operation accompanying with the refresh operation will be described in tails in FIG. 66.

Type 12—3-Port CAM Cell Variation I

Figure 45:
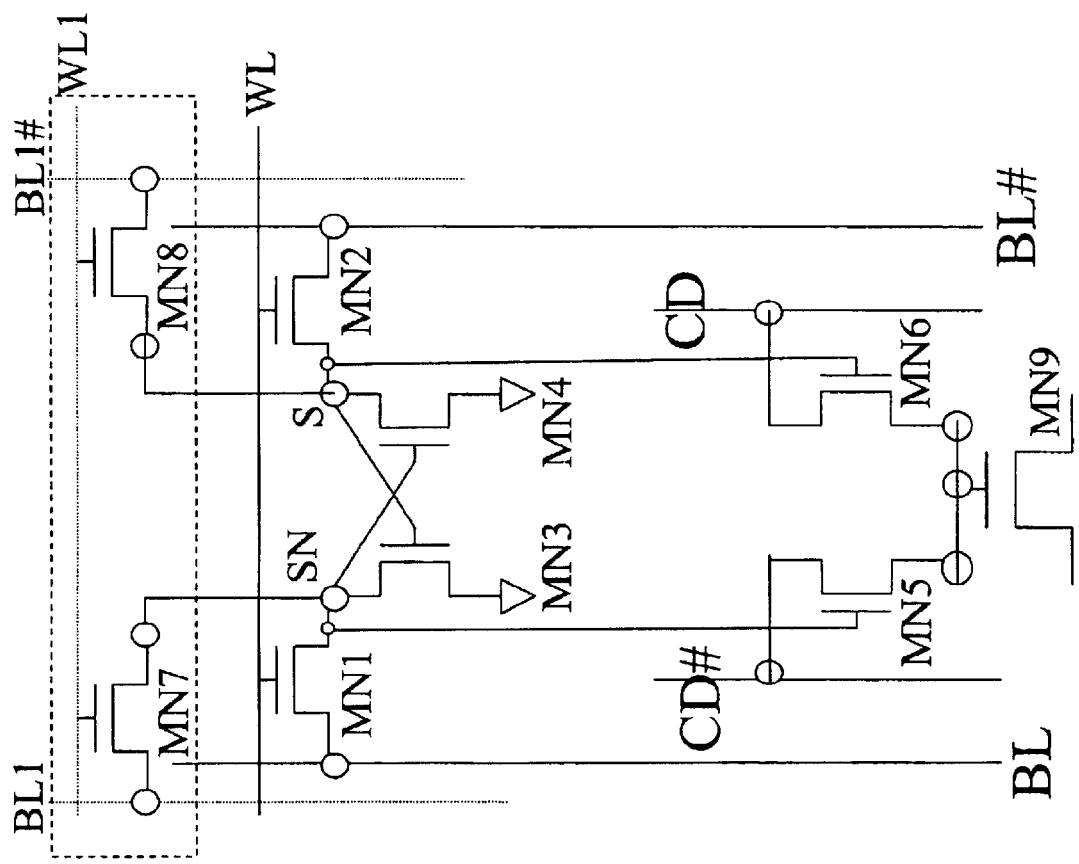
FIG. 45 is a diagram of a first variation of the 3-port dynamic differential CAM as shown in FIG. 44 of the fifth preferred embodiment of the invention.

Refer to FIG. 45, which is a diagram of a first variation of the 3-port dynamic differential CAM, as shown in the FIG. 44 of the fifth-preferred embodiment of the invention. This CAM cell stored one bit of data, but the data is stored differentially as true and complement data. The important variation of the embodiment is that two capacitors MC3 and MC4, shown in FIG. 44, are eliminated.

Operations of such 3-port CAM cell are familiar with the operations described in FIG. 40 except a separate pair of bit lines BL1 and BL1# and an additional word line WL1 are provided in this type of CAM cell of the fifth-preferred embodiment of the invention. These features are the same as described in the first type of 3-port CAM cell shown in FIG. 44.

Type 13—3-Port CAM Cell Variation II

Figure 46:
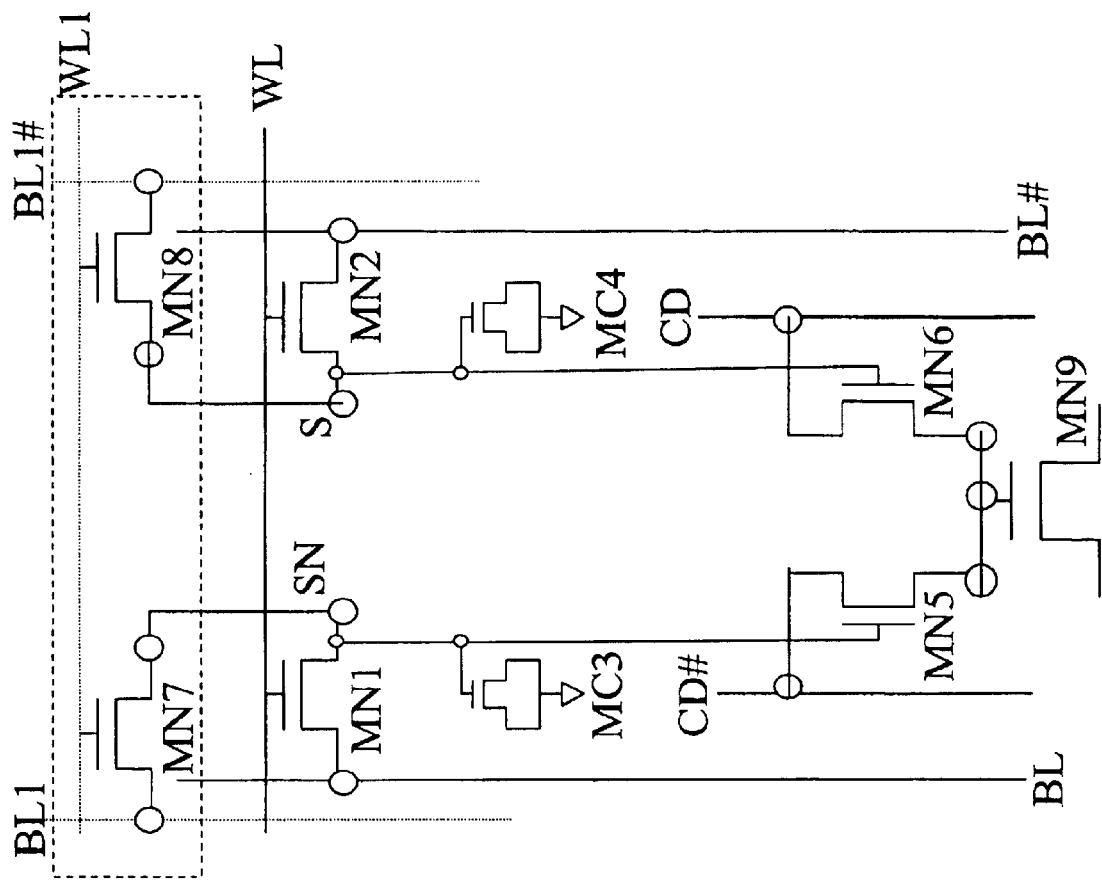
FIG. 46 is a diagram of a second variation of the 3-port dynamic differential CAM as shown in FIG. 44 of the fifth preferred embodiment of the invention.

Refer to FIG. 46, which is a diagram of a second variation of the 3-port dynamic differential CAM, as shown in the FIG. 44 of the fifth-preferred embodiment of the invention. This CAM cell stored one bit of data, but the data is stored differentially as true and complement data. The important variation of the embodiment is that two transistors MN3 and MN4, shown in FIG. 44, are eliminated.

Operations of such 3-port CAM cell are familiar with the operations described in FIG. 41 except a separate pair of bit lines BL1 and BL1# and an additional word line WL1 are provided in this type of CAM cell of the fifth-preferred embodiment of the invention. These features are the same as described in the first type of 3-port CAM cell shown in FIG. 44.

Type 14—3-Port CAM Cell Variation III

Figure 47:
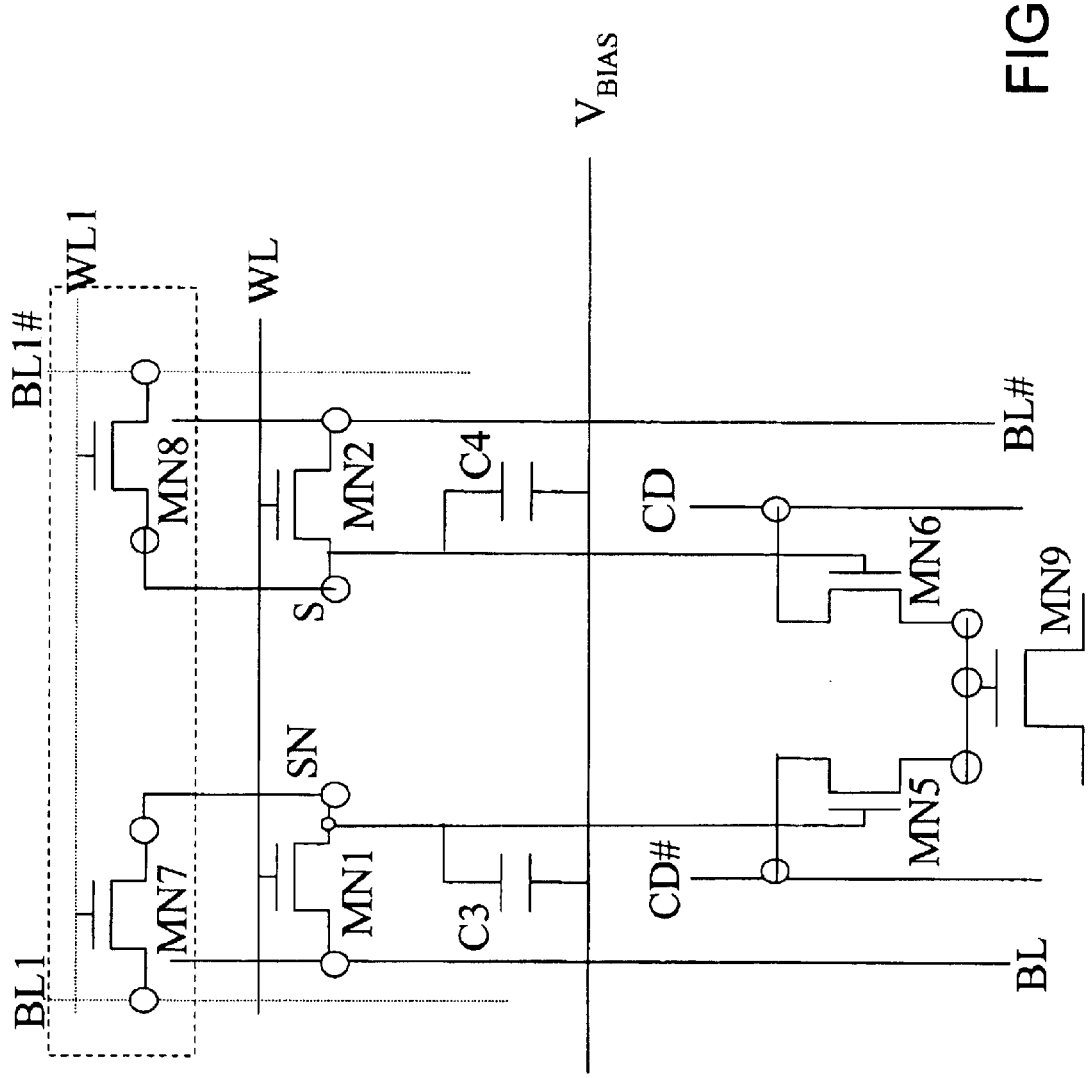
FIG. 47 is a diagram of a third variation of the 3-port dynamic differential CAM as shown in FIG. 44 of the fifth preferred embodiment of the invention.

Refer to FIG. 47, which is a diagram of a third variation of the 3-port dynamic differential CAM, as shown in the FIG. 44 of the fifth-preferred embodiment of the invention. This CAM cell stored one bit of data, but the data is stored differentially as true and complement data. The important variation of the embodiment is that two transistors MN3 and MN4 shown in FIG. 44 are eliminated and two capacitors MC3 and MC4 are replaced by the capacitors C3 and C4, which are manufactured by a DRAM process and can be DRAM capacitors, for example. A plate bias voltage $V_{BIAS}$ is applied to one terminal of each of the capacitors. For variations, the capacitors can be capacitors manufactured by a FRAM (Ferroelectric random-access memory), DRAM or MIM (metal-insulator-metal) capacitor process. Either polysilicon and metal-insulator-metal (MIM) capacitors can be used for the capacitors. The MIM capacitor module, which is inserted into the backend process of integrated circuit manufacturing, results in a very low capacitance density. The capacitance density is proportional to the reverse of the dielectric thickness. Often, sophisticated additional metal and dielectric layers must be added for high capacitance density.

Operations of such 3-port CAM cell are familiar with the operations described in FIG. 42 except a separate pair of bit lines BL1 and BL1# and an additional word line WL1 are provided in this type of CAM cell of the fifth-preferred embodiment of the invention. These features are the same as described in the first type of 3-port CAM cell shown in FIG. 44.

Type 15—3-Port CAM Cell Variation IV

Figure 48:
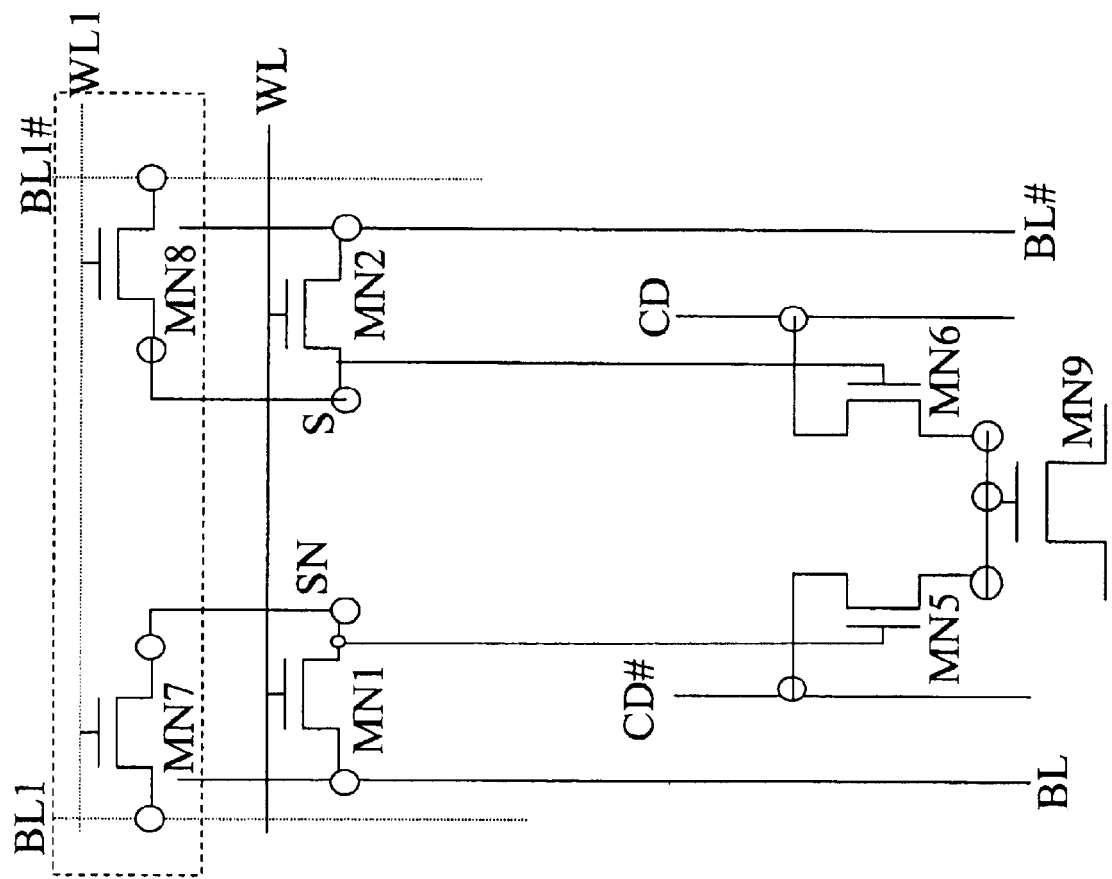
FIG. 48 is a diagram of a forth variation of the 3-port dynamic differential CAM as shown in FIG. 44 of the fifth preferred embodiment of the invention.

Refer to FIG. 48, which is a diagram of a forth variation of the 3-port dynamic differential CAM, as shown in the FIG. 44 of the fifth-preferred embodiment of the invention. This CAM cell stored one bit of data, but the data is stored differentially as true and complement data. The important variation of the embodiment is that two transistors MN3 and MN4 and two capacitors MC3 and MC4, shown in FIG. 44, are eliminated.

Operations of such 3-port CAM cell are familiar with the operations described in FIG. 43 except a separate pair of bit lines BL1 and BL1# and an additional word line WL1 are provided in this type of CAM cell of the fifth-preferred embodiment of the invention. These features are the same as described in the first type of 3-port CAM cell shown in FIG. 44.

Type 16—3-Port CAM Cell Variation V

Figure 49:
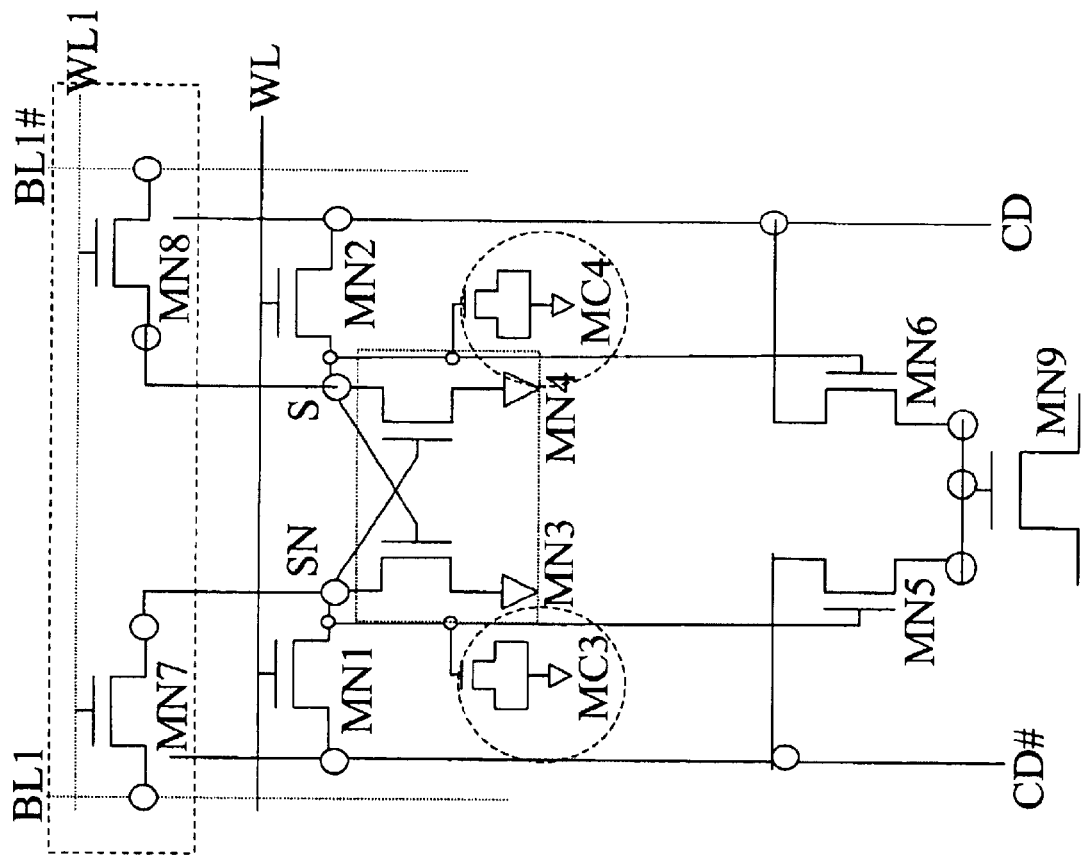
FIG. 49 is a diagram of a fifth variation of the 3-port dynamic differential CAM as shown in FIG. 44 of the fifth preferred embodiment of the invention.

Refer to FIG. 49, which is a diagram of a fifth variation of the 3-port dynamic differential CAM, as shown in the FIG. 44 of the fifth-preferred embodiment of the invention. This CAM cell stored one bit of data, but the data is stored differentially as true and complement data.

Operations of such 3-port CAM cell are familiar with the operations described in FIG. 34 except a separate pair of bit lines BL1 and BL1# and an additional word line WL1 are provided in this type of CAM cell of the fifth-preferred embodiment of the invention. These features are the same as described in the first type of 3-port CAM cell shown in FIG. 44.

Type 17—3-Port CAM Cell Variation VI

Figure 50:
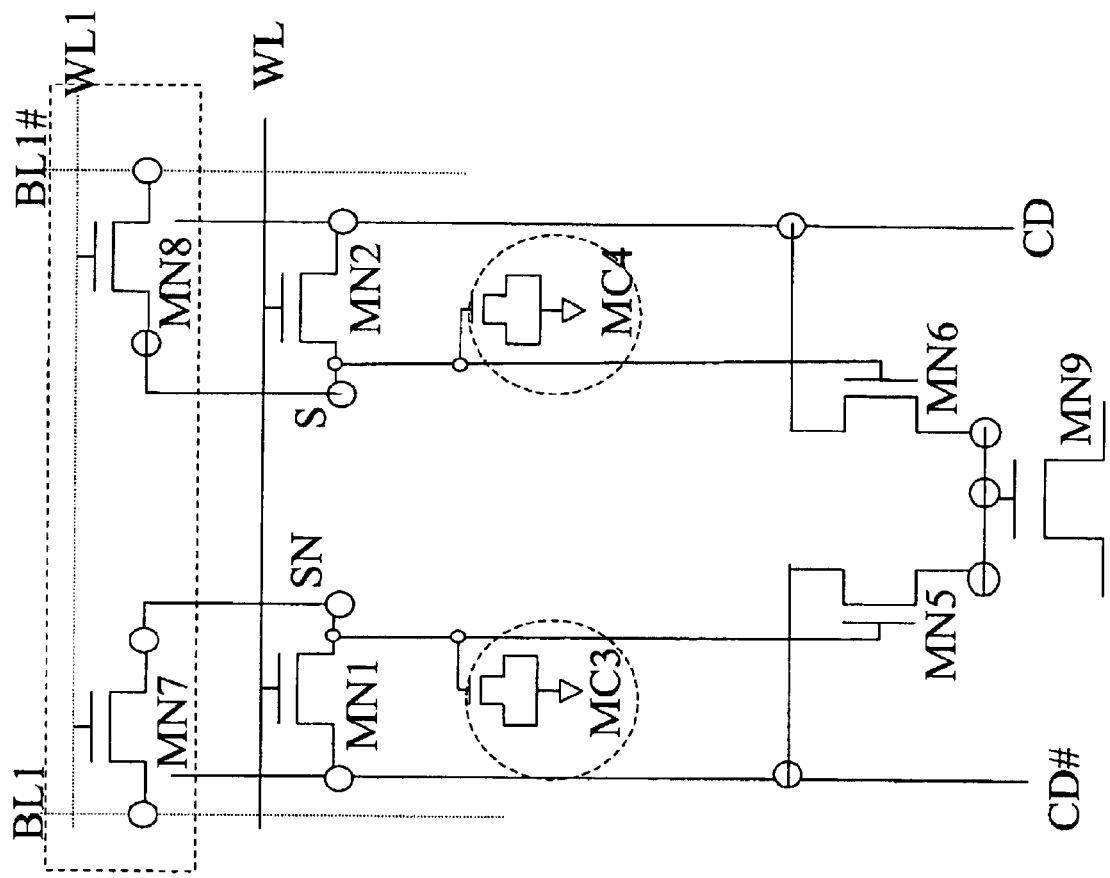
FIG. 50 is a diagram of a sixth variation of the 3-port dynamic differential CAM as shown in FIG. 44 of the fifth preferred embodiment of the invention.

Refer to FIG. 50, which is a diagram of a sixth variation of the 3-port dynamic differential CAM, as shown in the FIG. 44 of the fifth-preferred embodiment of the invention. This CAM cell stored one bit of data, but the data is stored differentially as true and complement data. The important variation of the embodiment is that two transistors MN3 and MN4, shown in FIG. 44, are eliminated.

Operations of such 3-port CAM cell are familiar with the operations described in FIG. 35 except a separate pair of bit lines BL1 and BL1# and an additional word line WL1 are provided in this type of CAM cell of the fifth-preferred embodiment of the invention. These features are the same as described in the first type of 3-port CAM cell shown in FIG. 44.

Type 18—3-Port CAM Cell Variation VII

Figure 51:
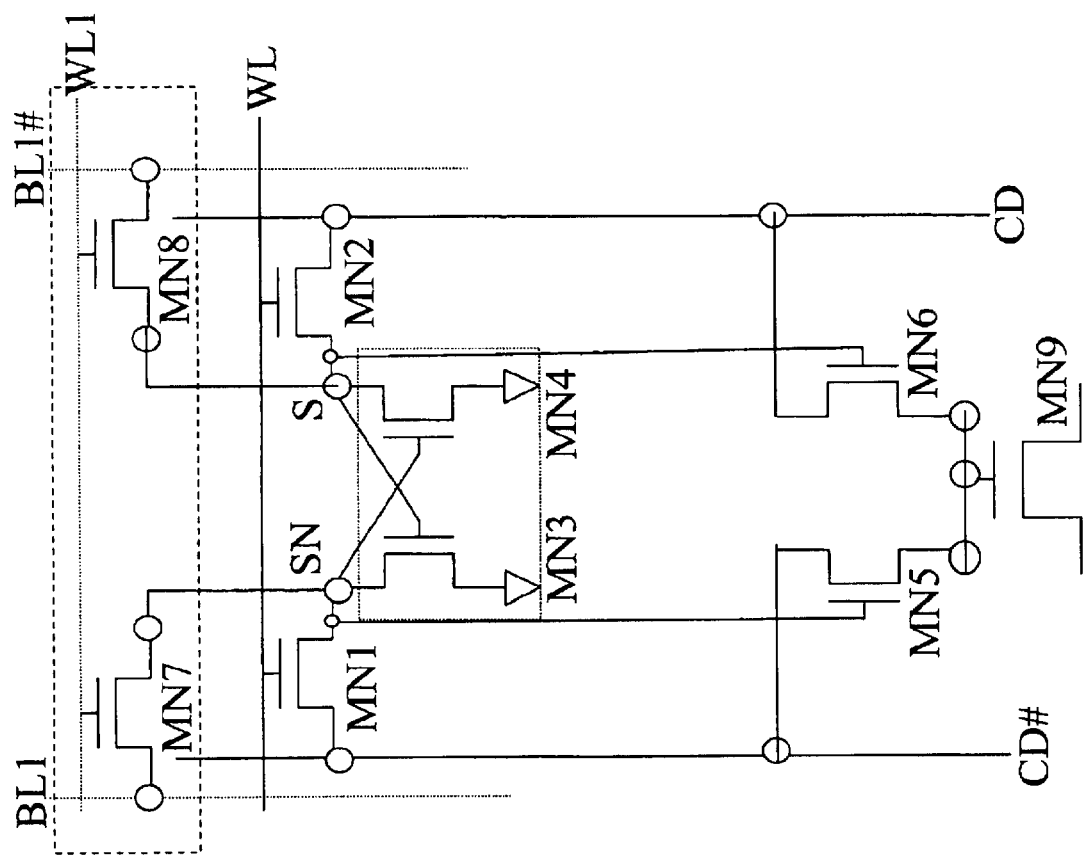
FIG. 51 is a diagram of a seventh variation of the 3-port dynamic differential CAM as shown in FIG. 44 of the fifth preferred embodiment of the invention.

Refer to FIG. 51, which is a diagram of a seventh variation of the 3-port dynamic differential CAM, as shown in the FIG. 44 of the fifth-preferred embodiment of the invention. This CAM cell stored one bit of data, but the data is stored differentially as true and complement data. The important variation of the embodiment is that two capacitors MC3 and MC4, shown in FIG. 44, are eliminated.

Operations of such 3-port CAM cell are familiar with the operations described in FIG. 36 except a separate pair of bit lines BL1 and BL1# and an additional word line WL1 are provided in this type of CAM cell of the fifth-preferred embodiment of the invention. These features are the same as described in the first type of 3-port CAM cell shown in FIG. 44.

Type 19—3-Port CAM Cell Variation V III

Figure 52:
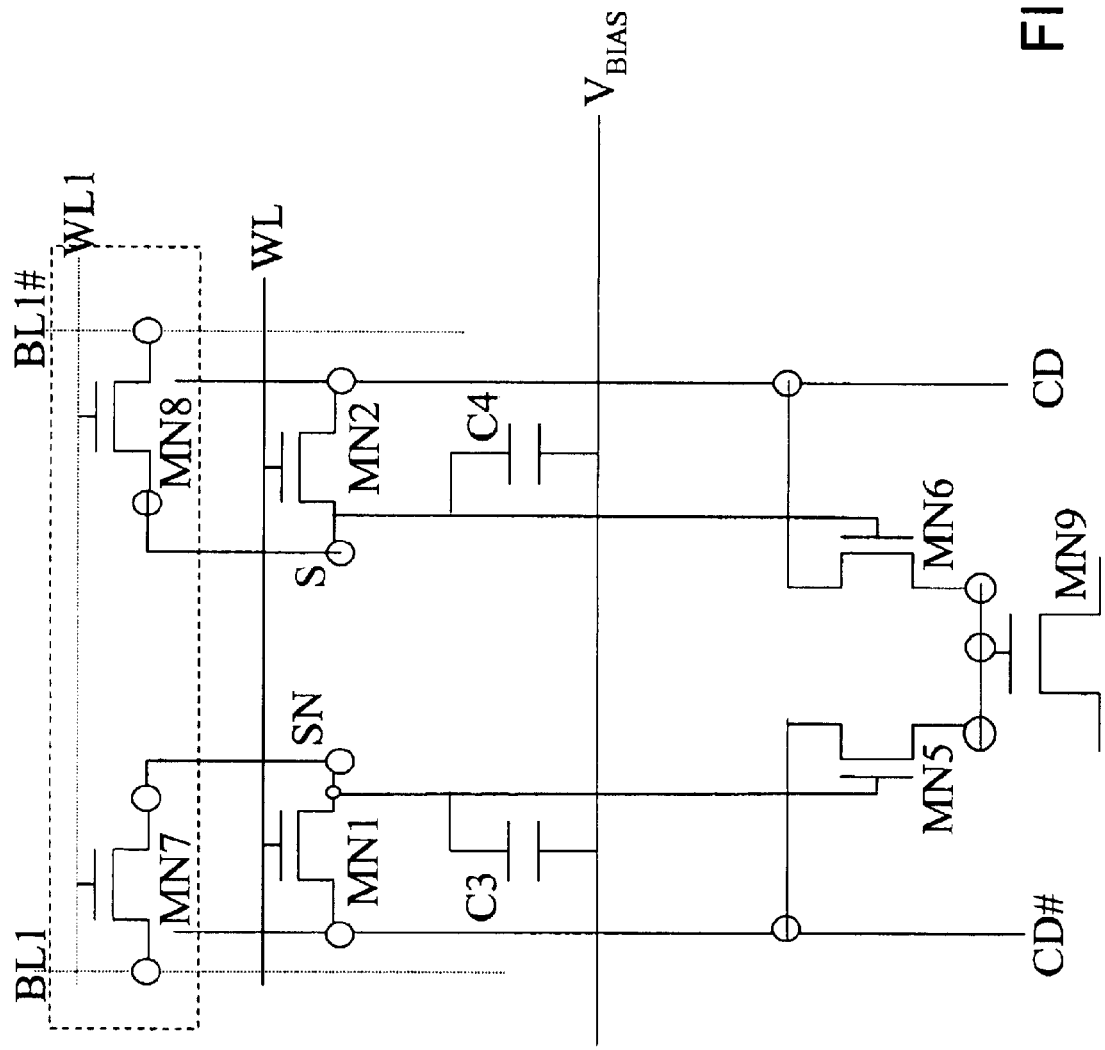
FIG. 52 is a diagram of an eighth variation of the 3-port dynamic differential CAM as shown in FIG. 44 of the fifth preferred embodiment of the invention.

Refer to FIG. 52, which is a diagram of a eighth variation of the 3-port dynamic differential CAM as shown in the FIG. 44 of the fifth-preferred embodiment of the invention. This CAM cell stored one bit of data, but the data is stored differentially as true and complement data. The important variation of the embodiment is that two transistors MN3 and MN4 shown in FIG. 44 are eliminated and two capacitors MC3 and MC4 are replaced by the capacitors C3 and C4, which are manufactured by a DRAM process and can be DRAM capacitors, for example. A plate bias voltage $V_{BIAS}$ is applied to one terminal of each of the capacitors. For variations, the capacitors can be capacitors manufactured by a FRAM (Ferroelectric random-access memory), DRAM or MIM (metal-insulator-metal) capacitor process. Either polysilicon and metal-insulator-metal (MIM) capacitors can be used for the capacitors. The MIM capacitor module, which is inserted into the backend process of integrated circuit manufacturing, results in a very low capacitance density. The capacitance density is proportional to the reverse of the dielectric thickness. Often, sophisticated additional metal and dielectric layers must be added for high capacitance density.

Operations of such 3-port CAM cell are familiar with the operations described in FIG. 38 except a separate pair of bit lines BL1 and BL1# and an additional word line WL1 are provided in this type of CAM cell of the fifth-preferred embodiment of the invention. These features are the same as described in the first type of 3-port CAM cell shown in FIG. 44.

Type 20—3-Port CAM Cell Variation IX

Figure 53:
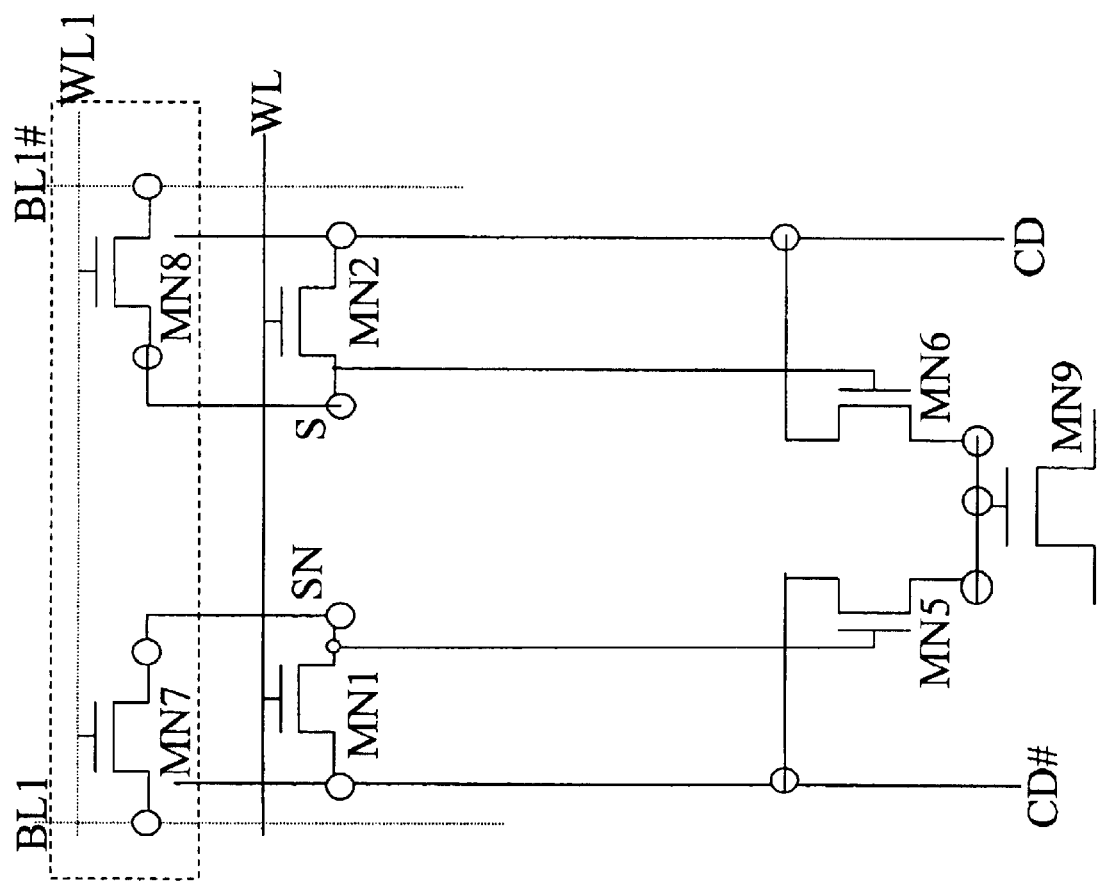
FIG. 53 is a diagram of a ninth variation of the 3-port dynamic differential CAM as shown in FIG. 44 of the fifth preferred embodiment of the invention.

Refer to FIG. 53, which is a diagram of a ninth variation of the 3-port dynamic differential CAM, as shown in the FIG. 44 of the fifth-preferred embodiment of the invention. This CAM cell stored one bit of data, but the data is stored differentially as true and complement data. The important variation of the embodiment is that two transistors MN3 and MN4 and two capacitors MC3 and MC4, shown in FIG. 44, are eliminated.

Operations of such 3-port CAM cell are familiar with the operations described in FIG. 37 except a separate pair of bit lines BL1 and BL1# and an additional word line WL1 are provided in this type of CAM cell of the fifth-preferred embodiment of the invention. These features are the same as described in the first type of 3-port CAM cell shown in FIG. 44.

Applications of the Embodiments of CAM Cells

In the fifth preferred embodiment of the CAM cells of the invention, different combinations or modifications of such CAM cells can be implemented in accordance with the design requirements. Accompanying peripheral circuits can also be designed in accordance with the memory products. These CAM cells can also be embedded in some specific-purpose semiconductor products in supports of comparing the desired information against the entire list of pre-stored entries simultaneously, often resulting in an order-of-magnitude reduction in the search time.

Figure 54:
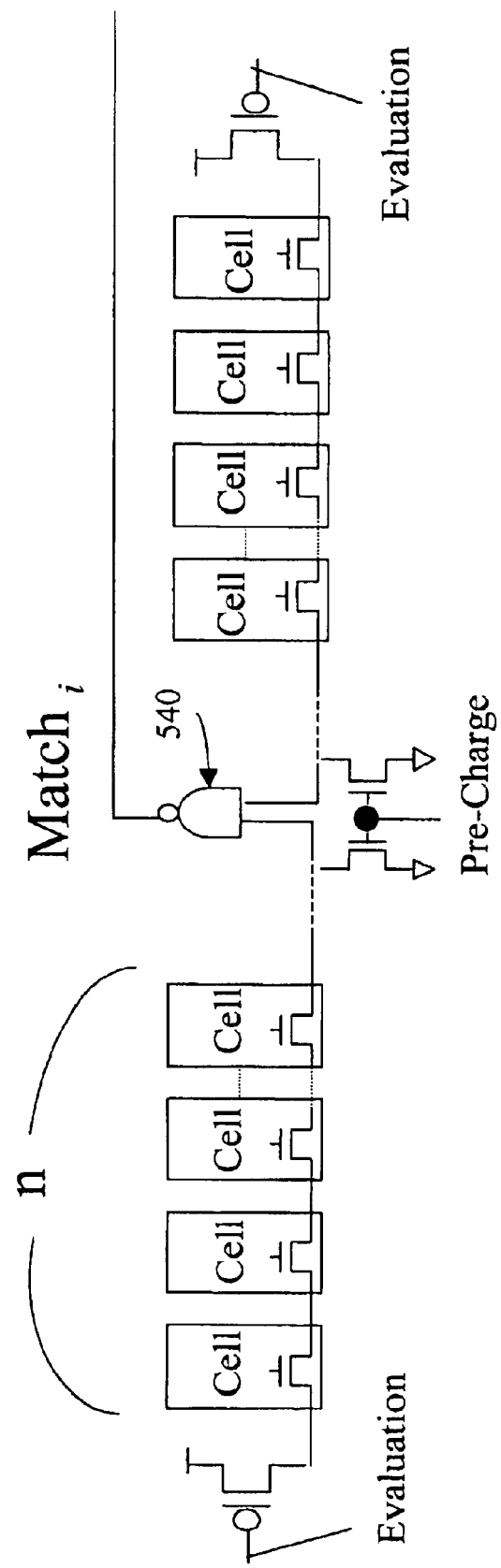
FIG. 54 shows an embodiment of a simple peripheral circuit with CAM cells described above for one-word comparison operation.

Refer to FIG. 54, which shows an embodiment of a simple peripheral circuit with CAM cells describe above for one word comparison operation. In such arrangement, the number of CAM cells is dependent on the bit number of the one-word comparison; for example, n bits being compared simultaneously and a match signal being signaled after comparison, as shown in FIG. 54. The CAM cells can be one of all types of the CAM cells described in the fifth-preferred embodiment. The match transistors MT1, MT2, MT3 . . . MTn are specifically turned on if the comparing data matches the stored data in the CAM cells. If all of the n match transistors are turned on, the current path will be established through the evaluation transistor to the pre-charge transistor. The one-word comparison operation can be easily implemented. For reducing power consumption during comparison operation because too many transistors are turned on simultaneously, another row of n match transistors can be used in the implementation for other n-bit comparison. By simply using a logic AND gate, the Match signal is generated from results of two or more n-bit comparison operations, which are used for the one-word comparison operation with more and more bits.

Figure 55:
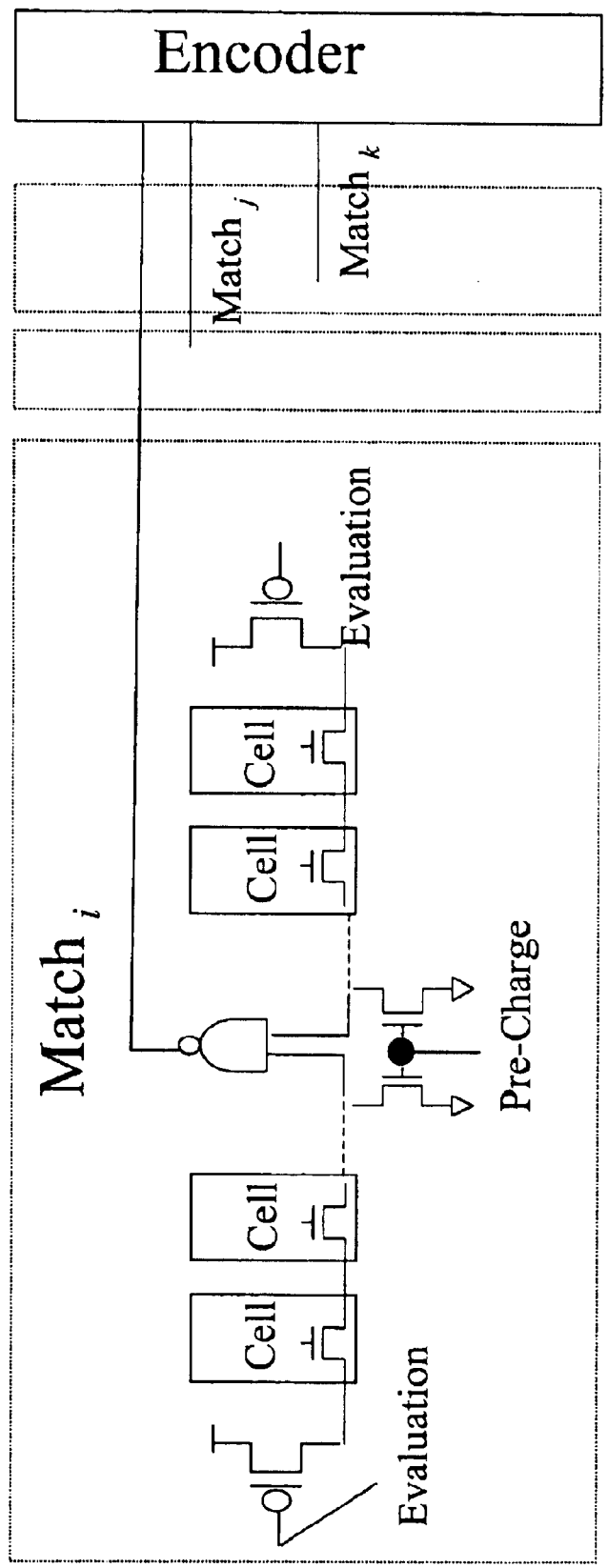
FIG. 55 shows an embodiment of a simple peripheral circuit with CAM cells described above for multiple-word comparison operation.

Refer to FIG. 55, which shows an embodiment of a simple peripheral circuit with CAM cells describe above for multiple-word comparison operation. In such arrangement, the number of CAM cells is dependent on the bit number of the word for such comparison; for example, n bits of one word being compared simultaneously and a Match signal being signaled after comparison. For other example, several n-bit comparison operations can also be performed simultaneously and a Match signal being signaled by using a AND gate.

For multiple words, for example, m words, m rows for n-bit comparisons will be arranged for such m-word comparison. The CAM cells can be one of all types of the CAM cells described in the fifth-preferred embodiments. Match signals such as $Match_i$, $Match_j$ and $Match_k$ are generated after several n-bit comparison operations. By using a encoder device, such as encoder ROM, a result signal can be easily signaled for simultaneously comparing m words. The numbers of m and n are determined in accordance with the design requirements.

NOR CAM Cells for Preferred Embodiments

In the following several embodiments, a NAND-type CAM cell implemented by all p-channel transistors is described for different applications of such CAM cells. There is no such spacing problem and the size of the cell can also be reduced. The data stored in such CAM cells is implemented by using a pair of true and complement terminals. If these two terminals both store "0", it means that the CAM cell is in a status of "Don't Care."

The embodiment relates to a CAM cell using multiple ports for operations in accordance with design requirements. For example, in the following embodiments, one design single port word line and bit line, one design for two port word lines, one design for two port bit lines, or one design for two port word lines and two port bit lines. One arrangement with two-port word line can be: (i) one port for refresh and other port for SRAM write operation, (ii) one port for read operation and other port for write operation, while a wave-pipeline technique for refresh cycle (which means hidden refresh), or (iii) one port for read operation and other port for write operation, while idle a refresh cycle for such dynamic CAM cell. One arrangement with two-port bit line can be: (i) Match operation and Read/Write operation can be performed in the same cycle, while a wave-pipeline technique for refresh cycle (which means hidden refresh), or (ii) Match operation and Read/Write operation can be performed in the same cycle, while idle one cycle for refresh. One arrangement with two-port bit line and two-port word line can be: (i) one word-line port for refresh and the other word-line port for SRAM write operation, while the Match operation can be performed in the same cycle; (ii) one word-line port for read operation and the other word-line port for write operation, while a wave-pipeline technique for hidden refresh is used for a refresh cycle (which means hidden refresh) and Match operation is performed in the same cycle; or (iii) one word-line port for read operation and the other word-line port for write operation, while Match operation is performed in the same cycle and idle a refresh cycle for refresh operation (for dynamic CAM cells). Such 3-port dynamic differential CAM cells can be implemented by any CMOS technologies, such as FRAM, DRAM, logic technology, etc. These CAM cells can be combined and modified in accordance with different purposes. These different types of CAM cells are described hereafter.

Sixth Embodiment—CAM Cell

Type 1—Single-Port CAM Cell

Figure 56:
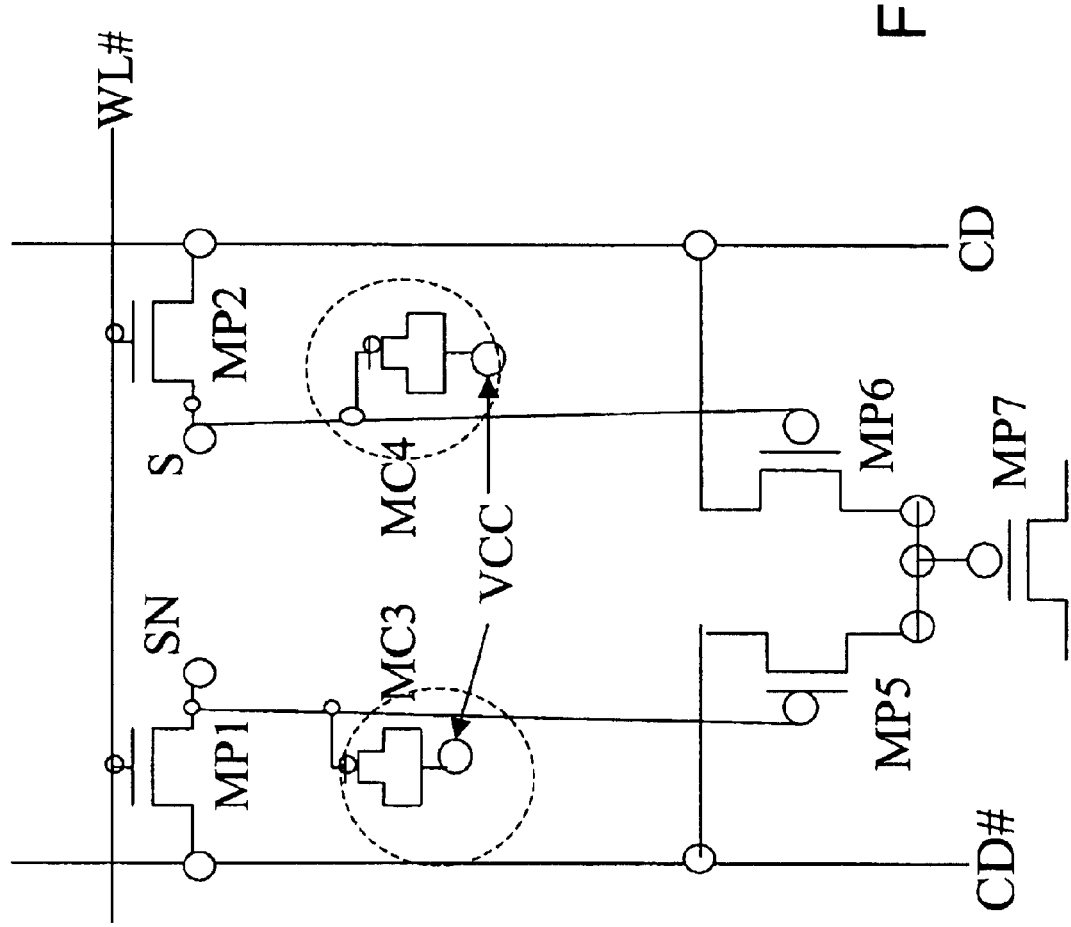
FIG. 56 is a diagram of a single-port dynamic differential CAM cell of a sixth embodiment of the invention.

Refer to FIG. 56, which is a diagram of a single-port dynamic differential CAM cell of a sixth embodiment of the invention. This CAM cell stored one bit of data, but the data is stored differentially as true and complement data, as shown in terminals S and SN. If these two terminals S and SN both store "0", it means that the CAM cell is in a status of "Don't Care." All transistors using in such CAM cell are p-channel transistors (PMOS).

For lower power consumption, a p-channel match transistor MP7 is introduced in the embodiment. If the comparing data matches the stored data in the CAM cell, the match transistor MP7 is turned on. However, if the comparing data does not match the stored data in the CAM cell, the match transistor MP7 remain off. If a word comparison is performed, that means that a serially connected match transistors can be used for comparison. If the serially connected match transistors are all turned on and a current flow path is established, that means that a match comparison is signaled by sensing the current flow path. In such arrangement, if a row of such CAM cells is not simultaneously turned on, there is no current flow path occurred, that means that no power consumption will occur. Operations of such arrays of CAM cells will be described later.

The comparing data from bit lines CD# and CD are applied to one of source/drain terminals of transistors MN5 and MN6 respectively. The other source/drain terminals of the transistors MN5 and MN6 are connected to the gate of the match transistors MN7. The complements of the comparing data are applied to these bit lines during the compare operation. Thus bit line CD carries the complement of the comparing data. Complement bit line CD# carries the true comparing data.

During read/write operation, complement word line WL# is driven low for turning on the pass transistors MP1 and MP2. For storing data 1, bit line CD# is high, storing charges in the capacitor MC3. Bit line CD is low, driving a low voltage to the capacitor MC4 and storing little or no charges on the capacitor MC4. When WL# is driven high, the accompanying capacitor MC3 stores charges while the capacitor MC4 stores little or no charges. The opposite occurs when a data 0 is written to the cell. That is, the capacitor MC3 store a positive charge while the capacitor MC4 stores little or no charge. Such arrangement can also be changed in accordance with the practical design. For example, for storing data 1, the capacitor MC3 can also store little or no charges while the capacitor MC4 stores lots of charges, which is totally different arrangement for the capacitor MC3 storing lots of charges. That is, the data can be stored differentially as true and complement data, in accordance with real requirements. In the embodiment, the former arrangement is introduced herewith.

The cell can be read by equalizing and pre-charging both bit lines CD and CD# to an intermediate voltage before WL# is driven low. One bit line is then driven low and the other is driven high by charges sharing as pass transistors MP1 and MP2 are turned on. A sensitive sense amplifier can then detect a slight voltage difference on bit lines CD and CD#. The cell can be refreshed by writing the sensed data back to the bit lines.

During a match or compare operation, the WL# is driven high and the pass transistors MP1 and MP2 remain off. Thus the stored charges on the capacitors MC3 and MC4 are isolated and not disturbed.

A comparing data with a true and complement format is applied to the source/drain terminals of match transistors MP5 and MP6 respectively through the bit lines CD# and CD. The complements of the comparing data are applied to these bit lines during the compare operation. Thus bit line CD carries the complement of the true comparing data. Complement bit line CD# carries the true comparing data.

When the comparing data matches the stored data in the CAM cell, the match transistor MP7 is turned on. For example, when the cell stores a 1, the transistor MP5 remain off because of the charges being stored on the capacitor MC3. The transistor MP6 is turned on because the capacitor MC4 stores little or no charges. The true comparing data is applied to bit line CD# while the complement comparing data is applied to bit line CD. Since the comparing data is also a 1, CD is low while CD# is high. The transistor MP6 is turned on and the gate of the match transistor MP7 is driven low because CD is low. That is, the match transistor MP7 is then turned on.

When the cell stores a 0, the transistor MP5 is turned on and the transistor MP6 is turned off. The true comparing data is applied to bit line CD# while the complement comparing data is applied to bit line CD. Since the comparing data is also a 0, CD is high while CD# is low. The transistor MP5 is turned on and the gate of the match transistor MP7 is driven low because CD# is low. That is, the match transistor MP7 is then turned on.

When the comparing data does not match the stored data in the CAM cell, the match transistor MP7 is turned off. For example, when the cell stores a 1, the transistor MP5 remain off because of the charges being stored on the capacitor MC3. The transistor MP6 is turned on because the capacitor MC4 stores little or no charges. The true comparing data is applied to bit line CD# while the complement comparing data is applied to bit line CD. If the comparing data is a 0, CD is high while CD# is low. The transistor MP6 is turned on and the transistor MP5 is turned off. Because CD is high and the transistor MP6 is turned on, the gate of the match transistor MP7 is driven high. That is, the match transistor MP7 remains off.

When the cell stores a 0, the transistor MP6 remain off because of the charges being stored on the capacitor MC4. The transistor MP5 is turned on because the capacitor MC3 stores little or no charges. The true comparing data is applied to bit line CD# while the complement comparing data is applied to bit line CD. If the comparing data is a 1, CD# is high while CD is low. The transistor MP5 is turned on and the transistor MP6 is turned off. Because CD# is high and the transistor MP5 is turned on, the gate of the match transistor MP7 is driven high. That is, the match transistor MP7 remains off.

The CAM cell requires only PMOS transistors, which does not have to expand for well-to-well spacing as only a P-well or p-substrate is present within the cell.

Type 2—Single-Port CAM Cell Var. I

Figure 57:
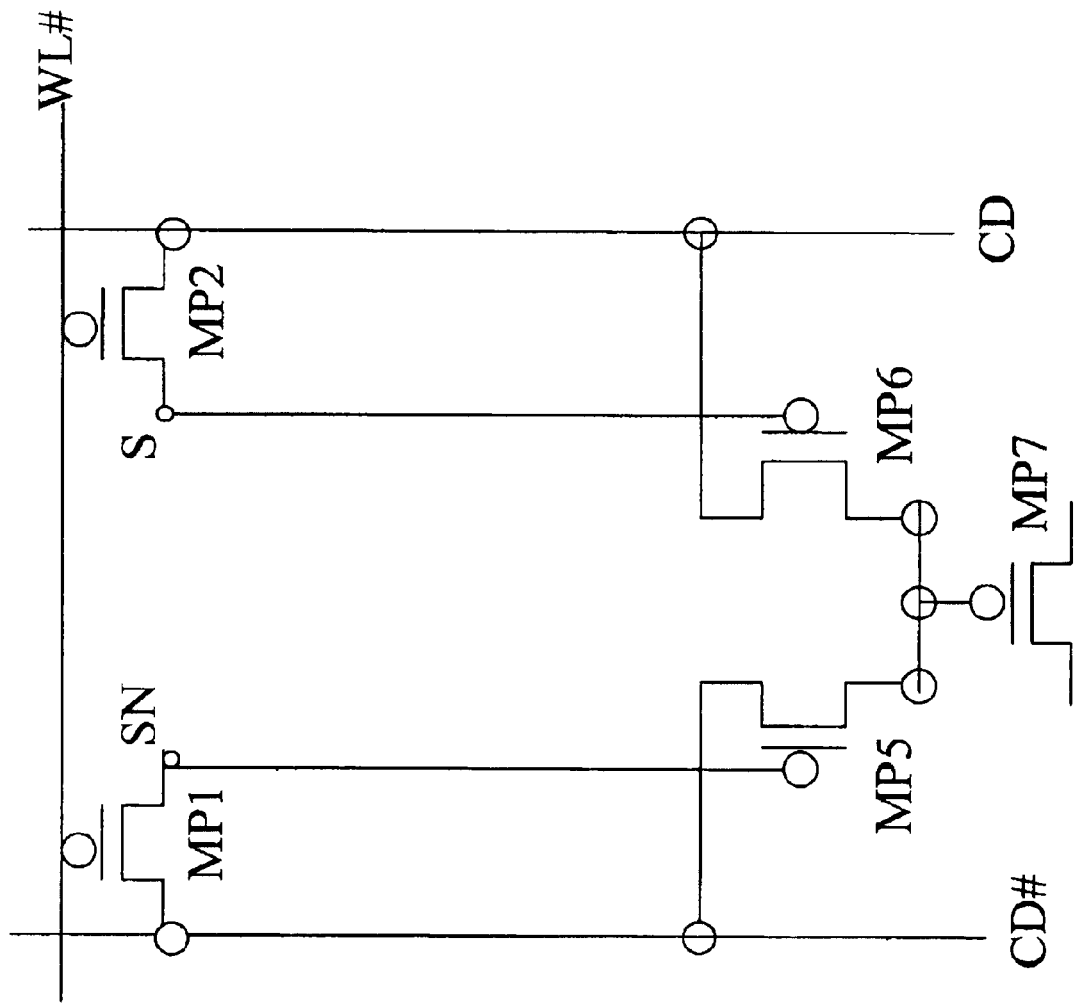
FIG. 57 is a diagram of a first variation of the single-port dynamic differential CAM as shown in FIG. 56 of the sixth preferred embodiment of the invention.

Refer to FIG. 57, which is a diagram of a first variation of the single-port dynamic differential CAM cell, as shown in FIG. 56, of the sixth embodiment of the invention. This CAM cell stored one bit of data, but the data is stored differentially as true and complement data, as shown in terminals S and SN. If these two terminals S and SN both store "0", it means that the CAM cell is in a status of "Don't Care." All transistors using in such CAM cell are p-channel transistors (PMOS). An important feature of this type of the CAM cell is that two capacitors MC3 and MC4, as shown in FIG. 56, are eliminated. Instead, the capacitance of the gate of transistors MP5 and MP6 is used for storing data in such CAM cell.

For lower power consumption, a match transistor MN9 is introduced in the embodiment. If the comparing data matches the stored data in the CAM cell, the match transistor MN7 is turned on. However, if the comparing data does not match the stored data in the CAM cell, the match transistor MN7 remain off.

The comparing data from bit lines CD# and CD are applied to one of source/drain terminals of transistors MN5 and MN6 respectively. The other source/drain terminals of the transistors MN5 and MN6 are connected to the gate of the match transistors MN7. The complements of the comparing data are applied to these bit lines during the compare operation. Thus bit line CD carries the complement of the comparing data. Complement bit line CD# carries the true comparing data.

During read/write operation, complement word line WL# is driven low for turning on the pass transistors MP1 and MP2. For storing data 1, bit line CD# is high, storing charges in the gate of the transistor MP5. Bit line CD is low, driving a low voltage to the gate of the transistor MP6 and storing little or no charges on the gate of the transistor MP6. When WL# is driven high, the gate of the transistor MP5 stores charges while the gate of the transistor MP5 stores little or no charges. The opposite occurs when a data 0 is written to the cell. That is, the gate of the transistor MP5 stores a positive charge while the gate of the transistor MP6 stores little or no charge. Such arrangement can also be changed in accordance with the practical design. For example, for storing data 1, the gate of the transistor MP5 can also store little or no charges while the gate of the transistor MP6 stores lots of charges, which is totally different arrangement for the gate of the transistor MP5 storing lots of charges. That is, the data can be stored differentially as true and complement data, in accordance with real requirements. In the embodiment, the former arrangement is introduced herewith.

The cell can be read by equalizing and pre-charging both bit lines CD and CD# to an intermediate voltage before WL# is driven low. One bit line is then driven low and the other is driven high by charges sharing as pass transistors MP1 and MP2 are turned on. A sensitive sense amplifier can then detect a slight voltage difference on bit lines CD and CD#. The cell can be refreshed by writing the sensed data back to the bit lines.

During a match or compare operation, the WL# is driven high and the pass transistors MP1 and MP2 remain off. Thus the stored charges on the gates of the transistor MP5 and MP6 are isolated and not disturbed.

A comparing data with a true and complement format is applied to the source/drain terminals of match transistors MP5 and MP6 respectively through the bit lines CD# and CD. The complements of the comparing data are applied to these bit lines during the compare operation. Thus bit line CD carries the complement of the true comparing data. Complement bit line CD# carries the true comparing data.

When the comparing data matches the stored data in the CAM cell, the match transistor MP7 is turned on. For example, when the cell stores a 1, the transistor MP5 remain off because of the charges being stored on the gate of the transistor MP5. The transistor MP6 is turned on because the gate of the transistor MP6 stores little or no charges. The true comparing data is applied to bit line CD# while the complement comparing data is applied to bit line CD. Since the comparing data is also a 1, CD is low while CD# is high. The transistor MP6 is turned on and the gate of the match transistor MP7 is driven low because CD is low. That is, the match transistor MP7 is then turned on.

When the cell stores a 0, the transistor MP5 is turned on and the transistor MP6 is turned off. The true comparing data is applied to bit line CD# while the complement comparing data is applied to bit line CD. Since the comparing data is also a 0, CD is high while CD# is low. The transistor MP5 is turned on and the gate of the match transistor MP7 is driven low because CD# is low. That is, the match transistor MP7 is then turned on.

When the comparing data does not match the stored data in the CAM cell, the match transistor MP7 is turned off. For example, when the cell stores a 1, the transistor MP5 remain off because of the charges being stored on the gate of the transistor MP5. The transistor MP6 is turned on because the gate of the transistor MP6 stores little or no charges. The true comparing data is applied to bit line CD# while the complement comparing data is applied to bit line CD. If the comparing data is a 0, CD is high while CD# is low. The transistor MP6 is turned on and the transistor MP5 is turned off. Because CD is high and the transistor MP6 is turned on, the gate of the match transistor MP7 is driven high. That is, the match transistor MP7 remains off.

When the cell stores a 0, the transistor MP6 remain off because of the charges being stored on the capacitor MC4. The transistor MP5 is turned on because the gate of the transistor MP5 stores little or no charges. The true comparing data is applied to bit line CD# while the complement comparing data is applied to bit line CD. If the comparing data is a 1, CD# is high while CD is low. The transistor MP5 is turned on and the transistor MP6 is turned off. Because CD# is high and the transistor MP5 is turned on, the gate of the match transistor MP7 is driven high. That is, the match transistor MP7 remains off.

The CAM cell requires only PMOS transistors, which does not have to expand for well-to-well spacing as only a P-well or p-substrate is present within the cell.

Type 3—2-Port CAM Cell

Figure 58:
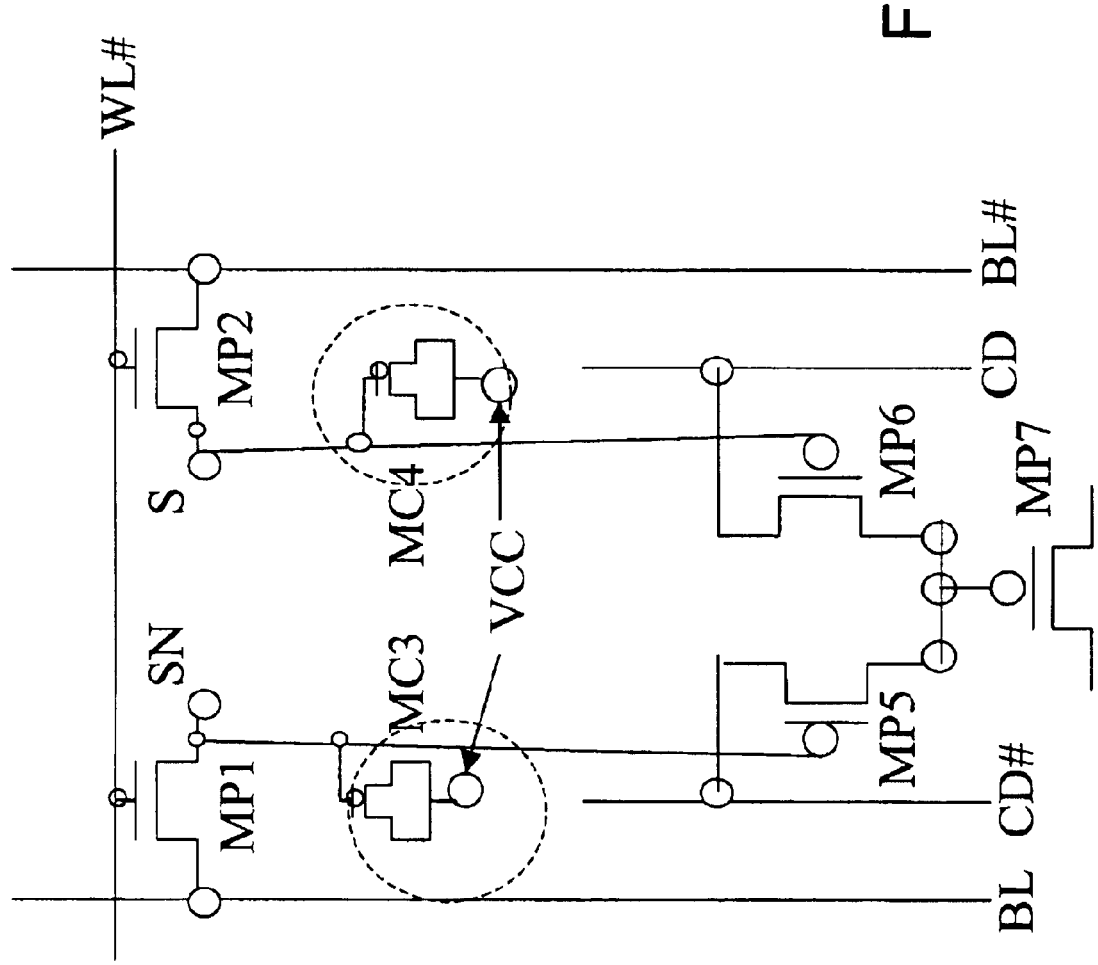
FIG. 58 is a diagram of a 2-port dynamic differential CAM cell of a sixth embodiment of the invention.

Refer to FIG. 58, which is a diagram of a 2-port dynamic differential CAM cell of a sixth embodiment of the invention. This CAM cell stored one bit of data, but the data is stored differentially as true and complement data, as shown in terminals S and SN. If these two terminals S and SN both store "0", it means that the CAM cell is in a status of "Don't Care." All transistors using in such CAM cell are p-channel transistors (PMOS).

For lower power consumption, a p-channel match transistor MP7 is introduced in the embodiment. If the comparing data matches the stored data in the CAM cell, the match transistor MP7 is turned on. However, if the comparing data does not match the stored data in the CAM cell, the match transistor MP7 remain off.

The comparing data from compare lines CD# and CD are applied to one of source/drain terminals of transistors MP5 and MP6 respectively. The other source/drain terminals of the transistors MP5 and MP6 are connected to the gate of the match transistors MP7. The complements of the comparing data are applied to these compare lines during the compare operation. Thus compare line CD carries the complement of the comparing data. Complement compare line CD# carries the true comparing data.

During read/write operation, complement word line WL# is driven low for turning on the pass transistors MP1 and MP2. For storing data 1, bit line BL is high, storing charges in the capacitor MC3. Bit line BL# is low, driving a low voltage to the capacitor MC4 and storing little or no charges on the capacitor MC4. When WL# is driven high, the accompanying capacitor MC3 stores charges while the capacitor MC4 stores little or no charges. The opposite occurs when a data 0 is written to the cell. That is, the capacitor MC3 store a positive charge while the capacitor MC4 stores little or no charge. Such arrangement can also be changed in accordance with the practical design. For example, for storing data 1, the capacitor MC3 can also store little or no charges while the capacitor MC4 stores lots of charges, which is totally different arrangement for the capacitor MC3 storing lots of charges. That is, the data can be stored differentially as true and complement data, in accordance with real requirements. In the embodiment, the former arrangement is introduced herewith.

The cell can be read by equalizing and pre-charging both bit lines BL and BL# to an intermediate voltage before WL# is driven low One bit line is then driven low and the other is driven high by charges sharing as pass transistors MP1 and MP2 are turned on. A sensitive sense amplifier can then detect a slight voltage difference on bit lines BL and BL#. The cell can be refreshed by writing the sensed data back to the bit lines.

During a match or compare operation, the WL# is driven high and the pass transistors MP1 and MP2 remain off. Thus the stored charges on the capacitors MC3 and MC4 are isolated and not disturbed.

A comparing data with a true and complement format is applied to the source/drain terminals of match transistors MP5 and MP6 respectively through the compare lines CD# and CD. The complements of the comparing data are applied to these compare lines during the compare operation. Thus the compare line CD carries the complement of the true comparing data. Complement compare line CD# carries the true comparing data.

When the comparing data matches the stored data in the CAM cell, the match transistor MP7 is turned on. For example, when the cell stores a 1, the transistor MP5 remain off because of the charges being stored on the capacitor MC3. The transistor MP6 is turned on because the capacitor MC4 stores little or no charges. The true comparing data is applied to the compare line CD# while the complement comparing data is applied to the compare line CD. Since the comparing data is also a 1, the compare line CD is low while the compare line CD# is high. The transistor MP6 is turned on and the gate of the match transistor MP7 is driven low because the compare line CD is low. That is, the match transistor MP7 is then turned on.

When the cell stores a 0, the transistor MP5 is turned on and the transistor MP6 is turned off. The true comparing data is applied to the compare line CD# while the complement comparing data is applied to the compare line CD. Since the comparing data is also a 0, the compare line CD is high while the compare line CD# is low. The transistor MP5 is turned on and the gate of the match transistor MP7 is driven low because the compare line CD# is low. That is, the match transistor MP7 is then turned on.

When the comparing data does not match the stored data in the CAM cell, the match transistor MP7 is turned off. For example, when the cell stores a 1, the transistor MP5 remain off because of the charges being stored on the capacitor MC3. The transistor MP6 is turned on because the capacitor MC4 stores little or no charges. The true comparing data is applied to the compare line CD# while the complement comparing data is applied to the compare line CD. If the comparing data is a 0, the compare line CD is high while the compare line CD# is low. The transistor MP6 is turned on and the transistor MP5 is turned off. Because the compare line CD is high and the transistor MP6 is turned on, the gate of the match transistor MP7 is driven high. That is, the match transistor MP7 remains off.

When the cell stores a 0, the transistor MP6 remain off because of the charges being stored on the capacitor MC4. The transistor MP5 is turned on because the capacitor MC3 stores little or no charges. The true comparing data is applied to the compare line CD# while the complement comparing data is applied to the compare line CD. If the comparing data is a 1, the compare line CD# is high while the compare line CD is low. The transistor MP5 is turned on and the transistor MP6 is turned off. Because the compare line CD# is high and the transistor MP5 is turned on, the gate of the match transistor MP7 is driven high. That is, the match transistor MP7 remains off.

The CAM cell requires only PMOS transistors, which does not have to expand for well-to-well spacing as only a P-well or p-substrate is present within the cell.

Type 4—2-Port CAM Cell Var. I

Figure 59:
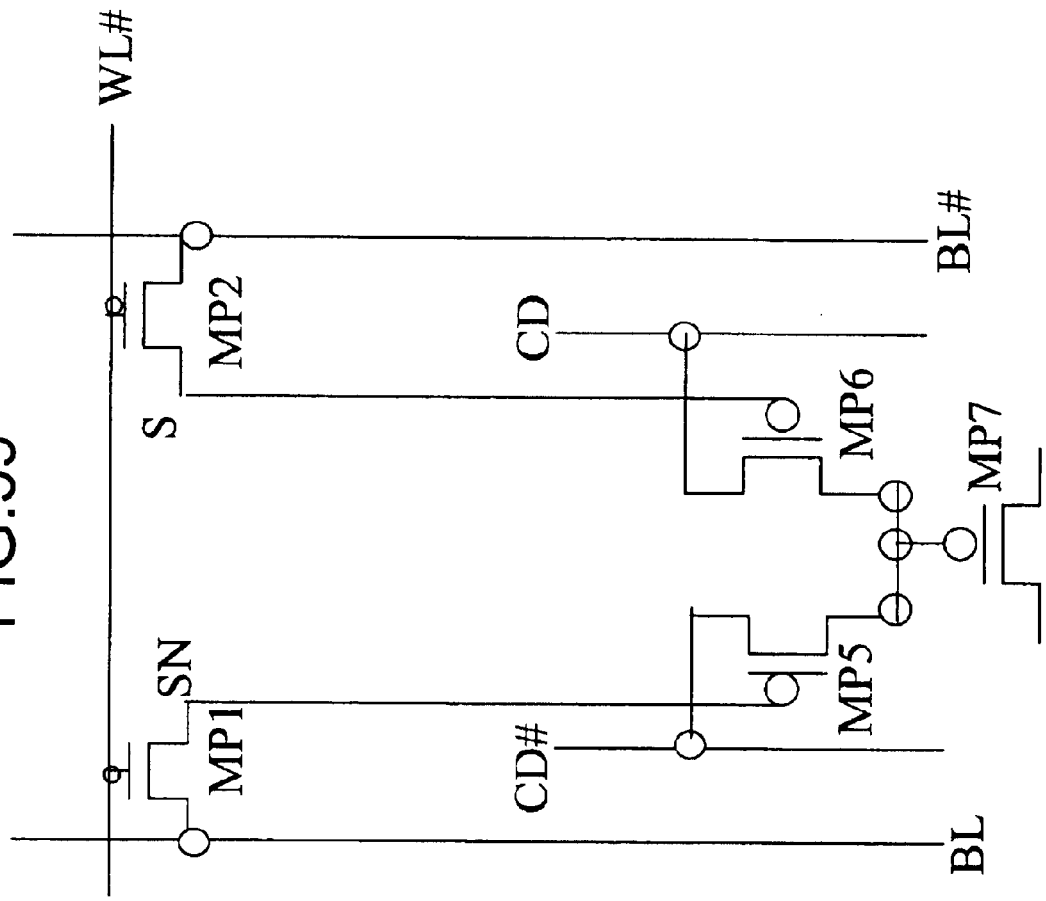
FIG. 59 is a diagram of a first variation of the 2-port dynamic differential CAM as shown in FIG. 58 of the sixth preferred embodiment of the invention.

Refer to FIG. 59, which is a diagram of a first variation of the 2-port dynamic differential CAM cell, as shown in FIG. 58, of a sixth embodiment of the invention. This CAM cell stored one bit of data, but the data is stored differentially as true and complement data, as shown in terminals S and SN. If these two terminals S and SN both store "0", it means that the CAM cell is in a status of "Don't Care." All transistors using in such CAM cell are p-channel transistors (PMOS). An important feature of this type of the CAM cell is that two capacitors MC3 and MC4, as shown in FIG. 56, are eliminated. Instead, the capacitance of the gate of transistors MP5 and MP6 is used for storing data in such CAM cell.

For lower power consumption, a p-channel match transistor MP7 is introduced in the embodiment. If the comparing data matches the stored data in the CAM cell, the match transistor MP7 is turned on. However, if the comparing data does not match the stored data in the CAM cell, the match transistor MP7 remain off.

The comparing data from compare lines CD# and CD are applied to one of source/drain terminals of transistors MP5 and MP6 respectively. The other source/drain terminals of the transistors MP5 and MP6 are connected to the gate of the match transistors MP7. The complements of the comparing data are applied to these compare lines during the compare operation. Thus compare line CD carries the complement of the comparing data. Complement compare line CD# carries the true comparing data.

During read/write operation, complement word line WL# is driven low for turning on the pass transistors MP1 and MP2. For storing data 1, bit line BL is high, storing charges in the gate of the transistor MP5. Bit line BL# is low, driving a low voltage to the gate of the transistor MP6 and storing little or no charges on the gate of the transistor MP6. When WL# is driven high, the gate of the transistor MP5 stores charges while the gate of the transistor MP6 stores little or no charges. The opposite occurs when a data 0 is written to the cell. That is, the gate of the transistor MP5 stores a positive charge while the gate of the transistor MP5 stores little or no charge. Such arrangement can also be changed in accordance with the practical design. For example, for storing data 1, the gate of the transistor MP5 can also store little or no charges while the gate of the transistor MP6 stores lots of charges, which is totally different arrangement for the capacitor MC3 storing lots of charges. That is, the data can be stored differentially as true and complement data, in accordance with real requirements. In the embodiment, the former arrangement is introduced herewith.

The cell can be read by equalizing and pre-charging both bit lines BL and BL# to an intermediate voltage before WL# is driven low. One bit line is then driven low and the other is driven high by charges sharing as pass transistors MP1 and MP2 are turned on. A sensitive sense amplifier can then detect a slight voltage difference on bit lines BL and BL#. The cell can be refreshed by writing the sensed data back to the bit lines.

During a match or compare operation, the WL# is driven high and the pass transistors MP1 and MP2 remain off. Thus the stored charges on the gates of the transistors MP5 and MP6 are isolated and not disturbed.

A comparing data with a true and complement format is applied to the source/drain terminals of match transistors MP5 and MP6 respectively through the compare lines CD# and CD. The complements of the comparing data are applied to these compare lines during the compare operation. Thus the compare line CD carries the complement of the true comparing data. Complement compare line CD# carries the true comparing data.

When the comparing data matches the stored data in the CAM cell, the match transistor MP7 is turned on. For example, when the cell stores a 1, the transistor MP5 remain off because of the charges being stored on the gate of the transistor MP5. The transistor MP6 is turned on because the gate of the transistor MP6 stores little or no charges. The true comparing data is applied to the compare line CD# while the complement comparing data is applied to the compare line CD. Since the comparing data is also a 1, the compare line CD is low while the compare line CD# is high. The transistor MP6 is turned on and the gate of the match transistor MP7 is driven low because the compare line CD is low. That is, the match transistor MP7 is then turned on.

When the cell stores a 0, the transistor MP5 is turned on and the transistor MP6 is turned off. The true comparing data is applied to the compare line CD# while the complement comparing data is applied to the compare line CD. Since the comparing data is also a 0, the compare line CD is high while the compare line CD# is low. The transistor MP5 is turned on and the gate of the match transistor MP7 is driven low because the compare line CD# is low. That is, the match transistor MP7 is then turned on.

When the comparing data does not match the stored data in the CAM cell, the match transistor MP7 is turned off. For example, when the cell stores a 1, the transistor MP5 remain off because of the charges being stored on the gate of the transistor MP5. The transistor MP6 is turned on because the gate of the transistor MP6 stores little or no charges. The true comparing data is applied to the compare line CD# while the complement comparing data is applied to the compare line CD. If the comparing data is a 0, the compare line CD is high while the compare line CD# is low. The transistor MP6 is turned on and the transistor MP5 is turned off. Because the compare line CD is high and the transistor MP6 is turned on, the gate of the match transistor MP7 is driven high. That is, the match transistor MP7 remains off.

When the cell stores a 0, the transistor MP6 remain off because of the charges being stored on the gate of the transistor MP6. The transistor MP5 is turned on because the gate of the transistor MP5 stores little or no charges. The true comparing data is applied to the compare line CD# while the complement comparing data is applied to the compare line CD. If the comparing data is a 1, the compare line CD# is high while the compare line CD is low. The transistor MP5 is turned on and the transistor MP6 is turned off. Because the compare line CD# is high and the transistor MP5 is turned on, the gate of the match transistor MP7 is driven high. That is, the match transistor MP7 remains off.

The CAM cell requires only PMOS transistors, which does not have to expand for well-to-well spacing as only a P-well or p-substrate is present within the cell.

Type 5—3-Port CAM Cell

Figure 60:
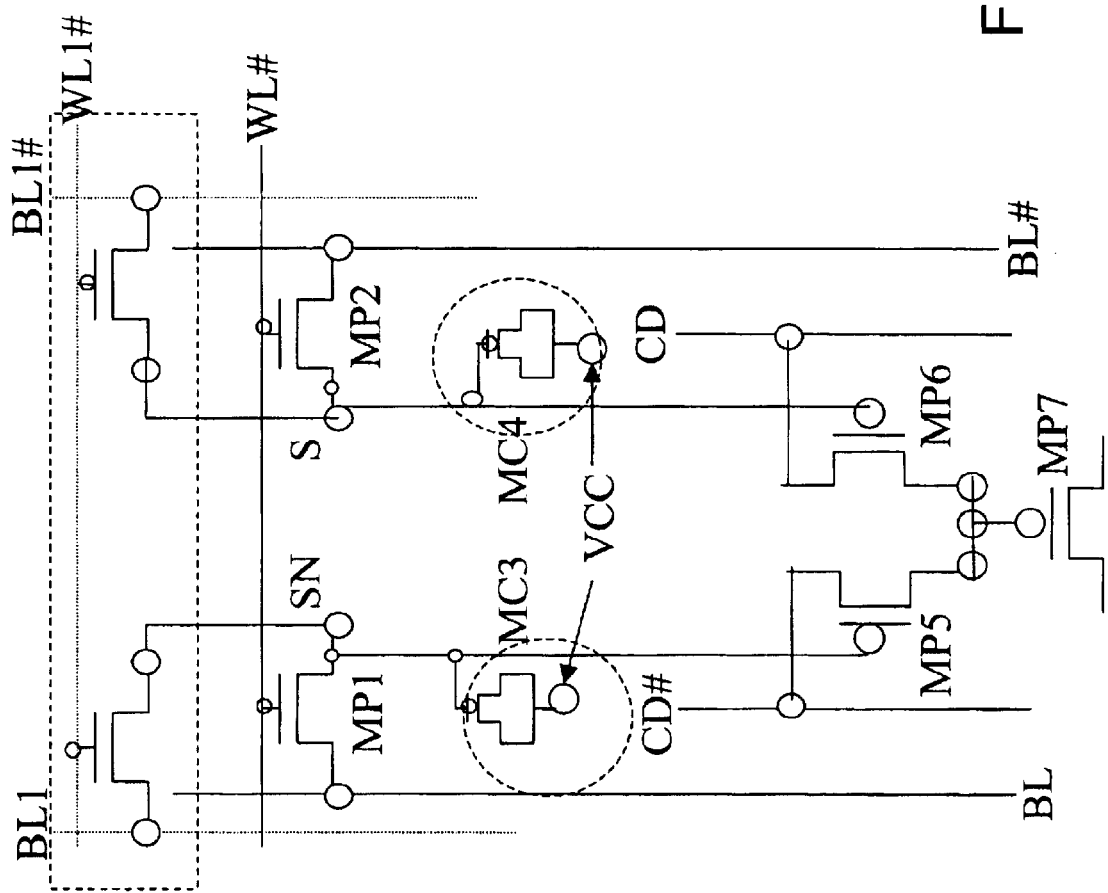
FIG. 60 is a diagram of a 3-port dynamic differential CAM cell of a sixth embodiment of the invention.

Refer to FIG. 60, which is a diagram of a 3-port dynamic differential CAM of the sixth-preferred embodiment of the invention. This CAM cell stored one bit of data, but the data is stored differentially as true and complement data.

Operations of such 3-port CAM cell are familiar with the operations described in FIG. 58 except a separate pair of bit lines BL1 and BLI# and an additional word line WL1#, which is complement of the word line WL, are provided in this type of CAM cell of the forth preferred embodiment of the invention.

These two word lines can be arranged as followed. In a case that if word line WL# is used for SRAM write operation, the other word line WL1# is used for refresh. In another case that if word line WL# is used for write operation, the other word line WL1# is used for read operation, while a wave-pipeline technique is used for refresh cycle (which means hidden refresh). In further case that if word line WL# is used for write operation, word line WL1# is used for read operation, while idle a refresh cycle for such dynamic CAM cell.

As describe above, there bit lines can be arranged as followed. In a case that Match operation and Read/Write operation can be performed in the same cycle through different pair of bit lines, while a wave-pipeline technique for refresh cycle (which means hidden refresh). In other case that Match operation and Read/Write operation can be performed in the same cycle through different pair of bit lines, while idle one cycle for refresh.

For combing these arrangements together, which means two pairs of bit lines BL, BL# and BL1, BL1#, and two word lines WL#, WL1# are provided. These features described above for two-pair bit lines and two word lines can be incorporated together for different purposes. For example, if word line WL# is used for SRAM write operation, the other word line WL1# is used for refresh. The Match operation can be performed in the same cycle when write operation and refresh operation are performed. Another arrangement can also that if word line WL# is for write operation, the word line WL1# is for read operation, while a wave-pipeline technique for hidden refresh is used for a refresh cycle (which means hidden refresh) and Match operation is performed in the same cycle. Another choice of arrangement is that if the word line WL# is for write operation, the other word line WL1# is for read operation, while Match operation is performed in the same cycle and idle a refresh cycle for refresh operation (for dynamic CAM cells). The read/write operation accompanying with the refresh operation will be described in tails in FIG. 66.

Type 6—3-Port CAM Cell Variation I

Figure 61:
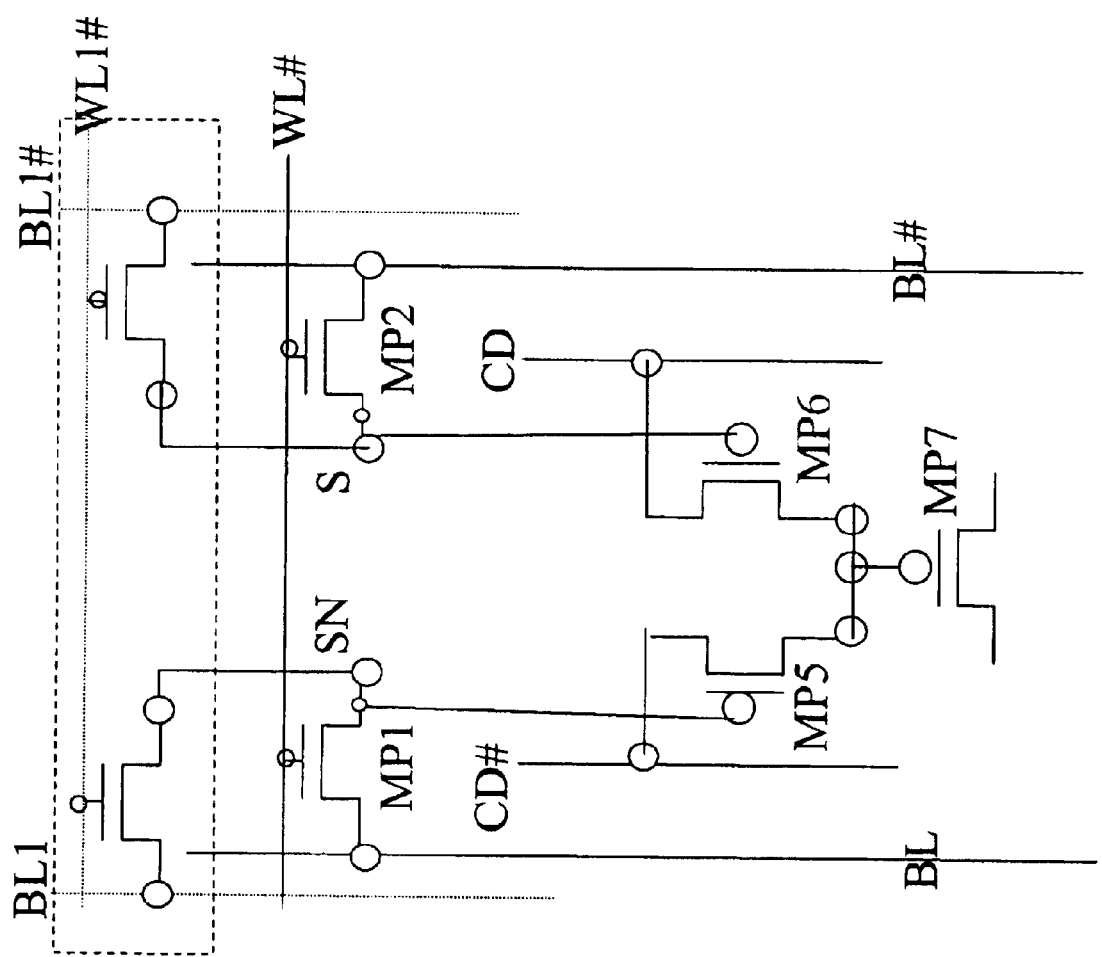
FIG. 61 is a diagram of a first variation of the 3-port dynamic differential CAM as shown in FIG. 60 of the sixth preferred embodiment of the invention.

Refer to FIG. 61, which is a diagram of a first variation of the 3-port dynamic differential CAM, as shown in the FIG. 60 of the sixth-preferred embodiment of the invention. This CAM cell stored one bit of data, but the data is stored differentially as true and complement data. The important variation of the embodiment is that two capacitors MC3 and MC4 shown in FIG. 60 are eliminated. Instead, the capacitance of the gates of the transistors MP5 and MP6 are used for storing data. The total size of CAM cell is significantly decreased, which meets the requirement of cost-down for such products.

Operations of such 3-port CAM cell are familiar with the operations described in FIG. 59 except a separate pair of bit lines BL1 and BL1# and an additional word line WL1# are provided in this type of CAM cell of the sixth-preferred embodiment of the invention. These features are the same as described in the first type of 3-port CAM cell shown in FIG. 60.

Type 7—3-Port CAM Cell Variation II

Figure 62:
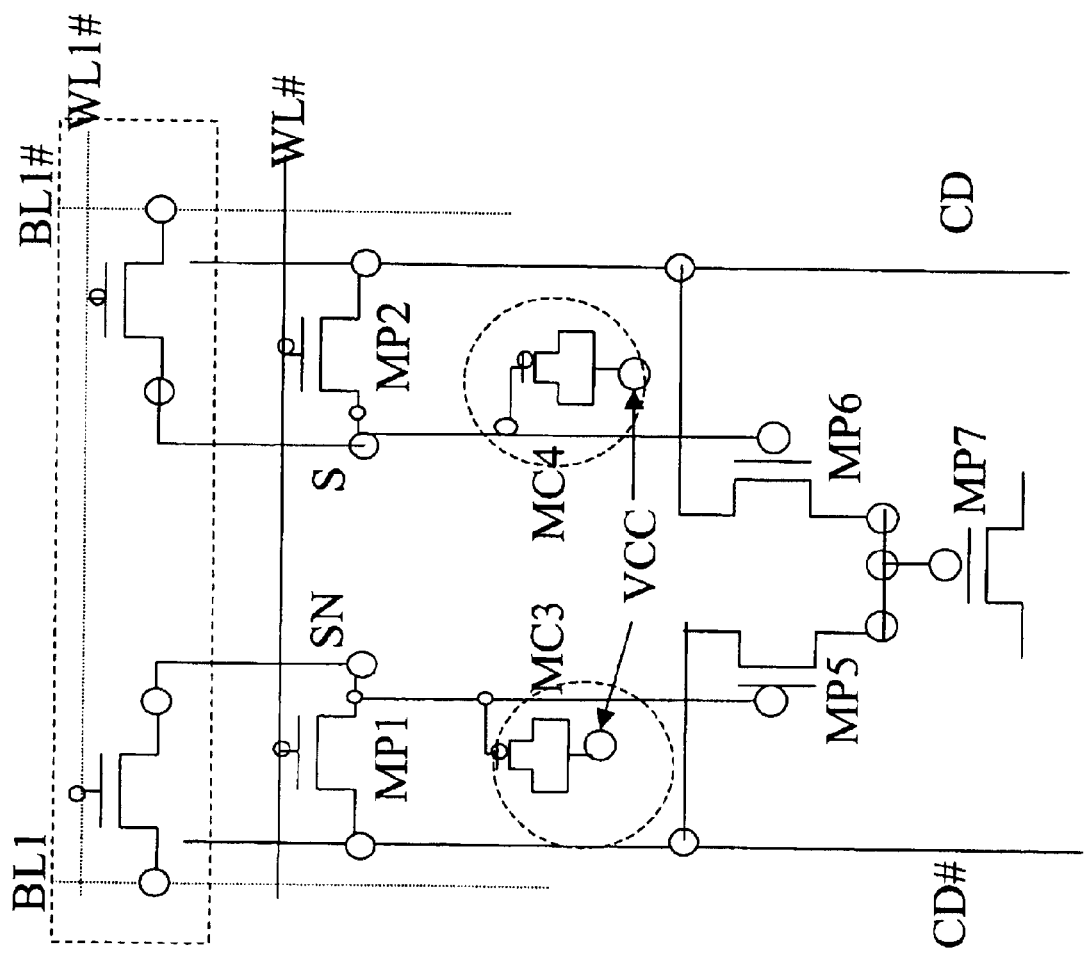
FIG. 62 is a diagram of a second variation of the 3-port dynamic differential CAM as shown in FIG. 60 of the sixth preferred embodiment of the invention.

Refer to FIG. 62, which is a diagram of a second variation of the 3-port dynamic differential CAM, as shown in the FIG. 60 of the sixth-preferred embodiment of the invention. This CAM cell stored one bit of data, but the data is stored differentially as true and complement data.

Operations of such 3-port CAM cell are familiar with the operations described in FIG. 56 except a separate pair of bit lines BL1 and BL1# and an additional word line WL1# are provided in this type of CAM cell of the sixth-preferred embodiment of the invention. These features are the same as described in the first type of 3-port CAM cell shown in FIG. 60.

Type 8—3-Port CAM Cell Variation II

Figure 63:
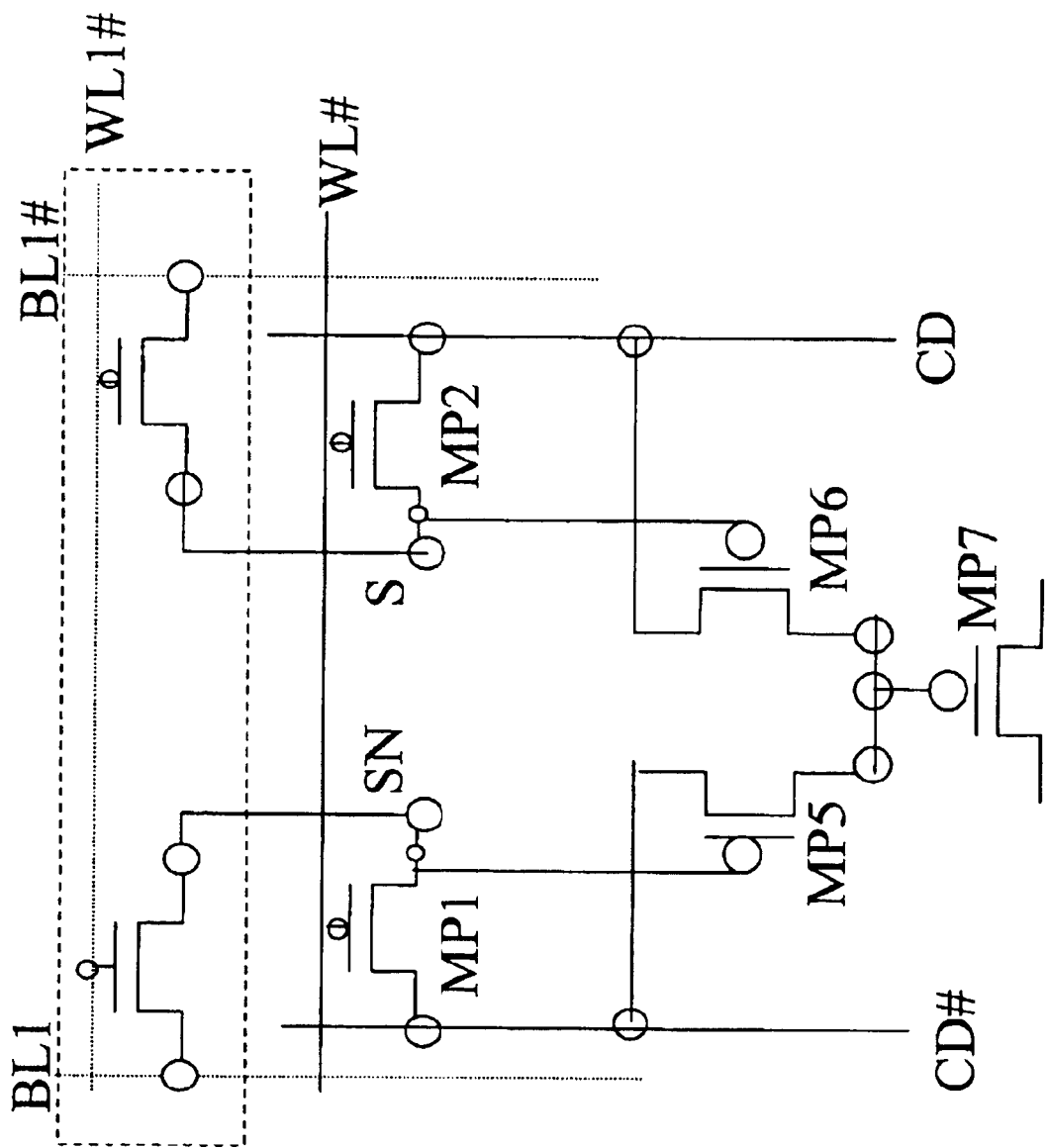
FIG. 63 is a diagram of a third variation of the 3-port dynamic differential CAM as shown in FIG. 60 of the sixth preferred embodiment of the invention.

Refer to FIG. 63, which is a diagram of a second variation of the 3-port dynamic differential CAM, as shown in the FIG. 60 of the sixth-preferred embodiment of the invention. This CAM cell stored one bit of data, but the data is stored differentially as true and complement data.

Operations of such 3-port CAM cell are familiar with the operations described in FIG. 57 except a separate pair of bit lines BL1 and BLI# and an additional word line WL1# are provided in this type of CAM cell of the sixth-preferred embodiment of the invention. These features are the same as described in the first type of 3-port CAM cell shown in FIG. 60.

Applications of The Embodiments of CAM Cells

In the sixth preferred embodiment of the CAM cells of the invention, different combinations or modifications of such CAM cells can be implemented in accordance with the design requirements. Accompanying peripheral circuits can also be designed in accordance with the memory products. These CAM cells can also be embedded in some specific-purpose semiconductor products in supports of comparing the desired information against the entire list of pre-stored entries simultaneously, often resulting in an order-of-magnitude reduction in the search time.

Figure 64:
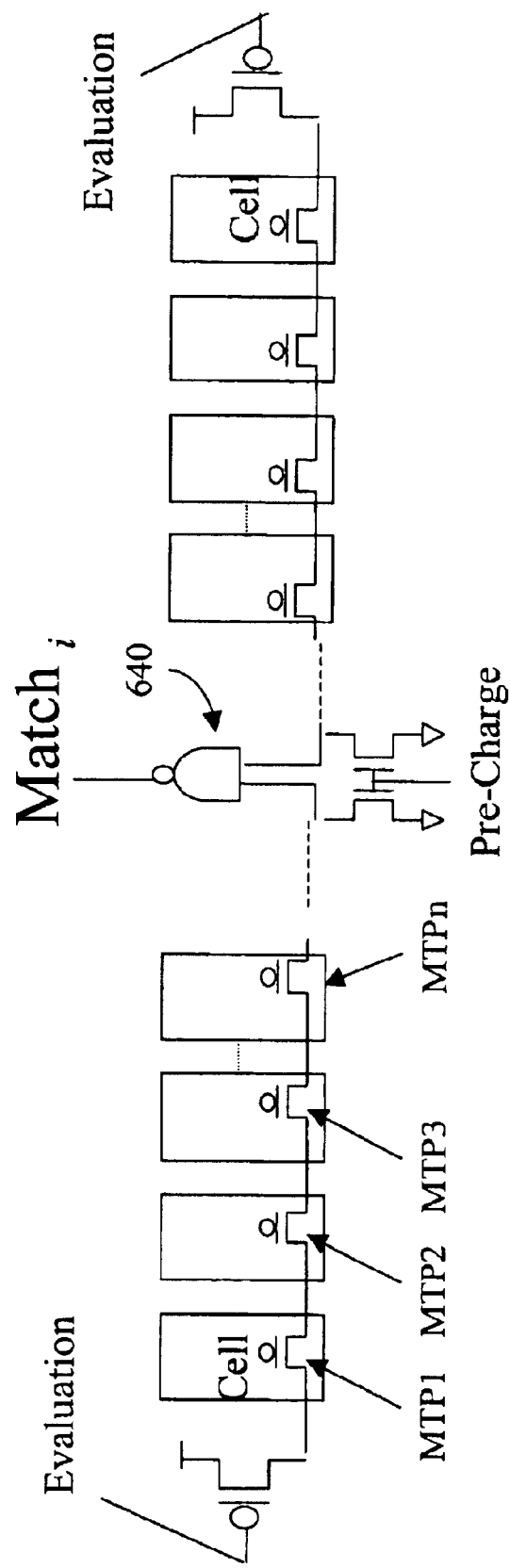
FIG. 64 shows an embodiment of a simple peripheral circuit with CAM cells described above for one-word comparison operation.

Refer to FIG. 64, which shows an embodiment of a simple peripheral circuit with CAM cells describe above for one word comparison operation. In such arrangement, the number of CAM cells is dependent on the bit number of the one-word comparison; for example, n bits being compared simultaneously and a match signal being signaled after comparison, as shown in FIG. 64. The CAM cells can be one of all types of the CAM cells described in the sixth-preferred embodiment. The match p-channel transistors MTP1, MTP2, MTP3 . . . MTPn are specifically turned on if the comparing data matches the stored data in the CAM cells. If all of the n match transistors are turned on, the current path will be established through the evaluation transistor to the pre-charge transistor. The one-word comparison operation can be easily implemented. For reducing power consumption during comparison operation because too many transistors are turned on simultaneously, another row of n match transistors can be used in the implementation for other n-bit comparison. By simply using a logic NAND gate 640, the Match signal is generated from results of two or more n-bit comparison operations, which are used for the one-word comparison operation with more and more bits.

Figure 65:
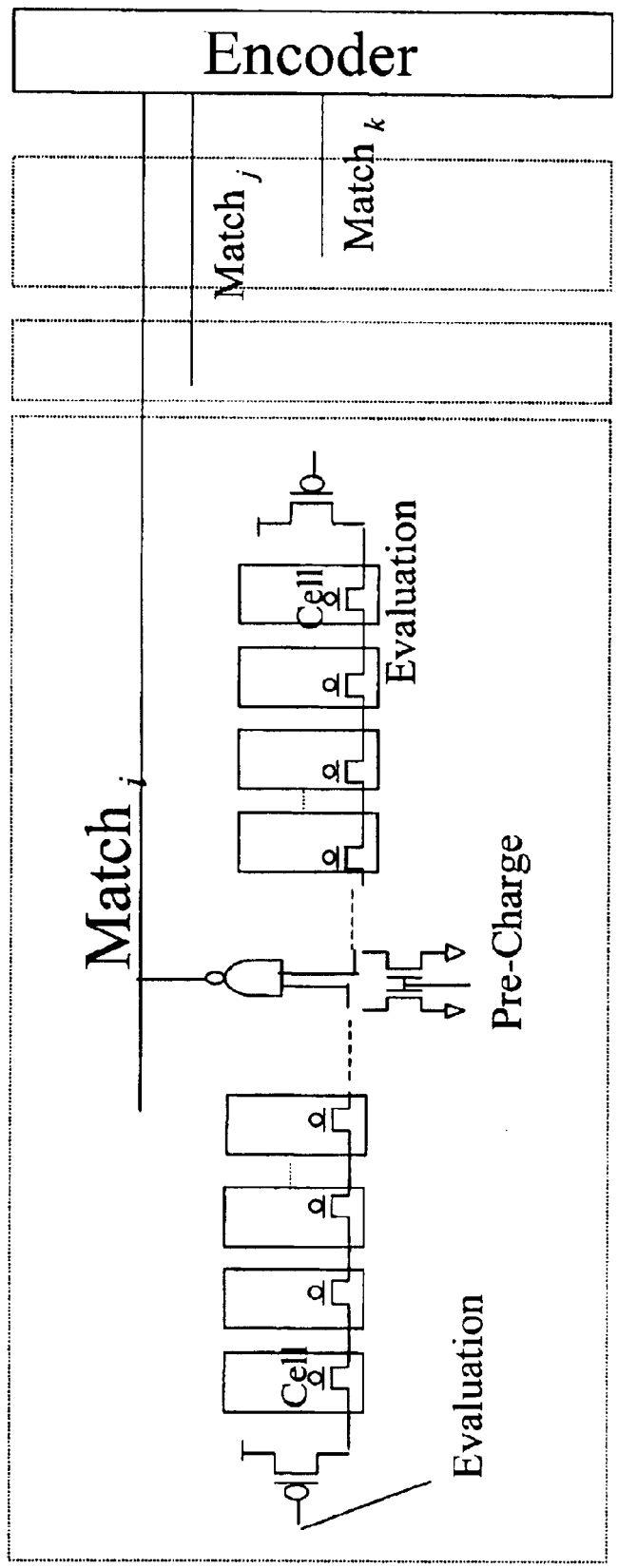
FIG. 65 shows an embodiment of a simple peripheral circuit with CAM cells described above for multiple-word comparison operation.

Refer to FIG. 65, which shows an embodiment of a simple peripheral circuit with CAM cells describe above for multiple-word comparison operation. In such arrangement, the number of CAM cells is dependent on the bit number of the word for such comparison; for example, n bits of one word being compared simultaneously and a Match signal being signaled after comparison. For other example, several n-bit comparison operations can also be performed simultaneously and a Match signal being signaled by using a NAND gate.

For multiple words, for example, m words, m rows for n-bit comparisons will be arranged for such m-word comparison. The CAM cells can be one of all types of the CAM cells described in the fifth-preferred embodiments. Match signals such as $Match_i$, $Match_j$ and $Match_k$ are generated after several n-bit comparison operations. By using a encoder device, such as encoder ROM, a result signal can be easily signaled for simultaneously comparing m words. The numbers of m and n are determined in accordance with the design requirements.

Applications of the Embodiments of CAM Cells

In the embodiments of the invention, two pairs of bit lines BL, BL# and BL1, BL1#, and/or two word lines WL, WL1 are selectively provided for different purposes. For example, if word line WL is used for SRAM write operation, the other word line WL1 is used for refresh. The match operation can be performed in the same cycle when write operation and refresh operation are performed. Another arrangement can also that if word line WL is for write operation, the word line WL1 is for read operation, while a wave-pipeline technique for hidden refresh is used for a refresh cycle (which means hidden refresh) and the match operation is performed in the same cycle.

Another choice of arrangement is that if the word line WL is for write operation, the other word line WL1 is for read operation, while the match operation is performed in the same cycle and idle a refresh cycle for refresh operation (for dynamic CAM cells).

Figure 66:
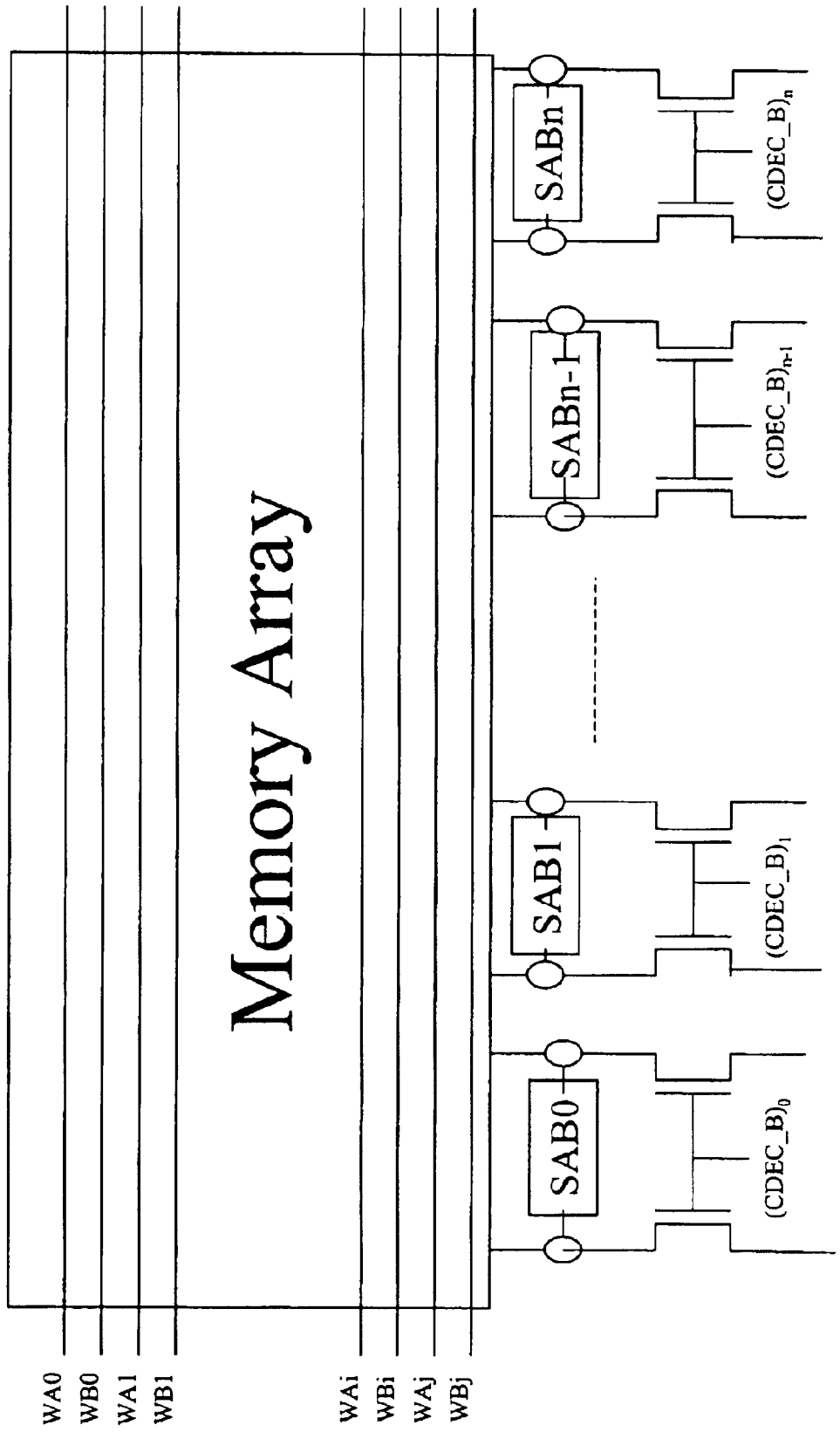
FIG. 66 is an architecture using the CAM cells of preferred embodiments of the invention can be arranged in such a way which memory array is provided with 2-port bit lines and 2-port word lines.
Figure 67:
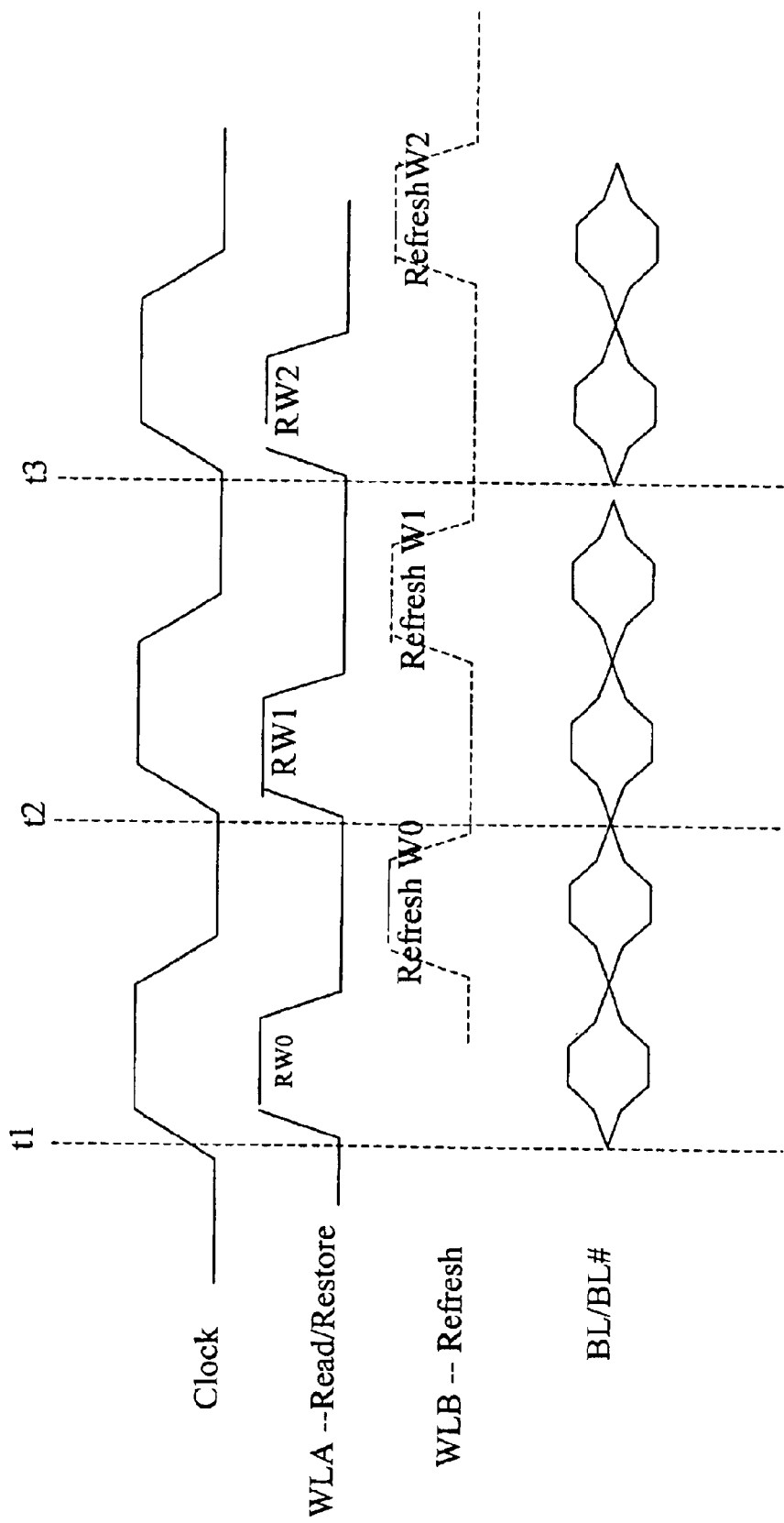
FIG. 67 shows a time diagram of an operating method for a synchronous static random access memory with a hidden refresh for the architecture using the CAM cells of preferred embodiments of the invention as shown in FIG. 66.

As shown in FIG. 66, an architecture using the CAM cells of preferred embodiments of the invention can be arranged in such a way which memory array is provided with 2-port bit lines and 2-port word lines. Each pair of bit lines has a sense amplifier unit, for example, bit lines $BL_0$ and $BL_0\#$ have a sense amplifier unit SAB0 for sensing data stored in the CAM cells. If a n-bit comparison operation is required, n pairs of bit lines with n sense amplifiers are provided in such memory array accompanying with n pairs of word lines. These read/write operations accompanying with a refresh operation are described in FIGS. 67–69. Refer to FIG. 67, which shows an operating method for a synchronous static random access memory with a hidden refresh. In such operating method, reading, writing (or restoring data) and refreshing are performed with one clock.

An example of one pair of bit lines BL/BL# as well as a pair of word lines WLA and WLB are described herein for a preferred embodiment of the invention. As shown in FIG. 67, in such a case that word line WLA is used for SRAM read/write operation, the other word line WLB is used for refresh. The match operation can be performed in the same cycle when write operation and refresh operation are performed. As shown in FIG. 67, a read/restore cycle from the word line WLA is triggered at time t1 and then a refresh cycle Refresh W0 is followed from word line WLB. The time period for the read/restore cycle should be enough to read or write data from the static random access memory cell. The time period for the refresh cycle should be enough to refresh data stored in the static random access memory cell. These two cycles can be implemented within an operating clock for the memory array. Such architecture is for synchronous SRAM with hidden refresh.

Figure 68:
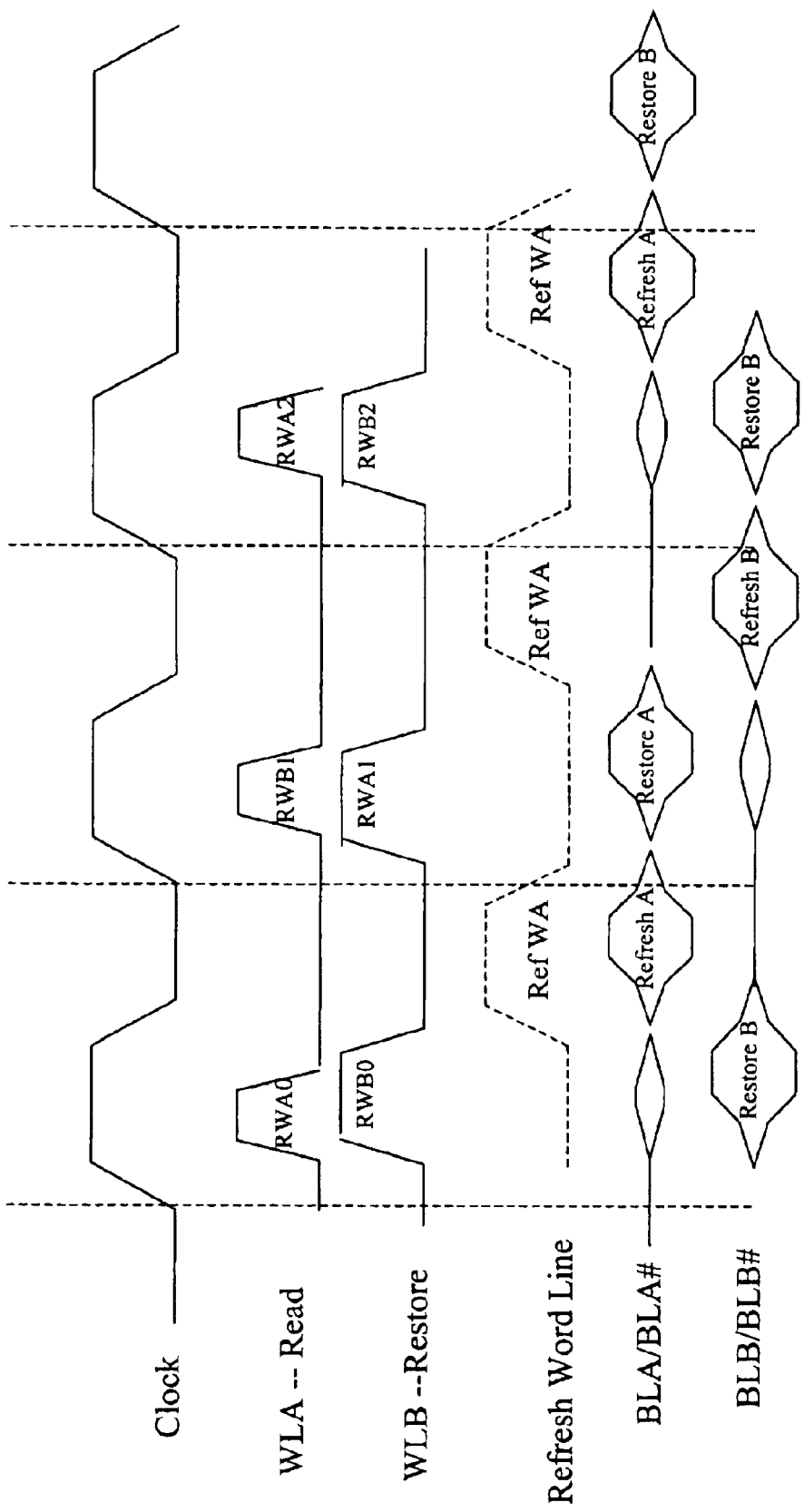
FIG. 68 shows a time diagram of two pairs of bit lines BLA/BLA# and BLB/BLB# as well as a pair of word lines WLA and WLB for the architecture using the CAM cells of preferred embodiments of the invention as shown in FIG. 66.

An example of two pairs of bit lines BLA/BLA# and BLB/BLB# as well as a pair of word lines WLA and WLB are described herein for a preferred embodiment of the invention, as shown in FIG. 68. The word line WLA is used for read operation, the other word line WLB is used for write (restore) operation, while the match operation is performed in the same cycle. A hidden refresh operation is performed at the same operating clock through one word line. Bit lines BLA/BLA# are used for refresh and the other bit lines BLB/BLB# are used for restore operation. The time period for the read/restore cycle should be enough to read or write data from the static random access memory cell. The time period for the refresh cycle should be enough to refresh data stored in the static random access memory cell.

Figure 69:
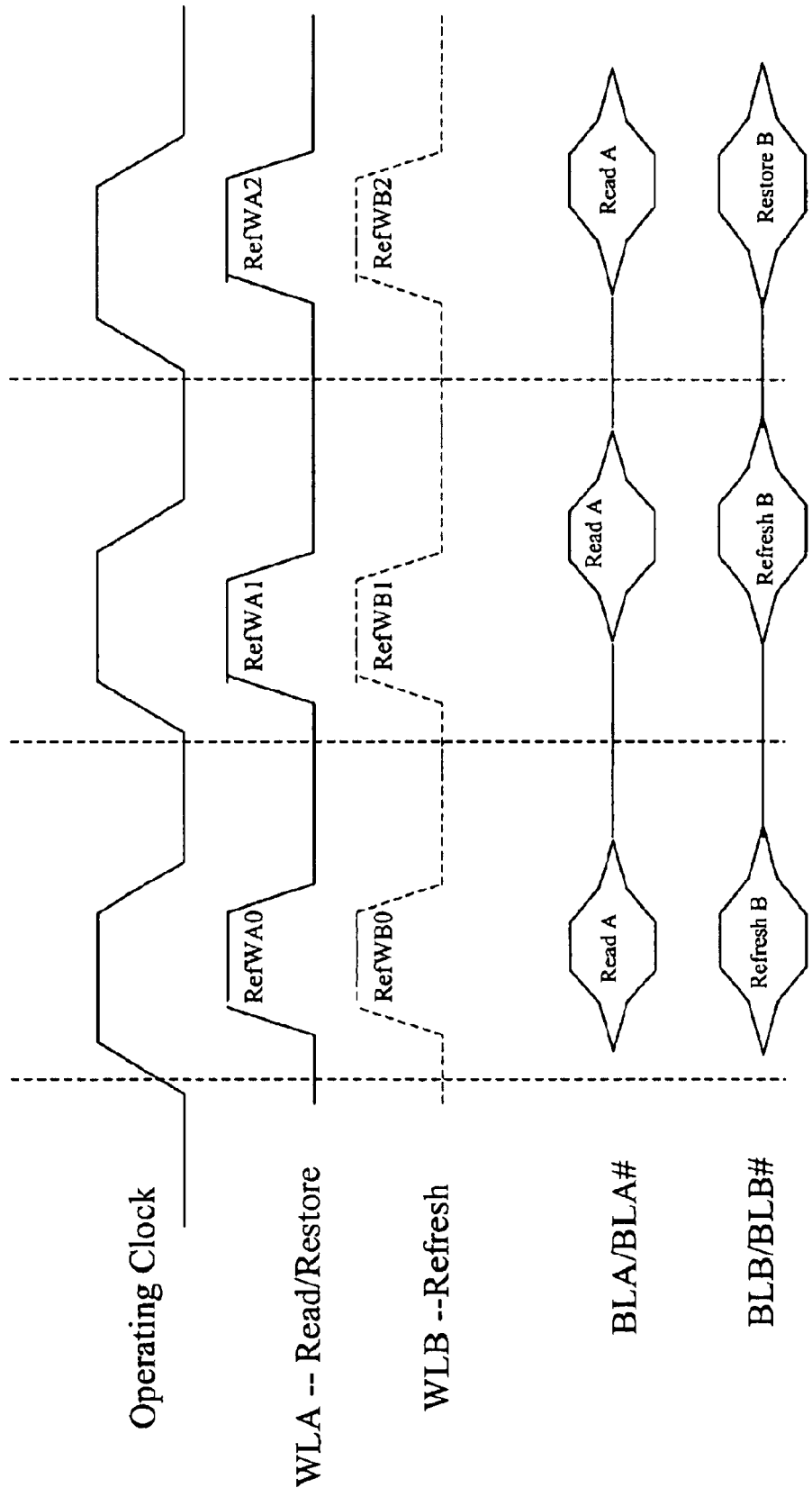

An example of two pairs of bit lines BLA/BLA# and BLB/BLB# as well as a pair of word lines WLA and WLB are described herein for a preferred embodiment of the invention, as shown in FIG. 69. The word line WLA is used for read/restore operation, the other word line WLB is used for refresh operation, while the match operation is performed in the same cycle. Bit lines BLA/BLA# are used for reading and the other bit lines BLB/BLB# are used for refreshing. The time period for the read/restore cycle should be enough to read or write data from the static random access memory cell. The time period for the refresh cycle should be enough to refresh data stored in the static random access memory cell.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A memory cell, comprising:
    a first bit line, for transmitting a first data bit to the memory cell;

a second bit line, for transmitting a complement of the first data bit to the memory cell;

a first word line, for selectively controlling data transmitting between the first and second bit lines and the memory cell in accordance with an accessing operation mode and a comparison operation mode of the memory cell;

a first pass transistor, having a gate controlled by the first word line, for connecting the first bit line to the gate of the first storage transistor and the first capacitor, during the accessing operation mode;

a second pass transistor, having a gate controlled by the first word line, for connecting the second bit line to the gate of the second storage transistor and the second capacitor, during the accessing operation mode;

a first storage transistor and a first capacitor, a gate of the first storage transistor and the first capacitor for dynamically storing a storage data bit of the memory cell in respond to the first data bit during the accessing operation mode;

a second storage transistor and a second capacitor, a gate of the second storage transistor and the second capacitor for dynamically storing a complement of the storage data bit of the memory cell in respond to the complement of first data bit during the accessing operation mode;

a match line;

a match unit, coupled to the first bit line, the second bit line, the first storage transistor and the second storage transistor, wherein during the comparison operation mode of the memory cell, the first word line stopping data transmitting between the first and second bit lines and the memory cell, the second bit line receiving a comparing data bit and the first bit line receiving a complement of the comparing data bit, if the complement of the comparing data bit from the first bit line is not logically equal to the storage data bit, or if the comparing data bit from the second bit line is not logically equal to the complement of the storage data bit, the match unit discharging current from the match line to indicate a mis-match signal.

2. The memory cell of claim 1, the match unit comprising:

a first transistor, being coupled a gate the first storage transistor and the first capacitor, a gate of the first transistor being controlled by the storage data bit stored in the a gate the first storage transistor and the first capacitor, a source/drain region of the first transistor being coupled to ground;

a second transistor, being coupled a gate of the second storage transistor and the second capacitor, a gate of the second transistor being controlled by the complement of the storage data bit stored in the gate of the second storage transistor and the second capacitor, a source/drain region of the second transistor being coupled to ground;

a first match transistor, a gate of the first match transistor being coupled to the first bit line, a source/drain region of the first match transistor being coupled to another ungrounded source/drain region of the first transistor and another source/drain region of the first match transistor being coupled to the match line; and a second match transistor, a gate of the second match transistor being coupled to the second bit line, a source/drain region of the second match transistor being coupled to another ungrounded source/drain region of the second transistor and another source/drain region of the second match transistor being coupled to the match line.

3. The memory cell of claim 2, wherein the first and second pass transistors, the first and second storage transistors, the first and second match transistors, and the first and second transistors are all n-channel metal-oxide-semiconductor (NMOS) transistors.

4. The memory cell of claim 1, wherein the first capacitor and the second capacitor are MOS capacitors.

5. The memory cell of claim 1, further comprising a third bit line, for transmitting a second data bit to the memory cell;

a forth bit line, for transmitting a complement of the second data bit to the memory cell;

a second word line, for selectively controlling data transmitting between the third and forth bit lines and the memory cell in accordance with the accessing operation mode and the comparison operation mode of the memory cell;

a third pass transistor, having a gate controlled by the second word line, for connecting the third bit line to the gate of the first storage transistor and the first capacitor; and a forth pass transistor, having a gate controlled by the second word line, for connecting the forth bit line to the gate of the second storage transistor and the second capacitor, wherein the storage data bit stored in the gate of the first storage transistor and the first capacitor being selectively updated in response to the second data bit, the storage data bit stored in the gate of the second storage transistor and the second capacitor being selectively updated in response to the complement of the second data bit.

6. The memory cell of claim 5, wherein the first and second pass transistors, the third and forth pass transistors, the first and second storage transistors, the first and second match transistors, and the first and second transistors are all n-channel metal-oxide-semiconductor (NMOS) transistors.

7. A memory cell, comprising:

a first bit line, for transmitting a first data bit to the memory cell;

a second bit line, for transmitting a complement of the first data bit to the memory cell;

a first word line, for selectively controlling data transmitting between the first and second bit lines and the memory cell in accordance with an accessing operation mode and a comparison operation mode of the memory cell;

a first pass transistor, having a gate controlled by the first word line, for connecting the first bit line to the gate of the first storage transistor, during the accessing operation mode;

a second pass transistor, having a gate controlled by the first word line, for connecting the second bit line to the gate of the second storage transistor, during the accessing operation mode;

a first storage transistor, having a first gate for dynamically storing a storage data bit of the memory cell in response to the first data bit;

a second storage transistor, having a second gate for dynamically storing a complement of the storage data bit of the memory cell in response to the complement of the first data bit;

a match line; and a match unit, coupled to the first bit line, the second bit line, the gate of the first storage transistor and the gate of the second storage transistor, wherein during the comparison operation mode of the memory cell, the first word line stopping data transmitting between the first and second bit lines and the memory cell, the second bit line receiving a comparing data bit and the first bit line receiving a complement of the comparing data bit, if the complement of the comparing data bit from the first bit line is not logically equal to the storage data bit, or if the comparing data bit from the second bit line is not logically equal to the complement of the storage data bit, the match unit discharging current from the match line to indicate a mis-match signal.

8. The memory cell of claim 7, the match unit comprising:

a first transistor, being coupled the first storage transistor, a gate of the first transistor being controlled by the storage data bit stored in the gate of the first storage transistor, a source/drain region of the first transistor being coupled to ground;

a second transistor, being coupled the second storage transistor, a gate of the second transistor being controlled by the complement of the storage data bit stored in the gate of the second storage transistor, a source/drain region of the second transistor being coupled to ground;

a first match transistor, a gate of the first match transistor being coupled to the first bit line, a source/drain region of the first match transistor being coupled to another ungrounded source/drain region of the first transistor and another source/drain region of the first match transistor being coupled to the match line; and a second match transistor, a gate of the second match transistor being coupled to the second bit line, a source/drain region of the second match transistor being coupled to another ungrounded source/drain region of the second transistor and another source/drain region of the second match transistor being coupled to the match line.

9. The memory cell of claim 8, wherein the first and second pass transistors, the first and second storage transistors, the first and second match transistors, and the first and second transistors are all n-channel metal-oxide-semiconductor (NMOS) transistors.

10. The memory cell of claim 1, further comprising a third bit line, for transmitting a second data bit to the memory cell;

a forth bit line, for transmitting a complement of the second data bit to the memory cell;

a second word line, for selectively controlling data transmitting between the third and forth bit lines and the memory cell in accordance with the accessing operation mode and the comparison operation mode of the memory cell;

a third pass transistor, having a gate controlled by the second word line, for connecting the third bit line to the gate of the first storage transistor and the first capacitor; and a forth pass transistor, having a gate controlled by the second word line, for connecting the forth bit line to the gate of the second storage transistor and the second capacitor, and wherein the storage data bit stored in the gate of the first storage transistor being selectively updated in response to the second data bit, the storage data bit stored in the gate of the second storage transistor being selectively updated in response to the complement of the second data bit.

11. The memory cell of claim 10, wherein the first and second pass transistors, the third and forth pass transistors, the first and second storage transistors, the first and second match transistors, and the first and second transistors are all n-channel metal-oxide-semiconductor (NMOS) transistors.

12. A memory cell, comprising:

a first bit line, for transmitting a first data bit to the memory cell;

a second bit line, for transmitting a complement of the first data bit to the memory cell;

a first word line, for selectively controlling data transmitting between the first and second bit lines and the memory cell in accordance with an accessing operation mode and a comparison operation mode of the memory cell;

a first pass transistor, having a gate controlled by the first match transistor word line, for connecting the first bit line to the first capacitor, during the accessing operation mode;

a second pass transistor, having a gate controlled by the first match transistor word line, for connecting the second bit line to the second capacitor, during the accessing operation mode;

a first capacitor, for storing a storage data bit of the memory cell in response to the first data bit;

a second capacitor, for dynamically storing a complement of the storage data bit of the memory cell in response to the complement of the first data bit;

a match line; and a match unit, coupled to the first bit line, the second bit line, the first capacitor and the second capacitor, wherein during the comparison operation mode of the memory cell, the first word line stopping data transmitting between the first and second bit lines and the memory cell, the second bit line receiving a comparing data bit and the first bit line receiving a complement of the comparing data bit, if the complement of the comparing data bit from the first bit line is not logically equal to the storage data bit, or if the comparing data bit from the second bit line is not logically equal to the complement of the storage data bit, the match unit discharging current from the match line to indicate a mis-match signal.

13. The memory cell of claim 12, the match unit comprising:

a first transistor, having a gate being controlled by the storage data bit stored in the first capacitor, a source/drain region of the first transistor being coupled to ground;

a second transistor, having a gate being controlled by the complement of the storage data bit stored in the second capacitor, a source/drain region of the second transistor being coupled to ground;

a first match transistor, a gate of the first match transistor being coupled to the first bit line, a source/drain region of the first match transistor being coupled to another ungrounded source/drain region of the first transistor and another source/drain region of the first match transistor being coupled to the match line; and a second match transistor, a gate of the second match transistor being coupled to the second bit line, a source/drain region of the second match transistor being coupled to another ungrounded source/drain region of the second transistor and another source/drain region of the second match transistor being coupled to the match line.

14. The memory cell of claim 13, wherein the first and second pass transistors, the first and second storage transistors, the first and second match transistors, and the first and second transistors are all n-channel metal-oxide-semiconductor (NMOS) transistors.

15. The memory cell of claim 13, wherein the first and second pass transistors, the first and second storage transistors, the first and second match transistors, and the first and second transistors are all p-channel metal-oxide-semiconductor (PMOS) transistors.

16. The memory cell of claim 12, wherein the first capacitor and the second capacitor are MOS capacitors.

17. The memory cell of claim 12, wherein the first capacitor and the second capacitor are metal-insulator-metal (MIM) capacitors.

18. The memory cell of claim 12, wherein the first capacitor and the second capacitor are polysilicon capacitors.

19. The memory cell of claim 12, wherein the first capacitor and the second capacitor are ferroelectric capacitors suitable usage for ferroelectric random-access memory (FRAM).

20. The memory cell of claim 12, wherein the first capacitor and the second capacitor are capacitors manufactured by a DRAM process.

21. The memory cell of claim 12, wherein the first capacitor and the second capacitor are magnetoresistive random access memory (MRAM) capacitors made of magnetic materials to store data.

22. The memory cell of claim 12, further comprising
a third bit line, for transmitting a second data bit to the memory cell;
a forth bit line, for transmitting a complement of the second data bit to the memory cell;
a second word line, for selectively controlling data transmitting between the third and forth bit lines and the memory cell in accordance with the accessing operation mode and the comparison operation mode of the memory cell;
a third pass transistor, having a gate controlled by the second word line, for connecting the third bit line to the first capacitor; and
a forth pass transistor, having a gate controlled by the second word line, for connecting the forth bit line to the second capacitor;
wherein
the storage data bit stored in the the first capacitor being selectively updated in response to the second data bit,
the storage data bit stored in the second capacitor being selectively updated in response to the complement of the second data bit.

23. The memory cell of claim 22, wherein the first and second pass transistors, the third and forth pass transistors, the first and second storage transistors, the first and second match transistors, and the first and second transistors are all n-channel metal-oxide-semiconductor (NMOS) transistors.

24. The memory cell of claim 22, wherein the first and second pass transistors, the third and forth pass transistors, the first and second storage transistors, the first and second match transistors, and the first and second transistors are all p-channel metal-oxide-semiconductor (PMOS) transistors.

25. A memory cell, comprising:
a first bit line, for transmitting a first data bit to the memory cell;
a second bit line, for transmitting a complement of the first data bit to the memory cell;
a first word line, for selectively controlling data transmitting between the first and second bit lines and the memory cell in accordance with an accessing operation mode and a comparison operation mode of the memory cell;
a first pass transistor, having a gate controlled by the first match transistor word line, for connecting the first bit line to the gate of the first transistor, during the accessing operation mode;
a second pass transistor, having a gate controlled by the first match transistor word line, for connecting the second bit line to the gate of the second transistor, during the accessing operation mode;
a first transistor, having a gate for dynamically storing a storage data bit of the memory cell and having a source/drain region coupling to ground;
a second transistor, having a gate for dynamically storing a complement of the storage data bit of the memory cell and having a source/drain region coupling to ground;
a match line;
a first match transistor, having a gate coupled to the first bit line, a source/drain region being coupled to another ungrounded source/drain region of the first transistor, and another source/drain region being coupled to the match line; and
a second match transistor, having a gate being coupled to the second bit line, a source/drain region being coupled to another ungrounded source/drain region of the second transistor, and another source/drain region being coupled to the match line,
wherein
during the comparison operation mode of the memory cell,
the first word line stopping data transmitting between the first and second bit lines and the memory cell,
the second bit line receiving a comparing data bit and the first bit line receiving a complement of the comparing data bit,
if the complement of the comparing data bit is not logically equal to the storage data bit, the first match transistor discharging current from the match line to indicate a mis-match signal,
if the complement of the comparing data bit from the first bit line is not logically equal to the storage data bit, or if the comparing data bit from the second bit line is not logically equal to the complement of the storage data bit, the second match transistor discharging current from the match line to indicate a mis-match signal.

26. The memory cell of claim 25, wherein the first and second pass transistors, the first and second storage transistors, the first and second match transistors, and the first and second transistors are all n-channel metal-oxide-semiconductor (NMOS) transistors.

27. The memory cell of claim 25, wherein the first and second pass transistors, the first and second storage transistors, the first and second match transistors, and the first and second transistors are all p-channel metal-oxide-semiconductor (PMOS) transistors.

28. The memory cell of claim 1, further comprising a third bit line, for transmitting a second data bit to the memory cell;
  a forth bit line, for transmitting a complement of the second data bit to the memory cell;
  a second word line, for selectively controlling data transmitting between the third and forth bit lines and the memory cell in accordance with the accessing operation mode and the comparison operation mode of the memory cell;
  a third pass transistor, having a gate controlled by the second word line, for connecting the third bit line to the first capacitor; and
  a forth pass transistor, having a gate controlled by the second word line, for connecting the forth bit line to the second capacitor,
  wherein
    the storage data bit stored in the gate of the first transistor being selectively updated in response to the second data bit,
    the storage data bit stored in the gate of the second transistor being selectively updated in response to the complement of the second data bit.

29. The memory cell of claim 28, wherein the first and second pass transistors, the third and forth pass transistors, the first and second storage transistors, the first and second match transistors, and the first and second transistors are all n-channel metal-oxide-semiconductor (NMOS) transistors.

30. The memory cell of claim 28, wherein the first and second pass transistors, the third and forth pass transistors, the first and second storage transistors, the first and second match transistors, and the first and second transistors are all p-channel metal-oxide-semiconductor (PMOS) transistors.

31. A memory cell, comprising:
  a first bit line, for transmitting a first data bit to the memory cell;
  a second bit line, for transmitting a complement of the first data bit to the memory cell;
  a first word line, for controlling data transmitting between the first and second bit lines and the memory cell;
  a first pass transistor, having a gate controlled by the first word line, for connecting the first bit line to the gate of the first storage transistor and the first capacitor;
  a second pass transistor, having a gate controlled by the first word line, for connecting the second bit line to the gate of the second storage transistor and the second capacitor;
  a first storage transistor and a first capacitor, a gate of the first storage transistor and the first capacitor for dynamically storing a storage data bit of the memory cell in response to the first data bit;
  a second storage transistor and a second capacitor, a gate of the second storage transistor and the second capacitor for dynamically storing a complement of the storage data bit of the memory cell in response to complement of the first data bit;
  a first compare line, for transmitting a compare data bit to the memory cell; a second compare bit line, for transmitting a complement of the compare data bit to the memory cell;
  a match line; and
  a match unit, coupled to the first and second bit lines, the first and second compare lines, the first storage transistor and the second storage transistor,
  wherein
    during comparison operation of the memory cell, the compare data bit being conducted to the first and second compare lines, and
    if the complement of the comparing data bit from the first compare line is not logically equal to the storage data bit, or if the comparing data bit from the second compare line is not logically equal to the complement of the storage data bit, the match unit discharging current from the match line to indicate a mismatch signal.

32. The memory cell of claim 31, the match unit comprising:
  a first transistor, being coupled to a gate of the first storage transistor and the first capacitor, a gate of the first transistor being controlled by the storage data bit stored in the first storage transistor and the first capacitor, a source/drain region of the first transistor being coupled to g round;
  a second transistor, being coupled to a gate of the second storage transistor and the second capacitor, a gate of the second transistor being controlled by the complement of the storage data bit stored in the second storage transistor and the second capacitor, a source/drain region of the second transistor being coupled to ground;
  a first match transistor, a gate of the first match transistor being controlled by the first compare line, a source/drain region of the first match transistor being coupled to another ungrounded source/drain region of the first transistor and another source/drain region of the first match transistor being coupled to the match line; and
  a second match transistor, a gate of the second match transistor being controlled by the second compare line, a source/drain region of the second match transistor being coupled to another ungrounded source/drain region of the second transistor and another source/drain region of the second match transistor being coupled to the match line.

33. The memory cell of claim 32, wherein the first and second pass transistors, the first and second storage transistors, the first and second match transistors, and the first and second transistors are all n-channel metal-oxide-semiconductor (NMOS) transistors.

34. The memory cell of claim 31, wherein the first capacitor and the second capacitor are MOS capacitors.

35. The memory cell of claim 31, further comprising
  a third bit line, for transmitting a second data bit to the memory cell;
  a forth bit line, for transmitting a complement of the second data bit to the memory cell;
  a second word line, for selectively controlling data transmitting between the third and forth bit lines and the memory cell in accordance with the accessing operation mode and the comparison operation mode of the memory cell;
  a third pass transistor, having a gate controlled by the second word line, for connecting the third bit line to the gate of the first storage transistor and the first capacitor; and
  a forth pass transistor, having a gate controlled by the second word line, for connecting the forth bit line to the gate of the second storage transistor and the second capacitor;

wherein
the storage data bit stored in the gate of the first storage transistor and the first capacitor being selectively updated in response to the second data bit,
the storage data bit stored in the gate of the second storage transistor and the second capacitor being selectively updated in response to the complement of the second data bit.

36. A memory cell, comprising:
a first bit line, for transmitting a first data bit to the memory cell;
a second bit line, for transmitting a complement of the first data bit to the memory cell;
a first word line, for controlling data transmitting between the first and second bit lines and the memory cell;
a first pass transistor, having a gate controlled by the first word line, for connecting the first bit line to the gate of the first storage transistor;
a second pass transistor, having a gate controlled by the first word line, for connecting the second bit line to the gate of the second storage transistor;
a first storage transistor, having a gate for dynamically storing a storage data bit of the memory cell in response to the first data bit;
a second storage transistor, having a gate for dynamically storing a complement of the storage data bit of the memory cell in response to complement of the first data bit;
a first compare line, for transmitting a compare data bit to the memory cell;
a second compare bit line, for transmitting a complement of the compare data bit to the memory cell;
a match line; and
a match unit, coupled to the first and second bit lines, the first and second compare lines, the first storage transistor and the second storage transistor,
wherein
during comparison operation of the memory cell, the compare data bit being conducted to the first and second compare lines, and
if the complement of the comparing data bit from the first compare line is not logically equal to the storage data bit, or if the comparing data bit from the second compare line is not logically equal to the complement of the storage data bit, the match unit discharging current from the match line to indicate a mismatch signal.

37. The memory cell of claim 36, the match unit comprising:
a first transistor, being coupled to a gate of the first storage transistor and the first capacitor, a gate of the first transistor being controlled by the storage data bit stored in the first storage transistor, a source/drain region of the first transistor being coupled to ground;
a second transistor, being coupled to a gate of the second storage transistor and the second capacitor, a gate of the second transistor being controlled by the complement of the storage data bit stored in the second storage transistor, a source/drain region of the second transistor being coupled to ground;
a first match transistor, a gate of the first match transistor being controlled by the first compare line, a source/drain region of the first match transistor being coupled to another ungrounded source/drain region of the first transistor and another source/drain region of the first match transistor being coupled to the match line; and
a second match transistor, a gate of the second match transistor being controlled by the second compare line, a source/drain region of the second match transistor being coupled to another ungrounded source/drain region of the second transistor and another source/drain region of the second match transistor being coupled to the match line.

38. The memory cell of claim 37, wherein the first and second pass transistors, the first and second storage transistors, the first and second match transistors, and the first and second transistors are all n-channel metal-oxide-semiconductor (NMOS) transistors.

39. The memory cell of claim 36, further comprising
a third bit line, for transmitting a second data bit to the memory cell;
a forth bit line, for transmitting a complement of the second data bit to the memory cell,
a second word line, for selectively controlling data transmitting between the third and forth bit lines and the memory cell in accordance with the accessing operation mode and the comparison operation mode of the memory cell;
a third pass transistor, having a gate controlled by the second word line, for connecting the third bit line to the gate of the first storage transistor; and
a forth pass transistor, having a gate controlled by the second word line, for connecting the forth bit line to the gate of the second storage transistor,
wherein
the storage data bit stored in the gate of the first storage transistor and the first capacitor being selectively updated in response to the second data bit,
the storage data bit stored in the gate of the second storage transistor and the second capacitor being selectively updated in response to the complement of the second data bit.

40. A memory cell, comprising:
a first bit line, for transmitting a first data bit to the memory cell;
a second bit line, for transmitting a complement of the first data bit to the memory cell;
a first word line, for controlling data transmitting between the first and second bit lines and the memory cell;
a first pass transistor, having a gate controlled by the first word line, for connecting the first bit line to the first capacitor;
a second pass transistor, having a gate controlled by the first word line, for connecting the second bit line to the second capacitor;
a first capacitor, for dynamically storing a storage data bit of the memory cell in response to the first data bit;
a second capacitor, for dynamically storing a complement of the storage data bit of the memory cell in response to complement of the first data bit;
a first compare line, for transmitting a compare data bit to the memory cell;
a second compare bit line, for transmitting a complement of the compare data bit to the memory cell;
a match line; and
a match unit, coupled to the first and second bit lines, the first and second compare lines, the first storage transistor and the second storage transistor, wherein during comparison operation of the memory cell, the compare data bit being conducted to the first and second compare lines, and if the complement of the comparing data bit from the first compare line is not logically equal to the storage data bit, or if the comparing data bit from the second compare line is not logically equal to the complement of the storage data bit, the match unit discharging current from the match line to indicate a mismatch signal.

41. The memory cell of claim 40, the match unit comprising:

a first transistor, being coupled to the first capacitor, a gate of the first transistor being controlled by the storage data bit stored in the first capacitor, a source/drain region of the first transistor being coupled to ground;

a second transistor, being coupled to the second capacitor, a gate of the second transistor being controlled by the complement of the storage data bit stored in the second capacitor, a source/drain region of the second transistor being coupled to ground;

a first match transistor, a gate of the first match transistor being controlled by the first compare line, a source/drain region of the first match transistor being coupled to another ungrounded source/drain region of the first transistor and another source/drain region of the first match transistor being coupled to the match line; and a second match transistor, a gate of the second match transistor being controlled by the second compare line, a source/drain region of the second match transistor being coupled to another ungrounded source/drain region of the second transistor and another source/drain region of the second match transistor being coupled to the match line.

42. The memory cell of claim 41, wherein the first and second pass transistors, the first and second storage transistors, the first and second match transistors, and the first and second transistors are all n-channel metal-oxide-semiconductor (NMOS) transistors.

43. The memory cell of claim 42, wherein the first and second pass transistors, the first and second storage transistors, the first and second match transistors, and the first and second transistors are all p-channel metal-oxide-semiconductor (PMOS) transistors.

44. The memory cell of claim 40, wherein the first capacitor and the second capacitor are MOS capacitors.

45. The memory cell of claim 40, further comprising a third bit line, for transmitting a second data bit to the memory cell;

a forth bit line, for transmitting a complement of the second data bit to the memory cell;

a second word line, for selectively controlling data transmitting between the third and forth bit lines and the memory cell in accordance with the accessing operation mode and the comparison operation mode of the memory cell;

a third pass transistor, having a gate controlled by the second word line, for connecting the third bit line to the first capacitor; and a forth pass transistor, having a gate controlled by the second word line, for connecting the forth bit line to the second capacitor, wherein the storage data bit stored in the gate of the first storage transistor and the first capacitor being selectively updated in response to the second data bit, the storage data bit stored in the gate of the second storage transistor and the second capacitor being selectively updated in response to the complement of the second data bit.

46. The memory cell of claim 45, wherein the first and second pass transistors, the third and forth pass transistors, the first and second storage transistors, the first and second match transistors, and the first and second transistors are all n-channel metal-oxide-semiconductor (NMOS) transistors.

47. The memory cell of claim 45, wherein the first and second pass transistors, the third and forth pass transistors, the first and second storage transistors, the first and second match transistors, and the first and second transistors are all p-channel metal-oxide-semiconductor (PMOS) transistors.

48. The memory cell of claim 41, wherein the first capacitor and the second capacitor are metal-insulator-metal (MIM) capacitors.

49. The memory cell of claim 41, wherein the first capacitor and the second capacitor are polysilicon capacitors.

50. The memory cell of claim 41, wherein the first capacitor and the second capacitor are ferroelectric capacitors suitable usage for ferroelectric random-access memory (FRAM).

51. The memory cell of claim 41, wherein the first capacitor and the second capacitor are capacitors manufactured by a DRAM process.

52. The memory cell of claim 41, wherein the first capacitor and the second capacitor are magnetoresistive random access memory (MRAM) capacitors made of magnetic materials to store data.

53. A memory cell, comprising:

a first bit line, for transmitting a first data bit to the memory cell;

a second bit line, for transmitting a complement of the first data bit to the memory cell;

a first word line, for controlling data transmitting between the first and second bit lines and the memory cell;

a first pass transistor, having a gate controlled by the first word line, for connecting the first bit line to the gate of the first transistor;

a second pass transistor, having a gate controlled by the first word line, for connecting the second bit line to the gate of the second transistor;

a first transistor, having a gate for dynamically storing a storage data bit of the memory cell in response to the first data bit and having a source/drain region coupling to ground;

a second transistor, having a gate for dynamically storing a complement of the storage data bit of the memory cell in response to the complement of the first data bit and having a source/drain region coupling to ground;

a first compare line, for transmitting a compare data bit to the memory cell;

a second bit line, for transmitting a complement of the compare data bit to the memory cell;

a match line;

a first match transistor, having a gate coupled to the first compare line, a source/drain region being coupled to another ungrounded source/drain region of the first transistor, and another source/drain region being coupled to the match line; and a second match transistor, having a gate being coupled to the second compare line, a source/drain region being coupled to another ungrounded source/drain region of the second transistor, and another source/drain region being coupled to the match line, wherein during comparison operation of the memory cell, the compare data bit being conducted to the first and second compare lines, and if the complement of the comparing data bit from the first compare line is not logically equal to the storage data bit, or if the comparing data bit from the second compare line is not logically equal to the complement of the storage data bit, the match unit discharging current from the match line to indicate a mismatch signal.

54. The memory cell of claim 53, wherein the first and second pass transistors, the first and second storage transistors, the first and second match transistors, and the first and second transistors are all n-channel metal-oxide-semiconductor (NMOS) transistors.

55. The memory cell of claim 53, wherein the first and second pass transistors, the first and second storage transistors, the first and second match transistors, and the first and second transistors are all p-channel metal-oxide-semiconductor (PMOS) transistors.

56. The memory cell of claim 53, further comprising a third bit line, for transmitting a second data bit to the memory cell;

a forth bit line, for transmitting a complement of the second data bit to the memory cell, a second word line, for selectively controlling data transmitting between the third and forth bit lines and the memory cell in accordance with the accessing operation mode and the comparison operation mode of the memory cell;

a third pass transistor, having a gate controlled by the second word line, for connecting the third bit line to the gate of the first transistor; and a forth pass transistor, having a gate controlled by the second word line, for connecting the forth bit line to the gate of the second transistor;

wherein the storage data bit stored in the gate of the first transistor being selectively updated in response to the second data bit, the storage data bit stored in the gate of the second transistor being selectively updated in response to the complement of the second data bit.

57. A memory cell, comprising:

a first bit line, for transmitting a first data bit to the memory cell;

a second bit line, for transmitting a complement of the first data bit to the memory cell;

a first word line, for selectively controlling data transmitting between the first and second bit lines and the memory cell in accordance with an accessing operation mode and a comparison operation mode of the memory cell;

a first pass transistor, having a gate controlled by the first word line, for connecting the first bit line to the gate of the first storage transistor and the first capacitor, during the accessing operation mode;

a second pass transistor, having a gate controlled by the first word line, for connecting the second bit line to the gate of the second storage transistor and the second capacitor, during the accessing operation mode;

a first storage transistor and a first capacitor, a gate of the first storage transistor and the first capacitor for dynamically storing a storage data bit of the memory cell in respond to the first data bit during the accessing operation mode;

a second storage transistor and a second capacitor, a gate of the second storage transistor and the second capacitor for dynamically storing a complement of the storage data bit of the memory cell in respond to the complement of first data bit during the accessing operation mode;

a first transistor, being coupled to a gate the first storage transistor and the first capacitor, a gate of the first transistor being controlled by the storage data bit stored in the a gate the first storage transistor and the first capacitor, a source/drain region of the first transistor being coupled to the first bit line;

a second transistor, being coupled to a gate of the second storage transistor and the second capacitor, a gate of the second transistor being controlled by the complement of the storage data bit stored in the gate of the second storage transistor and the second capacitor, a source/drain region of the second transistor being coupled to the second bit line; and a match transistor, having a gate coupled to an unconnected source/drain region of the first transistor and an unconnected source/drain region of the second transistor, during the comparison operation mode of the memory cell, the first word line stopping data transmitting between the first and second bit lines and the memory cell, the first bit line receiving a comparing data bit and the second bit line receiving a complement of the comparing data bit, if the comparing data bit from the first bit line is logically equal to the storage data bit, or if the comparing data bit from the second bit line is logically equal to the complement of the storage data bit, the match transistor being turned on to indicate a match signal.

58. The memory cell of claim 57, wherein the first and second pass transistors, the first and second transistors, and the match transistor are all n-channel metal-oxide-semiconductor (NMOS) transistors.

59. The memory cell of claim 57, further comprising a third bit line, for transmitting a second data bit to the memory cell;

a forth bit line, for transmitting a complement of the second data bit to the memory cell;

a second word line, for selectively controlling data transmitting between the third and forth bit lines and the memory cell in accordance with the accessing operation mode and the comparison operation mode of the memory cell;

a third pass transistor, having a gate controlled by the second word line, for connecting the third bit line to the gate of the first transistor and the first capacitor; and a forth pass transistor, having a gate controlled by the second word line, for connecting the forth bit line to the gate of the second transistor and the second capacitor, wherein the storage data bit stored in the gate of the first transistor and the first capacitor being selectively updated in response to the second data bit, the storage data bit stored in the gate of the second transistor and the second capacitor being selectively updated in response to the complement of the second data bit.

60. The memory cell of claim 59, wherein the first and second pass transistors, the third and forth pass transistors, the match transistor, and the first and second transistors are all n-channel metal-oxide-semiconductor (NMOS) transistors.

61. A memory cell, comprising:
a first bit line, for transmitting a first data bit to the memory cell;
a second bit line, for transmitting a complement of the first data bit to the memory cell;
a first word line, for selectively controlling data transmitting between the first and second bit lines and the memory cell in accordance with an accessing operation mode and a comparison operation mode of the memory cell;
a first pass transistor, having a gate controlled by the first word line, for connecting the first bit line to the gate of the first storage transistor, during the accessing operation mode;
a second pass transistor, having a gate controlled by the first word line, for connecting the second bit line to the gate of the second storage transistor, during the accessing operation mode;
a first capacitor, for dynamically storing a storage data bit of the memory cell in respond to the first data bit during the accessing operation mode;
a second capacitor, for dynamically storing a complement of the storage data bit of the memory cell in respond to the complement of first data bit during the accessing operation mode;
a first transistor, being coupled to the first capacitor, a gate of the first transistor being controlled by the storage data bit stored in the first capacitor, a source/drain region of the first transistor being coupled to the first bit line;
a second transistor, being coupled to the second capacitor, a gate of the second transistor being controlled by the complement of the storage data bit stored in the second capacitor, a source/drain region of the second transistor being coupled to the second bit line; and
a match transistor, having a gate coupled to an unconnected source/drain region of the first transistor and an unconnected source/drain region of the second transistor,
during the comparison operation mode of the memory cell,
the first word line stopping data transmitting between the first and second bit lines and the memory cell,
the first bit line receiving a comparing data bit and the second bit line receiving a complement of the comparing data bit,
if the comparing data bit from the first bit line is logically equal to the storage data bit, or if the comparing data bit from the second bit line is logically equal to the complement of the storage data bit, the match transistor being turned on to indicate a match signal.

62. The memory cell of claim 61, wherein the first and second pass transistors, the match transistor, and the first and second transistors are all n-channel metal-oxide-semiconductor (NMOS) transistors.

63. The memory cell of claim 61 wherein the first and second pass transistors, the match transistor, and the first and second transistors are all p-channel metal-oxide-semiconductor (PMOS) transistors.

64. The memory cell of claim 61, further comprising
a third bit line, for transmitting a second data bit to the memory cell;
a forth bit line, for transmitting a complement of the second data bit to the memory cell;
a second word line, for selectively controlling data transmitting between the third and forth bit lines and the memory cell in accordance with the accessing operation mode and the comparison operation mode of the memory cell;
a third pass transistor, having a gate controlled by the second word line, for connecting the third bit line to the gate of the first transistor and the first capacitor; and
a forth pass transistor, having a gate controlled by the second word line, for connecting the forth bit line to the gate of the second transistor and the second capacitor,
wherein
the storage data bit stored in the gate of the first transistor and the first capacitor being selectively updated in response to the second data bit,
the storage data bit stored in the gate of the second transistor and the second capacitor being selectively updated in response to the complement of the second data bit.

65. The memory cell of claim 64, wherein the first and second pass transistors, the third and forth pass transistors, the match transistor, and the first and second transistors are all n-channel metal-oxide-semiconductor (NMOS) transistors.

66. The memory cell of claim 64, wherein the first and second pass transistors, the third and forth pass transistors, the match transistor, and the first and second transistors are all p-channel metal-oxide-semiconductor (PMOS) transistors.

67. The memory cell of claim 61, wherein the first capacitor and the second capacitor are metal-insulator-metal (MIM) capacitors.

68. The memory cell of claim 61, wherein the first capacitor and the second capacitor are polysilicon capacitors.

69. The memory cell of claim 61, wherein the first capacitor and the second capacitor are ferroelectric capacitors suitable usage for ferroelectric random-access memory (FRAM).

70. The memory cell of claim 61, wherein the first capacitor and the second capacitor are capacitors manufactured by a DRAM process.

71. The memory cell of claim 61, wherein the first capacitor and the second capacitor are magnetoresistive random access memory (MRAM) capacitors made of magnetic materials to store data.

72. A memory cell, comprising:
a first bit line, for transmitting a first data bit to the memory cell;
a second bit line, for transmitting a complement of the first data bit to the memory cell;
a first word line, for selectively controlling data transmitting between the first and second bit lines and the memory cell in accordance with an accessing operation mode and a comparison operation mode of the memory cell;
a first pass transistor, having a gate controlled by the first word line, for connecting the first bit line to the gate of the first storage transistor and the first capacitor, during the accessing operation mode;

a second pass transistor, having a gate controlled by the first word line, for connecting the second bit line to the gate of the second storage transistor and the second capacitor, during the accessing operation mode;

a first storage transistor, having a gate for dynamically storing a storage data bit of the memory cell in respond to the first data bit during the accessing operation mode;

a second storage transistor, having a gate for dynamically storing a complement of the storage data bit of the memory cell in respond to the complement of first data bit during the accessing operation mode;

a first transistor, being coupled to a gate the first storage transistor, a gate of the first transistor being controlled by the storage data bit stored in the a gate the first storage transistor, a source/drain region of the first transistor being coupled to the first bit line;

a second transistor, being coupled to a gate of the second storage transistor, a gate of the second transistor being controlled by the complement of the storage data bit stored in the gate of the second storage transistor, a source/drain region of the second transistor being coupled to the second bit line; and a match transistor, having a gate coupled to an unconnected source/drain region of the first transistor and an unconnected source/drain region of the second transistor, during the comparison operation mode of the memory cell, the first word line stopping data transmitting between the first and second bit lines and the memory cell, the first bit line receiving a comparing data bit and the second bit line receiving a complement of the comparing data bit, if the comparing data bit from the first bit line is logically equal to the storage data bit, or if the comparing data bit from the second bit line is logically equal to the complement of the storage data bit, the match transistor being turned on to indicate a match signal.

73. The memory cell of claim 72, wherein the first and second pass transistors, the first and second storage transistors, the first and second transistors, and the match transistor are all n-channel metal-oxide-semiconductor (NMOS) transistors.

74. The memory cell of claim 72, further comprising a third bit line, for transmitting a second data bit to the memory cell;

a forth bit line, for transmitting a complement of the second data bit to the memory cell;

a second word line, for selectively controlling data transmitting between the third and forth bit lines and the memory cell in accordance with the accessing operation mode and the comparison operation mode of the memory cell;

a third pass transistor, having a gate controlled by the second word line, for connecting the third bit line to the gate of the first storage transistor; and a forth pass transistor, having a gate controlled by the second word line, for connecting the forth bit line to the gate of the second storage transistor, wherein the storage data bit stored in the gate of the first storage transistor being selectively updated in response to the second data bit, the storage data bit stored in the gate of the second storage transistor being selectively updated in response to the complement of the second data bit.

75. The memory cell of claim 74, wherein the first and second pass transistors, the third and forth pass transistors, the first and second storage transistors, the first and second match transistors, and the first and second transistors are all n-channel metal-oxide-semiconductor (NMOS) transistors.

76. A memory cell, comprising:

a first bit line, for transmitting a first data bit to the memory cell;

a second bit line, for transmitting a complement of the first data bit to the memory cell;

a first word line, for selectively controlling data transmitting between the first and second bit lines and the memory cell in accordance with an accessing operation mode and a comparison operation mode of the memory cell;

a first transistor, having a gate for dynamically storing a storage data bit of the memory cell in respond to the first data bit during the accessing operation mode, a source/drain region of the first transistor being coupled to the first bit line;

a second transistor, having a gate for dynamically storing a complement of the storage data bit of the memory cell in respond to the complement of first data bit during the accessing operation mode, a source/drain region of the second transistor being coupled to the second bit line;

a first pass transistor, having a gate controlled by the first word line, for connecting the first bit line to the gate of the first transistor, during the accessing operation mode;

a second pass transistor, having a gate controlled by the first word line, for connecting the second bit line to the gate of the second transistor, during the accessing operation mode;

a match transistor, having a gate coupled to an unconnected source/drain region of the first transistor and an unconnected source/drain region of the second transistor, during the comparison operation mode of the memory cell, the first word line stopping data transmitting between the first and second bit lines and the memory cell, the first bit line receiving a comparing data bit and the second bit line receiving a complement of the comparing data bit, if the comparing data bit from the first bit line is logically equal to the storage data bit, or if the comparing data bit from the second bit line is logically equal to the complement of the storage data bit, the match transistor being turned on to indicate a match signal.

77. The memory cell of claim 76, wherein the first and second pass transistors, the first and second transistors, and the match transistor are all n-channel metal-oxide-semiconductor (NMOS) transistors.

78. The memory cell of claim 76, wherein the first and second pass transistors, the first and second transistors, and the match transistor are all p-channel metal-oxide-semiconductor (PMOS) transistors.

79. The memory cell of claim 76, further comprising a third bit line, for transmitting a second data bit to the memory cell;

a forth bit line, for transmitting a complement of the second data bit to the memory cell;

a second word line, for selectively controlling data transmitting between the third and forth bit lines and the memory cell in accordance with the accessing operation mode and the comparison operation mode of the memory cell;

a third pass transistor, having a gate controlled by the second word line, for connecting the third bit line to the gate of the first transistor; and a forth pass transistor, having a gate controlled by the second word line, for connecting the forth bit line to the gate of the second transistor, wherein the storage data bit stored in the gate of the first transistor being selectively updated in response to the second data bit, the storage data bit stored in the gate of the second transistor being selectively updated in response to the complement of the second data bit.

80. The memory cell of claim 79, wherein the first and second pass transistors, the third and forth pass transistors, the match transistor, and the first and second transistors are all n-channel metal-oxide-semiconductor (NMOS) transistors.

81. The memory cell of claim 79, wherein the first and second pass transistors, the third and forth pass transistors, the match transistor, and the first and second transistors are all p-channel metal-oxide-semiconductor (PMOS) transistors.

82. A memory cell, comprising:
a first bit line, for transmitting a first data bit to the memory cell;

a second bit line, for transmitting a complement of the first data bit to the memory cell;

a first word line, for selectively controlling data transmitting between the first and second bit lines and the memory cell in accordance with an accessing operation mode and a comparison operation mode of the memory cell;

a first pass transistor, having a gate controlled by the first word line, for connecting the first bit line to the gate of the first storage transistor and the first capacitor, during the accessing operation mode;

a second pass transistor, having a gate controlled by the first word line, for connecting the second bit line to the gate of the second storage transistor and the second capacitor, during the accessing operation mode;

a first storage transistor and a first capacitor, a gate of the first storage transistor and the first capacitor for dynamically storing a storage data bit of the memory cell in respond to the first data bit during the accessing operation mode;

a second storage transistor and a second capacitor, a gate of the second storage transistor and the second capacitor for dynamically storing a complement of the storage data bit of the memory cell in respond to the complement of first data bit during the accessing operation mode;

a first compare line, for transmitting a compare data bit to the memory cell;

a second compare bit line, for transmitting a complement of the compare data bit to the memory cell;

a first transistor, being coupled to a gate the first storage transistor and the first capacitor, a gate of the first transistor being controlled by the storage data bit stored in the a gate the first storage transistor and the first capacitor, a source/drain region of the first transistor being coupled to the first compare line;

a second transistor, being coupled to a gate of the second storage transistor and the second capacitor, a gate of the second transistor being controlled by the complement of the storage data bit stored in the gate of the second storage transistor and the second capacitor, a source/drain region of the second transistor being coupled to the second compare line; and a match transistor, having a gate coupled to an unconnected source/drain region of the first transistor and an unconnected source/drain region of the second transistor, during the comparison operation mode of the memory cell, the first compare line receiving a comparing data bit and the second compare line receiving a complement of the comparing data bit, if the comparing data bit from the first compare line is logically equal to the storage data bit, or if the comparing data bit from the second compare line is logically equal to the complement of the storage data bit, the match transistor being turned on to indicate a match signal.

83. The memory cell of claim 82, wherein the first and second pass transistors, the first and second storage transistors, the first and second transistors, and the match transistor are all n-channel metal-oxide-semiconductor (NMOS) transistors.

84. The memory cell of claim 82, further comprising
a third bit line, for transmitting a second data bit to the memory cell;

a forth bit line, for transmitting a complement of the second data bit to the memory cell;

a second word line, for selectively controlling data transmitting between the third and forth bit lines and the memory cell in accordance with the accessing operation mode and the comparison operation mode of the memory cell;

a third pass transistor, having a gate controlled by the second word line, for connecting the third bit line to the gate of the first storage transistor and the first capacitor; and a forth pass transistor, having a gate controlled by the second word line, for connecting the forth bit line to the gate of the second storage transistor and the second capacitor, wherein the storage data bit stored in the gate of the first transistor and the first capacitor being selectively updated in response to the second data bit, the storage data bit stored in the gate of the second transistor and the second capacitor being selectively updated in response to the complement of the second data bit.

85. The memory cell of claim 84, wherein the first and second pass transistors, the third and forth pass transistors, the first and second storage transistors, the match transistor, and the first and second transistors are all n-channel metal-oxide-semiconductor (NMOS) transistors.

86. A memory cell, comprising:
a first bit line, for transmitting a first data bit to the memory cell;

a second bit line, for transmitting a complement of the first data bit to the memory cell;

a first word line, for selectively controlling data transmitting between the first and second bit lines and the memory cell in accordance with an accessing operation mode and a comparison operation mode of the memory cell;

a first pass transistor, having a gate controlled by the first word line, for connecting the first bit line to the gate of the first storage transistor and the first capacitor, during the accessing operation mode;

a second pass transistor, having a gate controlled by the first word line, for connecting the second bit line to the gate of the second storage transistor and the second capacitor, during the accessing operation mode;

a first storage transistor, having a gate for dynamically storing a storage data bit of the memory cell in respond to the first data bit during the accessing operation mode;

a second storage transistor, having a gate for dynamically storing a complement of the storage data bit of the memory cell in respond to the complement of first data bit during the accessing operation mode;

a first compare line, for transmitting a compare data bit to the memory cell;

a second compare bit line, for transmitting a complement of the compare data bit to the memory cell;

a first transistor, being coupled to a gate the first storage transistor, a gate of the first transistor being controlled by the storage data bit stored in a gate the first storage transistor, a source/drain region of the first transistor being coupled to the first compare line;

a second transistor, being coupled to a gate of the second storage transistor, a gate of the second transistor being controlled by the complement of the storage data bit stored in the gate of the second storage transistor, a source/drain region of the second transistor being coupled to the second compare line; and a match transistor, having a gate coupled to an unconnected source/drain region of the first transistor and an unconnected source/drain region of the second transistor, during the comparison operation mode of the memory cell, the first compare line receiving a comparing data bit and the second compare line receiving a complement of the comparing data bit, if the comparing data bit from the first compare line is logically equal to the storage data bit, or if the comparing data bit from the second compare line is logically equal to the complement of the storage data bit, the match transistor being turned on to indicate a match signal.

87. The memory cell of claim 86, wherein the first and second pass transistors, the first and second storage transistors, the first and second transistors, and the match transistor are all n-channel metal-oxide-semiconductor (NMOS) transistors.

88. The memory cell of claim 86, further comprising a third bit line, for transmitting a second data bit to the memory cell;

a forth bit line, for transmitting a complement of the second data bit to the memory cell;

a second word line, for selectively controlling data transmitting between the third and forth bit lines and the memory cell in accordance with the accessing operation mode and the comparison operation mode of the memory cell;

a third pass transistor, having a gate controlled by the second word line, for connecting the third bit line to the gate of the first transistor; and a forth pass transistor, having a gate controlled by the second word line, for connecting the forth bit line to the gate of the second transistor and the second capacitor, wherein the storage data bit stored in the gate of the first storage transistor being selectively updated in response to the second data bit, the storage data bit stored in the gate of the second storage transistor being selectively updated in response to the complement of the second data bit.

89. The memory cell of claim 88, wherein the first and second pass transistors, the third and forth pass transistors, the first and second storage transistors, the match transistor, and the first and second transistors are all n-channel metal-oxide-semiconductor (NMOS) transistors.

90. A memory cell, comprising:

a first bit line, for transmitting a first data bit to the memory cell;

a second bit line, for transmitting a complement of the first data bit to the memory cell;

a first word line, for selectively controlling data transmitting between the first and second bit lines and the memory cell in accordance with an accessing operation mode and a comparison operation mode of the memory cell;

a first pass transistor, having a gate controlled by the first word line, for connecting the first bit line to the gate of the first storage transistor and the first capacitor, during the accessing operation mode;

a second pass transistor, having a gate controlled by the first word line, for connecting the second bit line to the gate of the second storage transistor and the second capacitor, during the accessing operation mode;

a first capacitor, for dynamically storing a storage data bit of the memory cell in respond to the first data bit during the accessing operation mode;

a second capacitor, for dynamically storing a complement of the storage data bit of the memory cell in respond to the complement of first data bit during the accessing operation mode;

a first compare line, for transmitting a compare data bit to the memory cell;

a second compare bit line, for transmitting a complement of the compare data bit to the memory cell;

a first transistor, being coupled to the first capacitor, a gate of the first transistor being controlled by the storage data bit stored in the first capacitor, a source/drain region of the first transistor being coupled to the first compare line;

a second transistor, being coupled to the second capacitor, a gate of the second transistor being controlled by the complement of the storage data bit stored in the gate of the second capacitor, a source/drain region of the second transistor being coupled to the second compare line; and a match transistor, having a gate coupled to an unconnected source/drain region of the first transistor and an unconnected source/drain region of the second transistor, during the comparison operation mode of the memory cell, the first compare line receiving a comparing data bit and the second compare line receiving a complement of the comparing data bit, if the comparing data bit from the first compare line is logically equal to the storage data bit, or if the comparing data bit from the second compare line is logically equal to the complement of the storage data bit, the match transistor being turned on to indicate a match signal.

91. The memory cell of claim 90, wherein the first and second pass transistors, the first and second transistors, and the match transistor are all n-channel metal-oxide-semiconductor (NMOS) transistors.

92. The memory cell of claim 90, wherein the first and second pass transistors, the first and second transistors, and the match transistor are all p-channel metal-oxide-semiconductor (PMOS) transistors.

93. The memory cell of claim 90, further comprising
a third bit line, for transmitting a second data bit to the memory cell;
a forth bit line, for transmitting a complement of the second data bit to the memory cell;
a second word line, for selectively controlling data transmitting between the third and forth bit lines and the memory cell in accordance with the accessing operation mode and the comparison operation mode of the memory cell;
a third pass transistor, having a gate controlled by the second word line, for connecting the third bit line to the first capacitor; and
a forth pass transistor, having a gate controlled by the second word line, for connecting the forth bit line to the second capacitor,
wherein
the storage data bit stored in the first capacitor being selectively updated in response to the second data bit,
the storage data bit stored in the second capacitor being selectively updated in response to the complement of the second data bit.

94. The memory cell of claim 93, wherein the first and second pass transistors, the third and forth pass transistors, the match transistor, and the first and second transistors are all n-channel metal-oxide-semiconductor (NMOS) transistors.

95. The memory cell of claim 93, wherein the first and second pass transistors, the third and forth pass transistors, the match transistor, and the first and second transistors are all p-channel metal-oxide-semiconductor (PMOS) transistors.

96. The memory cell of claim 90, wherein the first capacitor and the second capacitor are metal-insulator-metal (MIM) capacitors.

97. The memory cell of claim 90, wherein the first capacitor and the second capacitor are polysilicon capacitors.

98. The memory cell of claim 90, wherein the first capacitor and the second capacitor are ferroelectric capacitors suitable usage for ferroelectric random-access memory (FRAM).

99. The memory cell of claim 90, wherein the first capacitor and the second capacitor are capacitors manufactured by a DRAM process.

100. The memory cell of claim 90, wherein the first capacitor and the second capacitor are magnetoresistive random access memory (MRAM) capacitors made of magnetic materials to store data.

101. A memory cell, comprising:
a first bit line, for transmitting a first data bit to the memory cell;
a second bit line, for transmitting a complement of the first data bit to the memory cell;
a first word line, for selectively controlling data transmitting between the first and second bit lines and the memory cell in accordance with an accessing operation mode and a comparison operation mode of the memory cell;
a first pass transistor, having a gate controlled by the first word line, for connecting the first bit line to the gate of the first storage transistor and the first capacitor, during the accessing operation mode;
a second pass transistor, having a gate controlled by the first word line, for connecting the second bit line to the gate of the second storage transistor and the second capacitor, during the accessing operation mode;
a first compare line, for transmitting a compare data bit to the memory cell;
a second compare bit line, for transmitting a complement of the compare data bit to the memory cell;
a first transistor, having a gate for dynamically storing a storage data bit of the memory cell in respond to the first data bit during the accessing operation mode, a source/drain region of the first transistor being coupled to the first compare line;
a second transistor, having a gate for dynamically storing a complement of the storage data bit of the memory cell in respond to the complement of first data bit during the accessing operation mode, a source/drain region of the second transistor being coupled to the first compare line; and
a match transistor, having a gate coupled to an unconnected source/drain region of the first transistor and an unconnected source/drain region of the second transistor,
during the comparison operation mode of the memory cell,
the first compare line receiving a comparing data bit and the second compare line receiving a complement of the comparing data bit,
if the comparing data bit from the first compare line is logically equal to the storage data bit, or if the comparing data bit from the second compare line is logically equal to the complement of the storage data bit, the match transistor being turned on to indicate a match signal.

102. The memory cell of claim 101, wherein the first and second pass transistors, the first and second transistors, and the match transistor are all n-channel metal-oxide-semiconductor (NMOS) transistors.

103. The memory cell of claim 101, wherein the first and second pass transistors, the first and second transistors, and the match transistor are all p-channel metal-oxide-semiconductor (PMOS) transistors.

104. The memory cell of claim 101, further comprising
a third bit line, for transmitting a second data bit to the memory cell;
a forth bit line, for transmitting a complement of the second data bit to the memory cell;
a second word line, for selectively controlling data transmitting between the third and forth bit lines and the memory cell in accordance with the accessing operation mode and the comparison operation mode of the memory cell;

a third pass transistor, having a gate controlled by the second word line, for connecting the third bit line to the gate of the first transistor; and a forth pass transistor, having a gate controlled by the second word line, for connecting the forth bit line to the gate of the second transistor, wherein
the storage data bit stored in the gate of the first transistor being selectively updated in response to the second data bit,
the storage data bit stored in the gate of the second transistor being selectively updated in response to the complement of the second data bit.

105. The memory cell of claim 104, wherein the first and second pass transistors, the third and forth pass transistors, the match transistor, and the first and second transistors are all n-channel metal-oxide-semiconductor (NMOS) transistors.

106. The memory cell of claim 104, wherein the first and second pass transistors, the third and forth pass transistors, the match transistor, and the first and second transistors are all p-channel metal-oxide-semiconductor (PMOS) transistors.

* * * * *